US012681814B2

(12) United States Patent
Przybylski et al.

(10) Patent No.: US 12,681,814 B2
(45) Date of Patent: Jul. 14, 2026

(54) BUILDING SYSTEM WITH BROKERING ARCHITECTURE AND TIERED STORAGE FOR REALTIME APPLICATIONS

(71) Applicant: Tyco Fire & Security GmbH, Neuhausen am Rheinfall (CH)

(72) Inventors: Andrew J. Przybylski, Franksville, WI (US); Jon T. Mueller, Lebanon, KY (US); John H. Burroughs, Wauwautosa, WI (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 0 days.

(21) Appl. No.: 18/882,673

(22) Filed: Sep. 11, 2024

(65) Prior Publication Data
US 2025/0085888 A1 Mar. 13, 2025

Related U.S. Application Data

(60) Provisional application No. 63/537,993, filed on Sep. 12, 2023.

(51) Int. Cl.
*G06F 11/00* (2006.01)
*G05B 13/02* (2006.01)
(Continued)

(52) U.S. Cl.
CPC ........ *G06F 11/2023* (2013.01); *G05B 13/021* (2013.01); *G05B 23/0216* (2013.01);
(Continued)

(58) Field of Classification Search
CPC .... G06F 8/61; G06F 16/2322; G06F 23/0216; G06F 3/0604; G06F 3/0655; G06F 3/067;
(Continued)

(56) References Cited

U.S. PATENT DOCUMENTS

| | | | |
|---|---|---|---|
| 6,351,770 B1 | 2/2002 | Li et al. | |
| 9,685,977 B1 | 6/2017 | Takemoto | |

(Continued)

FOREIGN PATENT DOCUMENTS

| | | |
|---|---|---|
| WO | WO-2019/067630 A1 | 4/2019 |
| WO | WO-2019/067645 A | 4/2019 |
| WO | WO-2020/018147 A1 | 1/2020 |

OTHER PUBLICATIONS

Whitehouse, et al., "Amazon Web Services: Enabling Cost-Efficient Disaster Recovery Leveraging Cloud Infrastructure," Jan. 2012, Enterprise Strategy Group, Inc., White Paper (pp. 1-16).

*Primary Examiner* — Craig S Goldschmidt
(74) *Attorney, Agent, or Firm* — Foley & Lardner LLP

(57) ABSTRACT
A brokering system used in distributed building controls provides multiple tiers of storage. Data can be requested at any time during the processing of new data received from a building device. Complex event processors, low latency control, and/or display interfaces may request and be provided data from memory (e.g., tier one storage) of a message broker. Digital twins and/or optimization algorithms may wait until data is stored to local disk before information is obtained. Other applications may wait until data is saved in the remote database before using the data to perform calculations. Data may be compressed and stored in timeseries that are accessed by a single requested to the message broker.

20 Claims, 42 Drawing Sheets

(51) Int. Cl.

| | |
|---|---|
| *G05B 23/02* | (2006.01) |
| *G06F 3/06* | (2006.01) |
| *G06F 8/61* | (2018.01) |
| *G06F 11/20* | (2006.01) |
| *G06F 16/23* | (2019.01) |
| *G06F 30/20* | (2020.01) |
| *H03M 7/30* | (2006.01) |

(52) U.S. Cl.
CPC ............ *G06F 3/0604* (2013.01); *G06F 3/067* (2013.01); *G06F 8/61* (2013.01); *G06F 8/63* (2013.01); *G06F 16/2322* (2019.01); *G06F 30/20* (2020.01); *H03M 7/6011* (2013.01); *G06F 3/0655* (2013.01); *G06F 2201/805* (2013.01); *H03M 7/3073* (2013.01)

(58) Field of Classification Search
CPC .. G06F 8/63; G06F 11/2023; G06F 2201/805; G05B 13/021; H03M 7/6011; H03M 7/3073

See application file for complete search history.

(56) References Cited

U.S. PATENT DOCUMENTS

| | | | | |
|---|---|---|---|---|
| 10,120,616 | B1* | 11/2018 | Salamon | G06F 13/102 |
| 10,176,033 | B1 | 1/2019 | Wang et al. | |
| 10,505,756 | B2 | 12/2019 | Park et al. | |
| 10,962,945 | B2 | 3/2021 | Park et al. | |
| 11,018,891 | B2 | 5/2021 | Park et al. | |
| 11,120,012 | B2 | 9/2021 | Park et al. | |
| 11,226,598 | B2 | 1/2022 | Oliver et al. | |
| 11,314,726 | B2 | 4/2022 | Park et al. | |
| 11,525,594 | B1 | 12/2022 | Hinson et al. | |
| 11,764,991 | B2 | 9/2023 | Park et al. | |
| 11,768,826 | B2 | 9/2023 | Park et al. | |
| 11,792,039 | B2 | 10/2023 | Park et al. | |
| 11,996,868 | B2 | 5/2024 | Alligand | |
| 12,013,842 | B2 | 6/2024 | Park et al. | |
| 2008/0189324 | A1 | 8/2008 | Keller | |
| 2017/0302531 | A1 | 10/2017 | Maes | |
| 2019/0095517 | A1 | 3/2019 | Park et al. | |
| 2019/0095518 | A1 | 3/2019 | Park et al. | |
| 2020/0012265 | A1* | 1/2020 | Thomsen | G06F 3/0481 |
| 2020/0042618 | A1* | 2/2020 | Mukku | G06F 3/0649 |
| 2020/0092127 | A1 | 3/2020 | Park et al. | |
| 2020/0167361 | A1* | 5/2020 | Princehouse | G06F 3/0649 |
| 2020/0304331 | A1 | 9/2020 | Park et al. | |
| 2020/0304332 | A1 | 9/2020 | Park et al. | |
| 2020/0304333 | A1 | 9/2020 | Park et al. | |
| 2020/0304334 | A1 | 9/2020 | Park et al. | |
| 2020/0313924 | A1 | 10/2020 | Park et al. | |
| 2021/0119641 | A1* | 4/2021 | Alligand | H03M 7/6064 |
| 2021/0158975 | A1 | 5/2021 | Turney et al. | |
| 2021/0190354 | A1 | 6/2021 | Llopis et al. | |
| 2021/0225528 | A1* | 7/2021 | Viengkham | G16Y 20/10 |
| 2021/0226812 | A1 | 7/2021 | Park et al. | |
| 2021/0306176 | A1 | 9/2021 | Park et al. | |
| 2022/0027215 | A1 | 1/2022 | Chilamakuri et al. | |
| 2022/0138183 | A1 | 5/2022 | Park et al. | |
| 2022/0299963 | A1 | 9/2022 | Waghmare et al. | |
| 2022/0327111 | A1 | 10/2022 | Park et al. | |
| 2023/0359455 | A1 | 11/2023 | Jalal et al. | |
| 2023/0385273 | A1 | 11/2023 | Park et al. | |
| 2024/0073055 | A1 | 2/2024 | Park et al. | |
| 2024/0080219 | A1 | 3/2024 | Park et al. | |
| 2024/0086399 | A1 | 3/2024 | Park et al. | |
| 2025/0284390 | A1* | 9/2025 | Buchman | G06F 3/0604 |

* cited by examiner

| Event ID | Start Time | End Time | State |
|---|---|---|---|
| 1 | 00:00 | 01:59 | Cold |
| 2 | 02:00 | 08:59 | Cool |
| 3 | 09:00 | 11:59 | Warm |
| 4 | 12:00 | 15:59 | Hot |
| 5 | 16:00 | 18:59 | Warm |
| 6 | 19:00 | 21:59 | Cool |
| 7 | 22:00 | 23:59 | Cold |

920

| Timestamp | OAT | State |
|---|---|---|
| 00:00 | 43 | Cold |
| 01:00 | 48 | Cold |
| 02:00 | 51 | Cool |
| 03:00 | 54 | Cool |
| 04:00 | 57 | Cool |
| 05:00 | 60 | Cool |
| 06:00 | 65 | Cool |
| 07:00 | 69 | Cool |
| 08:00 | 76 | Cool |
| 09:00 | 83 | Warm |
| 10:00 | 94 | Warm |
| 11:00 | 99 | Warm |
| 12:00 | 108 | Hot |
| 13:00 | 110 | Hot |
| 14:00 | 110 | Hot |
| 15:00 | 106 | Hot |
| 16:00 | 98 | Warm |
| 17:00 | 91 | Warm |
| 18:00 | 81 | Warm |
| 19:00 | 74 | Cool |
| 20:00 | 65 | Cool |
| 21:00 | 54 | Cool |
| 22:00 | 48 | Cold |
| 23:00 | 44 | Cold |

910

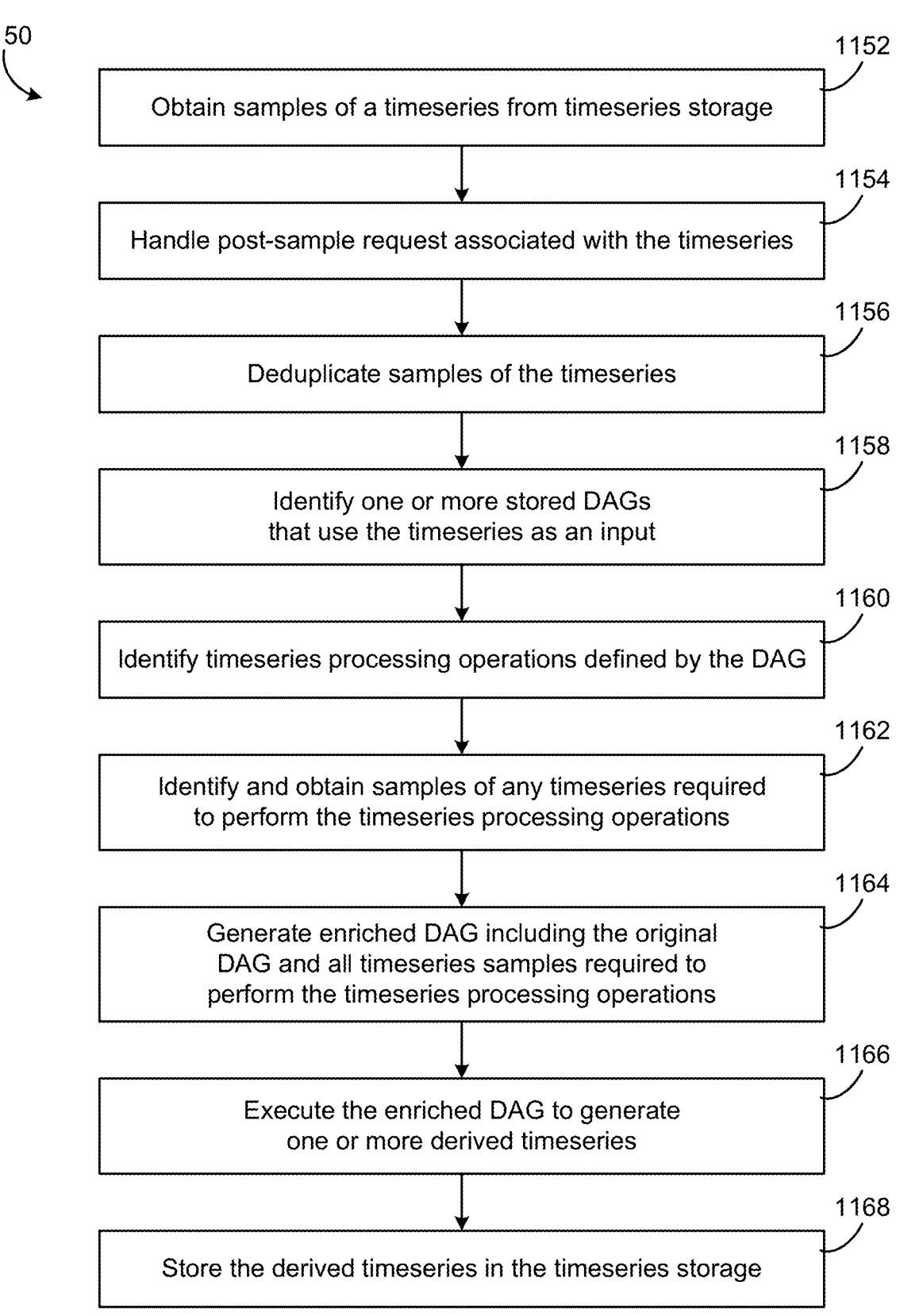

1150

1152
Obtain samples of a timeseries from timeseries storage

1154
Handle post-sample request associated with the timeseries

1156
Deduplicate samples of the timeseries

1158
Identify one or more stored DAGs
that use the timeseries as an input

1160
Identify timeseries processing operations defined by the DAG

1162
Identify and obtain samples of any timeseries required
to perform the timeseries processing operations 1164
Generate enriched DAG including the original
DAG and all timeseries samples required to
perform the timeseries processing operations 1166
Execute the enriched DAG to generate
one or more derived timeseries 1168
Store the derived timeseries in the timeseries storage

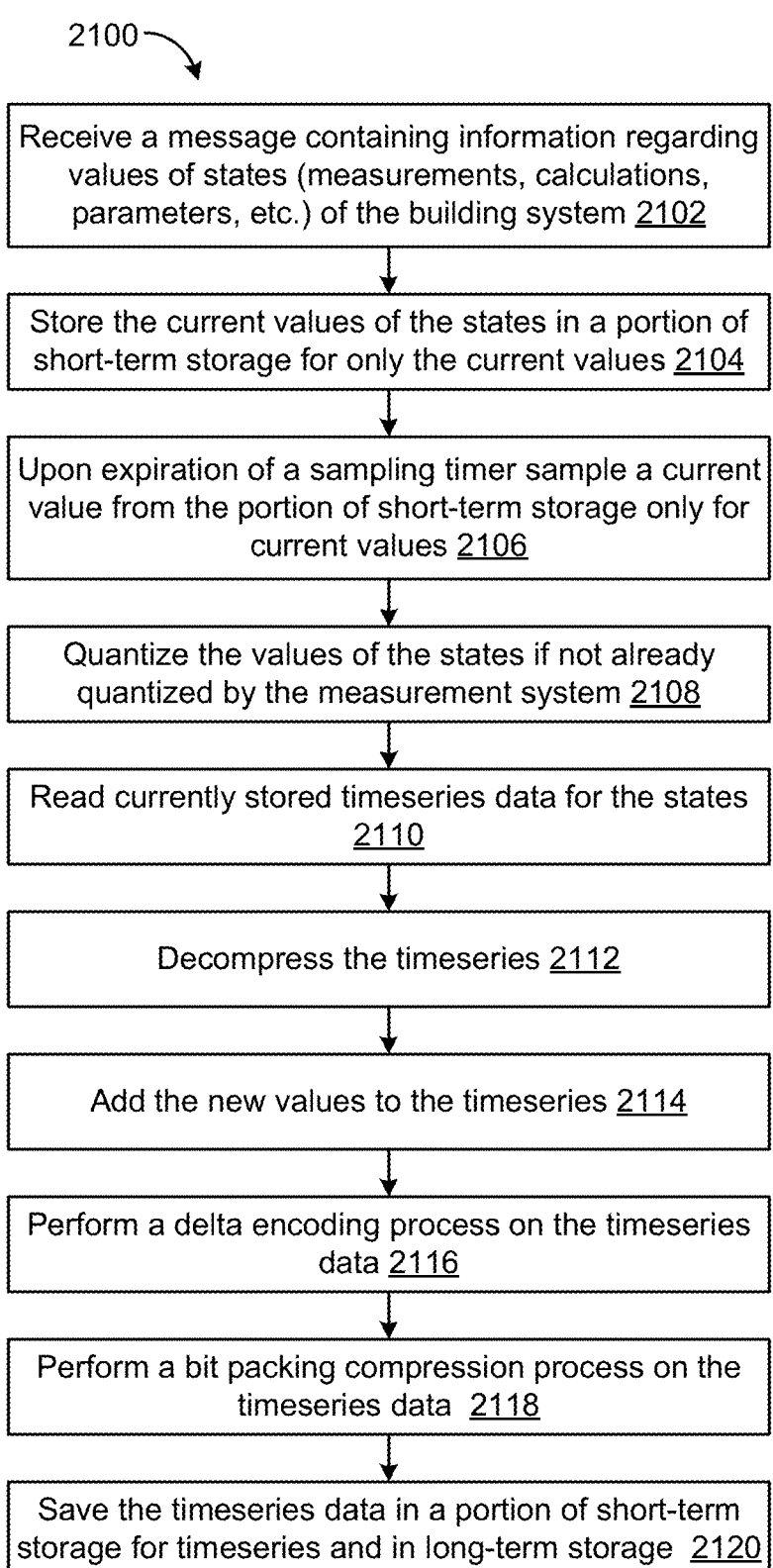

Receive a message containing information regarding values of states (measurements, calculations, parameters, etc.) of the building system 2102

Store the current values of the states in a portion of short-term storage for only the current values 2104

Upon expiration of a sampling timer sample a current value from the portion of short-term storage only for current values 2106

Quantize the values of the states if not already quantized by the measurement system 2108

Read currently stored timeseries data for the states 2110

Decompress the timeseries 2112

Add the new values to the timeseries 2114

Perform a delta encoding process on the timeseries data 2116

Perform a bit packing compression process on the timeseries data 2118

Save the timeseries data in a portion of short-term storage for timeseries and in long-term storage 2120

Read the most recent value of the timeseries data
(not stored as a change) 2302

Calculate the difference between a new value and
the most recent value 2304

Perform a bit packing compression or 7-bit encoding
on the difference 2306

Store the resulting compressed bits 2308

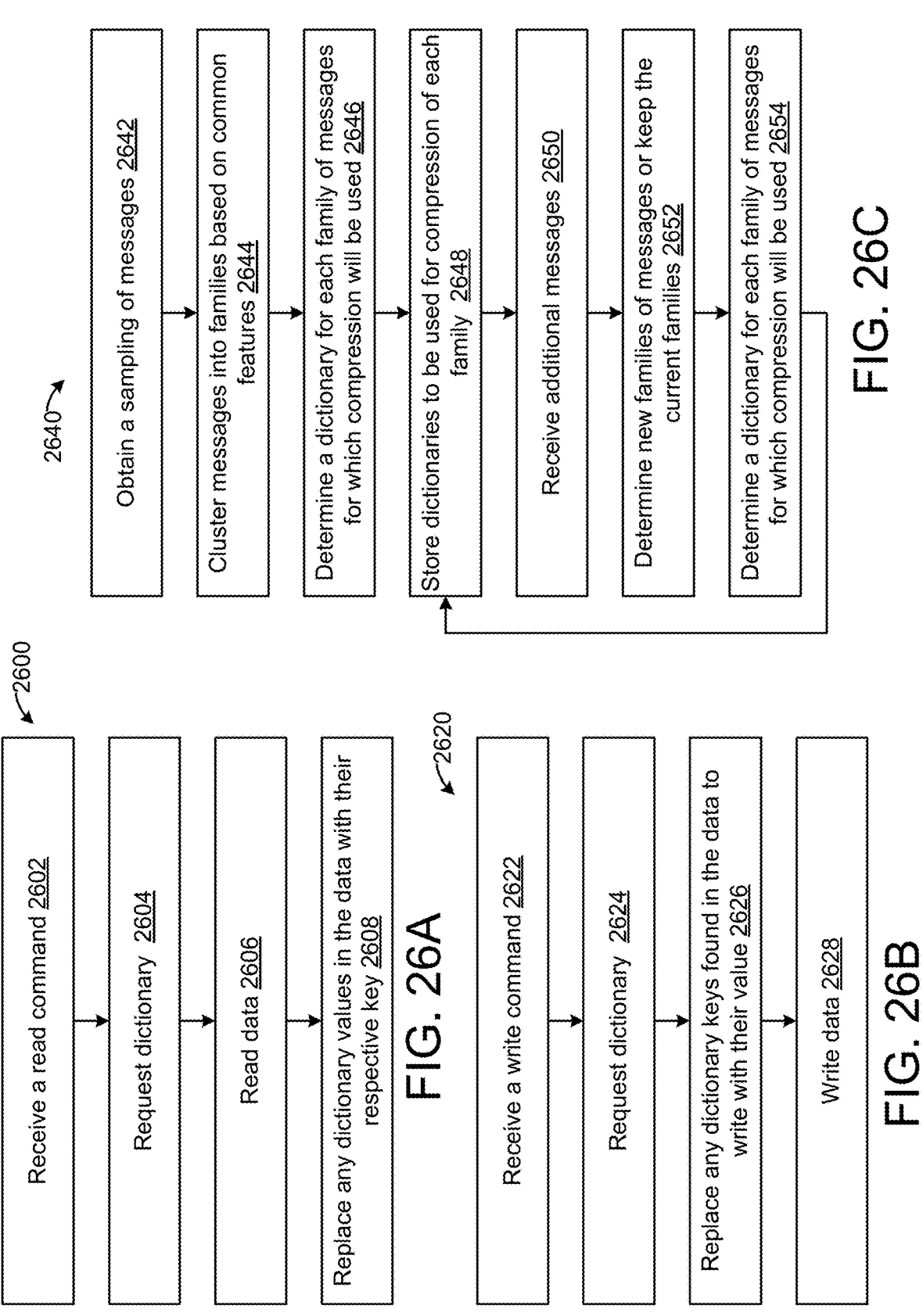

2640

Obtain a sampling of messages 2642

Cluster messages into families based on common features 2644

Determine a dictionary for each family of messages for which compression will be used 2646

Store dictionaries to be used for compression of each family 2648

Receive additional messages 2650

Determine new families of messages or keep the current families 2652

Determine a dictionary for each family of messages for which compression will be used 2654

Receive a read command 2602

Request dictionary 2604

Read data 2606

Replace any dictionary values in the data with their respective key 2608

Receive a write command 2622

Request dictionary 2624

Replace any dictionary keys found in the data to write with their value 2626

Write data 2628

FIG. 26B

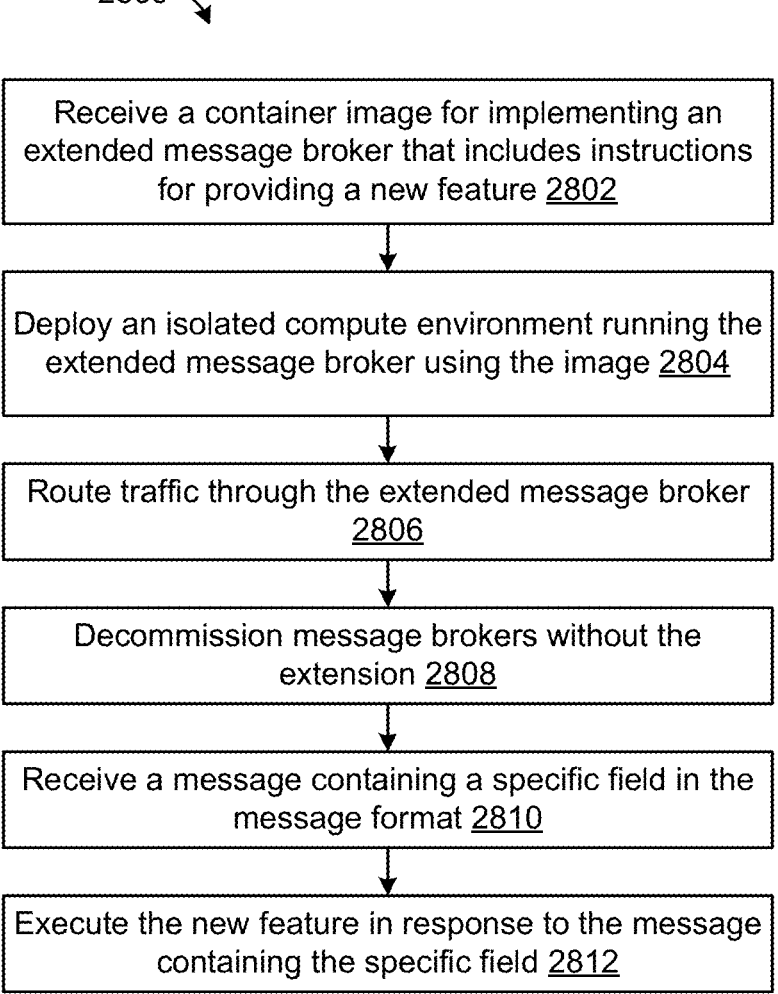

2800

Receive a container image for implementing an extended message broker that includes instructions for providing a new feature 2802

Deploy an isolated compute environment running the extended message broker using the image 2804

Route traffic through the extended message broker 2806

Decommission message brokers without the extension 2808

Receive a message containing a specific field in the message format 2810

Execute the new feature in response to the message containing the specific field 2812

FIG. 28

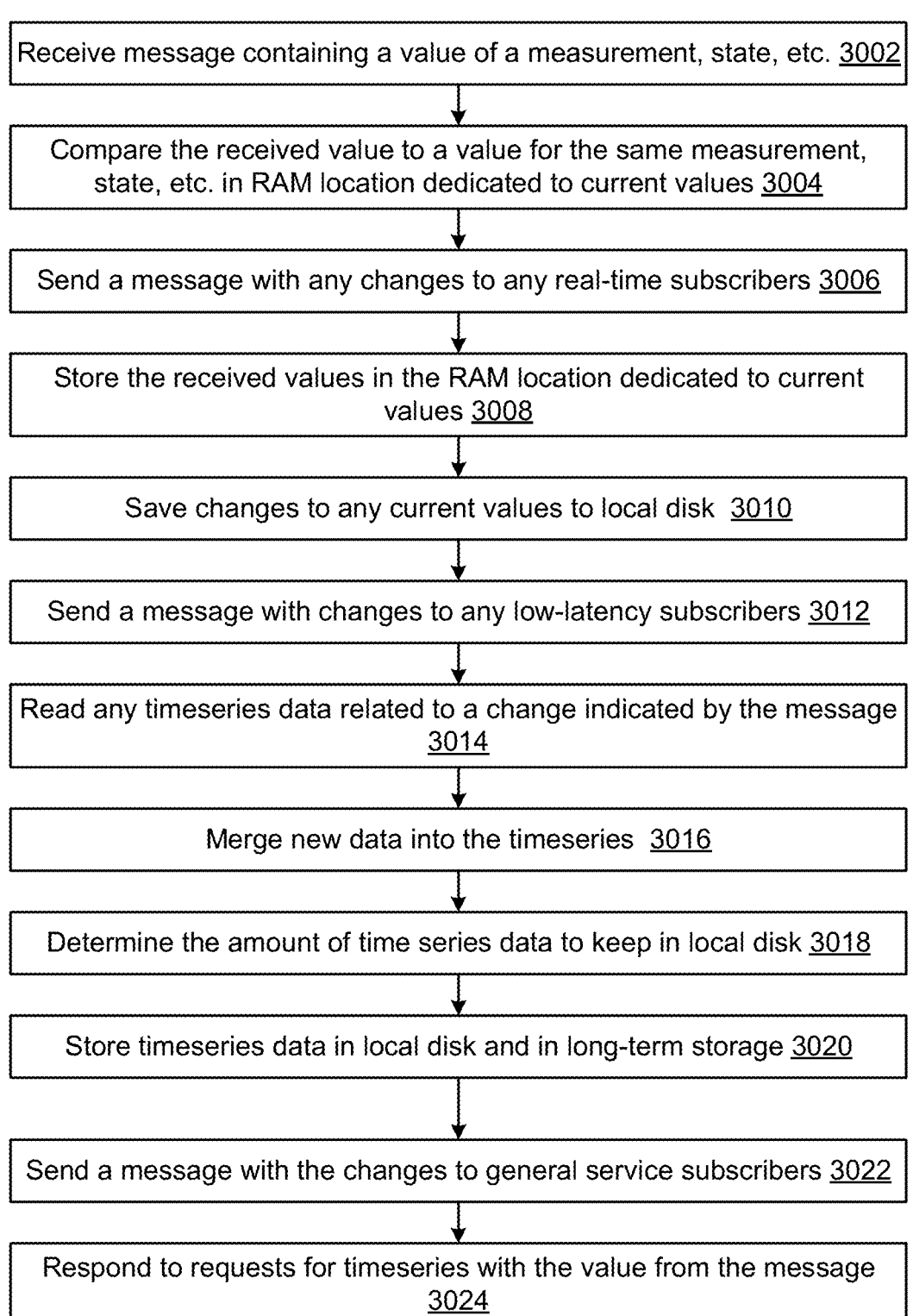

3000

Receive message containing a value of a measurement, state, etc. 3002

Compare the received value to a value for the same measurement, state, etc. in RAM location dedicated to current values 3004

Send a message with any changes to any real-time subscribers 3006

Store the received values in the RAM location dedicated to current values 3008

Save changes to any current values to local disk 3010

Send a message with changes to any low-latency subscribers 3012

Read any timeseries data related to a change indicated by the message 3014

Merge new data into the timeseries 3016

Determine the amount of time series data to keep in local disk 3018

Store timeseries data in local disk and in long-term storage 3020

Send a message with the changes to general service subscribers 3022

Respond to requests for timeseries with the value from the message 3024

Figures 36A, 36B:
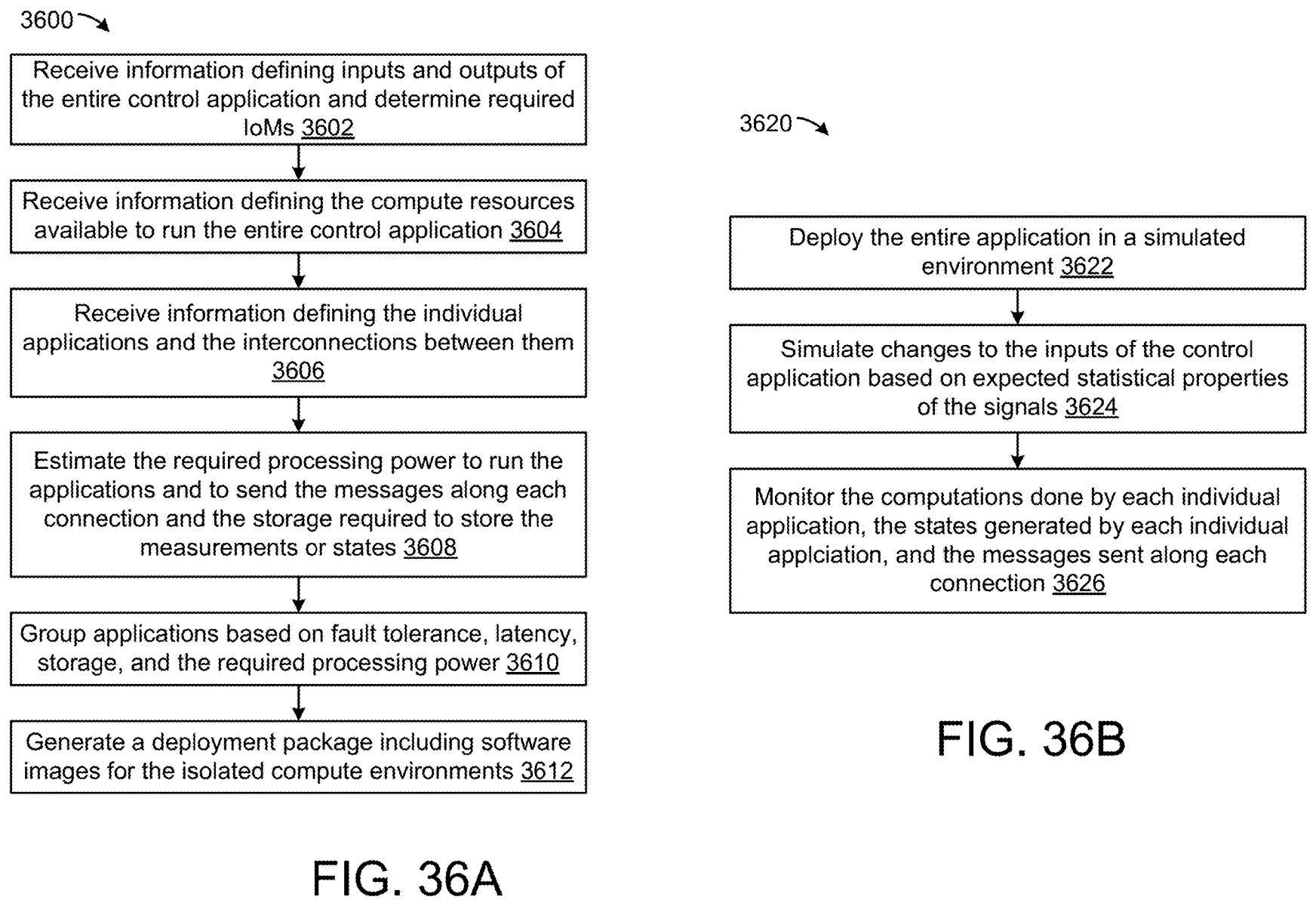

Deploy the entire application in a simulated environment 3622

→

Simulate changes to the inputs of the control application based on expected statistical properties of the signals 3624

→

Monitor the computations done by each individual application, the states generated by each individual application, and the messages sent along each connection 3626

Receive information defining inputs and outputs of the entire control application and determine required IoMs 3602

→

Receive information defining the compute resources available to run the entire control application 3604

→

Receive information defining the individual applications and the interconnections between them 3606

→

Estimate the required processing power to run the applications and to send the messages along each connection and the storage required to store the measurements or states 3608

→

Group applications based on fault tolerance, latency, storage, and the required processing power 3610

→

Generate a deployment package including software images for the isolated compute environments 3612

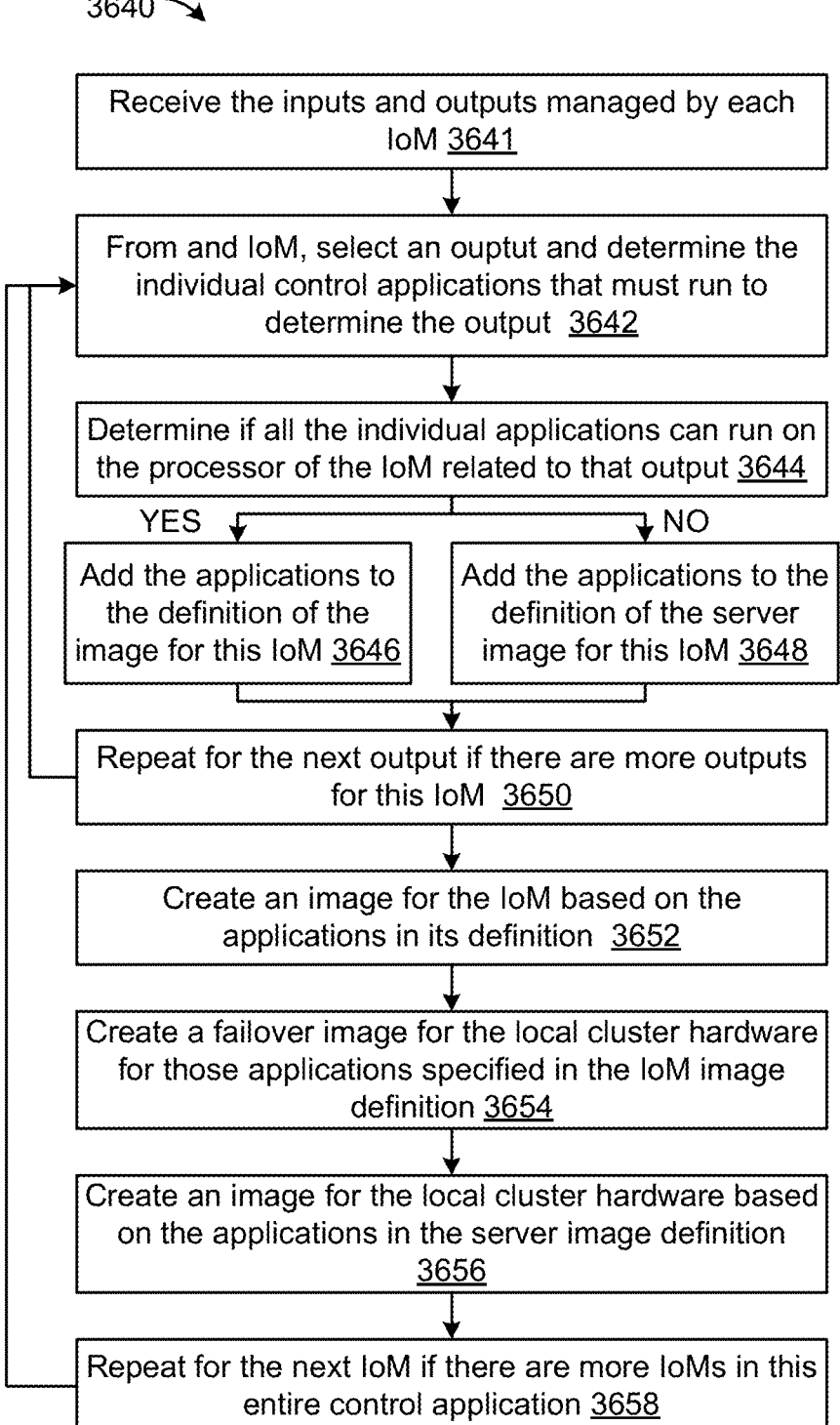

Receive the inputs and outputs managed by each IoM 3641

From and IoM, select an ouptut and determine the individual control applications that must run to determine the output 3642

Determine if all the individual applications can run on the processor of the IoM related to that output 3644

YES　　　　　　　　　　　　　　NO

Add the applications to the definition of the image for this IoM 3646

Add the applications to the definition of the server image for this IoM 3648

Repeat for the next output if there are more outputs for this IoM 3650

Create an image for the IoM based on the applications in its definition 3652

Create a failover image for the local cluster hardware for those applications specified in the IoM image definition 3654

Create an image for the local cluster hardware based on the applications in the server image definition 3656

Repeat for the next IoM if there are more IoMs in this entire control application 3658

FIG. 36C

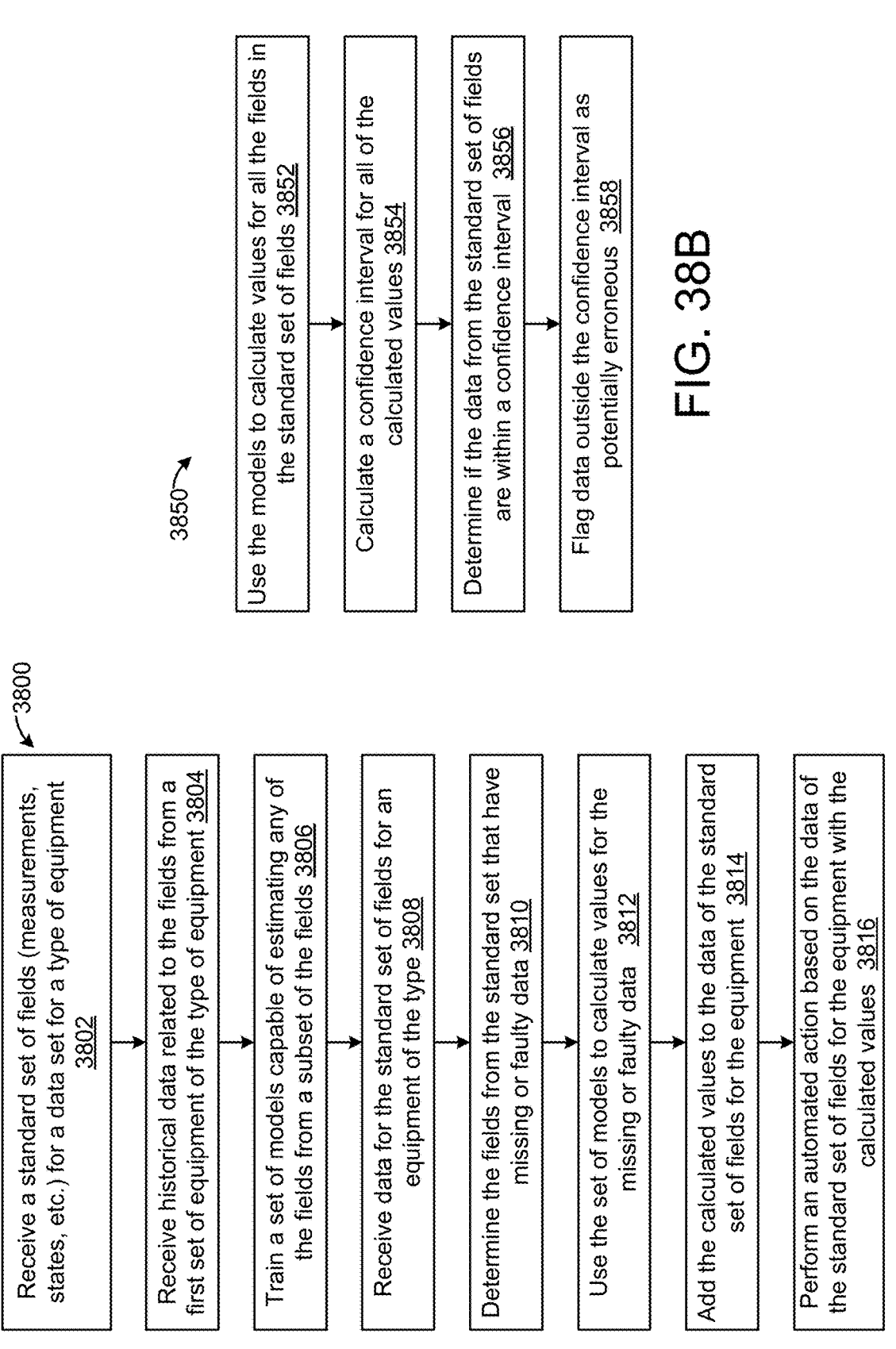

3850

Use the models to calculate values for all the fields in the standard set of fields 3852

↓

Calculate a confidence interval for all of the calculated values 3854

↓

Determine if the data from the standard set of fields are within a confidence interval 3856

↓

Flag data outside the confidence interval as potentially erroneous 3858

Receive a standard set of fields (measurements, states, etc.) for a data set for a type of equipment 3802

↓

Receive historical data related to the fields from a first set of equipment of the type of equipment 3804

↓

Train a set of models capable of estimating any of the fields from a subset of the fields 3806

↓

Receive data for the standard set of fields for an equipment of the type 3808

↓

Determine the fields from the standard set that have missing or faulty data 3810

↓

Use the set of models to calculate values for the missing or faulty data 3812

↓

Add the calculated values to the data of the standard set of fields for the equipment 3814

↓

Perform an automated action based on the data of the standard set of fields for the equipment with the calculated values 3816

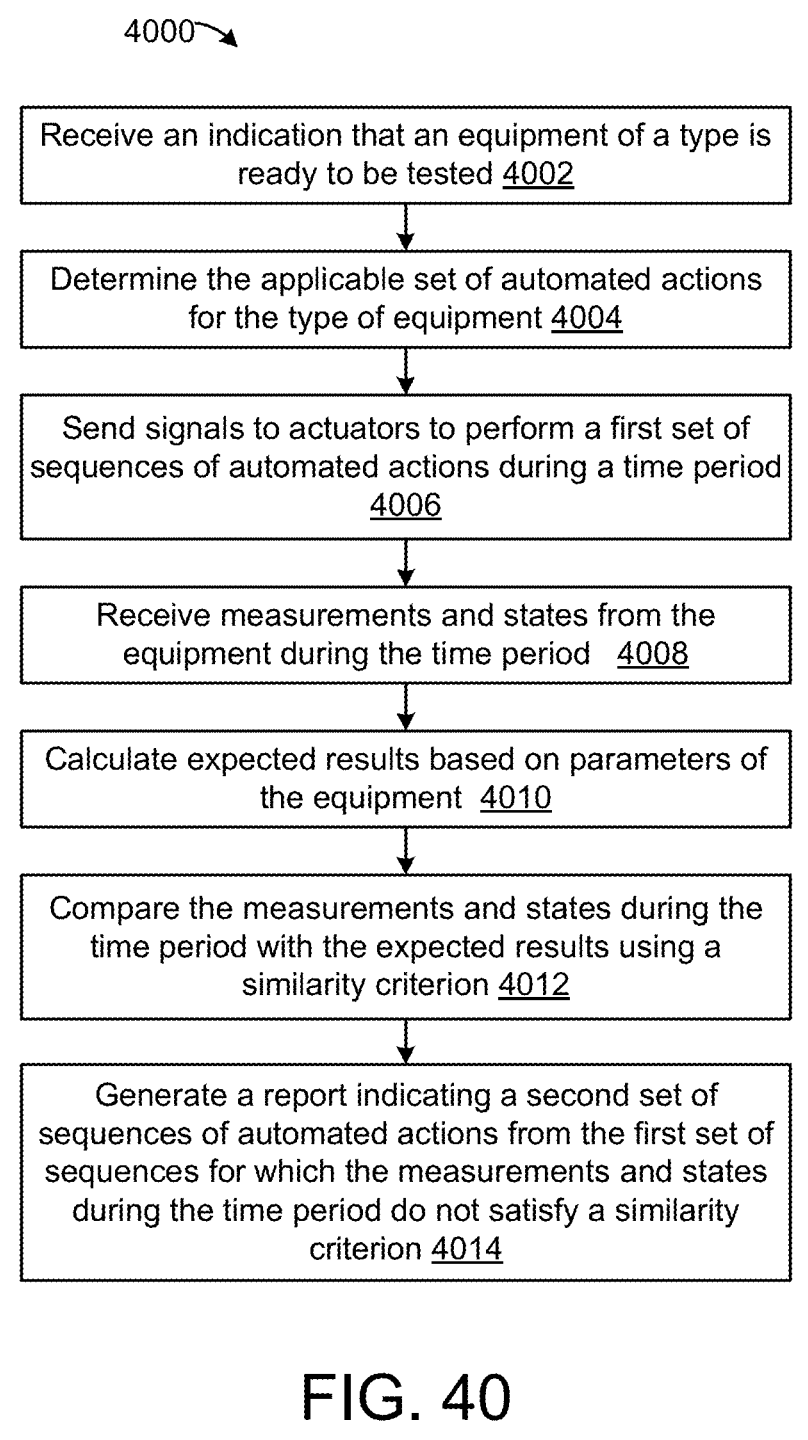

Receive an indication that an equipment of a type is ready to be tested 4002

↓

Determine the applicable set of automated actions for the type of equipment 4004

↓

Send signals to actuators to perform a first set of sequences of automated actions during a time period 4006

↓

Receive measurements and states from the equipment during the time period   4008

↓

Calculate expected results based on parameters of the equipment  4010

↓

Compare the measurements and states during the time period with the expected results using a similarity criterion 4012

↓

Generate a report indicating a second set of sequences of automated actions from the first set of sequences for which the measurements and states during the time period do not satisfy a similarity criterion 4014

FIG. 40

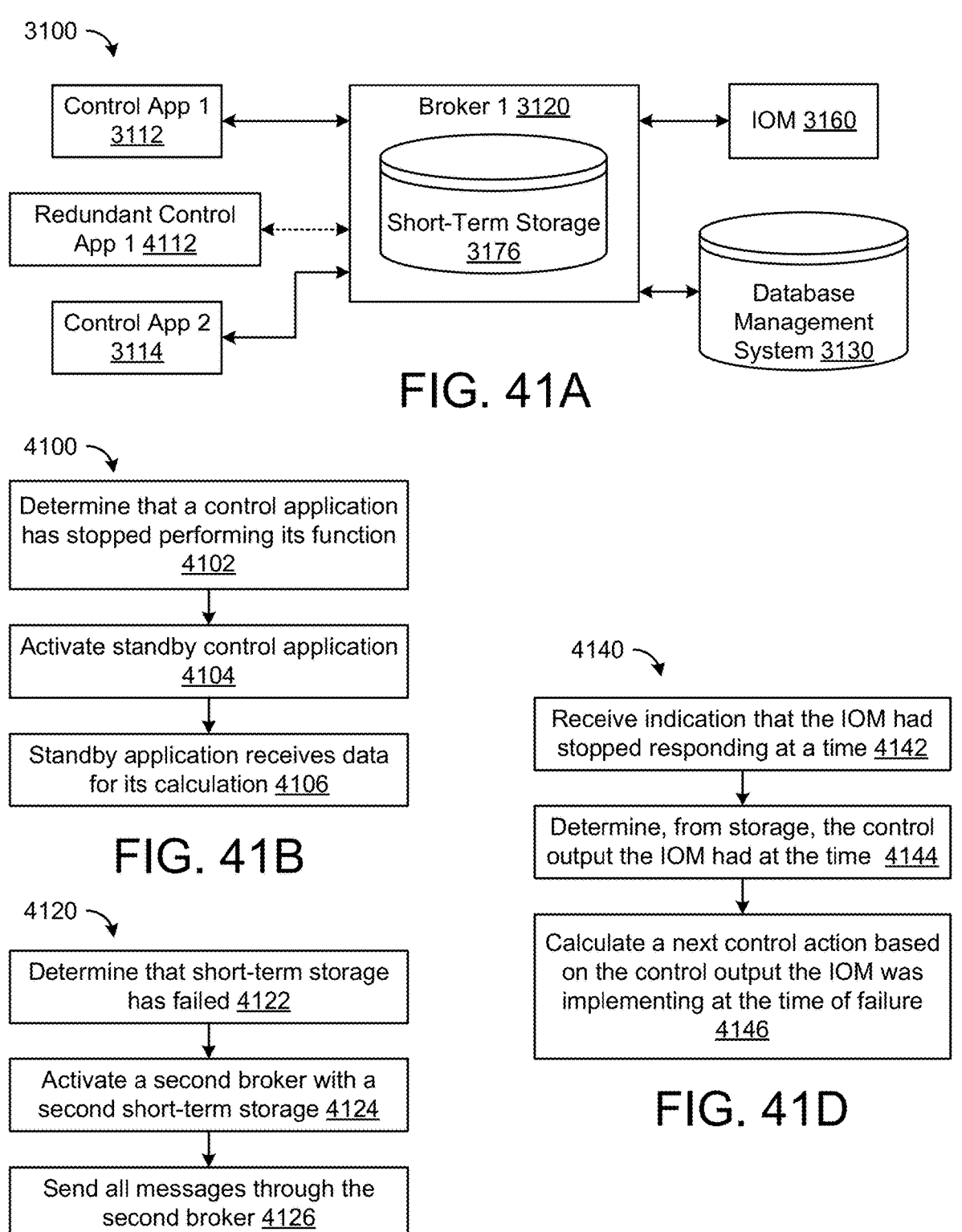

3100

Control App 1
3112

Redundant Control
App 1 4112

Control App 2
3114

Broker 1 3120

Short-Term Storage
3176

IOM 3160

Database
Management
System 3130

Determine that a control application
has stopped performing its function
4102

Activate standby control application
4104

Standby application receives data
for its calculation 4106

Determine that short-term storage
has failed 4122

Activate a second broker with a
second short-term storage 4124

Send all messages through the
second broker 4126

Receive indication that the IOM had
stopped responding at a time 4142

Determine, from storage, the control
output the IOM had at the time 4144

Calculate a next control action based
on the control output the IOM was
implementing at the time of failure
4146

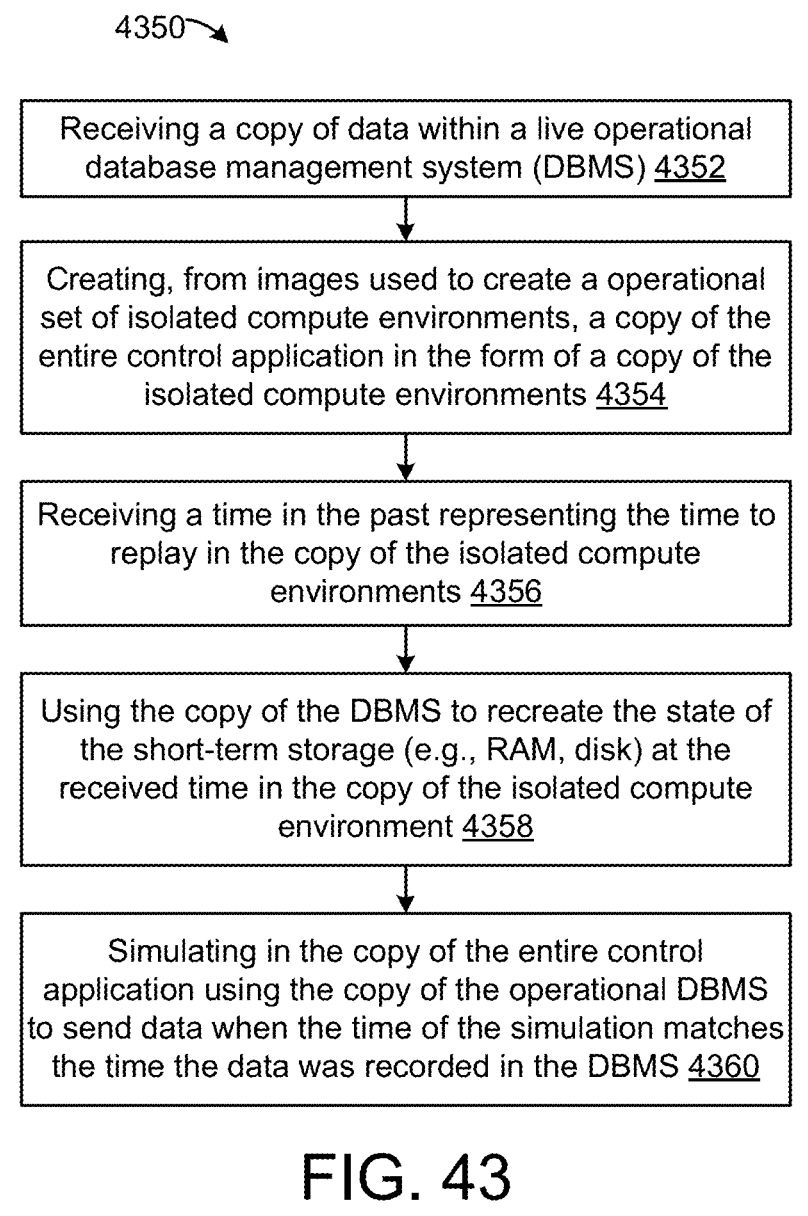

Receiving a copy of data within a live operational database management system (DBMS) 4352

Creating, from images used to create a operational set of isolated compute environments, a copy of the entire control application in the form of a copy of the isolated compute environments 4354

Receiving a time in the past representing the time to replay in the copy of the isolated compute environments 4356

Using the copy of the DBMS to recreate the state of the short-term storage (e.g., RAM, disk) at the received time in the copy of the isolated compute environment 4358

Simulating in the copy of the entire control application using the copy of the operational DBMS to send data when the time of the simulation matches the time the data was recorded in the DBMS 4360

FIG. 43

BUILDING SYSTEM WITH BROKERING ARCHITECTURE AND TIERED STORAGE FOR REALTIME APPLICATIONS

CROSS-REFERENCE TO RELATED PATENT APPLICATIONS

This application claims priority to U.S. Provisional Patent Application No. 63/537,993, filed on Sep. 12, 2023, the entirety of which is incorporated by reference herein.

BACKGROUND

The present disclosure relates generally to a web services platform and more particularly to a web services platform configured to ingest, process, and store timeseries data.

A web services platform can collect data from sensors and other types of networked devices (e.g., IoT devices). Data can be collected over time and combined into streams of timeseries data. Each sample of the timeseries data can include a timestamp and a data value. Some web services platforms store raw timeseries data in a relational database without significant organization or processing at the time of data collection. Applications that consume the timeseries data can be responsible for retrieving the raw timeseries data from the database and generating views of the timeseries data that can be presented via a chart, graph, or other user interface. These processing steps can be performed in response to a request for the timeseries data, which can significantly delay data presentation at query time.

A building management system (BMS) is, in general, a system of devices configured to control, monitor, and manage equipment in or around a building or building area. A BMS can include a heating, ventilation, or air conditioning (HVAC) system, a security system, a lighting system, a fire alerting system, another system that is capable of managing building functions or devices, or any combination thereof. BMS devices may be installed in any environment (e.g., an indoor area or an outdoor area) and the environment may include any number of buildings, spaces, zones, rooms, or areas. A BMS may include METASYS® building controllers or other devices sold by Johnson Controls, Inc., as well as building devices and components from other sources.

A BMS may include one or more computer systems (e.g., servers, BMS controllers, etc.) that serve as enterprise level controllers, application or data servers, head nodes, master controllers, or field controllers for the BMS. Such computer systems may communicate with multiple downstream building systems or subsystems (e.g., an HVAC system, a security system, etc.) according to like or disparate protocols (e.g., LON, BACnet, etc.). The computer systems may also provide one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with the BMS, its subsystems, and devices.

SUMMARY

An embodiment of the present disclosure relates to one or more memory devices having instructions stored thereon that, when executed by one or more processors, cause the one or more processors to perform operations. The operations include operating a first isolated compute environment including a message broker and a first tier of storage configured to respond faster than a second tier of storage and operating a second isolated compute environment including the second tier of storage. The message broker is configured to receive messages containing data related to measurements of a building system and store the data in the first tier of storage, send a message to the first isolated compute environment to store the data in the first tier of storage after storing the data in the second tier of storage, and respond to requests for the data stored in the second tier of storage before sending the message to the first isolated compute environment to store the data in the first tier of storage.

In some embodiments, the first tier of storage includes at least one of RAM, a solid-state drive, or an embedded multi-media card.

In some embodiments, the second tier of storage includes at least one of a solid-state drive, a magnetic disk drive, or an embedded multi-media card.

In some embodiments, the message broker is further configured to store a first portion of a timeseries representing a variable in the data in the first tier of storage and cause a second portion of the timeseries representing the variable to be stored in the second tier of storage.

In some embodiments, the message broker is further configured to encode the timeseries by subtracting time adjacent values of the timeseries to form an encoded timeseries and bit-pack the encoded timeseries to form a compressed timeseries.

In some embodiments, the operations also include operating a third isolated compute environment including an algorithm calculator configured to request the timeseries from the message broker. The message broker is also configured to request the second portion of the timeseries, combine the second portion of the timeseries with the first portion of the timeseries, and send the timeseries to the algorithm calculator.

In some embodiments, the operations also include operating a third isolated compute environment including a digital twin of at least a portion of the building system. The digital twin is configured to receive the data from the first tier of storage before the data is stored in the first tier of storage, display a state of the portion of the building system, request the timeseries from the message broker, and simulate the portion of the building system using the timeseries.

In some embodiments, the operations also include operating a third isolated compute environment including a complex event processor configured to receive the data from the second tier of storage before the data is stored in the first tier of storage and perform a fault detection operation with the data.

In some embodiments, the operations also include operating a third isolated compute environment including a control application configured to select the first tier of storage or the second tier of storage depending on a speed of dynamics of a system the control application is controlling and request the data from the selected tier of storage.

An embodiment of the present disclosure relates to a method for providing real-time data and historical data from a building system. The method includes storing messages containing data related to measurements of the building system in a first tier of storage operating in a first isolated compute environment. The method also includes processing requests for the data in the first tier of storage. The method also includes storing the data in a second tier of storage operating in a second isolated compute environment after processing the requests for the data in the second tier of storage. The first tier of storage is configured to respond faster than the second tied of storage.

In some embodiments, the first tier of storage includes at least one of RAM, a solid-state drive, or an embedded multi-media card.

In some embodiments, the second tier of storage includes at least one of a solid-state drive, a magnetic disk drive, or an embedded multi-media card.

In some embodiments, the data is stored in a timeseries. A first portion of the timeseries is stored in the first tier of storage and a second portion of the timeseries is stored in the second tier of storage.

In some embodiments, the timeseries is stored in a compressed form. The method also includes encoding the timeseries by subtracting time adjacent values of the data to form an encoded timeseries and bit-packing the encoded timeseries to form a compressed timeseries. A most recent stored value in the timeseries is not encoded or compressed.

In some embodiments, the method also includes performing calculations of an algorithm using the first portion of the timeseries and the second portion of the timeseries.

In some embodiments, the method also includes displaying in real-time a state of a part of the building system using the data from the first tier of storage and performing a simulation of the building system using the timeseries.

In some embodiments, the method also includes performing a fault detection operation using a response to a request for the data from the first tier of storage.

In some embodiments, the method also includes selecting the first tier of storage or the second tier of storage dependent on a speed of dynamics of a system a control application is controlling and performing a calculation of the control application using the data from the selected tier of storage.

An embodiment of the present disclosure relates to one or more non-transitory computer-readable storage media having instructions stored thereon that, when executed by one or more processors, cause the one or more processors to perform operations. The operations include receiving messages containing data related to measurements of a building system. The operations also include storing data in a first tier of storage operating in a first isolated compute environment. The operations also include responding to requests for the data in the first tier of storage before storing the data in a second tier of storage operating in the first isolated compute environment. The operations also include storing data in the second tier of storage. The operations also include responding to requests for the data in the second tier of storage before storing the data in a third tier of storage operating in a second isolated compute environment. The operations also include sending a message to store the data in the third tier of storage. The operations also include responding to requests for the data in the third tier of storage. The first tier of storage is configured to respond faster than the second tier of storage.

In some embodiments, the data is stored in a timeseries. The operations also include encoding the timeseries by subtracting time adjacent values of the data to form an encoded timeseries. Encoding the timeseries includes subtracting the data from a most recent stored value in the timeseries to obtain a difference and replacing the most recent stored value in the timeseries with the difference. The operations also include bit-packing the encoded timeseries to form a compressed timeseries. Bit-packing the encoded timeseries includes determining a binary representation of the difference. The most recent stored value in the timeseries is not encoded or compressed.

This summary is illustrative only and should not be regarded as limiting.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 11B is a flowchart of a process which can be performed by the workflow manager of FIG. 11A, according to some embodiments.

FIG. 21 is a flow diagram illustrating sampling data from storage to form a timeseries, which can be performed by change-focused brokering system of FIG. 16, according to some embodiments.

FIG. 26A is a flow diagram illustrating dictionary compression, according to some embodiments.

FIG. 26B is a flow diagram illustrating dictionary decompression, according to some embodiments.

FIG. 26C is a flow diagram illustrating updating dictionaries used to perform dictionary compression, according to some embodiments.

FIG. 28 is a flow diagram for deploying an enhanced change-focused brokering system while continuing to perform operations, according to some embodiments.

FIG. 30 is a flow diagram for providing multiple tiers of storage, which can be performed by change-focused brokering system of FIG. 16, according to some embodiments.

FIG. 36A is a flow diagram illustrating generating a deployment package, which can be performed by the system of FIG. 35B, according to some embodiments.

FIG. 36B is a flow diagram illustrating determining the computational requirements of a control application, which can be performed by the system of FIG. 35B, according to some embodiments.

FIG. 36C is a flow diagram illustrating determining the processors on which to run portions of the control application, which can be performed by the system of FIG. 35B, according to some embodiments.

FIG. 38A is a flow diagram for providing a fixed device schema, according to some embodiments.

FIG. 38B is a flow diagram for validating data provided by sensors with virtual sensors, according to some embodiments.

FIG. 40 is a flow diagram for validating equipment configuration and installation within a distributed control system, according to some embodiments.

FIG. 41A is a block diagram of a distributed control system able to provide bump-less failover, according to some embodiments.

FIG. 41B is a flow diagram for providing bump-less failover after a failure of a control application, which can be performed by the distributed control system of FIG. 41A, according to some embodiments.

FIG. 41C is a flow diagram for providing bump-less failover after a failure of a message broker, which can be performed by the distributed control system of FIG. 41A, according to some embodiments.

FIG. 41D is a flow diagram for providing bump-less failover after a failure of an input-output module, which can be performed by the distributed control system of FIG. 41A, according to some embodiments.

FIG. 43 is a flow diagram for providing replay of on-site operations, which can be performed by the system of FIG. 42, according to some embodiments.

DETAILED DESCRIPTION

Overview

Referring generally to the FIGURES, systems and methods for monitoring and controlling a building system are provided. The communications over the building system may be provided using a message broker. The message broker may store data incoming from various sensors of the building system and provide the data in response to requests from the various applications providing monitoring and control. In some embodiments, the message broker may focus on the changes of the measurements to provide a more responsive system to data requests. In some embodiments, the brokers may provide additional functionality responsive to various fields in messages communicated over the message bus. For example, the brokers may provide communication over with a secondary protocol or compress data.

In some embodiments, a unique combination of processing provides significant compression of data stored in a timeseries format. The reduced size allows the data to be stored in fast acting storage (e.g., RAM) increased responsiveness. Increased responsiveness allows the brokering system to provide data to several real-time or near real-time applications. For example, complex event processing, display, and/or control of fast control loops (e.g., pressure control).

Distributed control systems are disclosed including a state-less design that allows for bump-less failover to a new compute environment. Additionally, the distributed control system may provide replay of on-site control calculations and generation of a deployment package that enhances the commissioning of the control system. Further, the distributed control system may provide a fixed schema using virtual sensors. The virtual sensors may allow for standardized commissioning tests and detection of faults within the sensing system.

Web Services System

Figure 1:
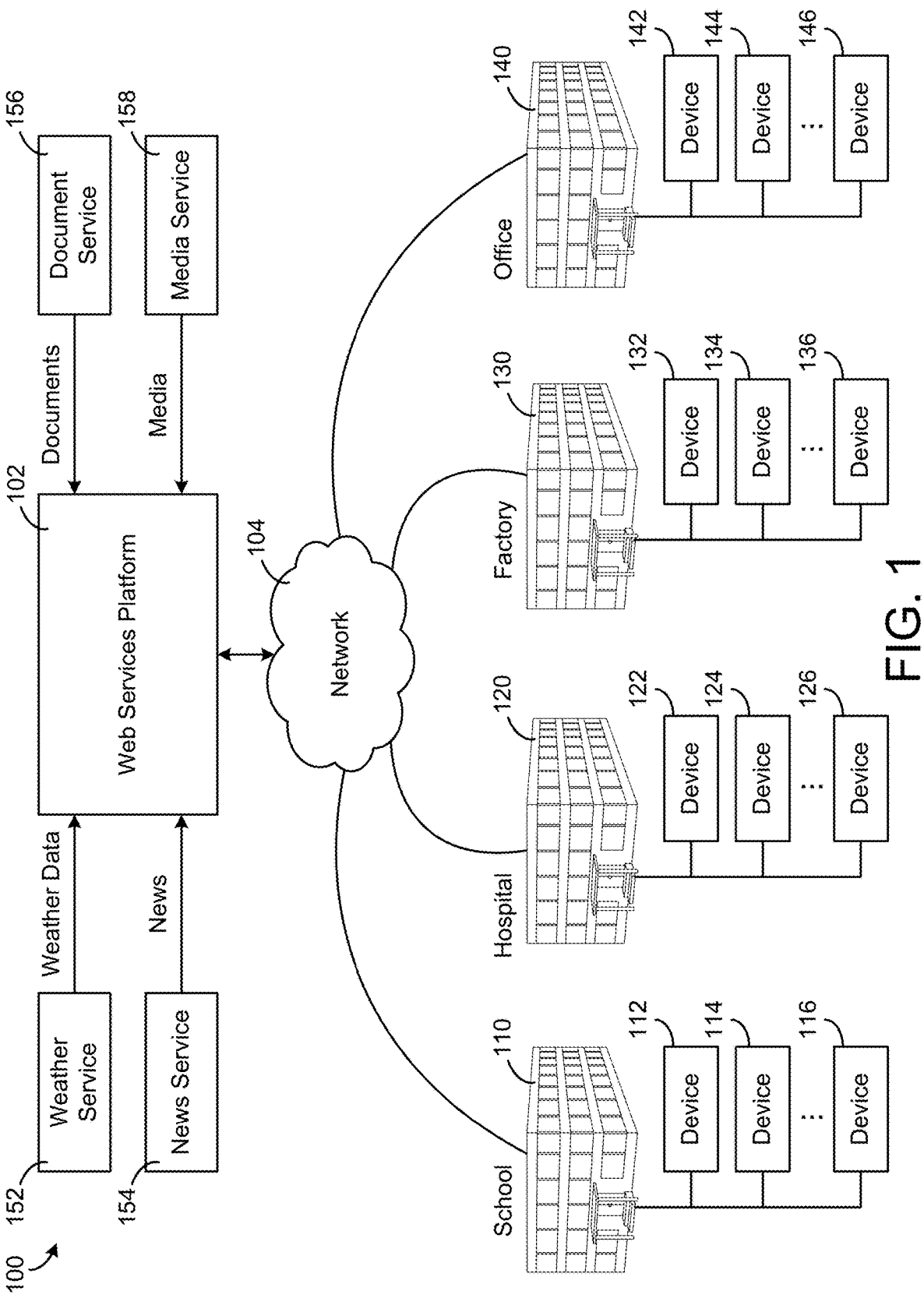
FIG. 1 is a block diagram of a web services system including a web services platform, according to some embodiments.

Referring now to FIG. 1, a block diagram of a web services system 100 is shown, according to an exemplary embodiment. Web services system 100 is shown to include a web services platform 102. Web services platform 102 can be configured to collect data from a variety of different data sources. For example, web services platform 102 is shown collecting data from a variety of devices 112-116, 122-126, 132-136, and 142-146. In some embodiments, devices 112-116, 122-126, 132-136, and 142-146 are internet of things (IoT) devices. Several examples of IoT devices which can provide data to web services platform 102 are described in detail with reference to FIG. 2. While the devices described herein are generally referred to as IoT devices, it should be understood that, in various embodiments, the devices references in the present disclosure could be any type of devices capable to communication of data over an electronic network.

Web services platform 102 can collect data from a variety of external systems or services. For example, web services platform 102 is shown receiving weather data from a weather service 152, news data from a news service 154, documents and other document-related data from a document service 156, and media (e.g., video, images, audio, social media, etc.) from a media service 158. In some embodiments, web services platform 102 generates data internally. For example, web services platform 102 may include a web advertising system, a website traffic monitoring system, a web sales system, or other types of platform services that generate data. The data generated by web services platform 102 can be collected, stored, and processed along with the data received from other data sources. Web services platform 102 can collect data directly from external systems or devices or via a network 104 (e.g., a WAN, the Internet, a cellular network, etc.). Web services platform 102 can process and transform collected data to generate timeseries data and entity data. Several features of web services platform 102 are described in detail below.

Web Services Platform

Figure 2:
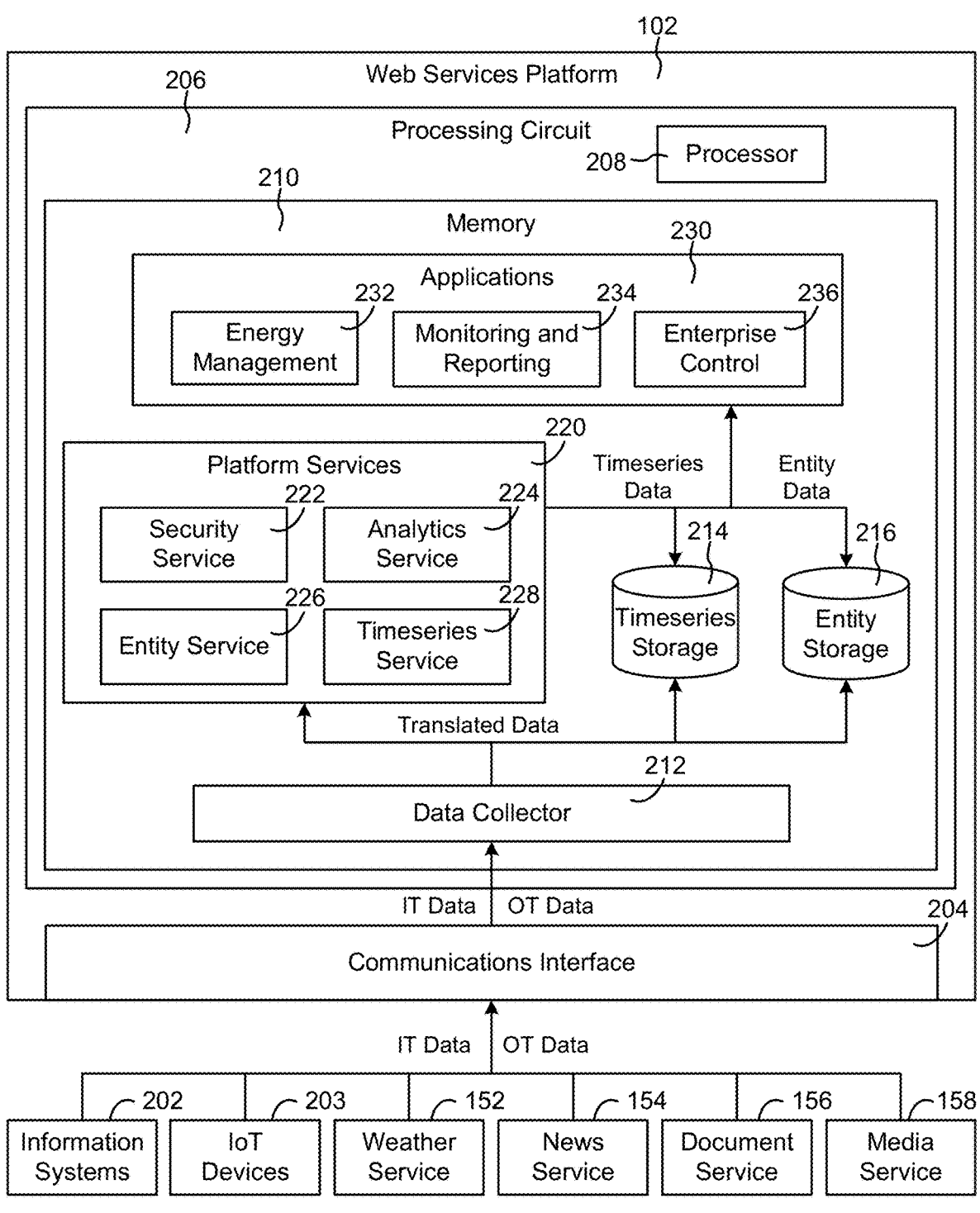
FIG. 2 is a block diagram illustrating the web services platform of FIG. 1 in greater detail including a data collector, platform services, and applications, according to some embodiments.

Referring now to FIG. 2, a block diagram illustrating web services platform 102 in greater detail is shown, according to some embodiments. Web services platform 102 can be configured to collect data from a variety of different data sources. For example, web services platform 102 is shown collecting data from information systems 202, internet of things (IoT) devices 203, weather service 152, news service 154, document service 156, and media service 158. In some embodiments, web services platform 102 separates data collection/ingestion; data storage, retrieval, and analysis; and data visualization into three different layers. This allows web services platform to support a variety of applications 230 that use the data and allows new applications 230 to reuse the existing infrastructure provided by platform services 220.

Information systems 202 can also include any type of system configured to manage information associated with any of a variety of devices, systems, people and/or the activities thereof. For example, information systems 202 can include a human resources (HR) system, an accounting system, a payroll system, a customer relationship management (CRM) system, a marketing system, an enterprise resource planning system, or any other type of system that can be used to manage devices, systems, people, and/or the information associated therewith.

IoT devices 203 may include any of a variety of physical devices, sensors, actuators, electronics, vehicles, home appliances, and/or other items having network connectivity which enable IoT devices 203 to communicate with web services platform 102. For example, IoT devices 203 can include smart home hub devices, smart house devices, doorbell cameras, air quality sensors, smart switches, smart lights, smart appliances, garage door openers, smoke detectors, heart monitoring implants, biochip transponders, cameras streaming live feeds, automobiles with built-in sensors, DNA analysis devices, field operation devices, tracking devices for people/vehicles/equipment, networked sensors, wireless sensors, wearable sensors, environmental sensors, RFID gateways and readers, IoT gateway devices, robots and other robotic devices, GPS devices, smart watches, virtual/augmented reality devices, and/or other networked or networkable devices. In some embodiments, IoT devices 203 include some or all of devices 112-116, 122-126, 132-136, and 142-146, as described with reference to FIG. 1.

Weather service 152, news service 154, document service 156, and media service 158 may be the same as previously described. For example, weather service 152 can be configured to provide weather data to web services platform 102. News service 154 can be configured to provide news data to web services platform 102. Document service 156 can be configured to provide documents and other document-related data to web services platform 102. Media service 158 can be configured to provide media (e.g., video, images, audio, social media, etc.) to web services platform 102. In some embodiments, media service 158 includes an internet-based advertising system or click tracking system. For example, media service 158 can provide event data to web services platform 102 in response to a web server delivering a webpage, advertisement, or receiving a click from a user. Web services platform 102 can be configured to ingest, process, store, and/or publish data from these and any of a variety of other data sources.

Web services platform 102 is shown receiving two main types of data: information technology (IT) data and operational technology (OT) data. IT data may include data that describes various entities (e.g., people, spaces, devices, etc.) and the relationships therebetween. For example, IT data may include an entity graph that describes the relationships between spaces, equipment, and other entities (e.g., person A owns device B, device B controls device C, sensor D provides input to device C, person E is part of employee team F, floor G contains room C, etc.). IT data may include human resources data that describes a set of employees and includes details about the employees (e.g., name, employee ID, job title/role, responsibilities, payroll information, address, etc.). IT data may include IoT device information (e.g., device locations, descriptions, device relationships, etc.), and/or other information that provides context for the data received by web services platform 102 or describes the entities managed by web services platform 102. In some embodiments, IT data is preexisting/static and can be provided to web services platform 102 as a batch. However, it is contemplated that IT data can be updated after it has been created if changes occur to the entities or relationships described by the IT data.

As used herein, the term "static" refers to data, characteristics, attributes, or other information that does not change over time or change infrequently. For example, a device name or address may be referred to as a static characteristic of the device because it does not change frequently. However, should be understood that "static" items are not limited to permanently fixed information. Some types of static items may change occasionally or infrequently. For example, a device address may be a type of static attribute that can be changed if desired but is not expected to change frequently. Static data is contrasted with dynamic data that is expected to change relatively frequently.

OT data may include data that is generated and/or updated in real-time as a result of operating the systems and devices that provide data to web services platform 102. For example, OT data may include timeseries data received from IoT devices 203 (e.g., sensor measurements, status indications, alerts, notifications, etc.), weather information received from weather service 152, a news feed received from news service 154, document updates received from document service 156, media updates received from media service 158, and/or other types of telemetry data. In general, OT data can be described as real-time operational data, dynamic data, or streaming data, whereas IT data can be described as institutional or contextual data that is not continuously updated. For example, the OT data associated with a particular sensor may include measurements from the sensor, whereas the IT data associated with the sensor may include the sensor name, sensor type, and sensor location.

Web services platform 102 can process and transform/translate the OT data and IT data using platform services 220 to generate timeseries data and entity data. Throughout this disclosure, the term "raw timeseries data" is used to describe the raw data samples of OT data received by web services platform 102. The term "derived timeseries data" is used to describe the result or output of a transformation or other timeseries processing operation performed by platform services 220 (e.g., data aggregation, data cleansing, virtual point calculation, etc.). The raw timeseries data and derived timeseries data can be provided to various applications 230 and/or stored in timeseries storage 214 (e.g., as materialized views of the raw timeseries data). The term "entity data" is used to describe the attributes of various entities (e.g., people, spaces, things, etc.) and relationships between entities. The entity data can be created by platform services 220 as a result of processing the IT data and/or OT data received by web services platform 102 and can be stored in entity storage 216.

Before discussing web services platform 102 in greater detail, it should be noted that the components of web services platform 102 can be integrated within a single device (e.g., a web server, a supervisory controller, a computing system, etc.) or distributed across multiple separate systems or devices. For example, the components of web services platform 102 can be implemented as part of a cloud computing platform configured to receive and process data from multiple IoT devices and other data sources. In other embodiments, the components of web services platform 102 can be implemented as part of a suite of cloud-hosted services. In other embodiments, some or all of the components of web services platform 102 can be components of a subsystem level controller, a plant controller, a device controller, a field controller, a computer workstation, a client device, or any other system or device that receives and processes data from IoT devices or other data sources.

Still referring to FIG. 2, web services platform 102 is shown to include a communications interface 204. Communications interface 204 can include wired or wireless communications interfaces (e.g., jacks, antennas, transmitters, receivers, transceivers, wire terminals, etc.) for conducting data communications with information systems 202, IoT devices 203, weather service 152, news service 154, document service 156, media service 158, or other external systems or devices. Communications conducted via communications interface 204 can be direct (e.g., local wired or wireless communications) or via a communications network 104 (e.g., a WAN, the Internet, a cellular network, etc.).

Communications interface 204 can facilitate communications between web services platform 102 and external applications (e.g., remote systems and applications) for allowing user control, monitoring, and adjustment to web services platform 102 and/or the devices that communicate with web services platform 102. Communications interface 204 can also facilitate communications between web services platform 102 and client devices (e.g., computer workstations, laptop computers, tablets, mobile devices, etc.). Web services platform 102 can be configured to communicate with external systems and devices using any of a variety of communications protocols (e.g., HTTP(S), WebSocket, CoAP, MQTT, etc.), industrial control protocols (e.g., MTConnect, OPC, OPC-UA, etc.), process automation protocols (e.g., HART, Profibus, etc.), home automation protocols, or any of a variety of other protocols. Advantageously, web services platform 102 can receive, ingest, and process data from any type of system or device regardless of the communications protocol used by the system or device.

Web services platform 102 is shown to include a processing circuit 206 including a processor 208 and memory 210. Processor 208 can be a general purpose or specific purpose processor, an application specific integrated circuit (ASIC), one or more field programmable gate arrays (FPGAs), a group of processing components, or other suitable processing components. Processor 208 is configured to execute computer code or instructions stored in memory 210 or received from other computer readable media (e.g., CDROM, network storage, a remote server, etc.).

Memory 210 can include one or more devices (e.g., memory units, memory devices, storage devices, etc.) for storing data and/or computer code for completing and/or facilitating the various processes described in the present disclosure. Memory 210 can include random access memory (RAM), read-only memory (ROM), hard drive storage, temporary storage, non-volatile memory, flash memory, optical memory, or any other suitable memory for storing software objects and/or computer instructions. Memory 210 can include database components, object code components, script components, or any other type of information structure for supporting the various activities and information structures described in the present disclosure. Memory 210 can be communicably connected to processor 208 via processing circuit 206 and can include computer code for executing (e.g., by processor 208) one or more processes described herein. When processor 208 executes instructions stored in memory 210, processor 208 generally configures processing circuit 206 to complete such activities.

In some embodiments, web services platform 102 includes a plurality of processors, memories, interfaces, and other components distributed across multiple devices or systems. For example, in a cloud-based or distributed implementation, web services platform 102 may include multiple discrete computing devices, each of which includes a processor 208, memory 210, communications interface 204, data collector 212, and/or other components of web services platform 102. Tasks performed by web services platform 102 can be distributed across multiple systems or devices, which may be located within a single building or facility or distributed across multiple buildings or facilities. In some embodiments, multiple data collectors 212 are implemented using different processors, computing devices, servers, and/or other components and carry out portions of the features described herein.

Still referring to FIG. 2, web services platform 102 is shown to include a data collector 212. Data collector 212 can receive the IT data and OT data via communications interface 204 and can provide translated IT data and OT data to platform services 220, timeseries storage 214, and/or entity storage 216. For example, data collector 212 can be configured to translate the incoming IT data and OT data from a protocol or format used by the data sources into a protocol or format used by platform services 220. In some embodiments, the OT data include timestamps and data values for various data points. The data values can be measured or calculated values, depending on the type of data point. For example, a data point received from a temperature sensor can include a measured data value indicating a temperature measured by the temperature sensor. A data point received from a device controller can include a calculated data value indicating a calculated efficiency of the device. Data collector 212 can receive data samples from multiple different devices.

The data samples can include one or more attributes that describe or characterize the corresponding data points. For example, the data samples can include a name attribute defining a point name or ID (e.g., "B1F4R2.T-Z"), a device attribute indicating a type of device from which the data samples is received (e.g., temperature sensor, humidity sensor, pressure sensor, etc.), a unit attribute defining a unit of measure associated with the data value (e.g., ° F., ° C., kPA, etc.), and/or any other attribute that describes the corresponding data point or provides contextual information regarding the data point. The types of attributes included in each data point can depend on the communications protocol used to send the data samples to web services platform 102. For example, data samples received via a first protocol can include a variety of descriptive attributes along with the data value, whereas data samples received via the second protocol may include a lesser number of attributes (e.g., only the data value without any corresponding attributes).

In some embodiments, each data sample is received with a timestamp indicating a time at which the corresponding data value was measured or calculated. In other embodiments, data collector 212 adds timestamps to the data samples based on the times at which the data samples are received. Data collector 212 can generate raw timeseries data for each of the data points for which data samples are received. Each timeseries can include a series of data values for the same data point and a timestamp for each of the data values. For example, a timeseries for a data point provided by a temperature sensor can include a series of temperature values measured by the temperature sensor and the corresponding times at which the temperature values were measured. An example of a timeseries which can be generated by data collector 212 is as follows:

> [<key,timestamp$_1$,value$_1$>,<key,timestamp$_2$,value$_2$>, <key,timestamp$_3$,value$_3$>]

> where key is an identifier of the source of the raw data samples (e.g., timeseries ID, sensor ID, etc.), timestamp$_i$ identifies the time at which the ith sample was collected, and value$_i$ indicates the value of the ith sample.

Data collector 212 can add timestamps to the data samples or modify existing timestamps such that each data sample includes a local timestamp. Each local timestamp indicates the local time at which the corresponding data sample was measured or collected and can include an offset relative to universal time. The local timestamp indicates the local time at the location the data point was measured at the time of measurement. The offset indicates the difference between the local time and a universal time (e.g., the time at the international date line). For example, a data sample collected in a time zone that is six hours behind universal time can include a local timestamp (e.g., Timestamp=2016-03-18T14: 10:02) and an offset indicating that the local timestamp is six hours behind universal time (e.g., Offset=−6: 00). The offset can be adjusted (e.g., +1:00 or −1:00) depending on whether the time zone is in daylight savings time when the data sample is measured or collected.

The combination of the local timestamp and the offset provides a unique timestamp across daylight saving time boundaries. This allows an application using the timeseries data to display the timeseries data in local time without first converting from universal time. The combination of the local timestamp and the offset also provides enough information to convert the local timestamp to universal time without needing to look up a schedule of when daylight savings time occurs. For example, the offset can be subtracted from the local timestamp to generate a universal time value that corresponds to the local timestamp without referencing an external database and without requiring any other information.

In some embodiments, data collector 212 organizes the raw timeseries data. Data collector 212 can identify a system or device associated with each of the data points. For example, data collector 212 can associate a data point with an IoT device, a sensor, a networking device, or any other type of system or device. In various embodiments, data collector 212 uses the name of the data point, a range of values of the data point, statistical characteristics of the data point, or other attributes of the data point to identify a particular system or device associated with the data point. Data collector 212 can then determine how that system or device relates to the other systems or devices. For example, data collector 212 can determine that the identified system or device is part of a larger system (e.g., a vehicle control system) or is associated with a particular space (e.g., a particular factory, a room or zone of the factory, etc.). In some embodiments, data collector 212 uses or creates an entity graph when organizing the timeseries data. An example of such an entity graph is described in greater detail with reference to FIG. 12.

In some embodiments, data collector 212 uses the IT data and OT data to update the attributes of various entities. As described above, an entity is a virtual representation (e.g., a data object) of a person, space, system, device, or thing that provides data to web services platform 102. For example, a vehicle entity may be a virtual representation of a physical vehicle (e.g., a car, truck, airplane, boat, etc.). The vehicle entity may include a variety of attributes that describe the vehicle. For example, the vehicle may include a "location" attribute that describes where the vehicle is located, a "contains" attribute that identifies one or more systems or devices of equipment contained within the vehicle, a "temperature" attribute that indicates the current air temperature within the vehicle, an "occupancy" attribute that indicates whether the vehicle is occupied or unoccupied, or any of a variety of other attributes. Data collector 212 can use the OT data to update the values of the attributes of various entities each time a new data sample or event is received. Similarly, data collector 212 can use the IT data to update the values of the attributes of various entities when the relationships between entities or other attributes indicated by the IT data changes. In other embodiments, entity attributes are updated by entity service 226 of platform services 220.

Data collector 212 can provide the timeseries data and entity data to platform services 220 and/or store the timeseries data and entity data in timeseries storage 214 and entity storage 216, respectively. In some embodiments, timeseries storage 214 and entity storage 216 can be data storage internal to web services platform 102 (e.g., within memory 210) or other on-site data storage local to the location at which the IT data and OT data are collected. In other embodiments, timeseries storage 214 and entity storage 216 can include a remote database, cloud-based data hosting, or other remote data storage. For example, timeseries storage 214 and entity storage 216 can include remote data storage located off-site relative to the location at which the IT data and OT data are collected. Timeseries storage 214 can be configured to store the raw timeseries data obtained by data collector 212, and/or the derived timeseries data generated by platform services 220. Similarly, entity storage 216 can be configured to store the IT data and OT data collected by data collector 212 and/or the entity data generated by platform services 220. Directed acyclic graphs (DAGs) used by platform services 220 to process the timeseries data can be stored in DAG storage 330 (shown in FIG. 3).

Still referring to FIG. 2, web services platform 102 is shown to include platform services 220. Platform services 220 can receive the translated IT data and OT data from data collector 212 and/or retrieve the timeseries data and entity data from timeseries storage 214 and entity storage 216. Platform services 220 can include a variety of services configured to analyze, process, and transform the IT data and OT data to create timeseries data and entity data. For example, platform services 220 are shown to include a security service 222, an analytics service 224, an entity service 226, and a timeseries service 228. Security service 222 can assign security attributes to the IT data and OT data to ensure that the IT data and OT data are only accessible to authorized individuals, systems, or applications.

Analytics service 224 can use the translated IT data and OT data as inputs to various analytics (e.g., fault detection, energy consumption, web traffic, revenue, etc.) to derive an analytic result from the IT data and OT data. Analytics service 224 can apply a set of fault detection rules to the IT data and OT data to determine whether a fault is detected at each interval of a timeseries. Fault detections can be stored as derived timeseries data. For example, analytics service 224 can generate a new fault detection timeseries with data values that indicate whether a fault was detected at each interval of the timeseries. The fault detection timeseries can be stored as derived timeseries data along with the raw timeseries data in timeseries storage 214.

Entity service 226 can use the translated IT data and OT data provided by data collector 212 to create or update the attributes of various entities managed by web services platform 102. Some entity attributes may be the most recent value of a data point provided to web services platform 102 as OT data. For example, the "temperature" attribute of a vehicle entity may be the most recent value of a temperature data point provided by a temperature sensor located in the vehicle. Entity service 226 can use the IT data to identify the temperature sensor located in the vehicle and can use the OT data associated with the identified temperature sensor to update the "temperature" attribute each time a new sample of the temperature data point is received. As another example, a "most recent view" attribute of a webpage entity may indicate the most recent time at which the webpage was viewed. Entity service 226 can use the OT data from a click tracking system or web server to determine when the most recent view occurred and can update the "most recent view" attribute accordingly.

Other entity attributes may be the result of an analytic, transformation, calculation, or other processing operation based on the OT data and IT data. For example, entity service 226 can use the IT data to identify an access control device (e.g., an electronic lock, a keypad, etc.) at the entrance/exit of a vehicle. Entity service 226 can use OT data received from the identified access control device to track the number of occupants entering and exiting the vehicle. Entity service 226 can update a "number of occupants" attribute of an entity representing the vehicle each time a person enters or exits the vehicle such that the "number of occupants" attribute reflects the current number of occupants within the vehicle. As another example, a "total revenue" attribute associated with a product line entity may be the summation of all the revenue generated from sales of the corresponding product. Entity service 226 can use the OT data received from a sales tracking system (e.g., a point of sale system, an accounting database, etc.) to determine when a sale of the product occurs and identify the amount of revenue generated by the sale. Entity service 226 can then update the "total revenue" attribute by adding the most recent sales revenue to the previous value of the attribute.

In some embodiments, entity service 226 uses IT data and/or OT data from multiple different data sources to update the attributes of various entities. For example, an entity representing a person may include a "risk" attribute that quantifies the person's level of risk attributable to various physical, environmental, or other conditions. Entity service 226 can use OT data from a card reader or IT data from a human resources system to determine the physical location of the person at any given time. Entity service 226 can use weather data from weather service 152 to determine whether any severe weather is approaching the person's location. Similarly, entity service 226 can use emergency data from news service 154 or media service 158 to determine whether the person's location is experiencing any emergency conditions (e.g., active shooter, police response, fire response, etc.). Entity service 226 can use data from information systems 202 to determine whether the person's location is experiencing any emergency conditions (e.g., fire, building lockdown, etc.) or environmental hazards (e.g., detected air contaminants, pollutants, extreme temperatures, etc.) that could increase the person's level of risk. Entity service 226 can use these and other types of data as inputs to a risk function that calculates the value of the person's "risk" attribute and can update the person entity accordingly.

Still referring to FIG. 2, timeseries service 228 can apply various transformations, operations, or other functions to the raw timeseries data provided by data collector 212 to generate derived timeseries data. In some embodiments, timeseries service 228 aggregates predefined intervals of the raw timeseries data (e.g., quarter-hourly intervals, hourly intervals, daily intervals, monthly intervals, etc.) to generate new derived timeseries of the aggregated values. These derived timeseries can be referred to as "data rollups" since they are condensed versions of the raw timeseries data. The data rollups generated by timeseries service 228 provide an efficient mechanism for applications 230 to query the timeseries data. For example, applications 230 can construct visualizations of the timeseries data (e.g., charts, graphs, etc.) using the pre-aggregated data rollups instead of the raw timeseries data. This allows applications 230 to simply retrieve and present the pre-aggregated data rollups without requiring applications 230 to perform an aggregation in response to the query. Since the data rollups are pre-aggregated, applications 230 can present the data rollups quickly and efficiently without requiring additional processing at query time to generate aggregated timeseries values.

In some embodiments, timeseries service 228 calculates virtual points based on the raw timeseries data and/or the derived timeseries data. Virtual points can be calculated by applying any of a variety of mathematical operations (e.g., addition, subtraction, multiplication, division, etc.) or functions (e.g., average value, maximum value, minimum value, thermodynamic functions, linear functions, nonlinear functions, etc.) to the actual data points represented by the timeseries data. For example, timeseries service 228 can calculate a virtual data point (pointID$_3$) by adding two or more actual data points (pointID$_1$ and pointID$_2$) (e.g., pointID$_3$=pointID$_1$+pointID$_2$). As another example, timeseries service 228 can calculate an enthalpy data point (pointID$_4$) based on a measured temperature data point (pointID$_2$) and a measured pressure data point (pointID$_6$) (e.g., pointID$_4$=enthalpy (pointID$_2$, pointID$_6$)). The virtual data points can be stored as derived timeseries data.

Applications 230 can access and use the virtual data points in the same manner as the actual data points. Applications 230 do not need to know whether a data point is an actual data point or a virtual data point since both types of data points can be stored as derived timeseries data and can be handled in the same manner by applications 230. In some embodiments, the derived timeseries are stored with attributes designating each data point as either a virtual data point or an actual data point. Such attributes allow applications 230 to identify whether a given timeseries represents a virtual data point or an actual data point, even though both types of data points can be handled in the same manner by applications 230.

Still referring to FIG. 2, web services platform 102 is shown to include several applications 230 including an energy management application 232, monitoring and reporting applications 234, and enterprise control applications 236. Although only a few applications 230 are shown, it is contemplated that applications 230 can include any of a variety of applications configured to use the derived timeseries generated by platform services 220. In some embodiments, applications 230 exist as a separate layer of web services platform 102 (i.e., separate from platform services 220 and data collector 212). This allows applications 230 to be isolated from the details of how the IT data and OT data are collected and how the timeseries data and entity data are generated. In other embodiments, applications 230 can exist as remote applications that run on remote systems or devices (e.g., remote systems and applications, client devices, etc.).

Applications 230 can use the derived timeseries data to perform a variety data visualization, monitoring, and/or control activities. For example, energy management application 232 and monitoring and reporting application 234 can use the derived timeseries data to generate user interfaces (e.g., charts, graphs, etc.) that present the derived timeseries data to a user. In some embodiments, the user interfaces present the raw timeseries data and the derived data rollups in a single chart or graph. For example, a dropdown selector can be provided to allow a user to select the raw timeseries data or any of the data rollups for a given data point.

Enterprise control application 236 can use the derived timeseries data to perform various control activities. For example, enterprise control application 236 can use the derived timeseries data as input to a control algorithm (e.g., a state-based algorithm, an extremum seeking control (ESC) algorithm, a proportional-integral (PI) control algorithm, a proportional-integral-derivative (PID) control algorithm, a model predictive control (MPC) algorithm, a feedback control algorithm, etc.) to generate control signals for IoT devices 203.

Timeseries Platform Service

Figure 3:
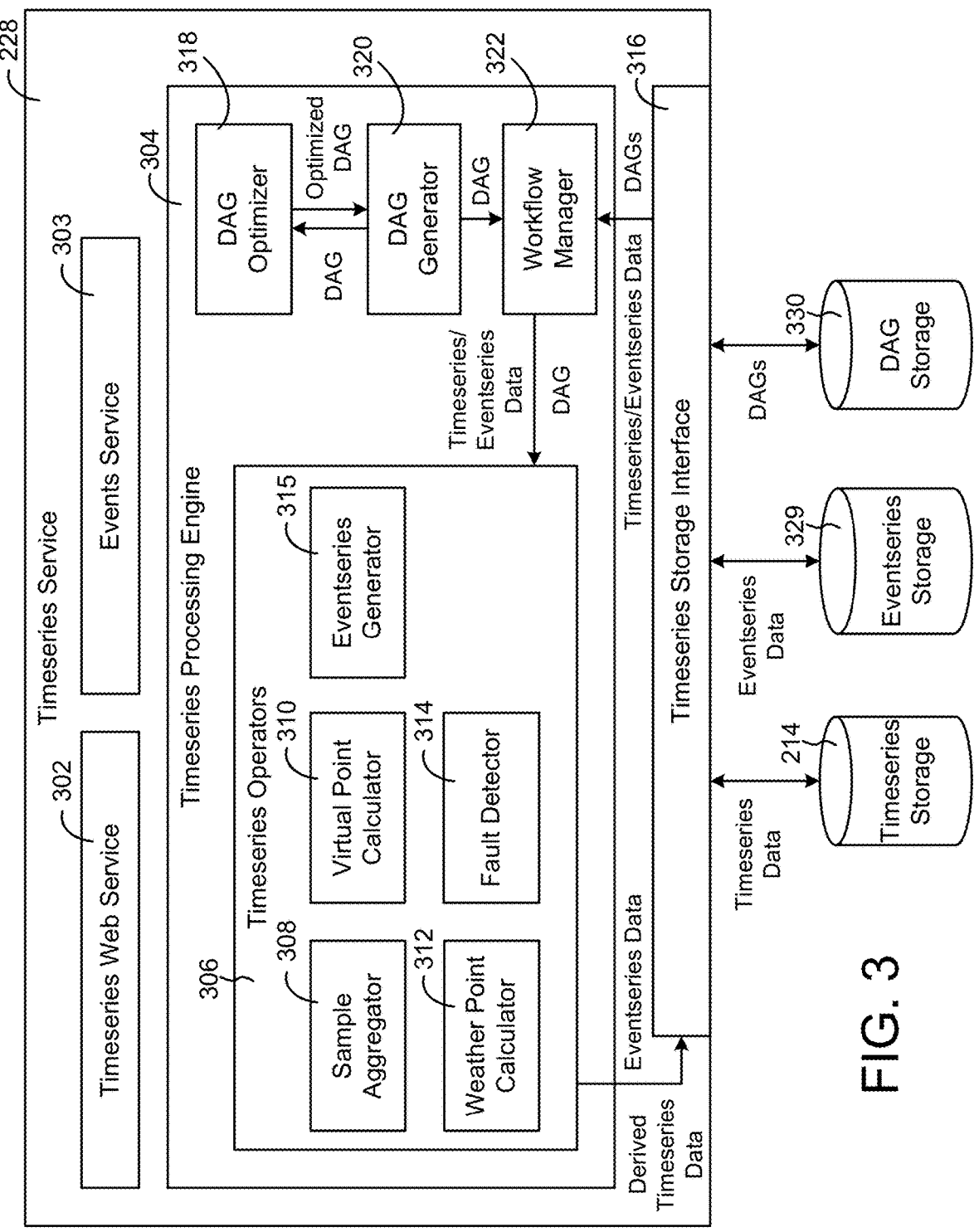
FIG. 3 is a block diagram of a timeseries service which can be implemented as some of the platform services shown in FIG. 2, according to some embodiments.

Referring now to FIG. 3, a block diagram illustrating timeseries service 228 in greater detail is shown, according to some embodiments. Timeseries service 228 is shown to include a timeseries web service 302, an events service 303, a timeseries processing engine 304, and a timeseries storage interface 316. Timeseries web service 302 can be configured to interact with web-based applications to send and/or receive timeseries data. In some embodiments, timeseries web service 302 provides timeseries data to web-based applications. For example, if one or more of applications 230 are web-based applications, timeseries web service 302 can provide derived timeseries data and raw timeseries data to the web-based applications. In some embodiments, timeseries web service 302 receives raw timeseries data from a web-based data collector. For example, if data collector 212 is a web-based application, timeseries web service 302 can receive data samples or raw timeseries data from data collector 212.

Timeseries storage interface 316 can be configured to store and read samples of various timeseries (e.g., raw timeseries data and derived timeseries data) and eventseries (described in greater detail below). Timeseries storage interface 316 can interact with timeseries storage 214, eventseries storage 329, and/or DAG storage 330. In some embodiments, timeseries storage interface 316 can read samples from timeseries storage 214 from a specified start time or start position in the timeseries to a specified stop time or a stop position in the timeseries. Similarly, timeseries storage interface 316 can retrieve eventseries data from eventseries storage 329. Timeseries storage interface 316 can also store timeseries data in timeseries storage 214 and can store eventseries data in eventseries storage 329. Advantageously, timeseries storage interface 316 provides a consistent interface which enables logical data independence.

In some embodiments, timeseries storage interface 316 stores timeseries as lists of data samples, organized by time. For example, timeseries storage interface 316 can store timeseries in the following format:

$[<key, timestamp_1, value_1>, <key, timestamp_2, value_2>, <key, timestamp_3, value_3>]$ where key is an identifier of the source of the data samples (e.g., timeseries ID, sensor ID, etc.), $timestamp_i$ identifies a time associated with the ith sample, and $value_i$ indicates the value of the ith sample.

In some embodiments, timeseries storage interface 316 stores eventseries as lists of events having a start time, an end time, and a state. For example, timeseries storage interface 316 can store eventseries in the following format:

$$[< eventID_1, start\_timestamp_1, end\_timestamp_1, state_1 >, ..., < eventID_N, start\_timestamp_N, end\_timestamp_N, state_N >]$$

where $eventID_i$ is an identifier of the ith event, $start\_timestamp_i$ is the time at which the ith event started, $end\_timestamp_i$ is the time at which the ith event ended, $state_i$ describes a state or condition associated with the ith event (e.g., cold, hot, warm, etc.), and N is the total number of events in the eventseries.

In some embodiments, timeseries storage interface 316 stores timeseries and eventseries in a tabular format. Timeseries storage interface 316 can store timeseries and eventseries in various tables having a column for each attribute of the timeseries/eventseries samples (e.g., key, timestamp, value). The timeseries tables can be stored in timeseries storage 214, whereas the eventseries tables can be stored in eventseries storage 329. In some embodiments, timeseries storage interface 316 caches older data in timeseries storage 214 but stores newer data in RAM. This may improve read performance when the newer data are requested for processing.

In some embodiments, timeseries storage interface 316 omits one or more of the attributes when storing the timeseries samples. For example, timeseries storage interface 316 may not need to repeatedly store the key or timeseries ID for each sample in the timeseries. In some embodiments, timeseries storage interface 316 omits timestamps from one or more of the samples. If samples of a particular timeseries have timestamps at regular intervals (e.g., one sample each minute), timeseries storage interface 316 can organize the samples by timestamps and store the values of the samples in a row. The timestamp of the first sample can be stored along with the interval between the timestamps. Timeseries storage interface 316 can determine the timestamp of any sample in the row based on the timestamp of the first sample and the position of the sample in the row.

In some embodiments, timeseries storage interface 316 stores one or more samples with an attribute indicating a change in value relative to the previous sample value. The change in value can replace the actual value of the sample when the sample is stored in timeseries storage 214. This allows timeseries storage interface 316 to use fewer bits when storing samples and their corresponding values. Timeseries storage interface 316 can determine the value of any sample based on the value of the first sample and the change in value of each successive sample.

In some embodiments, timeseries storage interface 316 creates containers or data objects in which samples of timeseries data and/or eventseries data can be stored. The containers can be JSON objects or other types of containers configured to store one or more timeseries samples and/or eventseries samples. Timeseries storage interface 316 can be configured to add samples to the containers and read samples from the containers. For example, timeseries storage interface 316 can receive a set of samples from data collector 212, timeseries web service 302, events service 303, and/or timeseries processing engine 304. Timeseries storage interface 316 can add the set of samples to a container and send the container to timeseries storage 214.

Timeseries storage interface 316 can use containers when reading samples from timeseries storage 214. For example, timeseries storage interface 316 can retrieve a set of samples from timeseries storage 214 and add the samples to a container. In some embodiments, the set of samples include all samples within a specified time period (e.g., samples with timestamps in the specified time period) or eventseries samples having a specified state. Timeseries storage interface 316 can provide the container of samples to timeseries web service 302, events service 303, timeseries processing engine 304, applications 230, and/or other components configured to use the timeseries/eventseries samples.

Still referring to FIG. 3, timeseries processing engine 304 is shown to include several timeseries operators 306. Timeseries operators 306 can be configured to apply various operations, transformations, or functions to one or more input timeseries to generate output timeseries and/or eventseries. The input timeseries can include raw timeseries data and/or derived timeseries data. Timeseries operators 306 can be configured to calculate aggregate values, averages, or apply other mathematical operations to the input timeseries. In some embodiments, timeseries operators 306 generate virtual point timeseries by combining two or more input timeseries (e.g., adding the timeseries together), creating multiple output timeseries from a single input timeseries, or applying mathematical operations to the input timeseries. In some embodiments, timeseries operators 306 perform data cleansing operations or deduplication operations on an input timeseries. In some embodiments, timeseries operators 306 use the input timeseries to generate eventseries based on the values of the timeseries samples (described in greater detail below). The output timeseries can be stored as derived timeseries data in timeseries storage 214. Similarly, the eventseries can be stored as eventseries data in eventseries storage 329.

In some embodiments, timeseries operators 306 do not change or replace the raw timeseries data, but rather generate various "views" of the raw timeseries data. The views can be queried in the same manner as the raw timeseries data. For example, samples can be read from the raw timeseries data, transformed to create the view, and then provided as an output. Because the transformations used to create the views can be computationally expensive, the views can be stored as "materialized views" in timeseries storage 214. These materialized views are referred to as derived timeseries data throughout the present disclosure.

Timeseries operators 306 can be configured to run at query time (e.g., when a request for derived timeseries data is received) or prior to query time (e.g., when new raw data samples are received, in response to a defined event or trigger, etc.). This flexibility allows timeseries operators 306 to perform some or all of their operations ahead of time and/or in response to a request for specific derived data timeseries. For example, timeseries operators 306 can be configured to pre-process one or more timeseries that are read frequently to ensure that the timeseries are updated whenever new data samples are received. However, timeseries operators 306 can be configured to wait until query time to process one or more timeseries that are read infrequently to avoid performing unnecessary processing operations.

In some embodiments, timeseries operators 306 are triggered in a particular sequence defined by a directed acyclic graph (DAG). The DAG may define a workflow or sequence of operations or transformations to apply to one or more input timeseries. For example, the DAG for a raw data timeseries may include a data cleansing operation, an aggregation operation, and a summation operation (e.g., adding two raw data timeseries to create a virtual point timeseries). The DAGs can be stored in DAG storage 330, or internally within timeseries processing engine 304. DAGs can be retrieved by workflow manager 322 and used to determine how and when to process incoming data samples. Exemplary systems and methods for creating and using DAGs are described in greater detail below.

Timeseries operators 306 can perform aggregations for dashboards, cleansing operations, logical operations for rules and fault detection, machine learning predictions or classifications, call out to external services, or any of a variety of other operations which can be applied to timeseries data. The operations performed by timeseries operators 306 are not limited to sensor data. Timeseries operators 306 can also operate on event data or function as a billing engine for a consumption or tariff-based billing system.

Sample Aggregation

Still referring to FIG. 3, timeseries operators 306 are shown to include a sample aggregator 308. Sample aggregator 308 can be configured to generate derived data rollups from the raw timeseries data. For each data point, sample aggregator 308 can aggregate a set of data values having timestamps within a predetermined time interval (e.g., a quarter-hour, an hour, a day, etc.) to generate an aggregate data value for the predetermined time interval. For example, the raw timeseries data for a particular data point may have a relatively short interval (e.g., one minute) between consecutive samples of the data point. Sample aggregator 308 can generate a data rollup from the raw timeseries data by aggregating all of the samples of the data point having timestamps within a relatively longer interval (e.g., a quarter-hour) into a single aggregated value that represents the longer interval.

For some types of timeseries, sample aggregator 308 performs the aggregation by averaging all of the samples of the data point having timestamps within the longer interval. Aggregation by averaging can be used to calculate aggregate values for timeseries of non-cumulative variables such as measured value. For other types of timeseries, sample aggregator 308 performs the aggregation by summing all of the samples of the data point having timestamps within the longer interval. Aggregation by summation can be used to calculate aggregate values for timeseries of cumulative variables such as the number of faults detected since the previous sample.

Figures 4, 5:
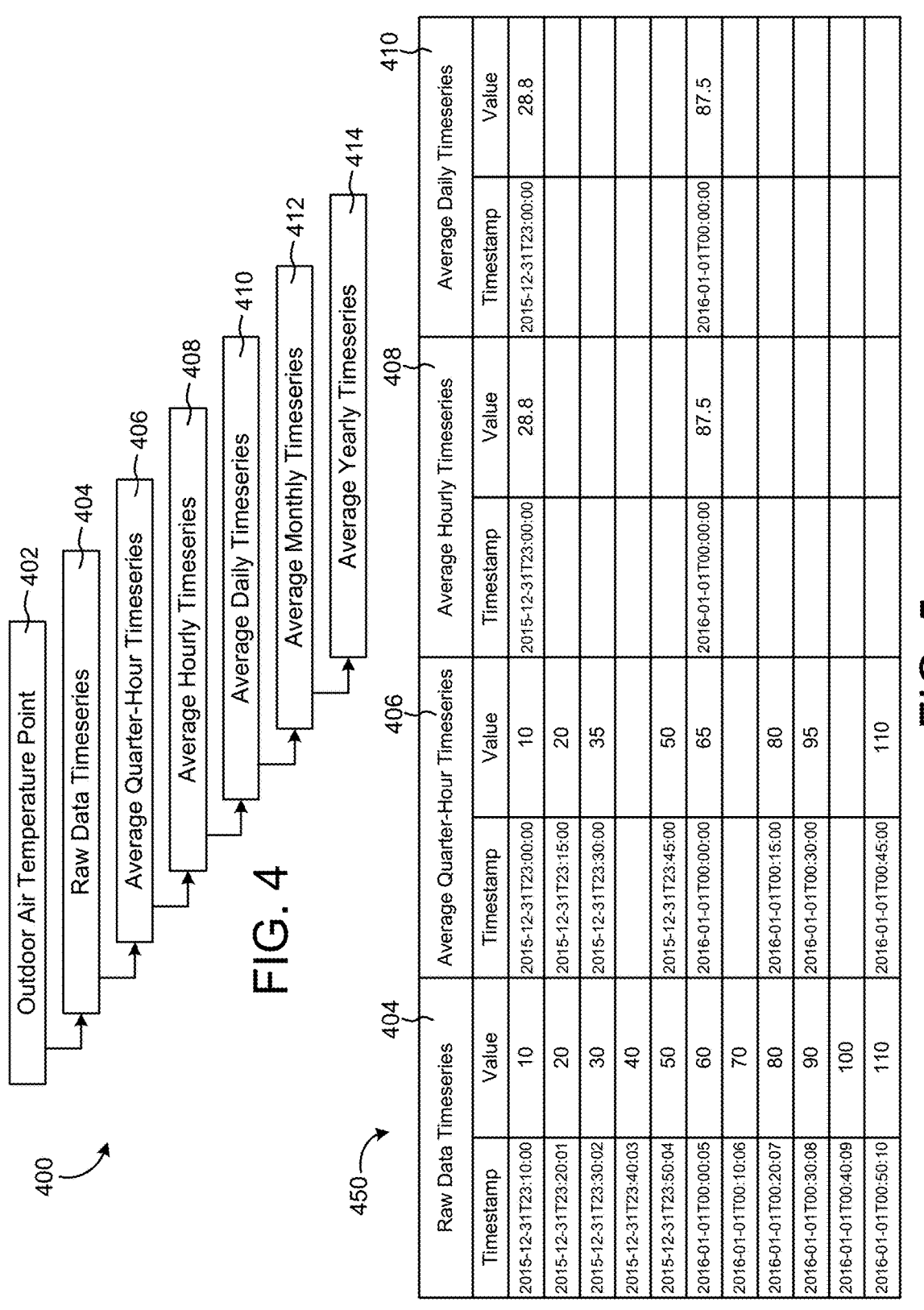
FIG. 4 is a block diagram illustrating an aggregation technique which can be used by the sample aggregator shown in FIG. 3 to aggregate raw data samples, according to some embodiments.
FIG. 5 is a data table which can be used to store raw data timeseries and a variety of derived data timeseries which can be generated by the timeseries service of FIG. 3, according to some embodiments.

Referring now to FIGS. 4-5, a block diagram 400 and a data table 450 illustrating an aggregation technique which can be used by sample aggregator 308 is shown, according to some embodiments. In FIG. 4, a data point 402 is shown. Data point 402 is an example of a measured data point for which timeseries values can be obtained. For example, data point 402 is shown as an outdoor air temperature point and has values which can be measured by a temperature sensor. Although a specific type of data point 402 is shown in FIG. 4, it should be understood that data point 402 can be any type of measured or calculated data point. Timeseries values of data point 402 can be collected by data collector 212 and assembled into a raw data timeseries 404.

As shown in FIG. 5, the raw data timeseries 404 includes a timeseries of data samples, each of which is shown as a separate row in data table 450. Each sample of raw data timeseries 404 is shown to include a timestamp and a data value. The timestamps of raw data timeseries 404 are ten minutes and one second apart, indicating that the sampling interval of raw data timeseries 404 is ten minutes and one second. For example, the timestamp of the first data sample is shown as 2015-12-31T23:10:00 indicating that the first data sample of raw data timeseries 404 was collected at 11:10:00 PM on Dec. 31, 2015. The timestamp of the second data sample is shown as 2015-12-31T23:20:01 indicating that the second data sample of raw data timeseries 404 was collected at 11:20:01 PM on Dec. 31, 2015. In some embodiments, the timestamps of raw data timeseries 404 are stored along with an offset relative to universal time, as previously described. The values of raw data timeseries 404 start at a value of 10 and increase by 10 with each sample. For example, the value of the second sample of raw data timeseries 404 is 20, the value of the third sample of raw data timeseries 404 is 30, etc.

In FIG. 4, several data rollup timeseries 406-414 are shown. Data rollup timeseries 406-414 can be generated by sample aggregator 308 and stored as derived timeseries data. The data rollup timeseries 406-414 include an average quarter-hour timeseries 406, an average hourly timeseries 408, an average daily timeseries 410, an average monthly timeseries 412, and an average yearly timeseries 414. Each of the data rollup timeseries 406-414 is dependent upon a parent timeseries. In some embodiments, the parent timeseries for each of the data rollup timeseries 406-414 is the timeseries with the next shortest duration between consecutive timeseries values. For example, the parent timeseries for average quarter-hour timeseries 406 is raw data timeseries 404. Similarly, the parent timeseries for average hourly timeseries 408 is average quarter-hour timeseries 406; the parent timeseries for average daily timeseries 410 is average hourly timeseries 408; the parent timeseries for average monthly timeseries 412 is average daily timeseries 410; and the parent timeseries for average yearly timeseries 414 is average monthly timeseries 412.

Sample aggregator 308 can generate each of the data rollup timeseries 406-414 from the timeseries values of the corresponding parent timeseries. For example, sample aggregator 308 can generate average quarter-hour timeseries 406 by aggregating all of the samples of data point 402 in raw data timeseries 404 that have timestamps within each quarter-hour. Similarly, sample aggregator 308 can generate average hourly timeseries 408 by aggregating all of the timeseries values of average quarter-hour timeseries 406 that have timestamps within each hour. Sample aggregator 308 can generate average daily timeseries 410 by aggregating all of the time series values of average hourly timeseries 408 that have timestamps within each day. Sample aggregator 308 can generate average monthly timeseries 412 by aggregating all of the time series values of average daily timeseries 410 that have timestamps within each month. Sample aggregator 308 can generate average yearly timeseries 414 by aggregating all of the time series values of average monthly timeseries 412 that have timestamps within each year.

In some embodiments, the timestamps for each sample in the data rollup timeseries 406-414 are the beginnings of the aggregation interval used to calculate the value of the sample. For example, the first data sample of average quarter-hour timeseries 406 is shown to include the timestamp 2015-12-31T23:00:00. This timestamp indicates that the first data sample of average quarter-hour timeseries 406 corresponds to an aggregation interval that begins at 11:00:00 PM on Dec. 31, 2015. Since only one data sample of raw data timeseries 404 occurs during this interval, the value of the first data sample of average quarter-hour timeseries 406 is the average of a single data value (i.e., average(10)=10). The same is true for the second data sample of average quarter-hour timeseries 406 (i.e., average(20)=20).

The third data sample of average quarter-hour timeseries 406 is shown to include the timestamp 2015-12-31T23:30:00. This timestamp indicates that the third data sample of average quarter-hour timeseries 406 corresponds to an aggregation interval that begins at 11:30:00 PM on Dec. 31, 2015. Since each aggregation interval of average quarter-hour timeseries 406 is a quarter-hour in duration, the end of the aggregation interval is 11:45:00 PM on Dec. 31, 2015. This aggregation interval includes two data samples of raw data timeseries 404 (i.e., the third raw data sample having a value of 30 and the fourth raw data sample having a value of 40). Sample aggregator 308 can calculate the value of the third sample of average quarter-hour timeseries 406 by averaging the values of the third raw data sample and the fourth raw data sample (i.e., average(30,40)=35). Accordingly, the third sample of average quarter-hour timeseries 406 has a value of 35. Sample aggregator 308 can calculate the remaining values of average quarter-hour timeseries 406 in a similar manner.

Still referring to FIG. 5, the first data sample of average hourly timeseries 408 is shown to include the timestamp 2015-12-31T23:00:00. This timestamp indicates that the first data sample of average hourly timeseries 408 corresponds to an aggregation interval that begins at 11:00:00 PM on Dec. 31, 2015. Since each aggregation interval of average hourly timeseries 408 is an hour in duration, the end of the aggregation interval is 12:00:00 AM on Jan. 1, 2016. This aggregation interval includes the first four samples of average quarter-hour timeseries 406. Sample aggregator 308 can calculate the value of the first sample of average hourly timeseries 408 by averaging the values of the first four values of average quarter-hour timeseries 406 (i.e., average(10, 20, 35, 50)=28.8). Accordingly, the first sample of average hourly timeseries 408 has a value of 28.8. Sample aggregator 308 can calculate the remaining values of average hourly timeseries 408 in a similar manner.

The first data sample of average daily timeseries 410 is shown to include the timestamp 2015-12-31T00:00:00. This timestamp indicates that the first data sample of average daily timeseries 410 corresponds to an aggregation interval that begins at 12:00:00 AM on Dec. 31, 2015. Since each aggregation interval of the average daily timeseries 410 is a day in duration, the end of the aggregation interval is 12:00:00 AM on Jan. 1, 2016. Only one data sample of average hourly timeseries 408 occurs during this interval. Accordingly, the value of the first data sample of average daily timeseries 410 is the average of a single data value (i.e., average(28.8)=28.8). The same is true for the second data sample of average daily timeseries 410 (i.e., average(87.5)=87.5).

In some embodiments, sample aggregator 308 stores each of the data rollup timeseries 406-414 in a single data table (e.g., data table 450) along with raw data timeseries 404. This allows applications 230 to retrieve all of the timeseries 404-414 quickly and efficiently by accessing a single data table. In other embodiments, sample aggregator 308 can store the various timeseries 404-414 in separate data tables which can be stored in the same data storage device (e.g., same database) or distributed across multiple data storage devices. In some embodiments, sample aggregator 308 stores data timeseries 404-414 in a format other than a data table. For example, sample aggregator 308 can store timeseries 404-414 as vectors, as a matrix, as a list, or using any of a variety of other data storage formats.

In some embodiments, sample aggregator 308 automatically updates the data rollup timeseries 406-414 each time a new raw data sample is received. Updating the data rollup timeseries 406-414 can include recalculating the aggregated values based on the value and timestamp of the new raw data sample. When a new raw data sample is received, sample aggregator 308 can determine whether the timestamp of the new raw data sample is within any of the aggregation intervals for the samples of the data rollup timeseries 406-414. For example, if a new raw data sample is received with a timestamp of 2016-01-01T00:52:00, sample aggregator 308 can determine that the new raw data sample occurs within the aggregation interval beginning at timestamp 2016-01-01T00:45:00 for average quarter-hour timeseries 406. Sample aggregator 308 can use the value of the new raw data point (e.g., value=120) to update the aggregated value of the final data sample of average quarter-hour timeseries 406 (i.e., average(110, 120)=115).

If the new raw data sample has a timestamp that does not occur within any of the previous aggregation intervals, sample aggregator 308 can create a new data sample in average quarter-hour timeseries 406. The new data sample in average quarter-hour timeseries 406 can have a new data timestamp defining the beginning of an aggregation interval that includes the timestamp of the new raw data sample. For example, if the new raw data sample has a timestamp of 2016-01-01T01:00:11, sample aggregator 308 can determine that the new raw data sample does not occur within any of the aggregation intervals previously established for average quarter-hour timeseries 406. Sample aggregator 308 can generate a new data sample in average quarter-hour timeseries 406 with the timestamp 2016-01-01T01:00:00 and can calculate the value of the new data sample in average quarter-hour timeseries 406 based on the value of the new raw data sample, as previously described.

Sample aggregator 308 can update the values of the remaining data rollup timeseries 408-414 in a similar manner. For example, sample aggregator 308 determine whether the timestamp of the updated data sample in average quarter-hour timeseries is within any of the aggregation intervals for the samples of average hourly timeseries 408. Sample aggregator 308 can determine that the timestamp 2016-01-01T00:45:00 occurs within the aggregation interval beginning at timestamp 2016-01-01T00:00:00 for average hourly timeseries 408. Sample aggregator 308 can use the updated value of the final data sample of average quarter-hour timeseries 406 (e.g., value=115) to update the value of the second sample of average hourly timeseries 408 (i.e., average(65, 80, 95, 115)=88.75). Sample aggregator 308 can use the updated value of the final data sample of average hourly timeseries 408 to update the final sample of average daily timeseries 410 using the same technique.

In some embodiments, sample aggregator 308 updates the aggregated data values of data rollup timeseries 406-414 each time a new raw data sample is received. Updating each time a new raw data sample is received ensures that the data rollup timeseries 406-414 always reflect the most recent data samples. In other embodiments, sample aggregator 308 updates the aggregated data values of data rollup timeseries 406-414 periodically at predetermined update intervals (e.g., hourly, daily, etc.) using a batch update technique. Updating periodically can be more efficient and require less data processing than updating each time a new data sample is received, but can result in aggregated data values that are not always updated to reflect the most recent data samples.

In some embodiments, sample aggregator 308 is configured to cleanse raw data timeseries 404. Cleansing raw data timeseries 404 can include discarding exceptionally high or low data. For example, sample aggregator 308 can identify a minimum expected data value and a maximum expected data value for raw data timeseries 404. Sample aggregator 308 can discard data values outside this range as bad data. In some embodiments, the minimum and maximum expected values are based on attributes of the data point represented by the timeseries. For example, data point 402 represents a measured outdoor air temperature and therefore has an expected value within a range of reasonable outdoor air temperature values for a given geographic location (e.g., between −20° F. and 110° F.). Sample aggregator 308 can discard a data value of 330 for data point 402 since a temperature value of 330° F. is not reasonable for a measured outdoor air temperature.

In some embodiments, sample aggregator 308 identifies a maximum rate at which a data point can change between consecutive data samples. The maximum rate of change can be based on physical principles (e.g., heat transfer principles), weather patterns, or other parameters that limit the maximum rate of change of a particular data point. For example, data point 402 represents a measured outdoor air temperature and therefore can be constrained to have a rate of change less than a maximum reasonable rate of change for outdoor temperature (e.g., five degrees per minute). If two consecutive data samples of the raw data timeseries 404 have values that would require the outdoor air temperature to change at a rate in excess of the maximum expected rate of change, sample aggregator 308 can discard one or both of the data samples as bad data.

Sample aggregator 308 can perform any of a variety of data cleansing operations to identify and discard bad data samples. In some embodiments, sample aggregator 308 performs the data cleansing operations for raw data timeseries 404 before generating the data rollup timeseries 406-414. This ensures that raw data timeseries 404 used to generate data rollup timeseries 406-414 does not include any bad data samples. Accordingly, the data rollup timeseries 406-414 do not need to be re-cleansed after the aggregation is performed.

Virtual Points

Referring again to FIG. 3, timeseries operators 306 are shown to include a virtual point calculator 310. Virtual point calculator 310 is configured to create virtual data points and calculate timeseries values for the virtual data points. A virtual data point is a type of calculated data point derived from one or more actual data points. In some embodiments, actual data points are measured data points, whereas virtual data points are calculated data points. Virtual data points can be used as substitutes for actual sensor data when the sensor data desired for a particular application does not exist, but can be calculated from one or more actual data points. For example, a virtual data point representing the enthalpy of a refrigerant can be calculated using actual data points measuring the temperature and pressure of the refrigerant. Virtual data points can also be used to provide timeseries values for calculated quantities such as efficiency, coefficient of performance, and other variables that cannot be directly measured.

Virtual point calculator 310 can calculate virtual data points by applying any of a variety of mathematical operations or functions to actual data points or other virtual data points. For example, virtual point calculator 310 can calculate a virtual data point (pointID$_3$) by adding two or more actual data points (pointID$_1$ and pointID$_2$) (e.g., pointID$_3$=pointID$_1$+pointID$_2$). As another example, virtual point calculator 310 can calculate an enthalpy data point (pointID$_4$) based on a measured temperature data point (pointID$_5$) and a measured pressure data point (pointID$_6$) (e.g., pointID$_4$=enthalpy (pointID$_5$, pointID$_6$)). In some instances, a virtual data point can be derived from a single actual data point. For example, virtual point calculator 310 can calculate a saturation temperature (pointID$_7$) of a known refrigerant based on a measured refrigerant pressure (pointID$_8$) (e.g., pointID$_7$=T$_{sat}$ (pointID$_8$)). In general, virtual point calculator 310 can calculate the timeseries values of a virtual data point using the timeseries values of one or more actual data points and/or the timeseries values of one or more other virtual data points.

In some embodiments, virtual point calculator 310 uses a set of virtual point rules to calculate the virtual data points. The virtual point rules can define one or more input data points (e.g., actual or virtual data points) and the mathematical operations that should be applied to the input data point(s) to calculate each virtual data point. The virtual point rules can be provided by a user, received from an external system or device, and/or stored in memory 210. Virtual point calculator 310 can apply the set of virtual point rules to the timeseries values of the input data points to calculate timeseries values for the virtual data points. The timeseries values for the virtual data points can be stored as derived timeseries data in timeseries storage 214.

Virtual point calculator 310 can calculate virtual data points using the values of raw data timeseries 404 and/or the aggregated values of the data rollup timeseries 406-414. In some embodiments, the input data points used to calculate a virtual data point are collected at different sampling times and/or sampling rates. Accordingly, the samples of the input data points may not be synchronized with each other, which can lead to ambiguity in which samples of the input data points should be used to calculate the virtual data point. Using the data rollup timeseries 406-414 to calculate the virtual data points ensures that the timestamps of the input data points are synchronized and eliminates any ambiguity in which data samples should be used.

Figures 6, 7, 8:
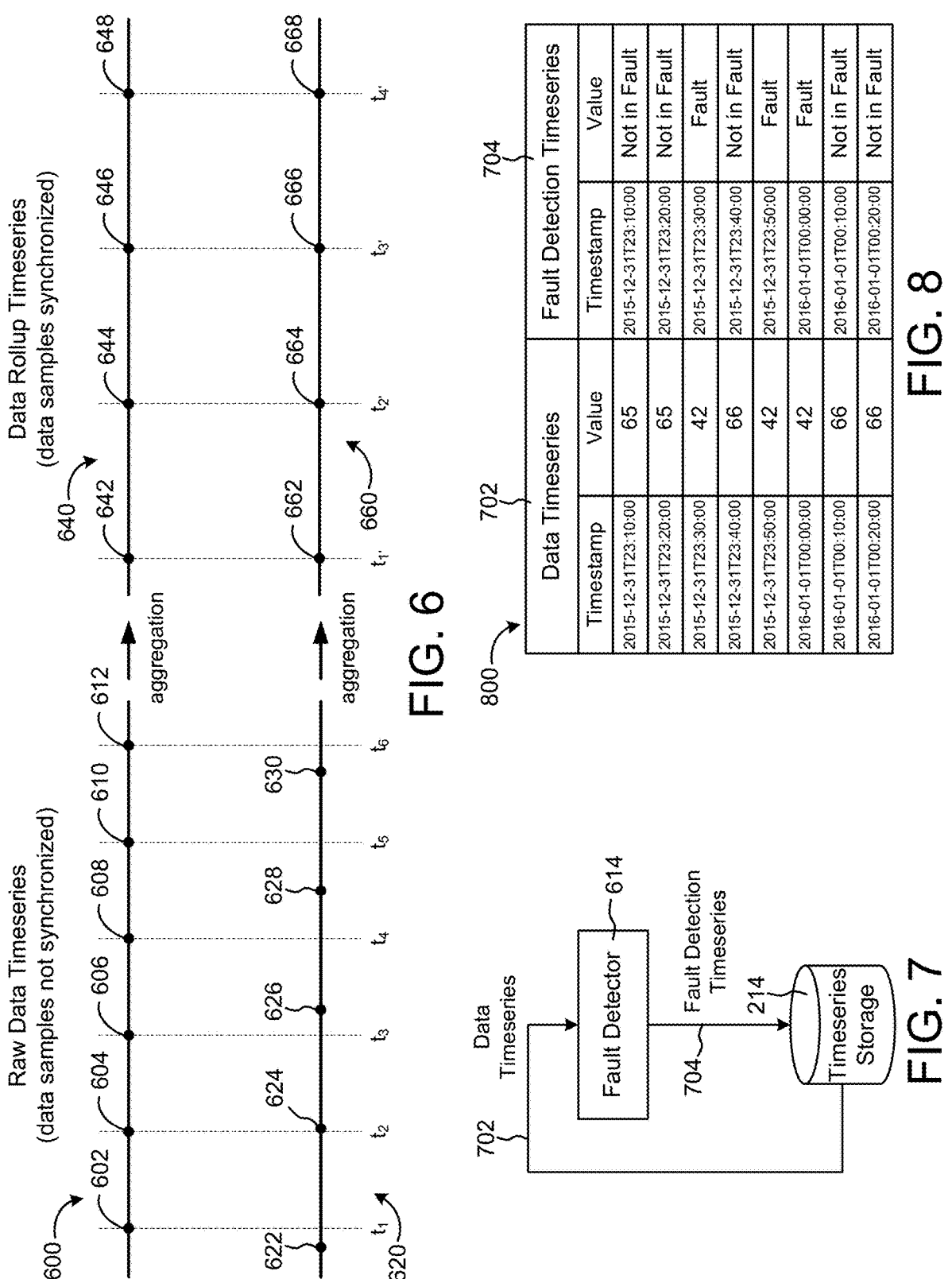
FIG. 6 is a drawing of several timeseries illustrating the synchronization of data samples which can be performed by the data aggregator shown in FIG. 3, according to some embodiments.
FIG. 7 is a flow diagram illustrating the creation and storage of a fault detection timeseries which can be performed by the fault detector shown in FIG. 3, according to some embodiments.
FIG. 8 is a data table which can be used to store the raw data timeseries and the fault detection timeseries, according to some embodiments.

Referring now to FIG. 6, several timeseries 600, 620, 640, and 660 illustrating the synchronization of data samples resulting from aggregating the raw timeseries data are shown, according to some embodiments. Timeseries 600 and 620 are raw data timeseries. Raw data timeseries 600 has several raw data samples 602-610. Raw data sample 602 is collected at time t$_1$; raw data sample 604 is collected at time t$_2$; raw data sample 606 is collected at time t$_3$; raw data sample 608 is collected at time t$_4$; raw data sample 610 is collected at time t$_5$; and raw data sample 612 is collected at time t$_6$.

Raw data timeseries 620 also has several raw data samples 622, 624, 626, 628, and 630. However, raw data samples, 622-630 are not synchronized with raw data samples 602-612. For example, raw data sample 622 is collected before time $t_1$; raw data sample 624 is collected between times $t_2$ and $t_3$; raw data sample 626 is collected between times $t_3$ and $t_4$; raw data sample 628 is collected between times $t_4$ and $t_5$; and raw data sample 630 is collected between times $t_5$ and $t_6$. The lack of synchronization between data samples 602-612 and raw data samples 622-630 can lead to ambiguity in which of the data samples should be used together to calculate a virtual data point.

Timeseries 640 and 660 are data rollup timeseries. Data rollup timeseries 640 can be generated by sample aggregator 308 by aggregating raw data timeseries 600. Similarly, data rollup timeseries 660 can be generated by sample aggregator 308 by aggregating raw data timeseries 620. Both raw data timeseries 600 and 620 can be aggregated using the same aggregation interval. Accordingly, the resulting data rollup timeseries 640 and 660 have synchronized data samples. For example, aggregated data sample 642 is synchronized with aggregated data sample 662 at time $t_1'$. Similarly, aggregated data sample 644 is synchronized with aggregated data sample 664 at time $t_2'$; aggregated data sample 646 is synchronized with aggregated data sample 666 at time $t_3'$; and aggregated data sample 648 is synchronized with aggregated data sample 668 at time $t_4'$.

The synchronization of data samples in data rollup timeseries 640 and 660 allows virtual point calculator 310 to readily identify which of the data samples should be used together to calculate a virtual point. For example, virtual point calculator 310 can identify which of the samples of data rollup timeseries 640 and 660 have the same timestamp (e.g., data samples 642 and 662, data samples 644 and 664, etc.). Virtual point calculator 310 can use two or more aggregated data samples with the same timestamp to calculate a timeseries value of the virtual data point. In some embodiments, virtual point calculator 310 assigns the shared timestamp of the input data samples to the timeseries value of the virtual data point calculated from the input data samples.

Weather Points

Referring again to FIG. 3, timeseries operators 306 are shown to include a weather point calculator 312. Weather point calculator 312 is configured to perform weather-based calculations using the timeseries data. In some embodiments, weather point calculator 312 creates virtual data points for weather-related variables such as cooling degree days (CDD), heating degree days (HDD), cooling energy days (CED), heating energy days (HED), and normalized energy consumption. The timeseries values of the virtual data points calculated by weather point calculator 312 can be stored as derived timeseries data in timeseries storage 214.

Weather point calculator 312 can calculate CDD by integrating the positive temperature difference between the time-varying outdoor air temperature $T_{OA}$ and the cooling balance point $T_{bC}$ as shown in the following equation:

$$CDD = \int^{period} \max\{0, (T_{OA} - T_{bC})\} \, dt$$

where period is the integration period. In some embodiments, the outdoor air temperature $T_{OA}$ is a measured data point, whereas the cooling balance point $T_{bC}$ is a stored parameter. To calculate CDD for each sample of the outdoor air temperature $T_{OA}$, weather point calculator 312 can multiply the quantity $\max\{0, (T_{OA}-T_{bC})\}$ by the sampling period $\Delta t$ of the outdoor air temperature $T_{OA}$. Weather point calculator 312 can calculate CED in a similar manner using outdoor air enthalpy $E_{OA}$ instead of outdoor air temperature $T_{OA}$. Outdoor air enthalpy $E_{OA}$ can be a measured or virtual data point.

Weather point calculator 312 can calculate HDD by integrating the positive temperature difference between a heating balance point $T_{bH}$ and the time-varying outdoor air temperature $T_{OA}$ as shown in the following equation:

$$HDD = \int^{period} \max\{0, (T_{bH} - T_{OA})\} \, dt$$

where period is the integration period. In some embodiments, the outdoor air temperature $T_{OA}$ is a measured data point, whereas the heating balance point $T_{bH}$ is a stored parameter. To calculate HDD for each sample of the outdoor air temperature $T_{OA}$, weather point calculator 312 can multiply the quantity $\max\{0, (T_{bH}-T_{OA})\}$ by the sampling period $\Delta t$ of the outdoor air temperature $T_{OA}$. Weather point calculator 312 can calculate HED in a similar manner using outdoor air enthalpy $E_{OA}$ instead of outdoor air temperature $T_{OA}$.

In some embodiments, both virtual point calculator 310 and weather point calculator 312 calculate timeseries values of virtual data points. Weather point calculator 312 can calculate timeseries values of virtual data points that depend on weather-related variables (e.g., outdoor air temperature, outdoor air enthalpy, outdoor air humidity, outdoor light intensity, precipitation, wind speed, etc.). Virtual point calculator 310 can calculate timeseries values of virtual data points that depend on other types of variables (e.g., non-weather-related variables). Although only a few weather-related variables are described in detail here, it is contemplated that weather point calculator 312 can calculate virtual data points for any weather-related variable. The weather-related data points used by weather point calculator 312 can be received as timeseries data from various weather sensors and/or from a weather service.

Fault Detection

Still referring to FIG. 3, timeseries operators 306 are shown to include a fault detector 314. Fault detector 314 can be configured to detect faults in timeseries data. In some embodiments, fault detector 314 performs fault detection for timeseries data representing meter data (e.g., measurements from a sensor) and/or for other types of timeseries data. Fault detector 314 can detect faults in the raw timeseries data and/or the derived timeseries data. In some embodiments, fault detector 314 receives fault detection rules from analytics service 224. Fault detection rules can be defined by a user (e.g., via a rules editor) or received from an external system or device. In various embodiments, the fault detection rules can be stored within timeseries storage 214. Fault detector 314 can retrieve the fault detection rules from timeseries storage 214 and can use the fault detection rules to analyze the timeseries data.

In some embodiments, the fault detection rules provide criteria that can be evaluated by fault detector 314 to detect faults in the timeseries data. For example, the fault detection rules can define a fault as a data value above or below a threshold value. As another example, the fault detection rules can define a fault as a data value outside a predetermined range of values. The threshold value and predetermined range of values can be based on the type of timeseries data (e.g., meter data, calculated data, etc.), the type of variable represented by the timeseries data (e.g., temperature, humidity, energy consumption, etc.), the system or device that measures or provides the timeseries data (e.g., a sensor, an IoT device, etc.), and/or other attributes of the timeseries data.

Fault detector 314 can apply the fault detection rules to the timeseries data to determine whether each sample of the timeseries data qualifies as a fault. In some embodiments, fault detector 314 generates a fault detection timeseries containing the results of the fault detection. The fault detection timeseries can include a set of timeseries values, each of which corresponds to a data sample of the timeseries data evaluated by fault detector 314. In some embodiments, each timeseries value in the fault detection timeseries includes a timestamp and a fault detection value. The timestamp can be the same as the timestamp of the corresponding data sample of the data timeseries. The fault detection value can indicate whether the corresponding data sample of the data timeseries qualifies as a fault. For example, the fault detection value can have a value of "Fault" if a fault is detected and a value of "Not in Fault" if a fault is not detected in the corresponding data sample of the data timeseries. The fault detection timeseries can be stored in timeseries storage 214 along with the raw timeseries data and the derived timeseries data.

Referring now to FIGS. 7-8, a block diagram and data table 800 illustrating the fault detection timeseries is shown, according to some embodiments. In FIG. 7, fault detector 314 is shown receiving a data timeseries 702 from timeseries storage 214. Data timeseries 702 can be a raw data timeseries or a derived data timeseries. In some embodiments, data timeseries 702 is a timeseries of values of an actual data point (e.g., a measured temperature). In other embodiments, data timeseries 702 is a timeseries of values of a virtual data point (e.g., a calculated efficiency). As shown in table 800, data timeseries 702 includes a set of data samples. Each data sample includes a timestamp and a value. Most of the data samples have values within the range of 65-66. However, three of the data samples have values of 42.

Fault detector 314 can evaluate data timeseries 702 using a set of fault detection rules to detect faults in data timeseries 702. In some embodiments, fault detector 314 determines that the data samples having values of 42 qualify as faults according to the fault detection rules. Fault detector 314 can generate a fault detection timeseries 704 containing the results of the fault detection. As shown in table 800, fault detection timeseries 704 includes a set of data samples. Like data timeseries 702, each data sample of fault detection timeseries 704 includes a timestamp and a value. Most of the values of fault detection timeseries 704 are shown as "Not in Fault," indicating that no fault was detected for the corresponding sample of data timeseries 702 (i.e., the data sample with the same timestamp). However, three of the data samples in fault detection timeseries 704 have a value of "Fault," indicating that the corresponding sample of data timeseries 702 qualifies as a fault. As shown in FIG. 7, fault detector 314 can store fault detection timeseries 704 in timeseries storage 214 along with the raw timeseries data and the derived timeseries data.

Fault detection timeseries 704 can be used by web services platform 102 to perform various fault detection, diagnostic, and/or control processes. In some embodiments, fault detection timeseries 704 is further processed by timeseries processing engine 304 to generate new timeseries derived from fault detection timeseries 704. For example, sample aggregator 308 can use fault detection timeseries 704 to generate a fault duration timeseries. Sample aggregator 308 can aggregate multiple consecutive data samples of fault detection timeseries 704 having the same data value into a single data sample. For example, sample aggregator 308 can aggregate the first two "Not in Fault" data samples of fault detection timeseries 704 into a single data sample representing a time period during which no fault was detected. Similarly, sample aggregator 308 can aggregate the final two "Fault" data samples of fault detection timeseries 704 into a single data sample representing a time period during which a fault was detected.

In some embodiments, each data sample in the fault duration timeseries has a fault occurrence time and a fault duration. The fault occurrence time can be indicated by the timestamp of the data sample in the fault duration timeseries. Sample aggregator 308 can set the timestamp of each data sample in the fault duration timeseries equal to the timestamp of the first data sample in the series of data samples in fault detection timeseries 704 which were aggregated to form the aggregated data sample. For example, if sample aggregator 308 aggregates the first two "Not in Fault" data samples of fault detection timeseries 704, sample aggregator 308 can set the timestamp of the aggregated data sample to 2015-12-31T23:10:00. Similarly, if sample aggregator 308 aggregates the final two "Fault" data samples of fault detection timeseries 704, sample aggregator 308 can set the timestamp of the aggregated data sample to 2015-12-31T23:50:00.

The fault duration can be indicated by the value of the data sample in the fault duration timeseries. Sample aggregator 308 can set the value of each data sample in the fault duration timeseries equal to the duration spanned by the consecutive data samples in fault detection timeseries 704 which were aggregated to form the aggregated data sample. Sample aggregator 308 can calculate the duration spanned by multiple consecutive data samples by subtracting the timestamp of the first data sample of fault detection timeseries 704 included in the aggregation from the timestamp of the next data sample of fault detection timeseries 704 after the data samples included in the aggregation.

For example, if sample aggregator 308 aggregates the first two "Not in Fault" data samples of fault detection timeseries 704, sample aggregator 308 can calculate the duration of the aggregated data sample by subtracting the timestamp 2015-12-31T23:10:00 (i.e., the timestamp of the first "Not in Fault" sample) from the timestamp 2015-12-31T23:30:00 (i.e., the timestamp of the first "Fault" sample after the consecutive "Not in Fault" samples) for an aggregated duration of twenty minutes. Similarly, if sample aggregator 308 aggregates the final two "Fault" data samples of fault detection timeseries 704, sample aggregator 308 can calculate the duration of the aggregated data sample by subtracting the timestamp 2015-12-31T23:50:00 (i.e., the timestamp of the first "Fault" sample included in the aggregation) from the timestamp 2016-01-01T00:10:00 (i.e., the timestamp of the first "Not in Fault" sample after the consecutive "Fault" samples) for an aggregated duration of twenty minutes.

Eventseries

Referring again to FIG. 3, timeseries operators 306 are shown to include an eventseries generator 315. Eventseries generator 315 can be configured to generate eventseries based on the raw data timeseries and/or the derived data timeseries. Each eventseries may include a plurality of event samples that characterize various events and define the start times and end times of the events. In the context of eventseries, an "event" can be defined as a state or condition that occurs over a period of time. In other words, an event is not an instantaneous occurrence, but rather is a non-instantaneous state or condition observed over a time period having a non-zero duration (i.e., having both a start time and a subsequent stop time). The state or condition of the event can be based on the values of the timeseries samples used to generate the eventseries. In some embodiments, eventseries generator 315 assigns a state to each timeseries sample based on the value of the timeseries sample and then aggregates multiple consecutive samples having the same state to define the time period over which that state is observed.

Eventseries generator 315 can be configured to assign a state to each sample of an input timeseries (e.g., a raw data timeseries or a derived timeseries) by applying a set of rules to each sample. The process of assigning a state to each sample of the input timeseries can be described as an event-condition-action (ECA) process. ECA refers to the structure of active rules in event driven architecture and active database systems. For example, each rule in the set of rules may include an event, a condition, and an action. The event part of the rule may specify a signal that triggers invocation of the rule. The condition part of the rule may be a logical test (or series of logical tests) that, if satisfied or evaluates to true, causes the action to be carried out. The action part of the rule may specify one or more actions to be performed when the corresponding logical test is satisfied (e.g., assigning a particular state to a sample of the input timeseries).

In some embodiments, the event part is the arrival of a new sample of an input timeseries. Different rules may apply to different input timeseries. For example, the arrival of a new sample of a first input timeseries may qualify as a first event, whereas the arrival of a new sample of a second input timeseries may qualify as a second event. Eventseries generator 315 can use the identity of the input timeseries to determine which event has occurred when a new sample of a particular input timeseries is received. In other words, eventseries generator 315 can select a particular rule to evaluate based on the identity of the input timeseries.

In some embodiments, the condition includes one or more mathematical checks or logic statements that are evaluated by eventseries generator 315. For example, evaluating the condition of a particular rule may include comparing the value of the sample of the input timeseries to a threshold value. The condition may be satisfied if the value of the sample is less than the threshold value, equal to the threshold value, or greater than the threshold value, depending on the particular logic statement specified by the condition. In some embodiments, the condition includes a series of mathematical checks that are performed by eventseries generator 315 in a predetermined order. Each mathematical check may correspond to a different action to be performed if that mathematical check is satisfied. For example, the conditions and corresponding actions may be specified as follows:

$$
\begin{aligned}
&\text{If Value} > \theta_1, \text{Action} = \text{Action}_1 \\
&\text{Else If } \theta_1 \geq \text{Value} > \theta_2, \text{Action} = \text{Action}_2 \\
&\text{Else If } \theta_2 \geq \text{Value} > \theta_3, \text{Action} = \text{Action}_3 \\
&\text{Else If } \theta_3 \geq \text{Value}, \text{Action} = \text{Action}_4
\end{aligned}
$$

where Value is the value of the sample of the input timeseries, $\theta_1$-$\theta_4$ are thresholds for the value, and Action$_1$-Action$_4$ are specific actions that are performed if the corresponding logic statement is satisfied. For example, Action$_1$ may be performed if the value of the sample is greater than $\theta_1$.

In some embodiments, the actions include assigning various states to the sample of the input timeseries. For example, Action$_1$ may include assigning a first state to the sample of the input timeseries, whereas Action$_2$ may include assigning a second state to the sample of the input timeseries. Accordingly, different states can be assigned to the sample based on the value of the sample relative to the threshold values. Each time a new sample of an input timeseries is received, eventseries generator 315 can run through the set of rules, select the rules that apply to that specific input timeseries, apply them in a predetermined order, determine which condition is satisfied, and assign a particular state to the sample based on which condition is satisfied.

One example of an eventseries which can be generated by eventseries generator 315 is an outdoor air temperature (OAT) eventseries. The OAT eventseries may define one or more temperature states and may indicate the time periods during which each of the temperature states is observed. In some embodiments, the OAT eventseries is based on a timeseries of measurements of the OAT received as a raw data timeseries. Eventseries generator 315 can use a set of rules to assign a particular temperature state (e.g., hot, warm, cool, cold) to each of the timeseries OAT samples. For example, eventseries generator 315 can apply the following set of rules to the samples of an OAT timeseries:

$$
\begin{aligned}
&\text{If OAT} > 100, \text{State} = \text{Hot} \\
&\text{Else If } 100 \geq \text{OAT} > 80, \text{State} = \text{Warm} \\
&\text{Else If } 80 \geq \text{OAT} > 50, \text{State} = \text{Cool} \\
&\text{Else If } 50 \geq \text{OAT}, \text{State} = \text{Cold}
\end{aligned}
$$

where OAT is the value of a particular timeseries data sample. If the OAT is above 100, eventseries generator 315 can assign the timeseries sample to the "Hot" temperature state. If the OAT is less than or equal to 100 and greater than 80, eventseries generator 315 can assign the timeseries sample to the "Warm" temperature state. If the OAT is less than or equal to 80 and greater than 50, eventseries generator 315 can assign the timeseries sample to the "Cool" temperature state. If the OAT is less than or equal to 50, eventseries generator 315 can assign the timeseries sample to the "Cold" temperature state.

In some embodiments, eventseries generator 315 creates a new timeseries that includes the assigned states for each sample of the original input timeseries. The new timeseries may be referred to as a "state timeseries" because it indicates the state assigned to each timeseries sample. The state timeseries can be created by applying the set of rules to an input timeseries as previously described. In some embodiments, the state timeseries includes a state value and a timestamp for each sample of the state timeseries. An example of a state timeseries is as follows:

$$[\langle state_1, timestamp_1 \rangle, \langle state_2, timestamp_2 \rangle, \ldots \langle state_N, timestamp_N \rangle]$$

where state$_i$ is the state assigned to the ith sample of the input timeseries, timestamp$_i$ is the timestamp of the ith sample of the input timeseries, and N is the total number of samples in the input timeseries. In some instances, two or more of the state values may be the same if the same state is assigned to multiple samples of the input timeseries.

In some embodiments, the state timeseries also includes the original value of each sample of the input timeseries. For example, each sample of the state timeseries may include a state value, a timestamp, and an input data value, as shown in the following equation:

$$[\langle state_1, timestamp_1, value_1 \rangle, \ldots \langle state_N, timestamp_N, value_N \rangle]$$

where $value_i$ is the original value of the ith sample of the input timeseries. The state timeseries is a type of derived timeseries which can be stored and processed by timeseries service 228.

Figures 9A, 9B:
FIG. 9A is a data table which can be used to store states assigned to samples of a data timeseries, according to some embodiments.
FIG. 9B is a data table including various events generated based on the assigned states shown in the table of FIG. 9A, according to some embodiments.

Referring now to FIG. 9A, a table 910 illustrating the result of assigning a temperature state to each timeseries sample is shown, according to some embodiments. Each timeseries sample is shown as a separate row of table 910. The "Time" column of table 910 indicates the timestamp associated with each sample, whereas the "OAT" column of table 910 indicates the value of each timeseries sample. The "State" column of table 910 indicates the state assigned to each timeseries sample by eventseries generator 315.

Referring now to FIG. 9B, a table 920 illustrating a set of events generated by eventseries generator 315 is shown, according to some embodiments. Each event is shown as a separate row of table 920. The "Event ID" column of table 920 indicates the unique identifier for each event (e.g., Event 1, Event 2, etc.). The "Start Time" column of table 920 indicates the time at which each event begins and the "End Time" column of table 920 indicates the time at which event ends. The "State" column of table 920 indicates the state associated with each event.

Eventseries generator 315 can generate each event shown in table 920 by identifying consecutive timeseries samples with the same assigned state and determining a time period that includes the identified samples. In some embodiments, the time period starts at the timestamp of the first sample having a given state and ends immediately before the timestamp of the next sample having a different state. For example, the first two timeseries samples shown in table 910 both have the state "Cold," whereas the third sample in table 910 has the state "Cool." Eventseries generator 315 can identify the first two samples as having the same state and can generate the time period 00:00-01:59 which includes both of the identified samples. This time period begins at the timestamp of the first sample (i.e., 00:00) and ends immediately before the timestamp of the third sample (i.e., 02:00). Eventseries generator 315 can create an event for each group of consecutive samples having the same state.

Eventseries generator 315 can perform a similar analysis for the remaining timeseries samples in table 910 to generate each of the events shown in table 920. In some instances, multiple events can have the same state associated therewith. For example, both Event 1 and Event 7 shown in table 920 have the "Cold" state. Similarly, both Event 2 and Event 6 have the "Cool" state and both Event 3 and Event 5 have the "Warm" state. It should be noted that an event defines not only a particular state, but also a time period (i.e., a series of consecutive time samples) during which that state is observed. If the same state is observed during multiple non-consecutive time periods, multiple events having the same state can be generated to represent each of the non-consecutive time periods.

In some embodiments, eventseries generator 315 creates an eventseries for a set of events. An eventseries is conceptually similar to a timeseries in that both represent a series of occurrences. However, the samples of a timeseries correspond to instantaneous occurrences having a single timestamp, whereas the samples of an eventseries correspond to non-instantaneous events having both a start time and a stop time. For example, eventseries generator 315 may create the following eventseries for the set of events shown in table 920:

```
[⟨ID = 1, State = Cold, StartTime = 00:00, EndTime = 01;59⟩,
    ⟨ID = 2, State = Cool, StartTime = 02:00, EndTime = 08;59⟩,
    ⟨ID = 3, State = Warm, StartTime = 09:00, EndTime = 11;59⟩
    ⟨ID = 4, State = Hot, StartTime = 12:00, EndTime = 15;59⟩,
    ⟨ID = 5, State = Warm, StartTime = 16:00, EndTime = 18;59⟩,
    ⟨ID = 6, State = Cool, StartTime = 19:00, EndTime = 21;59⟩,
    ⟨ID = 7, State = Cold, StartTime = 22:00, EndTime = 23;59⟩]
``` where each item within the bent brackets ⟨ ⟩ is an event having the attributes ID, State, StartTime, and EndTime. Events can be stored in a tabular format (as shown in FIG. 9B), as a text string (as shown above), as a data object (e.g., a JSON object), in a container format, or any of a variety of formats.

Event Service

Referring again to FIG. 3, timeseries service 228 is shown to include an event service 303. In some embodiments, event service 303 is part of timeseries service 228. In other embodiments, event service 303 is a separate service (i.e., separate from timeseries service 228) within platform services 220. Event service 303 can be configured to receive and process requests for information relating to various events and eventseries. Event service 303 can also create and update events and eventseries in response to a request from an application or a user. Several examples of how event service 303 can handle requests are described below. The following table identifies the types of actions event service 303 can perform with respect to events and eventseries:

| Resource | GET (read) | POST (create) | PUT (update) |
|---|---|---|---|
| /Eventseries | Retrieve list of Eventseries | Create one or more new Eventseries | N/A |
| /Eventseries/ {eventseriesId} | Read a specific Eventseries | Create a specific Eventseries | Update the specific Eventseries |
| /Events | Retrieve a list of Events | Create one or more new Events | N/A |
| /Events/ {eventId} | Read a specific Event | Create a specific Event | Update the specific Event |

Event service 303 can be configured to create a new eventseries in response to a request containing an OrgID attribute and a processing type attribute. For example, event service 303 can receive the following request:

```
Post {timeseriesV2}/eventseries/new
{
    "orgId": "Abc Inc",
    "ProcessingType" : "none"
}
``` where "Abc Inc" is the ID of the organization to which the new eventseries will belong and no processing type is specified.

In response to this request, event service 303 can create a new eventseries (i.e., an empty eventseries container) and assign an EventseriesID to the eventseries. For example, event service 303 can respond to the request as follows:

```
{
    "eventseriesId": "c7c157e4-303f-4b25-b182-ce7b0f8291d8",
    "orgId": "Abc Inc",
    "inputTimeseriesId": null,
    "stateTimeseriesId": null,
```

-continued

```
    "rules": null,
    "status": "active",
    "processingType": "stream"
}
```

In some embodiments, event service 303 is configured to create a new eventseries in response to a request containing an OrgID attribute, an InputTimeseriesID attribute, a State-TimeseriesID attribute, and a Rules attribute. For example, event service 303 can receive the following request:

```
{
    "orgId": "Abc Inc",
    "inputTimeseriesId": "793c156e4-303f-4b2e-bt82-ce7b0f829uj3",
    "stateTimeseriesId": "uic157e4-6r2f-4b25-b682-ct7b0f82917u",
```

-continued

```
    "rules": [
        {"compareOp": "Gt", "scalar": 100, "state": "Hot"},
        {"compareOp": "Gt", "scalar": 80, "state": "Warm"},
        {"compareOp": "Gt", "scalar": 50, "state": "Cool"},
        {"compareOp": "Lte", "scalar": 50, "state": "Cold"}
    ]
}
``` where "793c156e4-303f-4b2e-bt82-ce7b0f829uj3" is the ID of the input timeseries used to generate the eventseries, "uic157e4-6r2f-4b25-b682-ct7b0f82917u" is the ID of the state timeseries containing the states assigned to each sample of the input timeseries, and the "rules" attribute contains a set of rules used to assign a state to each sample of the input timeseries.

In response to this request, event service 303 can create a new eventseries (i.e., an empty eventseries container) and assign an EventseriesID to the eventseries. For example, event service 303 can respond to the request as follows:

```
{
    "eventseriesId": "c7c157e4-303f-4b25-b182-ce7b0f8291d8",
    "orgId": "Abc Inc",
    "inputTimeseriesId": "793c156e4-303f-4b2e-bt82-ce7b0f829uj3",
    "stateTimeseriesId": "uic157e4-6r2f-4b25-b682-ct7b0f82917u",
```

-continued

```
    "rules": [
        {"compareOp": "Gt", "scalar": 100, "state": "Hot"},
        {"compareOp": "Gt", "scalar": 80, "state": "Warm"},
        {"compareOp": "Gt", "scalar": 50, "state": "Cool"},
        {"compareOp": "Lte", "scalar": 50, "state": "Cold"}
    ],
    "status": "active",
    "processingType": "stream"
}
```

In some embodiments, event service 303 is configured to add new events to an existing eventseries. For example, event service 303 can receive a request to add a new event to an eventseries. The request may specify the Event-seriesID, the start time of the event, the end time of the event, and the state associated with the event, as shown in the following request:

```
Post {timeseriesV2}/eventseries/c7c157e4-303f-4b25-b182-ce7b0f8291d8/events
[
    {
        "eventseriesId": "c7c157e4-303f-4b25-b182-ce7b0f8291d8",
        "startTimestamp": "2017-04-01 13:48:23-05:00",
    "endTimestamp": "2017-04-01 13:54:11-05:00",
    "state": "High Pressure Alarm"
    }
]
```

In response to this request, event service 303 can generate a new EventID for the new event and can add the new event to the eventseries designated by the EventseriesID "c7c157e4-303f-4b25-b182-ce7b0f8291d8." The new event may have the start time "2017 Apr. 1 13:48:23-05:00," the end time "2017 Apr. 1 13:54:11-05:00," and the state "High Pressure Alarm" as specified in the request. In some embodiments, event service 303 responds to the request by acknowledging that the new event has been added to the eventseries.

In some embodiments, event service 303 is configured to update existing events in an eventseries. For example, event service 303 can receive a request to add update one or more properties of an existing event in an eventseries. The request may specify the EventseriesID, the updated start time of the event, the updated end time of the event, and/or the updated state associated with the event, as shown in the following request:

```
Put {timeseriesV2}/eventseries/c7c157e4-303f-4b25-b182-ce7b0f8291d8/events/ c7c157e4-
303f-4b25-b182-ce7b0f8291d8
{
    "eventseriesId": "c7c157e4-303f-4b25-b182-ce7b0f8291d8",
    "startTimestamp": "2017-04-01 13:48:23-05:00",
    "endTimestamp": "2017-04-01 13:54:11-05:00",
    "state": "High Pressure Alarm"
}
```

In response to this request, event service 303 can update the specified properties of the event designated by Event-seriesID "c7c157e4-303f-4b25-b182-ce7b0f8291d8." The updated event may have the start time "2017 Apr. 1 13:48:23-05:00," the end time "2017 Apr. 1 13:54:11-05:00," and the state "High Pressure Alarm" as specified in the request. In some embodiments, event service 303 responds to the request by acknowledging that the event has been updated.

In some embodiments, event service 303 is configured to read the events of an eventseries. For example, event service 303 can receive a request to identify all of the events associated with an eventseries. The request may be specified as a get request as follows:

Get {timeseries V2}/eventseries/c7c157e4-303f-4b25-b182-ce7b0f8291d8/events where "c7c157e4-303f-4b25-b182-ce7b0f8291d8" is the EventseriesID of a specific eventseries.

In response to this request, event service 303 can search for all events of the specified eventseries and can return a list of the identified events. An example response which can be provided by event service 303 is as follows:

```
[
  {
    "eventid": "g9c197e4-003f-4u25-b182-se7b0f81945y",
    "eventseriesId": "c7c157e4-303f-4b25-b182-ce7b0f8291d8",
    "startTimestamp": "2017-04-01 13:48:23-05:00",
  "endTimestamp": "2017-04-01 13:54:11-05:00",
  "state": "High Pressure Alarm"
  }
]
``` where "g9c197e4-003f-4u25-b182-se7b0f81945y" is the EventID of an identified event matching the search param-eters. The response may specify the EventseriesID, Start-Timestamp, EndTimestamp, and State properties of each identified event.

In some embodiments, event service 303 is configured to search for the events of an eventseries that have a specific state. For example, event service 303 can receive a request to identify all of the events associated with a particular eventseries which have a specific state. The request may be specified as a get request as follows:

Get {timeseries V2}/eventseries/c7c157e4-303f-4b25-b182-ce7b0f8291d8/events?state=Hot where "c7c157e4-303f-4b25-b182-ce7b0f8291d8" is the EventseriesID of a particular eventseries and "state=Hot" specifies that the search should return only events of the eventseries that have the state "Hot." In response to this request, event service 303 may search for all matching events (i.e., events of the specified eventseries that have the specified state) and may return a list of events that match the search parameters.

In some embodiments, event service 303 is configured to search for the events of an eventseries that have a start time or end time matching a given value. For example, event service 303 can receive a request to identify all of the events of a particular eventseries that have a start time or end time that matches a specified timestamp. The request may be specified as a get request as follows:

```
Get {timeseriesV2}/eventseries/c7c157e4-303f-4b25-b182-
ce7b0f8291d8/events?startTime=2017-04-01%2010:00:00-05:00&endTime=2017-04-
01%2010:00:00-05:00
``` where "c7c157e4-303f-4b25-b182-ce7b0f8291d8" is the EventseriesID of a particular eventseries and the "startTime" and "endTime" parameters specify the start time and end time of the event. In response to this request, event service 303 may search for all matching events (i.e., (startTime-stamp of event<startTime and endTimestamp of event>endTime) and may return a list of events that match the search parameters.

In some embodiments, event service 303 is configured to search for the events of an eventseries that have a time range overlapping (at least partially) with a specified time range. For example, event service 303 can receive a request to identify all of the events of a particular eventseries that have (1) an event start time before a specified start time and an event end time after the specified start time or (2) an event start time before a specified end time and an event end time after the specified end time. The request may be specified as a get request as follows:

```
Get {timeseriesV2}/eventseries/c7c157e4-303f-4b25-b182-
ce7b0f8291d8/events?startTime=2017-04-01%2010:00:00-05:00&endTime=2017-04-
01%2011:59:00-05:00
``` where "c7c157e4-303f-4b25-b182-ce7bof8291d8" is the EventseriesID of a particular eventseries and the "startTime" and "endTime" parameters specify the start time and end time of the event. In response to this request, event service 303 may search for all events that match the following criteria:

```
[(startTimestamp of event < startTime of query) AND (endTimestamp of event > startTime of
query)] OR [(startTimestamp of event < endTime of query) AND (endTimestamp of event >
endTime of query)]
``` and may return a list of events that match these criteria.

In some embodiments, event service 303 is configured to search for events of an eventseries that have a specific state and a time range that overlaps (at least partially) with a given time range. For example, event service 303 can receive a request to identify all of the events of a particular eventseries that have a particular state and either (1) an event start time before a specified start time and an event end time after the specified start time or (2) an event start time before a specified end time and an event end time after the specified end time. The request may be specified as a get request as follows:

```
Get {timeseriesV2}/eventseries/c7c157e4-303f-4b25-b182-
ce7b0f8291d8/events?state=Hot&startTime=2017-04-01%2010:00:00-05:00&endTime=2017-
04-01%2011:59:00-05:00
``` where "c7c157e4-303f-4b25-b182-ce7b0f8291d8" is the EventseriesID of a particular eventseries, the "state" parameter specifies a particular state, and the "startTime" and "endTime" parameters specify the start time and end time of the event. In response to this request, event service 303 may search for all events that match the following criteria:

```
State=Hot AND
[(startTimestamp of event < startTime of query) AND (endTimestamp of event > startTime of
query)] OR [(startTimestamp of event < endTime of query) AND (endTimestamp of event >
endTime of query)]
``` and may return a list of events that match these criteria.

Directed Acyclic Graphs

Referring again to FIG. 3, timeseries processing engine 304 is shown to include a directed acyclic graph (DAG) generator 320. DAG generator 320 can be configured to generate one or more DAGs for each raw data timeseries. Each DAG may define a workflow or sequence of operations which can be performed by timeseries operators 306 on the raw data timeseries. When new samples of the raw data timeseries are received, workflow manager 322 can retrieve the corresponding DAG and use the DAG to determine how the raw data timeseries should be processed. In some embodiments, the DAGs are declarative views which represent the sequence of operations applied to each raw data timeseries. The DAGs may be designed for timeseries rather than structured query language (SQL). In some embodiments, each DAG (i.e., each timeseries processing workflow) applies to one or more input timeseries and is triggered when a new sample of any of the one or more input timeseries is received.

In some embodiments, DAGs apply over windows of time. For example, the timeseries processing operations defined by a DAG may include a data aggregation operation that aggregates a plurality of raw data samples having timestamps within a given time window. The start time and end time of the time window may be defined by the DAG and the timeseries to which the DAG is applied. The DAG may define the duration of the time window over which the data aggregation operation will be performed. For example, the DAG may define the aggregation operation as an hourly aggregation (i.e., to produce an hourly data rollup timeseries), a daily aggregation (i.e., to produce a daily data rollup timeseries), a weekly aggregation (i.e., to produce a weekly data rollup timeseries), or any other aggregation duration. The position of the time window (e.g., a specific day, a specific week, etc.) over which the aggregation is performed may be defined by the timestamps of the data samples of timeseries provided as an input to the DAG.

In operation, sample aggregator 308 can use the DAG to identify the duration of the time window (e.g., an hour, a day, a week, etc.) over which the data aggregation operation will be performed. Sample aggregator 308 can use the time-stamps of the data samples in the timeseries provided as an input to the DAG to identify the location of the time window (i.e., the start time and the end time). Sample aggregator 308 can set the start time and end time of the time window such that the time window has the identified duration and includes the timestamps of the data samples. In some embodiments, the time windows are fixed, having predefined start times and end times (e.g., the beginning and end of each hour, day, week, etc.). In other embodiments, the time windows may be sliding time windows, having start times and end times that depend on the timestamps of the data samples in the input timeseries.

Figures 10A, 10B:
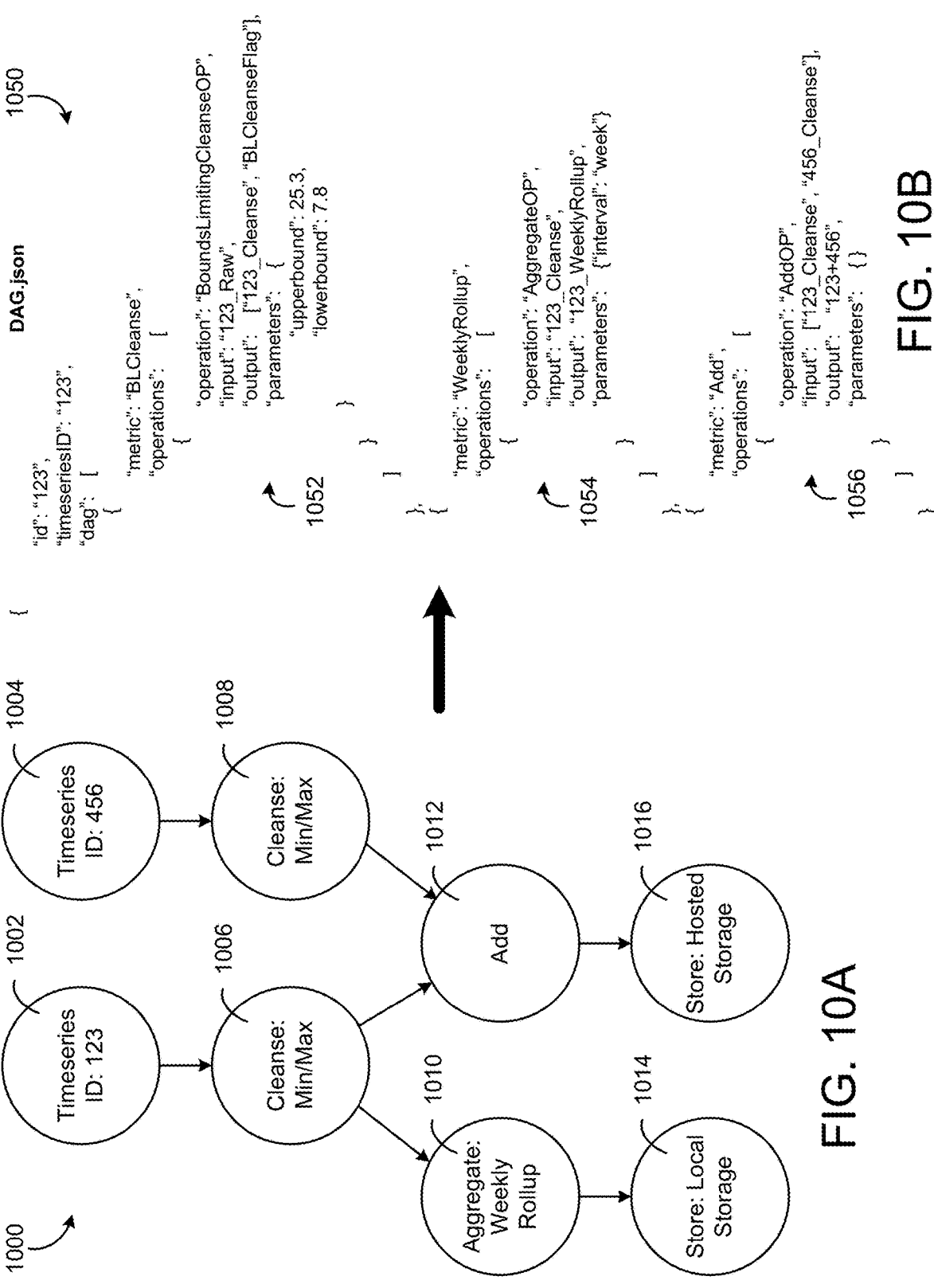
FIG. 10A is a directed acyclic graph (DAG) which can be generated by the DAG generator of FIG. 3, according to some embodiments.
FIG. 10B is a code snippet which can be automatically generated by the DAG generator of FIG. 3 based on the DAG, according to some embodiments.

Referring now to FIG. 10A, an example of a DAG 1000 which can be created by DAG generator 320 is shown, according to an exemplary embodiment. DAG 1000 is shown as a structured tree representing a graph of the dataflow rather than a formal scripting language. Blocks 1002 and 1004 represent the input timeseries which can be specified by timeseries ID (e.g., ID 123, ID 456, etc.). Blocks 1006 and 1008 are functional blocks representing data cleansing operations. Similarly, block 1010 is a functional block representing a weekly rollup aggregation and block 1012 is a functional block representing an addition operation. Blocks 1014 and 1016 represent storage operations indicating where the output of DAG 1000 should be stored (e.g., local storage, hosted storage, etc.).

In DAG 1000, the arrows connecting blocks 1002-1016 represent the flow of data and indicate the sequence in which the operations defined by the functional blocks should be performed. For example, the cleansing operation represented by block 1006 will be the first operation performed on the timeseries represented by block 1002. The output of the cleansing operation in block 1006 will then be provided as an input to both the aggregation operation represented by block 1010 and the addition operation represented by block 1012. Similarly, the cleansing operation represented by block 1008 will be the first operation performed on the timeseries represented by block 1004. The output of the cleansing operation in block 1008 will then be provided as an input to the addition operation represented by block 1012.

In some embodiments, DAG 1000 can reference other DAGs as inputs. Timeseries processing engine 304 can stitch the DAGs together into larger groups. DAG 1000 can support both scalar operators (e.g., run this function on this sample at this timestamp) and aggregate window operators (e.g., apply this function over all the values in the timeseries from this time window). The time windows can be arbitrary and are not limited to fixed aggregation windows. Logical operators can be used to express rules and implement fault detection algorithms. In some embodiments, DAG 1000 supports user-defined functions and user-defined aggregates.

In some embodiments, DAG 1000 is created based on user input. A user can drag-and-drop various input blocks 1002-1004, functional blocks 1006-1012, and output blocks 1014-1016 into DAG 1000 and connect them with arrows to define a sequence of operations. The user can edit the operations to define various parameters of the operations. For example, the user can define parameters such as upper and lower bounds for the data cleansing operations in blocks 1006-1008 and an aggregation interval for the aggregation operation in block 1010. DAG 1000 can be created and edited in a graphical drag-and-drop flow editor without requiring the user to write or edit any formal code. In some embodiments, DAG generator 320 is configured to automatically generate the formal code used by timeseries operators 306 based on DAG 1000.

Referring now to FIG. 10B, an example of code 1050 which can be generated by DAG generator 320 is shown, according to an exemplary embodiment. Code 1050 is shown as a collection of JSON objects 1052-1056 that represent the various operations defined by DAG 1000. Each JSON object corresponds to one of the functional blocks in DAG 1000 and specifies the inputs/sources, the computation, and the outputs of each block. For example, object 1052 corresponds to the cleansing operation represented by block 1006 and defines the input timeseries (i.e., "123_Raw"), the particular cleansing operation to be performed (i.e., "BoundsLimitingCleanseOP"), the parameters of the cleansing operation (i.e., "upperbound" and "lowerbound") and the outputs of the cleansing operation (i.e., "123_Cleanse" and "BLCleanseFlag").

Similarly, object 1054 corresponds to the aggregation operation represented by block 1010 and defines the input timeseries (i.e., "123_Cleanse"), the aggregation operation to be performed (i.e., "AggregateOP"), the parameter of the aggregation operation (i.e., "interval": "week") and the output of the aggregation operation (i.e., "123_WeeklyRollup"). Object 1056 corresponds to the addition operation represented by block 1012 and defines the input timeseries (i.e., "123_Cleanse" and "456_Cleanse"), the addition operation to be performed (i.e., "AddOP"), and the output of the addition operation (i.e., "123+456"). Although not specifically shown in FIG. 10B, code 1050 may include an object for each functional block in DAG 1000.

Advantageously, the declarative views defined by the DAGs provide a comprehensive view of the operations applied to various input timeseries. This provides flexibility to run the workflow defined by a DAG at query time (e.g., when a request for derived timeseries data is received) or prior to query time (e.g., when new raw data samples are received, in response to a defined event or trigger, etc.). This flexibility allows timeseries processing engine 304 to perform some or all of their operations ahead of time and/or in response to a request for specific derived data timeseries.

Referring again to FIG. 3, timeseries processing engine 304 is shown to include a DAG optimizer 318. DAG optimizer 318 can be configured to combine multiple DAGs or multiple steps of a DAG to improve the efficiency of the operations performed by timeseries operators 306. For example, suppose that a DAG has one functional block which adds "Timeseries A" and "Timeseries B" to create "Timeseries C" (i.e., A+B=C) and another functional block which adds "Timeseries C" and "Timeseries D" to create "Timeseries E" (i.e., C+D=E). DAG optimizer 318 can combine these two functional blocks into a single functional block which computes "Timeseries E" directly from "Timeseries A," "Timeseries B," and "Timeseries D" (i.e., E=A+ B+D). Alternatively, both "Timeseries C" and "Timeseries E" can be computed in the same functional block to reduce the number of independent operations required to process the DAG.

In some embodiments, DAG optimizer 318 combines DAGs or steps of a DAG in response to a determination that multiple DAGs or steps of a DAG will use similar or shared inputs (e.g., one or more of the same input timeseries). This allows the inputs to be retrieved and loaded once rather than performing two separate operations that both load the same inputs. In some embodiments, DAG optimizer 318 schedules timeseries operators 306 to nodes where data is resident in memory in order to further reduce the amount of data required to be loaded from timeseries storage 214.

Nested Stream Generation

Figure 11A:
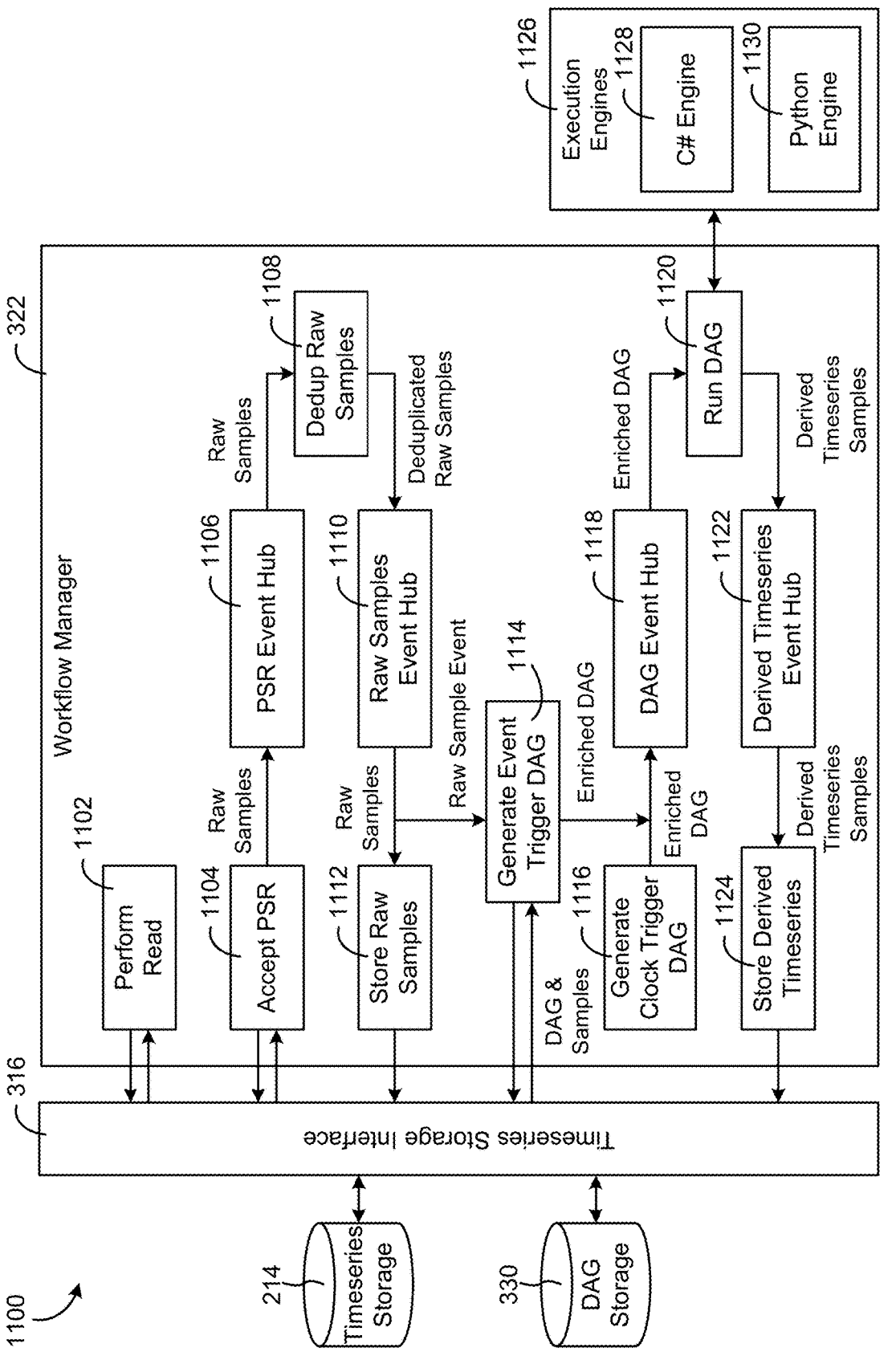
FIG. 11A is a block diagram illustrating a timeseries processing workflow which can be performed by the timeseries service of FIGS. 2-3, according to some embodiments.

Referring now to FIGS. 11A-11B, web services platform 102 can be configured to generate nested streams of timeseries data. Nested streams can include various types of derived timeseries created by processing DAGs. For example, nested streams can include data rollup timeseries, virtual point timeseries, weather point timeseries, fault detection timeseries, assigned state timeseries, abnormal event timeseries, and/or any other type of derived timeseries previously described. In some embodiments, the nested streams are created from input timeseries retrieved from timeseries storage 214 (as described with reference to FIGS. 11A-11B). In other embodiments, the nested streams are created from streaming data received in real-time from IoT devices 203 and/or other data sources (as described with reference to FIG. 14). In some embodiments, the nested streams are used as an intermediate timeseries in a timeseries processing workflow. For example, a first derived timeseries can be created by processing a first DAG and used as an input to a second DAG to create a second derived timeseries.

In some embodiments, the timeseries data contained in the nested streams are used to populate or define various types of smart entities. Smart entities are virtual representations of systems (e.g., groups of equipment), devices, people, spaces, or other items associated with web services platform 102. Smart entities may also define relationships between various systems, devices, people, and spaces. Smart entities may include attributes that describe a corresponding system, device, person, relationship, or other items represented by the smart entities. In some embodiments, the attributes of smart entities may include the nested timeseries data or may contain pointers to the nested timeseries data. The implementation of smart entities in web services platform 102 is described in detail in U.S. Provisional Patent Application No. 62/588,179 filed Nov. 17, 2017, U.S. Provisional Patent Application No. 62/588,190 filed Nov. 17, 2017, and U.S. Provisional Patent Application No. 62/611, 962 filed Dec. 29, 2017. The entire disclosures of all of these patent applications are incorporated by reference herein.

Timeseries Processing Workflow

Referring particularly to FIG. 11A, a block diagram illustrating a timeseries processing workflow 1100 is shown, according to an exemplary embodiment. Workflow 1100 may be performed by workflow manager 322 in combination with other components of timeseries service 228. Workflow 1100 is shown to include performing a read of the timeseries data (step 1102). Step 1102 may include reading raw data samples and/or the derived data samples provided by timeseries storage interface 316. The timeseries data may be stored in timeseries storage 214. In some embodiments, timeseries storage 214 includes on-site data storage (e.g., Redis, PostgreSQL, etc.) and/or cloud data storage (e.g., Azure Redis, DocDB, HBase, etc.).

Timeseries storage interface 316 can be configured to read and write a timeseries collection, a samples collection, and a post sample request (PSR) collection. Each of these collections can be stored in timeseries storage 214. The timeseries collection may contain all the timeseries registered in workflow manager 322. The timeseries collection may also contain the DAG for each timeseries. The timeseries collection can be used by workflow manager 322 to accept only PSRs related to valid timeseries registered in workflow manager 322. The timeseries collection can also be used in steps 1114-1116 to lookup the DAG for a specific timeseries ID.

In some embodiments, the entire timeseries collection is loaded into local memory. The timeseries collection can be a regular collection or a partitioned collection (e.g., one partition for approximately every 100 timeseries). In some embodiments, the timeseries collection contains about 200,000 to 250,000 timeseries. The ID for each document in the timeseries collection may be the timeseries ID. The DAG for each timeseries may contain a set of operations and/or transformations that need to be performed to generate the derived timeseries data based on the timeseries. On registration of a new timeseries, the DAG for the timeseries can be selected from DAG templates. The DAG template may include a set of standard operations applicable to the timeseries. On definition of a new metric for a timeseries, the new metric and the list of operations to generate that metric can be added to the DAG.

The samples collection may contain all of the timeseries samples (e.g., raw samples, derived timeseries samples). The samples collection can be used for all GET requests for a specific timeseries ID. A portion of the samples collection can be stored in local memory (e.g., past 48 hours) whereas the remainder of the samples collection can be stored in timeseries storage 214. The samples collection may act as a partitioned collection instead of a regular collection to improve efficiency and performance. In some embodiments, the samples collection is stored in a JSON format and partitioned on timeseries ID. The ID field may be unique for each partition and may have the form "Metric: Timestamp."

The PSR collection may contain all of the PSRs and can be used to provide status updates to the user for a PSR related to a specific timeseries ID. A portion of the PSR collection can be stored in local memory (e.g., past 48 hours) whereas the remainder of the PSR collection can be stored in timeseries storage 214. The PSR collection can be partitioned on timeseries ID. In some embodiments, the ID for each document in the PSR collection has the form "TimeseriesID: Timestamp."

Still referring to FIG. 11A, workflow 1100 is shown to include accepting a PSR (step 1104). Step 1104 may be performed by executing a PSR process. In some embodiments, the PSR process receives a PSR and determines whether the PSR contains more than one timeseries ID. In response to a determination that the PSR contains more than one timeseries ID, the PSR process may break the PSR into multiple PSRs, each of which is limited to a single timeseries ID. The PSRs can be provided to PSR event hub 1106. PSR event hub 1106 can be configured to store PSR events. Each PSR event may include a PSR for one timeseries ID. In some embodiments, each PSR event is stored in the form "TimeseriesID: Timestamp."

Workflow 1100 is shown to include deduplicating raw samples (step 1108). Step 1108 may be performed by executing a deduplication process. In some embodiments, the deduplication process includes accepting PSR events from PSR event hub 1106 and splitting each PSR into a list of samples. Step 1108 may include tagging each sample as a new sample, an updated sample, or a duplicate sample. New samples and updated samples can be sent to raw samples event hub 1110, whereas duplicate samples may be discarded. In some embodiments, step 1108 is deployed on Azure using Azure Worker Roles. Step 1108 can include checking for duplicate samples in timeseries storage 214 as well as the samples that are currently in raw samples event hub 1110.

In some embodiments, the deduplication process in step 1108 removes all duplicate data samples such that only a single unique copy of each data sample remains. Removing all duplicate samples may ensure that aggregate operations produce accurate aggregate values. In other embodiments, the deduplication process in step 1108 is configured to remove most, but not all, duplicate samples. For example, the deduplication process can be implemented using a Bloom filter, which allows for the possibility of false positives but not false negatives. In step 1108, a false positive can be defined as a non-duplicate new or updated sample. Accordingly, some duplicates may be flagged as non-duplicate, which introduces the possibility that some duplicate samples may not be properly identified and removed. The deduplicated raw samples can be sent to raw samples event hub 1110.

Workflow 1100 is shown to include storing the raw samples (step 1112). Step 1112 can include accepting the raw samples from raw samples event hub 1110 and pushing the raw samples to persistent storage. In some embodiments, step 1112 is deployed on Azure using Azure Worker Roles. The worker role may generate requests at a rate based on X % of the capacity of the storage. For example, if the capacity of the storage is 10,000 storage units and X % is 20% (e.g., 20% of the storage throughput is reserved for sample writes), and each write takes 5 storage units, step 1112 may generate a total of 400 writes per second (i.e., 10,000*20%/5=400).

Workflow 1100 is shown to include generating an event trigger DAG (step 1114). Step 1114 can be performed by executing an event trigger DAG process. Step 1114 may include accepting events (samples) from raw samples event hub 1110. For each sample event, step 1114 may include identifying the timeseries ID of the sample and accessing the timeseries collection to obtain the DAG for the corresponding timeseries. Step 1114 may include identifying each derived data timeseries generated by the DAG and each operation included in the DAG. In some embodiments, step 1114 tags each operation to indicate whether the operation should be sent to the C# engine 1332 or the Python engine 1130 for execution. While C# and Python are provided as example engines that may be utilized for operation execution, it should be understood that, in various embodiments, any engine based in any suitable programming language may be utilized. Step 1114 may include identifying and fetching any additional data (e.g., samples, timeseries, parameters, etc.) which may be necessary to perform the operations defined by the DAG. Step 1114 may generate an enriched DAG which includes the original DAG along with all the data necessary to perform the operations defined by the DAG. The enriched DAG can be sent to the DAG event hub 1118.

In some embodiments, workflow 1100 includes generating a clock trigger DAG (step 1116). Step 1116 can be performed by executing a clock trigger DAG process. Step 1116 may be similar to step 1114. However, step 1116 may be performed in response to a clock trigger rather than in response to receiving a raw sample event. The clock trigger can periodically trigger step 1116 to perform batch queries (e.g., every hour). Step 1116 may include identifying a timeseries ID specified in the clock trigger and accessing the timeseries collection to obtain the DAG for the corresponding timeseries. Step 1116 may include identifying each derived data timeseries generated by the DAG and each operation included in the DAG. In some embodiments, step 1116 tags each operation to indicate whether the operation should be sent to the C# engine 1332 or the Python engine 1130 for execution. Step 1116 may include identifying and fetching any additional data (e.g., samples, timeseries, parameters, etc.) which may be necessary to perform the operations defined by the DAG. Step 1116 may generate an enriched DAG which includes the original DAG along with all the data necessary to perform the operations defined by the DAG. The enriched DAG can be sent to the DAG event hub 1118.

DAG event hub 1118 can be configured to store enriched DAG events. Each enriched DAG event can include an enriched DAG. The enriched DAG may include a DAG for a particular timeseries along with all the data necessary to perform the operations defined by the DAG. DAG event hub 1118 can provide the enriched DAG events to step 1120.

Still referring to FIG. 11A, workflow 1100 is shown to include running the DAG (step 1120). Step 1120 can include accepting enriched DAG events from DAG event hub 1118 and running through the sequence of operations defined by the DAG. Workflow manager 322 can submit each operation in series to execution engines 1126 and wait for results before submitting the next operation. Execution engines 1126 may include a C# engine 1332, a Python engine 1130, or any other engine configured to perform the operations defined by the DAG. In some embodiments, execution engines 1126 include timeseries operators 306. When a given operation is complete, execution engines 1126 can provide the results of the operation to workflow manager 322. Workflow manager 322 can use the results of one or more operations as inputs for the next operation, along with any other inputs that are required to perform the operation. In some embodiments, the results of the operations are the derived timeseries samples. The derived timeseries samples can be provided to derived timeseries event hub 1122.

Derived timeseries event hub 1122 can be configured to store derived timeseries sample. Each derived timeseries sample may include a sample of a derived timeseries. The derived timeseries may include the results of the operations performed by execution engines 1126. Derived timeseries event hub 1122 can provide the derived timeseries samples to step 1324.

Workflow 1100 is shown to include storing the derived timeseries samples (step 1324). Step 1324 can include accepting derived timeseries samples from derived timeseries event hub 1122 and storing the derived timeseries samples in persistent storage (e.g., timeseries storage 214). In some embodiments, step 1324 is deployed on Azure using Azure Worker Roles. The worker role may generate requests at a rate based on Y % of the capacity of the storage. For example, if the capacity of the storage is 10,000 storage units and Y % is 50% (e.g., 50% of the storage throughput is reserved for sample writes), and each write takes 5 storage units, step 1324 may generate a total of 1,000 writes per second $$\left( \text{i.e.,} \ \frac{10{,}000 * 50\%}{5} = 1{,}000 \right).$$

Referring now to FIG. 11B, a flowchart of a process 1150 for obtaining and processing timeseries data is shown, according to an exemplary embodiment. Process 1150 can be performed by workflow manager 322 in combination with other components of timeseries service 228. Process 1150 is shown to include obtaining samples of a timeseries from timeseries storage (step 1152). Step 1152 may include obtaining raw data samples and/or derived data samples via timeseries storage interface 316. The samples of the timeseries may be obtained from timeseries storage 214 or received in real-time from a sensor or other device that generates the samples. Step 1152 can include loading the entire timeseries or a subset of the samples of the timeseries into local memory. For example, some of the samples of the timeseries may be stored in local memory (e.g., past 48 hours) whereas the remainder of the samples of the timeseries can be stored in timeseries storage 214.

Process 1150 is shown to include handling a post-sample request (PSR) associated with the timeseries (step 1154). The PSR may be obtained from a PSR collection via timeseries storage interface 316. The PSR can be used to provide status updates to the user for a specific timeseries ID. In some embodiments, step 1154 includes receiving a PSR and determining whether the PSR contains more than one timeseries ID. In response to a determination that the PSR contains more than one timeseries ID, step 1154 may include breaking the PSR into multiple PSRs, each of which is limited to a single timeseries ID. The PSRs can be provided to PSR event hub 1106 and stored as PSR events. Each PSR event may include a PSR for one timeseries ID. In some embodiments, each PSR event is stored in the form "TimeseriesID: Timestamp."

Process 1150 is shown to include deduplicating samples of the timeseries (step 1156). Step 1156 may be performed by executing a deduplication process. In some embodiments, the deduplication process includes accepting PSR events from PSR event hub 1106 and splitting each PSR into a list of samples. Step 1156 may include tagging each sample as a new sample, an updated sample, or a duplicate sample. New samples and updated samples can be sent to raw samples event hub 1110, whereas duplicate samples may be discarded. In some embodiments, step 1156 is deployed on Azure using Azure Worker Roles. Step 1156 can include checking for duplicate samples in timeseries storage 214 as well as the samples that are currently in raw samples event hub 1110.

In some embodiments, the deduplication process in step 1156 removes all duplicate data samples such that only a single unique copy of each data sample remains. Removing all duplicate samples may ensure that aggregate operations produce accurate aggregate values. In other embodiments, the deduplication process in step 1156 is configured to remove some, but not all, duplicate samples. For example, the deduplication process can be implemented using a Bloom filter, which allows for the possibility of false positives but not false negatives. In step 1156, a false positive can be defined as a non-duplicate new or updated sample. Accordingly, some duplicates may be flagged as non-duplicate, which introduces the possibility that some duplicate samples may not be properly identified and removed. The deduplicated samples can be sent to raw samples event hub 1110.

Still referring to FIG. 11B, process 1150 is shown to include identifying one or more stored DAGs that use the timeseries as an input (step 1158). Step 1158 can include obtaining the stored DAGs via timeseries storage interface 316 and identifying the required timeseries inputs of each DAG. For each DAG that uses the timeseries as an input, process 1150 can identify the timeseries processing operations defined by the DAG (step 1160). The timeseries processing operations can include data cleansing operations, data aggregation operations, timeseries adding operations, virtual point calculation operations, or any other type of operation that can be applied to one or more input timeseries.

Process 1150 is shown to include identifying and obtaining samples of any timeseries required to perform the timeseries processing operations (step 1162). The timeseries can be identified by inspecting the inputs required by each of the timeseries processing operations identified in step 1160. For example, DAG 1000 in FIG. 10A is shown to include both "Timeseries ID: 123" and "Timeseries ID: 456" as required inputs. Assuming that samples of the timeseries ID 123 are obtained in step 1152, DAG 1000 can be identified in step 1158 as a DAG that uses the timeseries ID 123 as an input. The timeseries identified in step 1162 can include timeseries ID 123, timeseries ID 456, or any other timeseries used as an input to DAG 1000. Step 1162 may include identifying and fetching any additional data (e.g., samples, timeseries, parameters, etc.) which may be necessary to perform the operations defined by the DAG.

In some embodiments, the samples obtained in step 1162 are based on the timeseries processing operations defined by the DAG, as well as the timestamps of the original samples obtained in step 1152. For example, the DAG may include a data aggregation operation that aggregates a plurality of data samples having timestamps within a given time window. The start time and end time of the time window may be defined by the DAG and the timeseries to which the DAG is applied. The DAG may define the duration of the time window over which the data aggregation operation will be performed. For example, the DAG may define the aggregation operation as an hourly aggregation (i.e., to produce an hourly data rollup timeseries), a daily aggregation (i.e., to produce a daily data rollup timeseries), a weekly aggregation (i.e., to produce a weekly data rollup timeseries), or any other aggregation duration. The position of the time window (e.g., a specific day, a specific week, etc.) over which the aggregation is performed may be defined by the timestamps of the samples obtained in step 1152.

Step 1162 can include using the DAG to identify the duration of the time window (e.g., an hour, a day, a week, etc.) over which the data aggregation operation will be performed. Step 1162 can include using the timestamps of the data samples obtained in step 1152 identify the location of the time window (i.e., the start time and the end time). Step 1162 can include setting the start time and end time of the time window such that the time window has the identified duration and includes the timestamps of the data samples obtained in step 1152. In some embodiments, the time windows are fixed, having predefined start times and end times (e.g., the beginning and end of each hour, day, week, etc.). In other embodiments, the time windows may be sliding time windows, having start times and end times that depend on the timestamps of the data samples in the input timeseries. Once the appropriate time window has been set and the other input timeseries are identified, step 1162 can obtain samples of any input timeseries to the DAG that have timestamps within the appropriate time window. The input timeseries can include the original timeseries identified in step 1152 and any other timeseries used as input to the DAG.

Process 1150 is shown to include generating an enriched DAG including the original DAG and all timeseries samples required to perform the timeseries processing operations (step 1164). The original DAG may be the DAG identified in step 1158. The timeseries samples required to perform the timeseries processing operations may include any of the timeseries samples obtained in step 1162. In some embodiments, step 1164 includes identifying each derived data timeseries generated by the DAG and each operation included in the DAG. In some embodiments, step 1164 tags each operation to indicate a particular execution engine (e.g., C# engine 1332, Python engine 1130, etc.) to which the processing operation should be sent for execution.

Process 1150 is shown to include executing the enriched DAG to generate one or more derived timeseries (step 1166). Step 1166 can include submitting each timeseries processing operation in series to execution engines 1126 and waiting for results before submitting the next operation. When a given operation is complete, execution engines 1126 can provide the results of the operation to workflow manager 322. Process 1150 can use the results of one or more operations as inputs for the next operation, along with any other inputs that are required to perform the operation. In some embodiments, the results of the operations are the derived timeseries samples.

Process 1150 is shown to include storing the derived timeseries in the timeseries storage (step 1168). The derived timeseries may include the results of the operations performed in step 1166. Step 1168 can include accepting derived timeseries samples from derived timeseries event hub 1122 and storing the derived timeseries samples in persistent storage (e.g., timeseries storage 214). In some embodiments, step 1168 is deployed on Azure using Azure Worker Roles. The worker role may generate requests at a rate based on Y % of the capacity of the storage. For example, if the capacity of the storage is 10,000 storage units and Y % is 50% (e.g., 50% of the storage throughput is reserved for sample writes), and each write takes 5 storage units, step 1168 may generate a total of 1,000 writes per second $$\left( i.e., \frac{10,000 * 50\%}{5} = 1,000 \right).$$

Building and Building Management System

Figure 12:
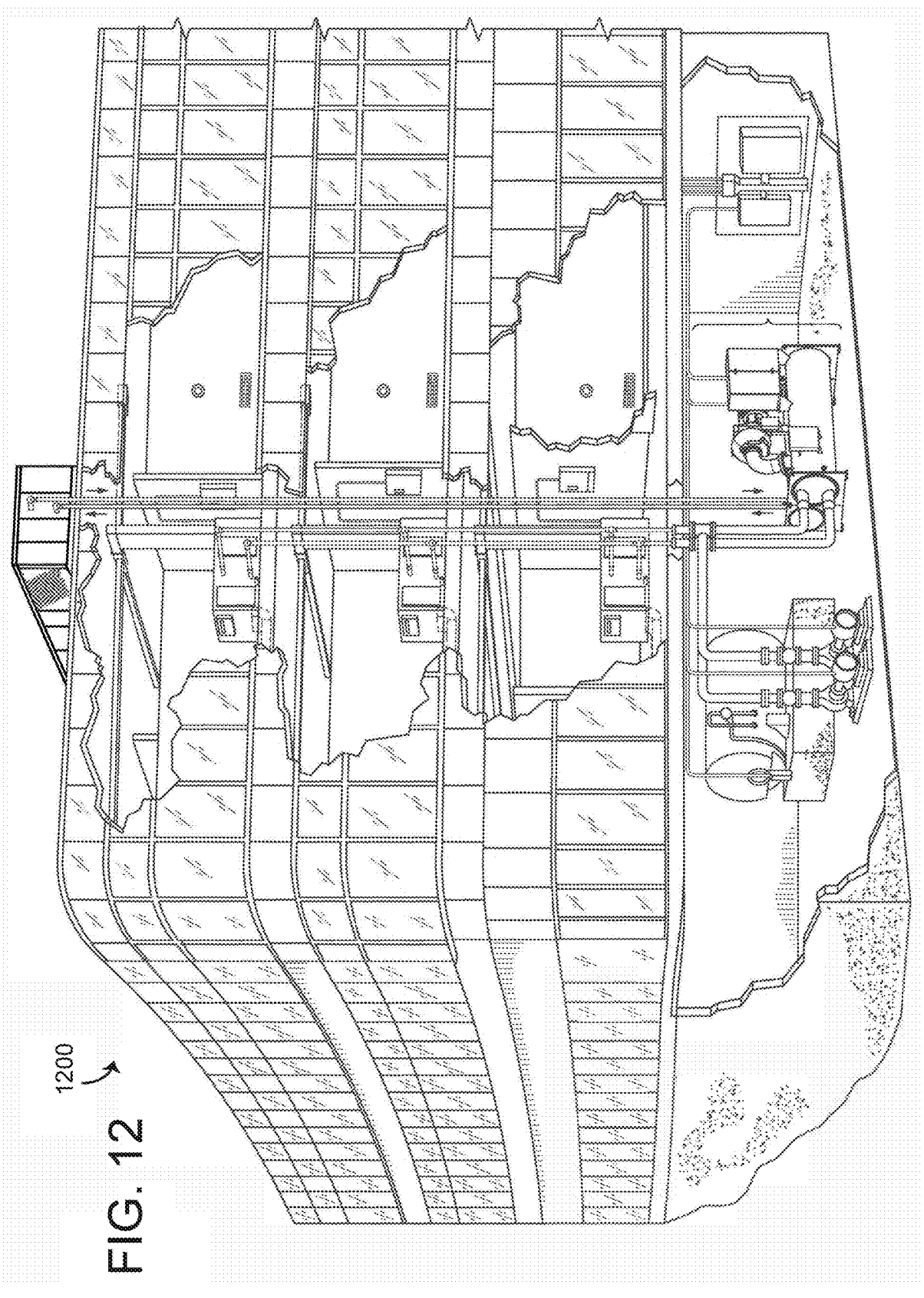
FIG. 12 is a drawing of a building equipped with a building management system (BMS), according to some embodiments.

Referring now to FIG. 12, a perspective view of a building 1200 is shown, according to an exemplary embodiment. A BMS serves building 1200. The BMS for building 1200 may include any number or type of devices that serve building 1200. For example, each floor may include one or more security devices, video surveillance cameras, fire detectors, smoke detectors, lighting systems, HVAC systems, or other building systems or devices. In modern BMSs, BMS devices can exist on different networks within the building (e.g., one or more wireless networks, one or more wired networks, etc.) and yet serve the same building space or control loop. For example, BMS devices may be connected to different communications networks or field controllers even if the devices serve the same area (e.g., floor, conference room, building zone, tenant area, etc.) or purpose (e.g., security, ventilation, cooling, heating, etc.).

BMS devices may collectively or individually be referred to as building equipment. Building equipment may include any number or type of BMS devices within or around building 1200. For example, building equipment may include controllers, chillers, rooftop units, fire and security systems, elevator systems, thermostats, lighting, serviceable equipment (e.g., vending machines), and/or any other type of equipment that can be used to control, automate, or otherwise contribute to an environment, state, or condition of building 1200. The terms "BMS devices," "BMS device" and "building equipment" are used interchangeably through-out this disclosure.

Figure 13:
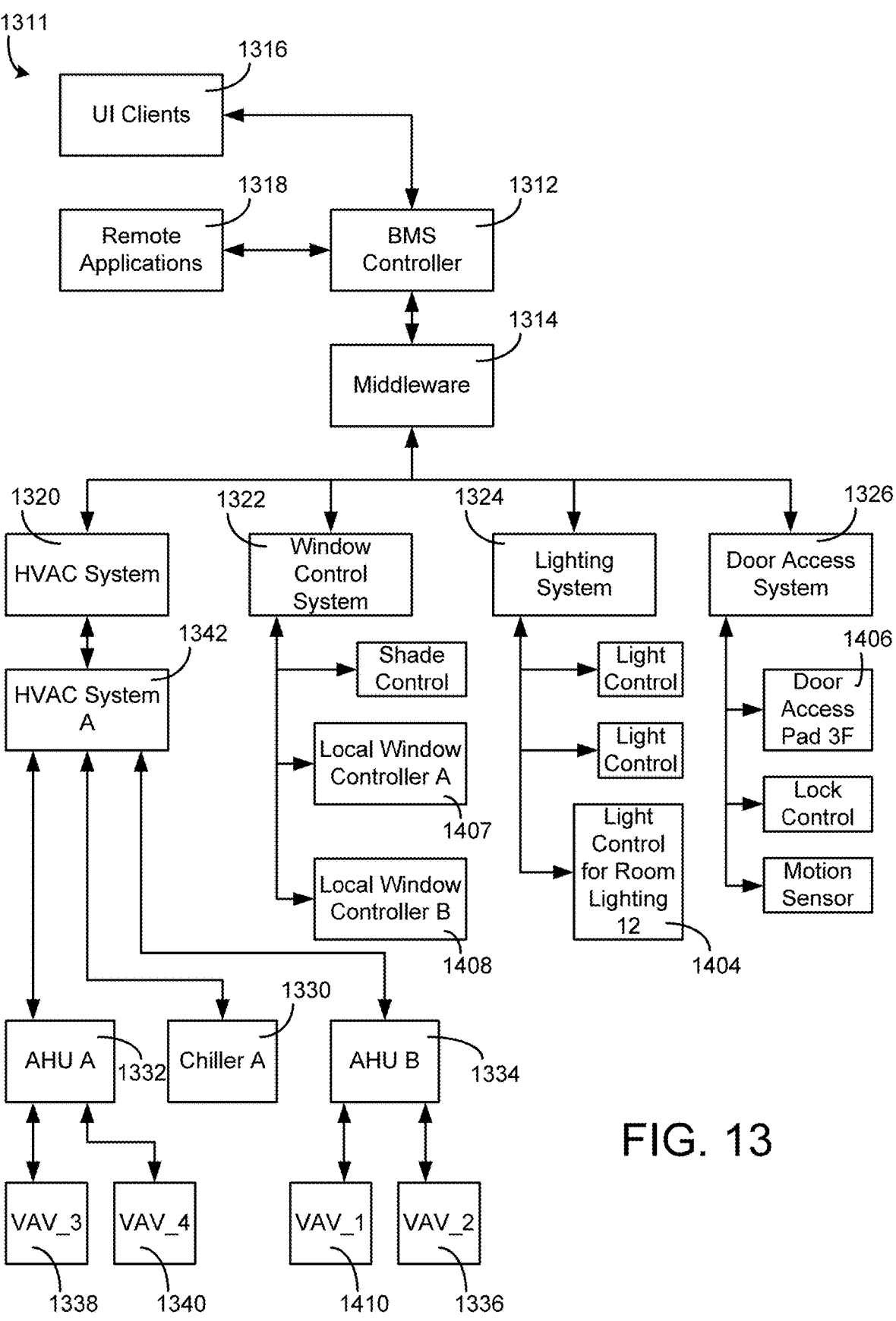
FIG. 13 is a block diagram of a BMS that serves the building of FIG. 1, according to some embodiments.

Referring now to FIG. 13, a block diagram of a BMS 1311 for building 1200 is shown, according to an exemplary embodiment. BMS 1311 is shown to include a plurality of BMS subsystems 1320-1326. Each BMS subsystem 1320-1326 is connected to a plurality of BMS devices and makes data points for varying connected devices available to upstream BMS controller 1312. Additionally, BMS subsystems 1320-1326 may encompass other lower-level subsystems. For example, an HVAC system may be broken down further as "HVAC system A," "HVAC system B," etc. In some buildings, multiple HVAC systems or subsystems may exist in parallel and may not be a part of the same HVAC system 1320.

As shown in FIG. 13, BMS 1311 may include a HVAC system 1320. HVAC system 1320 may control HVAC operations building 1200. HVAC system 1320 is shown to include a lower-level HVAC system 1342 (named "HVAC system A"). HVAC system 1342 may control HVAC operations for a specific floor or zone of building 1200. HVAC system 1342 may be connected to air handling units (AHUs) 1332, 1334 (named "AHU A" and "AHU B," respectively, in BMS 11). AHU 1332 may serve variable air volume (VAV) boxes 1338, 1340 (named "VAV_3" and "VAV_4" in BMS 11). Likewise, AHU 1334 may serve VAV boxes 1336 and 110 (named "VAV_2" and "VAV_1"). HVAC system 1342 may also include chiller 1330 (named "Chiller A" in BMS 11). Chiller 1330 may provide chilled fluid to AHU 1332 and/or to AHU 34. HVAC system 1342 may receive data (i.e., BMS inputs such as temperature sensor readings, damper positions, temperature setpoints, etc.) from AHUs 131323, 34. HVAC system 1342 may provide such BMS inputs to HVAC system 1320 and on to middleware 14 and BMS controller 1312. Similarly, other BMS subsystems may receive inputs from other building devices or objects and provide the received inputs to BMS controller 1312 (e.g., via middle-ware 14).

Middleware 1314 may include services that allow interoperable communication to, from, or between disparate BMS subsystems 1320-1326 of BMS 1311 (e.g., HVAC systems from different manufacturers, HVAC systems that communicate according to different protocols, security/fire systems, IT resources, door access systems, etc.). Middleware 1314 may be, for example, an EnNet server sold by Johnson Controls, Inc. While middleware 1314 is shown as separate from BMS controller 1312, middleware 1314 and BMS controller 1312 may integrated in some embodiments. For example, middleware 1314 may be a part of BMS controller 1312.

Still referring to FIG. 13, window control system 1322 may receive shade control information from one or more shade controls, ambient light level information from one or more light sensors, and/or other BMS inputs (e.g., sensor information, setpoint information, current state information, etc.) from downstream devices. Window control system 1322 may include window controllers 1407, 1408 (e.g., named "local window controller A" and "local window controller B," respectively, in BMS 11). Window controllers 1407, 1408 control the operation of subsets of window control system 1322. For example, window controller 1408 may control window blind or shade operations for a given room, floor, or building in the BMS.

Lighting system 1324 may receive lighting related information from a plurality of downstream light controls (e.g., from room lighting 1404). Door access system 1326 may receive lock control, motion, state, or other door related information from a plurality of downstream door controls. Door access system 1326 is shown to include door access pad 1406 (named "Door Access Pad 3F"), which may grant or deny access to a building space (e.g., a floor, a conference room, an office, etc.) based on whether valid user credentials are scanned or entered (e.g., via a keypad, via a badge-scanning pad, etc.).

BMS subsystems 1320-1326 may be connected to BMS controller 1312 via middleware 1314 and may be configured to provide BMS controller 1312 with BMS inputs from various BMS subsystems 1320-1326 and their varying downstream devices. BMS controller 1312 may be configured to make differences in building subsystems transparent at the human-machine interface or client interface level (e.g., for connected or hosted user interface (UI) clients 1316, remote applications 1318, etc.). BMS controller 1312 may be configured to describe or model different building devices and building subsystems using common or unified objects (e.g., software objects stored in memory) to help provide the transparency. Software equipment objects may allow developers to write applications capable of monitoring and/or controlling various types of building equipment regardless of equipment-specific variations (e.g., equipment model, equipment manufacturer, equipment version, etc.). Software building objects may allow developers to write applications capable of monitoring and/or controlling building zones on a zone-by-zone level regardless of the building subsystem makeup.

Figure 14:
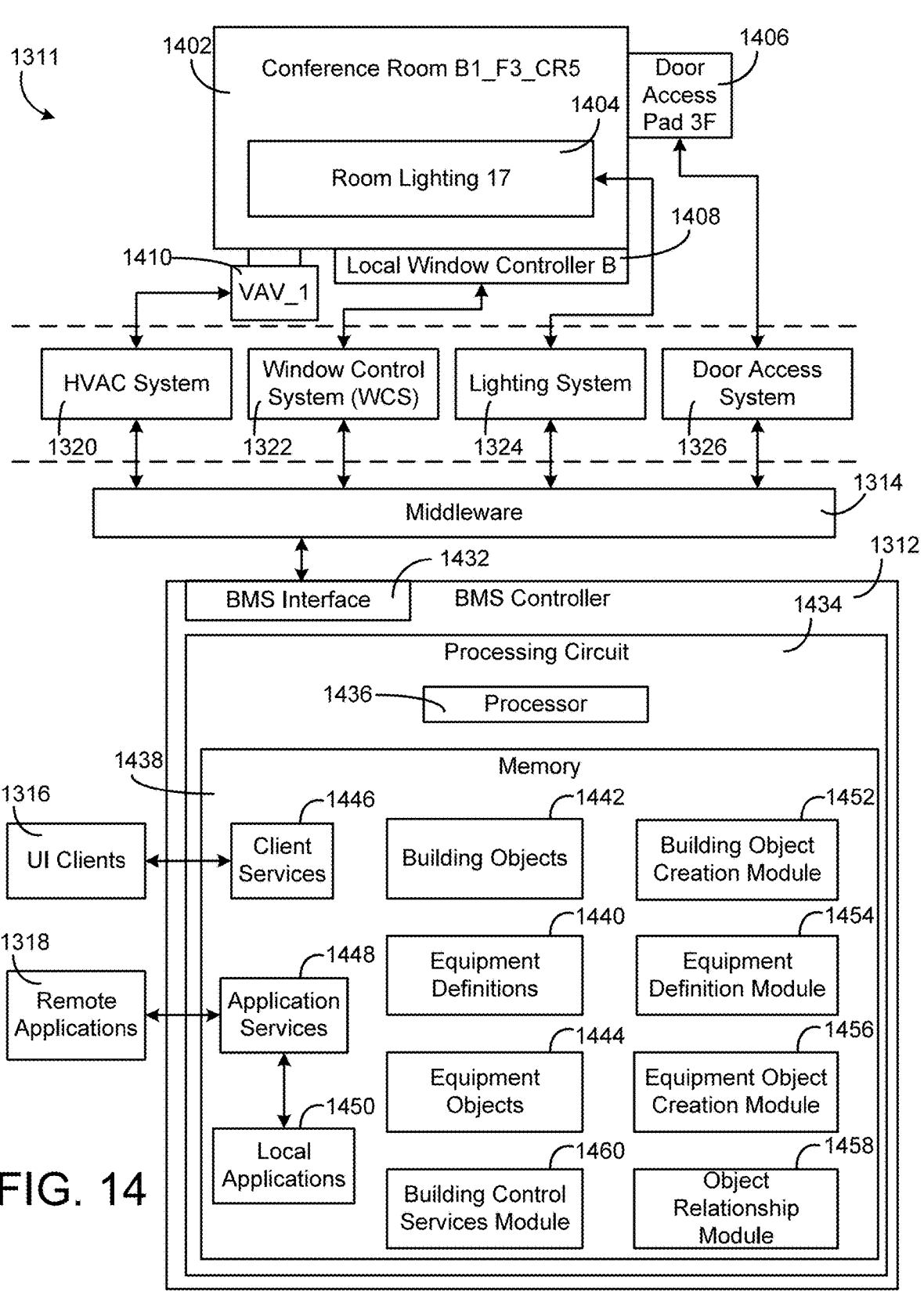
FIG. 14 is a block diagram of a BMS controller which can be used in the BMS of FIG. 2, according to some embodiments.

Referring now to FIG. 14, a block diagram illustrating a portion of BMS 1311 in greater detail is shown, according to an exemplary embodiment. Particularly, FIG. 14 illustrates a portion of BMS 1311 that services a conference room 1402 of building 1200 (named "B1_F3_CR5"). Conference room 1402 may be affected by many different building devices connected to many different BMS subsystems. For example, conference room 1402 includes or is otherwise affected by VAV box 1410, window controller 1408 (e.g., a blind controller), a system of lights 1404 (named "Room Lighting 17"), and a door access pad 1406.

Each of the building devices shown at the top of FIG. 14 may include local control circuitry configured to provide signals to their supervisory controllers or more generally to the BMS subsystems 1320-1326. The local control circuitry of the building devices shown at the top of FIG. 3 may also be configured to receive and respond to control signals, commands, setpoints, or other data from their supervisory controllers. For example, the local control circuitry of VAV box 1410 may include circuitry that affects an actuator in response to control signals received from a field controller that is a part of HVAC system 1320. Window controller 1408 may include circuitry that affects windows or blinds in response to control signals received from a field controller that is part of window control system (WCS) 1322. Room lighting 14104 may include circuitry that affects the lighting in response to control signals received from a field controller that is part of lighting system 1324. Access pad 1406 may include circuitry that affects door access (e.g., locking or unlocking the door) in response to control signals received from a field controller that is part of door access system 1326.

Still referring to FIG. 4, BMS controller 1312 is shown to include a BMS interface 1432 in communication with middleware 1314. In some embodiments, BMS interface 1432 is a communications interface. For example, BMS interface 1432 may include wired or wireless interfaces (e.g., jacks, antennas, transmitters, receivers, transceivers, wire terminals, etc.) for conducting data communications with various systems, devices, or networks. BMS interface 1432 can include an Ethernet card and port for sending and receiving data via an Ethernet-based communications network. In another example, BMS interface 1432 includes a Wi-Fi transceiver for communicating via a wireless communications network. BMS interface 1432 may be configured to communicate via local area networks or wide area networks (e.g., the Internet, a building WAN, etc.).

In some embodiments, BMS interface 1432 and/or middleware 1314 includes an application gateway configured to receive input from applications running on client devices. For example, BMS interface 1432 and/or middleware 1314 may include one or more wireless transceivers (e.g., a Wi-Fi transceiver, a Bluetooth transceiver, a NFC transceiver, a cellular transceiver, etc.) for communicating with client devices. BMS interface 1432 may be configured to receive building management inputs from middleware 1314 or directly from one or more BMS subsystems 1320-1326. BMS interface 1432 and/or middleware 1314 can include any number of software buffers, queues, listeners, filters, translators, or other communications-supporting services.

Still referring to FIG. 14, BMS controller 1312 is shown to include a processing circuit 1434 including a processor 14436 and memory 138. Processor 1436 may be a general purpose or specific purpose processor, an application specific integrated circuit (ASIC), one or more field programmable gate arrays (FPGAs), a group of processing components, or other suitable processing components. Processor 14436 is configured to execute computer code or instructions stored in memory 138 or received from other computer readable media (e.g., CDROM, network storage, a remote server, etc.).

Memory 1438 may include one or more devices (e.g., memory units, memory devices, storage devices, etc.) for storing data and/or computer code for completing and/or facilitating the various processes described in the present disclosure. Memory 1438 may include random access memory (RAM), read-only memory (ROM), hard drive storage, temporary storage, non-volatile memory, flash memory, optical memory, or any other suitable memory for storing software objects and/or computer instructions. Memory 1438 may include database components, object code components, script components, or any other type of information structure for supporting the various activities and information structures described in the present disclosure. Memory 1438 may be communicably connected to processor 1436 via processing circuit 1434 and may include computer code for executing (e.g., by processor 1436) one or more processes described herein. When processor 1436 executes instructions stored in memory 1438 for completing the various activities described herein, processor 1436 generally configures BMS controller 1312 (and more particularly processing circuit 1434) to complete such activities.

Still referring to FIG. 14, memory 1438 is shown to include building objects 1442. In some embodiments, BMS controller 1312 uses building objects 1442 to group otherwise ungrouped or unassociated devices so that the group may be addressed or handled by applications together and in a consistent manner (e.g., a single user interface for controlling all of the BMS devices that affect a particular building zone or room). Building objects can apply to spaces of any granularity. For example, a building object can represent an entire building, a floor of a building, or individual rooms on each floor. In some embodiments, BMS controller 1312 creates and/or stores a building object in memory 1438 for each zone or room of building 1200. Building objects 1442 can be accessed by UI clients 1316 and remote applications 1318 to provide a comprehensive user interface for controlling and/or viewing information for a particular building zone. Building objects 1442 may be created by building object creation module 1452 and associated with equipment objects by object relationship module 1458, described in greater detail below.

Still referring to FIG. 14, memory 1438 is shown to include equipment definitions 1440. Equipment definitions 1440 stores the equipment definitions for various types of building equipment. Each equipment definition may apply to building equipment of a different type. For example, equipment definitions 1440 may include different equipment definitions for variable air volume modular assemblies (VMAs), fan coil units, air handling units (AHUs), lighting fixtures, water pumps, and/or other types of building equipment.

Equipment definitions 1440 define the types of data points that are generally associated with various types of building equipment. For example, an equipment definition for VMA may specify data point types such as room temperature, damper position, supply air flow, and/or other types data measured or used by the VMA. Equipment definitions 1440 allow for the abstraction (e.g., generalization, normalization, broadening, etc.) of equipment data from a specific BMS device so that the equipment data can be applied to a room or space.

Each of equipment definitions 1440 may include one or more point definitions. Each point definition may define a data point of a particular type and may include search criteria for automatically discovering and/or identifying data points that satisfy the point definition. An equipment definition can be applied to multiple pieces of building equipment of the same general type (e.g., multiple different VMA controllers). When an equipment definition is applied to a BMS device, the search criteria specified by the point definitions can be used to automatically identify data points provided by the BMS device that satisfy each point definition.

In some embodiments, equipment definitions 1440 define data point types as generalized types of data without regard to the model, manufacturer, vendor, or other differences between building equipment of the same general type. The generalized data points defined by equipment definitions 1440 allows each equipment definition to be referenced by or applied to multiple different variants of the same type of building equipment.

In some embodiments, equipment definitions 1440 facilitate the presentation of data points in a consistent and user-friendly manner. For example, each equipment definition may define one or more data points that are displayed via a user interface. The displayed data points may be a subset of the data points defined by the equipment definition.

In some embodiments, equipment definitions 1440 specify a system type (e.g., HVAC, lighting, security, fire, etc.), a system sub-type (e.g., terminal units, air handlers, central plants), and/or data category (e.g., critical, diagnostic, operational) associated with the building equipment defined by each equipment definition. Specifying such attributes of building equipment at the equipment definition level allows the attributes to be applied to the building equipment along with the equipment definition when the building equipment is initially defined. Building equipment can be filtered by various attributes provided in the equipment definition to facilitate the reporting and management of equipment data from multiple building systems.

Equipment definitions 1440 can be automatically created by abstracting the data points provided by archetypal controllers (e.g., typical or representative controllers) for various types of building equipment. In some embodiments, equipment definitions 1440 are created by equipment definition module 1454, described in greater detail below.

Still referring to FIG. 14, memory 1438 is shown to include equipment objects 1444. Equipment objects 1444 may be software objects that define a mapping between a data point type (e.g., supply air temperature, room temperature, damper position) and an actual data point (e.g., a measured or calculated value for the corresponding data point type) for various pieces of building equipment. Equipment objects 1444 may facilitate the presentation of equipment-specific data points in an intuitive and user-friendly manner by associating each data point with an attribute identifying the corresponding data point type. The mapping provided by equipment objects 1444 may be used to associate a particular data value measured or calculated by BMS 1311 with an attribute that can be displayed via a user interface.

Equipment objects 1444 can be created (e.g., by equipment object creation module 156) by referencing equipment definitions 1440. For example, an equipment object can be created by applying an equipment definition to the data points provided by a BMS device. The search criteria included in an equipment definition can be used to identify data points of the building equipment that satisfy the point definitions. A data point that satisfies a point definition can be mapped to an attribute of the equipment object corresponding to the point definition.

Each equipment object may include one or more attributes defined by the point definitions of the equipment definition used to create the equipment object. For example, an equipment definition which defines the attributes "Occupied Command," "Room Temperature," and "Damper Position" may result in an equipment object being created with the same attributes. The search criteria provided by the equipment definition are used to identify and map data points associated with a particular BMS device to the attributes of the equipment object. The creation of equipment objects is described in greater detail below with reference to equipment object creation module 1456.

Equipment objects 1444 may be related with each other and/or with building objects 1442. Causal relationships can be established between equipment objects to link equipment objects to each other. For example, a causal relationship can be established between a VMA and an AHU which provides airflow to the VMA. Causal relationships can also be established between equipment objects 1444 and building objects 1442. For example, equipment objects 1444 can be associated with building objects 1442 representing particular rooms or zones to indicate that the equipment object serves that room or zone. Relationships between objects are described in greater detail below with reference to object relationship module 1458.

Still referring to FIG. 14, memory 1438 is shown to include client services 1446 and application services 1448. Client services 1446 may be configured to facilitate interaction and/or communication between BMS controller 1312 and various internal or external clients or applications. For example, client services 1446 may include web services or application programming interfaces available for communication by UI clients 1316 and remote applications 1318 (e.g., applications running on a mobile device, energy monitoring applications, applications allowing a user to monitor the performance of the BMS, automated fault detection and diagnostics systems, etc.). Application services 1448 may facilitate direct or indirect communications between remote applications 1318, local applications 1450, and BMS controller 1312. For example, application services 1448 may allow BMS controller 1312 to communicate (e.g., over a communications network) with remote applications 1318 running on mobile devices and/or with other BMS controllers.

In some embodiments, application services 1448 facilitate an applications gateway for conducting electronic data communications with UI clients 16 and/or remote applications 1318. For example, application services 1448 may be configured to receive communications from mobile devices and/or BMS devices. Client services 1446 may provide client devices with a graphical user interface that consumes data points and/or display data defined by equipment definitions 1440 and mapped by equipment objects 1444.

Still referring to FIG. 3, memory 1438 is shown to include a building object creation module 1452. Building object creation module 1452 may be configured to create the building objects stored in building objects 1442. Building object creation module 1452 may create a software building object for various spaces within building 1200. Building object creation module 1452 can create a building object for a space of any size or granularity. For example, building object creation module 1452 can create a building object representing an entire building, a floor of a building, or individual rooms on each floor. In some embodiments, building object creation module 1452 creates and/or stores a building object in memory 1438 for each zone or room of building 1200.

The building objects created by building object creation module 1452 can be accessed by UI clients 1316 and remote applications 1318 to provide a comprehensive user interface for controlling and/or viewing information for a particular building zone. Building objects 1442 can group otherwise ungrouped or unassociated devices so that the group may be addressed or handled by applications together and in a consistent manner (e.g., a single user interface for controlling all of the BMS devices that affect a particular building zone or room). In some embodiments, building object creation module 1452 uses the systems and methods described in U.S. patent application Ser. No. 12/887,390, filed Sep. 21, 2010, for creating software defined building objects.

In some embodiments, building object creation module 1452 provides a user interface for guiding a user through a process of creating building objects. For example, building object creation module 1452 may provide a user interface to client devices (e.g., via client services 1446) that allows a new space to be defined. In some embodiments, building object creation module 1452 defines spaces hierarchically. For example, the user interface for creating building objects may prompt a user to create a space for a building, for floors within the building, and/or for rooms or zones within each floor.

In some embodiments, building object creation module 1452 creates building objects automatically or semi-automatically. For example, building object creation module 1452 may automatically define and create building objects using data imported from another data source (e.g., user view folders, a table, a spreadsheet, etc.). In some embodiments, building object creation module 1452 references an existing hierarchy for BMS 1311 to define the spaces within building 1200. For example, BMS 1311 may provide a listing of controllers for building 1200 (e.g., as part of a network of data points) that have the physical location (e.g., room name) of the controller in the name of the controller itself. Building object creation module 1452 may extract room names from the names of BMS controllers defined in the network of data points and create building objects for each extracted room. Building objects may be stored in building objects 1442.

Still referring to FIG. 14, memory 1438 is shown to include an equipment definition module 1454. Equipment definition module 1454 may be configured to create equipment definitions for various types of building equipment and to store the equipment definitions in equipment definitions 1440. In some embodiments, equipment definition module 1454 creates equipment definitions by abstracting the data points provided by archetypal controllers (e.g., typical or representative controllers) for various types of building equipment. For example, equipment definition module 1454 may receive a user selection of an archetypal controller via a user interface. The archetypal controller may be specified as a user input or selected automatically by equipment definition module 1454. In some embodiments, equipment definition module 1454 selects an archetypal controller for building equipment associated with a terminal unit such as a VMA.

Equipment definition module 1454 may identify one or more data points associated with the archetypal controller. Identifying one or more data points associated with the archetypal controller may include accessing a network of data points provided by BMS 1311. The network of data points may be a hierarchical representation of data points that are measured, calculated, or otherwise obtained by various BMS devices. BMS devices may be represented in the network of data points as nodes of the hierarchical representation with associated data points depending from each BMS device. Equipment definition module 1454 may find the node corresponding to the archetypal controller in the network of data points and identify one or more data points which depend from the archetypal controller node.

Equipment definition module 1454 may generate a point definition for each identified data point of the archetypal controller. Each point definition may include an abstraction of the corresponding data point that is applicable to multiple different controllers for the same type of building equipment. For example, an archetypal controller for a particular VMA (i.e., "VMA-20") may be associated an equipment-specific data point such as "VMA-20.DPR-POS" (i.e., the damper position of VMA-20) and/or "VMA-20.SUP-FLOW" (i.e., the supply air flow rate through VMA-20). Equipment definition module 154 abstract the equipment-specific data points to generate abstracted data point types that are generally applicable to other equipment of the same type. For example, equipment definition module 1454 may abstract the equipment-specific data point "VMA-20.DPR-POS" to generate the abstracted data point type "DPR-POS" and may abstract the equipment-specific data point "VMA-20.SUP-FLOW" to generate the abstracted data point type "SUP-FLOW." Advantageously, the abstracted data point types generated by equipment definition module 1454 can be applied to multiple different variants of the same type of building equipment (e.g., VMAs from different manufacturers, VMAs having different models or output data formats, etc.).

In some embodiments, equipment definition module 1454 generates a user-friendly label for each point definition. The user-friendly label may be a plain text description of the variable defined by the point definition. For example, equipment definition module 1454 may generate the label "Supply Air Flow" for the point definition corresponding to the abstracted data point type "SUP-FLOW" to indicate that the data point represents a supply air flow rate through the VMA. The labels generated by equipment definition module 1454 may be displayed in conjunction with data values from BMS devices as part of a user-friendly interface.

In some embodiments, equipment definition module 1454 generates search criteria for each point definition. The search criteria may include one or more parameters for identifying another data point (e.g., a data point associated with another controller of BMS 1311 for the same type of building equipment) that represents the same variable as the point definition. Search criteria may include, for example, an instance number of the data point, a network address of the data point, and/or a network point type of the data point.

In some embodiments, search criteria include a text string abstracted from a data point associated with the archetypal controller. For example, equipment definition module 1454 may generate the abstracted text string "SUP-FLOW" from the equipment-specific data point "VMA-20.SUP-FLOW." Advantageously, the abstracted text string matches other equipment-specific data points corresponding to the supply air flow rates of other BMS devices (e.g., "VMA-18.SUP-FLOW," "SUP-FLOW.VMA-01," etc.). Equipment definition module 1454 may store a name, label, and/or search criteria for each point definition in memory 1438.

Equipment definition module 1454 may use the generated point definitions to create an equipment definition for a particular type of building equipment (e.g., the same type of building equipment associated with the archetypal controller). The equipment definition may include one or more of the generated point definitions. Each point definition defines a potential attribute of BMS devices of the particular type and provides search criteria for identifying the attribute among other data points provided by such BMS devices.

In some embodiments, the equipment definition created by equipment definition module 1454 includes an indication of display data for BMS devices that reference the equipment definition. Display data may define one or more data points of the BMS device that will be displayed via a user interface. In some embodiments, display data are user defined. For example, equipment definition module 1454 may prompt a user to select one or more of the point definitions included in the equipment definition to be represented in the display data. Display data may include the user-friendly label (e.g., "Damper Position") and/or short name (e.g., "DPR-POS") associated with the selected point definitions.

In some embodiments, equipment definition module 1454 provides a visualization of the equipment definition via a graphical user interface. The visualization of the equipment definition may include a point definition portion which displays the generated point definitions, a user input portion configured to receive a user selection of one or more of the point definitions displayed in the point definition portion, and/or a display data portion which includes an indication of an abstracted data point corresponding to each of the point definitions selected via the user input portion. The visualization of the equipment definition can be used to add, remove, or change point definitions and/or display data associated with the equipment definitions.

Equipment definition module 1454 may generate an equipment definition for each different type of building equipment in BMS 1311 (e.g., VMAs, chillers, AHUs, etc.). Equipment definition module 1454 may store the equipment definitions in a data storage device (e.g., memory 1438, equipment definitions 1440, an external or remote data storage device, etc.).

Still referring to FIG. 14, memory 1438 is shown to include an equipment object creation module 1456. Equipment object creation module 1456 may be configured to create equipment objects for various BMS devices. In some embodiments, equipment object creation module 1456 creates an equipment object by applying an equipment definition to the data points provided by a BMS device. For example, equipment object creation module 1456 may receive an equipment definition created by equipment definition module 1454. Receiving an equipment definition may include loading or retrieving the equipment definition from a data storage device.

In some embodiments, equipment object creation module 1456 determines which of a plurality of equipment definitions to retrieve based on the type of BMS device used to create the equipment object. For example, if the BMS device is a VMA, equipment object creation module 1456 may retrieve the equipment definition for VMAs; whereas if the BMS device is a chiller, equipment object creation module 1456 may retrieve the equipment definition for chillers. The type of BMS device to which an equipment definition applies may be stored as an attribute of the equipment definition. Equipment object creation module 1456 may identify the type of BMS device being used to create the equipment object and retrieve the corresponding equipment definition from the data storage device.

In other embodiments, equipment object creation module 1456 receives an equipment definition prior to selecting a BMS device. Equipment object creation module 1456 may identify a BMS device of BMS 1311 to which the equipment definition applies. For example, equipment object creation module 1456 may identify a BMS device that is of the same type of building equipment as the archetypal BMS device used to generate the equipment definition. In various embodiments, the BMS device used to generate the equipment object may be selected automatically (e.g., by equipment object creation module 1456), manually (e.g., by a user) or semi-automatically (e.g., by a user in response to an automated prompt from equipment object creation module 1456).

In some embodiments, equipment object creation module 1456 creates an equipment discovery table based on the equipment definition. For example, equipment object creation module 1456 may create an equipment discovery table having attributes (e.g., columns) corresponding to the variables defined by the equipment definition (e.g., a damper position attribute, a supply air flow rate attribute, etc.). Each column of the equipment discovery table may correspond to a point definition of the equipment definition. The equipment discovery table may have columns that are categorically defined (e.g., representing defined variables) but not yet mapped to any particular data points.

Equipment object creation module 1456 may use the equipment definition to automatically identify one or more data points of the selected BMS device to map to the columns of the equipment discovery table. Equipment object creation module 1456 may search for data points of the BMS device that satisfy one or more of the point definitions included in the equipment definition. In some embodiments, equipment object creation module 1456 extracts a search criterion from each point definition of the equipment definition. Equipment object creation module 1456 may access a data point network of the building automation system to identify one or more data points associated with the selected BMS device. Equipment object creation module 1456 may use the extracted search criterion to determine which of the identified data points satisfy one or more of the point definitions.

In some embodiments, equipment object creation module 1456 automatically maps (e.g., links, associates, relates, etc.) the identified data points of selected BMS device to the equipment discovery table. A data point of the selected BMS device may be mapped to a column of the equipment discovery table in response to a determination by equipment object creation module 1456 that the data point satisfies the point definition (e.g., the search criteria) used to generate the column. For example, if a data point of the selected BMS device has the name "VMA-18.SUP-FLOW" and a search criterion is the text string "SUP-FLOW," equipment object creation module 1456 may determine that the search criterion is met. Accordingly, equipment object creation module 1456 may map the data point of the selected BMS device to the corresponding column of the equipment discovery table.

Advantageously, equipment object creation module 1456 may create multiple equipment objects and map data points to attributes of the created equipment objects in an automated fashion (e.g., without human intervention, with minimal human intervention, etc.). The search criteria provided by the equipment definition facilitates the automatic discovery and identification of data points for a plurality of equipment object attributes. Equipment object creation module 1456 may label each attribute of the created equipment objects with a device-independent label derived from the equipment definition used to create the equipment object. The equipment objects created by equipment object creation module 1456 can be viewed (e.g., via a user interface) and/or interpreted by data consumers in a consistent and intuitive manner regardless of device-specific differences between BMS devices of the same general type. The equipment objects created by equipment object creation module 1456 may be stored in equipment objects 1444.

Still referring to FIG. 14, memory 1438 is shown to include an object relationship module 1458. Object relationship module 1458 may be configured to establish relationships between equipment objects 1444. In some embodiments, object relationship module 158 establishes causal relationships between equipment objects 1444 based on the ability of one BMS device to affect another BMS device. For example, object relationship module 1458 may establish a causal relationship between a terminal unit (e.g., a VMA) and an upstream unit (e.g., an AHU, a chiller, etc.) which affects an input provided to the terminal unit (e.g., air flow rate, air temperature, etc.).

Object relationship module 1458 may establish relationships between equipment objects 1444 and building objects 1442 (e.g., spaces). For example, object relationship module

158 may associate equipment objects 1444 with building objects 1442 representing particular rooms or zones to indicate that the equipment object serves that room or zone. In some embodiments, object relationship module 1458 provides a user interface through which a user can define relationships between equipment objects 1444 and building objects 1442. For example, a user can assign relationships in a "drag and drop" fashion by dragging and dropping a building object and/or an equipment object into a "serving" cell of an equipment object provided via the user interface to indicate that the BMS device represented by the equipment object serves a particular space or BMS device.

Still referring to FIG. 14, memory 1438 is shown to include a building control services module 1460. Building control services module 1460 may be configured to automatically control BMS 1311 and the various subsystems thereof. Building control services module 1460 may utilize closed loop control, feedback control, PI control, model predictive control, or any other type of automated building control methodology to control the environment (e.g., a variable state or condition) within building 1200.

Building control services module 1460 may receive inputs from sensory devices (e.g., temperature sensors, pressure sensors, flow rate sensors, humidity sensors, electric current sensors, cameras, radio frequency sensors, microphones, etc.), user input devices (e.g., computer terminals, client devices, user devices, etc.) or other data input devices via BMS interface 1432. Building control services module 1460 may apply the various inputs to a building energy use model and/or a control algorithm to determine an output for one or more building control devices (e.g., dampers, air handling units, chillers, boilers, fans, pumps, etc.) in order to affect a variable state or condition within building 1200 (e.g., zone temperature, humidity, air flow rate, etc.).

In some embodiments, building control services module 1460 is configured to control the environment of building 1200 on a zone-individualized level. For example, building control services module 1460 may control the environment of two or more different building zones using different setpoints, different constraints, different control methodology, and/or different control parameters. Building control services module 1460 may operate BMS 1311 to maintain building conditions (e.g., temperature, humidity, air quality, etc.) within a setpoint range, to optimize energy performance (e.g., to minimize energy consumption, to minimize energy cost, etc.), and/or to satisfy any constraint or combination of constraints as may be desirable for various implementations.

In some embodiments, building control services module 1460 uses the location of various BMS devices to translate an input received from a building system into an output or control signal for the building system. Building control services module 1460 may receive location information for BMS devices and automatically set or recommend control parameters for the BMS devices based on the locations of the BMS devices. For example, building control services module 1460 may automatically set a flow rate setpoint for a VAV box based on the size of the building zone in which the VAV box is located.

Building control services module 1460 may determine which of a plurality of sensors to use in conjunction with a feedback control loop based on the locations of the sensors within building 1200. For example, building control services module 1460 may use a signal from a temperature sensor located in a building zone as a feedback signal for controlling the temperature of the building zone in which the temperature sensor is located.

In some embodiments, building control services module 1460 automatically generates control algorithms for a controller or a building zone based on the location of the zone in the building 1200. For example, building control services module 1460 may be configured to predict a change in demand resulting from sunlight entering through windows based on the orientation of the building and the locations of the building zones (e.g., east-facing, west-facing, perimeter zones, interior zones, etc.).

Building control services module 1460 may use zone location information and interactions between adjacent building zones (rather than considering each zone as an isolated system) to more efficiently control the temperature and/or airflow within building 1200. For control loops that are conducted at a larger scale (i.e., floor level) building control services module 1460 may use the location of each building zone and/or BMS device to coordinate control functionality between building zones. For example, building control services module 1460 may consider heat exchange and/or air exchange between adjacent building zones as a factor in determining an output control signal for the building zones.

In some embodiments, building control services module 1460 is configured to optimize the energy efficiency of building 1200 using the locations of various BMS devices and the control parameters associated therewith. Building control services module 1460 may be configured to achieve control setpoints using building equipment with a relatively lower energy cost (e.g., by causing airflow between connected building zones) in order to reduce the loading on building equipment with a relatively higher energy cost (e.g., chillers and roof top units). For example, building control services module 1460 may be configured to move warmer air from higher elevation zones to lower elevation zones by establishing pressure gradients between connected building zones.

Figure 15:
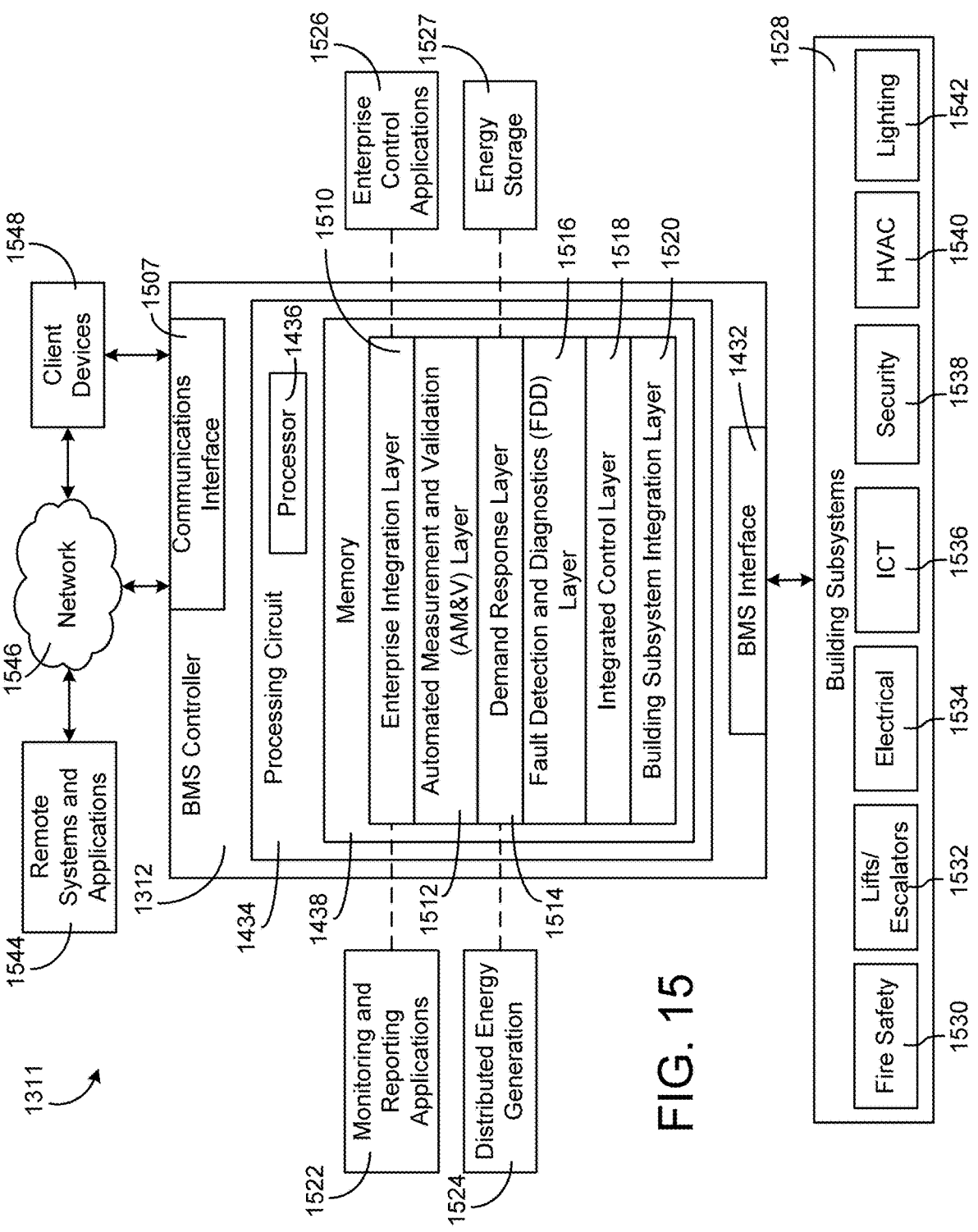
FIG. 15 is another block diagram of the BMS that serves the building of FIG. 1, according to some embodiments.

Referring now to FIG. 15, another block diagram illustrating a portion of BMS 1311 in greater detail is shown, according to some embodiments. BMS 1311 can be implemented in building 1310 to automatically monitor and control various building functions. BMS 1311 is shown to include BMS controller 1312 and a plurality of building subsystems 1528. Building subsystems 1528 are shown to include a building electrical subsystem 1534, an information communication technology (ICT) subsystem 1536, a security subsystem 1538, a HVAC subsystem 1540, a lighting subsystem 1542, a lift/escalators subsystem 1532, and a fire safety subsystem 1530. In various embodiments, building subsystems 1528 can include fewer, additional, or alternative subsystems. For example, building subsystems 1528 may also or alternatively include a refrigeration subsystem, an advertising or signage subsystem, a cooking subsystem, a vending subsystem, a printer or copy service subsystem, or any other type of building subsystem that uses controllable equipment and/or sensors to monitor or control building 1200.

Each of building subsystems 1528 can include any number of devices, controllers, and connections for completing its individual functions and control activities. HVAC subsystem 1540 can include many of the same components as HVAC system 1320, as described with reference to FIGS. 13-14. For example, HVAC subsystem 1540 can include a chiller, a boiler, any number of air handling units, economizers, field controllers, supervisory controllers, actuators, temperature sensors, and other devices for controlling the temperature, humidity, airflow, or other variable conditions within building 1200. Lighting subsystem 1542 can include any number of light fixtures, ballasts, lighting sensors, dimmers, or other devices configured to controllably adjust the amount of light provided to a building space. Security subsystem 1538 can include occupancy sensors, video surveillance cameras, digital video recorders, video processing servers, intrusion detection devices, access control devices and servers, or other security-related devices.

Still referring to FIG. 15, BMS controller 1312 is shown to include a communications interface 1507 and a BMS interface 1432. Interface 1507 may facilitate communications between BMS controller 1312 and external applications (e.g., monitoring and reporting applications 1522, enterprise control applications 1526, remote systems and applications 1544, applications residing on client devices 1548, etc.) for allowing user control, monitoring, and adjustment to BMS controller 1312 and/or subsystems 1528. Interface 1507 may also facilitate communications between BMS controller 1312 and client devices 1448. BMS interface 1432 may facilitate communications between BMS controller 1312 and building subsystems 1528 (e.g., HVAC, lighting security, lifts, power distribution, business, etc.).

Interfaces 1507, 1432 can be or include wired or wireless communications interfaces (e.g., jacks, antennas, transmitters, receivers, transceivers, wire terminals, etc.) for conducting data communications with building subsystems 1528 or other external systems or devices. In various embodiments, communications via interfaces 1507, 1432 can be direct (e.g., local wired or wireless communications) or via a communications network 1546 (e.g., a WAN, the Internet, a cellular network, etc.). For example, interfaces 1507, 1432 can include an Ethernet card and port for sending and receiving data via an Ethernet-based communications link or network. In another example, interfaces 1507, 1432 can include a Wi-Fi transceiver for communicating via a wireless communications network. In another example, one or both of interfaces 1507, 1432 can include cellular or mobile phone communications transceivers. In one embodiment, communications interface 1507 is a power line communications interface and BMS interface 1532 is an Ethernet interface. In other embodiments, both communications interface 1507 and BMS interface 1432 are Ethernet interfaces or are the same Ethernet interface.

Still referring to FIG. 15, BMS controller 1312 is shown to include a processing circuit 1434 including a processor 1436 and memory 1438. Processing circuit 1434 can be communicably connected to BMS interface 1432 and/or communications interface 1507 such that processing circuit 1434 and the various components thereof can send and receive data via interfaces 1507, 1432. Processor 1436 can be implemented as a general purpose processor, an application specific integrated circuit (ASIC), one or more field programmable gate arrays (FPGAs), a group of processing components, or other suitable electronic processing components.

Memory 1438 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 1438 can be or include volatile memory or non-volatile memory. Memory 1438 can include database components, object code components, script components, or any other type of information structure for supporting the various activities and information structures described in the present application. According to some embodiments, memory 1438 is communicably connected to processor 1436 via processing circuit 1434 and includes computer code for executing (e.g., by processing circuit 1434 and/or processor 1436) one or more processes described herein.

In some embodiments, BMS controller 1312 is implemented within a single computer (e.g., one server, one housing, etc.). In various other embodiments BMS controller 1312 can be distributed across multiple servers or computers (e.g., that can exist in distributed locations). Further, while FIG. 15 shows applications 1522 and 1526 as existing outside of BMS controller 1312, in some embodiments, applications 1522 and 1526 can be hosted within BMS controller 1312 (e.g., within memory 1438).

Still referring to FIG. 15, memory 1438 is shown to include an enterprise integration layer 1510, an automated measurement and validation (AM&V) layer 1512, a demand response (DR) layer 1514, a fault detection and diagnostics (FDD) layer 1516, an integrated control layer 1518, and a building subsystem integration later 1520. Layers 1510-1520 can be configured to receive inputs from building subsystems 1528 and other data sources, determine optimal control actions for building subsystems 1528 based on the inputs, generate control signals based on the optimal control actions, and provide the generated control signals to building subsystems 1528. The following paragraphs describe some of the general functions performed by each of layers 1510-1520 in BMS 1311.

Enterprise integration layer 1510 can be configured to serve clients or local applications with information and services to support a variety of enterprise-level applications. For example, enterprise control applications 1526 can be configured to provide subsystem-spanning control to a graphical user interface (GUI) or to any number of enterprise-level business applications (e.g., accounting systems, user identification systems, etc.). Enterprise control applications 1526 may also or alternatively be configured to provide configuration GUIs for configuring BMS controller 1312. In yet other embodiments, enterprise control applications 1526 can work with layers 1510-1520 to optimize building performance (e.g., efficiency, energy use, comfort, or safety) based on inputs received at interface 1507 and/or BMS interface 1432.

Building subsystem integration layer 1520 can be configured to manage communications between BMS controller 1312 and building subsystems 1528. For example, building subsystem integration layer 420 may receive sensor data and input signals from building subsystems 1528 and provide output data and control signals to building subsystems 1528. Building subsystem integration layer 1520 may also be configured to manage communications between building subsystems 1528. Building subsystem integration layer 1520 translate communications (e.g., sensor data, input signals, output signals, etc.) across a plurality of multi-vendor/multi-protocol systems.

Demand response layer 1514 can be configured to optimize resource usage (e.g., electricity use, natural gas use, water use, etc.) and/or the monetary cost of such resource usage in response to satisfy the demand of building 1200. The optimization can be based on time-of-use prices, curtailment signals, energy availability, or other data received from utility providers, distributed energy generation systems 1524, from energy storage 1527, or from other sources. Demand response layer 1514 may receive inputs from other layers of BMS controller 1312 (e.g., building subsystem integration layer 1520, integrated control layer 1518, etc.). The inputs received from other layers can include environmental or sensor inputs such as temperature, carbon dioxide levels, relative humidity levels, air quality sensor outputs, occupancy sensor outputs, room schedules, and the like. The inputs may also include inputs such as electrical use (e.g., expressed in kWh), thermal load measurements, pricing information, projected pricing, smoothed pricing, curtailment signals from utilities, and the like.

According to some embodiments, demand response layer 1514 includes control logic for responding to the data and signals it receives. These responses can include communicating with the control algorithms in integrated control layer 1518, changing control strategies, changing setpoints, or activating/deactivating building equipment or subsystems in a controlled manner. Demand response layer 1514 may also include control logic configured to determine when to utilize stored energy. For example, demand response layer 1514 may determine to begin using energy from energy storage 1527 just prior to the beginning of a peak use hour.

In some embodiments, demand response layer 1514 includes a control module configured to actively initiate control actions (e.g., automatically changing setpoints) which minimize energy costs based on one or more inputs representative of or based on demand (e.g., price, a curtailment signal, a demand level, etc.). In some embodiments, demand response layer 414 uses equipment models to determine an optimal set of control actions. The equipment models can include, for example, thermodynamic models describing the inputs, outputs, and/or functions performed by various sets of building equipment. Equipment models may represent collections of building equipment (e.g., subplants, chiller arrays, etc.) or individual devices (e.g., individual chillers, heaters, pumps, etc.).

Demand response layer 1514 may further include or draw upon one or more demand response policy definitions (e.g., databases, XML files, etc.). The policy definitions can be edited or adjusted by a user (e.g., via a graphical user interface) so that the control actions initiated in response to demand inputs can be tailored for the user's application, desired comfort level, particular building equipment, or based on other concerns. For example, the demand response policy definitions can specify which equipment can be turned on or off in response to particular demand inputs, how long a system or piece of equipment should be turned off, what setpoints can be changed, what the allowable set point adjustment range is, how long to hold a high demand setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.).

Integrated control layer 1518 can be configured to use the data input or output of building subsystem integration layer 1520 and/or demand response later 1514 to make control decisions. Due to the subsystem integration provided by building subsystem integration layer 1520, integrated control layer 1518 can integrate control activities of the subsystems 1528 such that the subsystems 1528 behave as a single integrated supersystem. In some embodiments, integrated control layer 1518 includes control logic that uses inputs and outputs from a plurality of building subsystems to provide greater comfort and energy savings relative to the comfort and energy savings that separate subsystems could provide alone. For example, integrated control layer 1518 can be configured to use an input from a first subsystem to make an energy-saving control decision for a second subsystem. Results of these decisions can be communicated back to building subsystem integration layer 1520.

Integrated control layer 1518 is shown to be logically below demand response layer 1514. Integrated control layer 1518 can be configured to enhance the effectiveness of demand response layer 1514 by enabling building subsystems 1528 and their respective control loops to be controlled in coordination with demand response layer 1514. This configuration may advantageously reduce disruptive demand response behavior relative to conventional systems. For example, integrated control layer 1518 can be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller.

Integrated control layer 1518 can be configured to provide feedback to demand response layer 1514 so that demand response layer 1514 checks that constraints (e.g., temperature, lighting levels, etc.) are properly maintained even while demanded load shedding is in progress. The constraints may also include setpoint or sensed boundaries relating to safety, equipment operating limits and performance, comfort, fire codes, electrical codes, energy codes, and the like. Integrated control layer 1518 is also logically below fault detection and diagnostics layer 1516 and automated measurement and validation layer 1512. Integrated control layer 1518 can be configured to provide calculated inputs (e.g., aggregations) to these higher levels based on outputs from more than one building subsystem.

Automated measurement and validation (AM&V) layer 1512 can be configured to verify that control strategies commanded by integrated control layer 1518 or demand response layer 414 are working properly (e.g., using data aggregated by AM&V layer 1512, integrated control layer 1518, building subsystem integration layer 1520, FDD layer 1516, or otherwise). The calculations made by AM&V layer 1512 can be based on building system energy models and/or equipment models for individual BMS devices or subsystems. For example, AM&V layer 1512 may compare a model-predicted output with an actual output from building subsystems 1528 to determine an accuracy of the model.

Fault detection and diagnostics (FDD) layer 1516 can be configured to provide on-going fault detection for building subsystems 1528, building subsystem devices (i.e., building equipment), and control algorithms used by demand response layer 1514 and integrated control layer 1518. FDD layer 1516 may receive data inputs from integrated control layer 1518, directly from one or more building subsystems or devices, or from another data source. FDD layer 1516 may automatically diagnose and respond to detected faults. The responses to detected or diagnosed faults can include providing an alert message to a user, a maintenance scheduling system, or a control algorithm configured to attempt to repair the fault or to work-around the fault.

FDD layer 1516 can be configured to output a specific identification of the faulty component or cause of the fault (e.g., loose damper linkage) using detailed subsystem inputs available at building subsystem integration layer 1520. In other exemplary embodiments, FDD layer 1516 is configured to provide "fault" events to integrated control layer 1518 which executes control strategies and policies in response to the received fault events. According to some embodiments, FDD layer 1516 (or a policy executed by an integrated control engine or business rules engine) may shut-down systems or direct control activities around faulty devices or systems to reduce energy waste, extend equipment life, or assure proper control response.

FDD layer 1516 can be configured to store or access a variety of different system data stores (or data points for live data). FDD layer 1516 may use some content of the data stores to identify faults at the equipment level (e.g., specific chiller, specific AHU, specific terminal unit, etc.) and other content to identify faults at component or subsystem levels. For example, building subsystems 1528 may generate temporal (i.e., time-series) data indicating the performance of BMS 1311 and the various components thereof. The data generated by building subsystems 1528 can include measured or calculated values that exhibit statistical characteristics and provide information about how the corresponding system or process (e.g., a temperature control process, a flow control process, etc.) is performing in terms of error from its setpoint. These processes can be examined by FDD layer 1516 to expose when the system begins to degrade in performance and alert a user to repair the fault before it becomes more severe.

Change-Focused Brokering System

Figure 16:
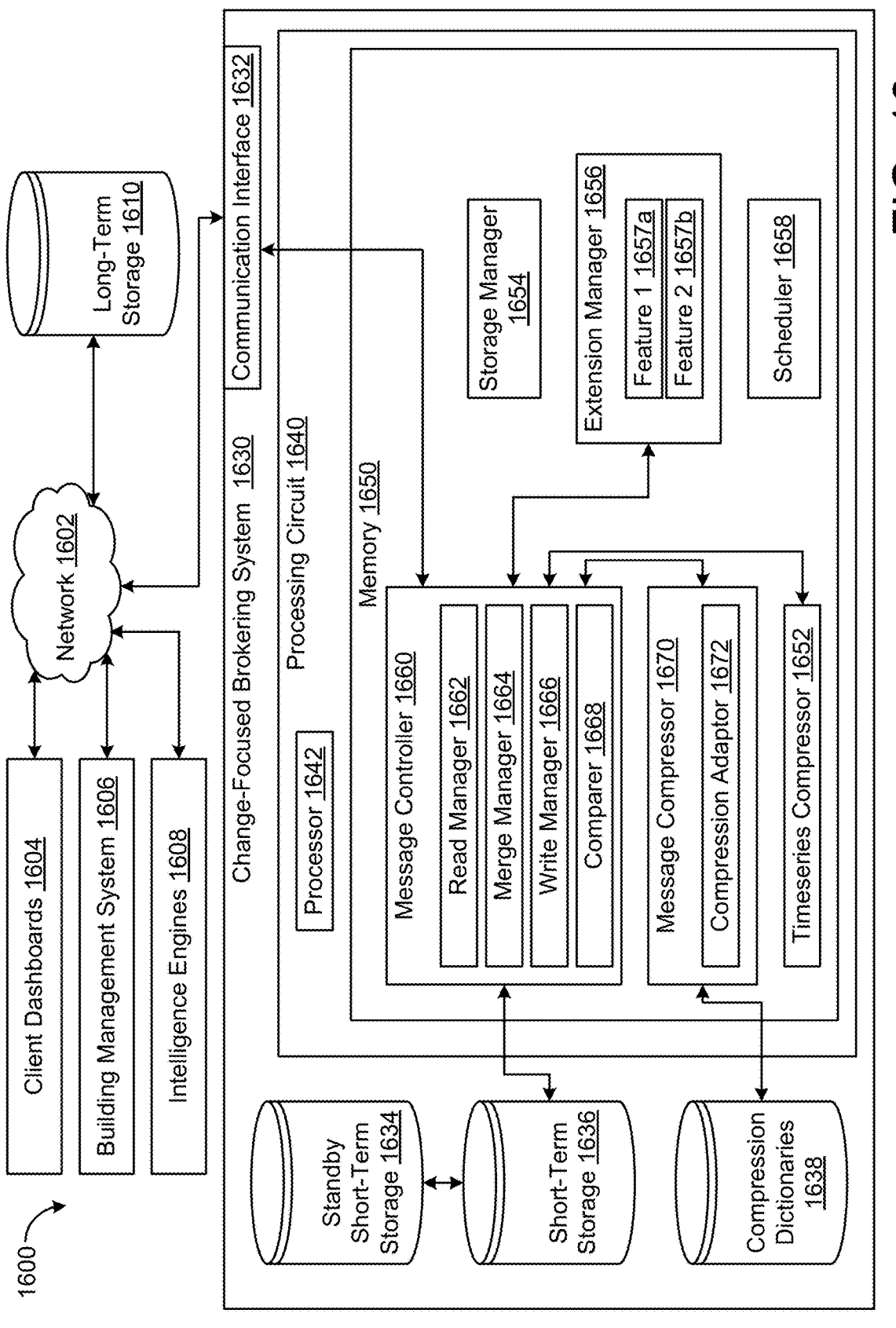
FIG. 16 is a block diagram a building system including a change-focused brokering system, according to some embodiments.

Referring now to FIG. 16, a block diagram of building system 1600 is shown, according to some embodiments. As shown in FIG. 16, the building system 1600 includes change-focused brokering system 1630 within an environment for providing control and monitoring to a building system in some embodiments. Building management system 1600 may include change-focused brokering system, client dashboards 1604, building management system 1606, intelligence engines 1608, and long-term storage 1610 communicating over network 1602. Change-focused brokering system 1630 may be configured to receive messages through communication interface 1632. In some embodiments, building management system 1604 may communicate messages related to sensor input to change-focused brokering system 1630 over network 1602. Network 1602 may be any type of communications network capable of delivering messages between various computers or processors. Change-focused brokering system 1630 may in turn store data in local short-term storage 1634 and 1636, relay messages to other data clients connected to network 1602, and ready and commit data to long term storage 1610. For example, upon receipt of data, change-focused brokering system 1630 may send an update message to client dashboard 1604 for display and send a storage message to long term storage 1610. The primary focus of change-focused brokering system is to provide efficient processing of messages, for example, in the form of data to be stored or requests for data, and storage of the current value of a state and historical audit tracking information.

Still referring to FIG. 16, change-focused brokering system 1630 or portions thereof can be implemented by one or more processors coupled with one or more memory devices (memory). The processors can be a general purpose or specific purpose processors, an application specific integrated circuit (ASIC), one or more field programmable gate arrays (FPGAs), a group of processing components, or other suitable processing components. The processors may be configured to execute computer code and/or instructions stored in the memories or received from other computer readable media (e.g., CDROM, network storage, a remote server, etc.). The processors can be configured in various computer architectures, such as graphics processing units (GPUs), distributed computing architectures, cloud server architectures, client-server architectures, or various combinations thereof. One or more first processors can be implemented by a first device, such as an edge device, and one or more second processors can be implemented by a second device, such as a server or other device that is communicatively coupled with the first device and may have greater processor and/or memory resources. One or more processors may implement multiple isolated compute environments (e.g, virtual machines, containers, etc.) to provide levels of logical isolation and or fault domains within the hardware.

A change-focused brokering system may have several technical advantages over other systems. As will become clear through the description herein, focusing on the changes of various parameters, states, and measurements may provide for data change audits natively without requiring an additional system sending messages to the broker. Additionally, focusing on the changes of various parameters, states, and measurements may provide for efficient compression. Efficient compression of the messages may allow for more messages to be processed and more information to be stored in local or short-term storage, potentially providing for a more responsive system and user experience.

Building system 1600 can include several systems connected to the network 1602 and capable of communicating with change-focused brokering system 1630 in some embodiments. Network 1602 may be any interconnection of devices for transmitting messages. Network 1602 may be one or more isolated networks and may use any of a plurality of communication protocols (e.g., Modbus, BacNet, TCP/IP). In some embodiments, client dashboards 1604 communicate user input to other components within building system 1600. User input may affect how the building system controls or monitors the building and the changes to any user modified parameters may be required to be stored in any of a number of storage devices and may be requested by other systems when providing control and monitoring to a building system. Client dashboards 1604 may also include a provision for displaying various system statuses to the user. Client dashboards 1604 may be realized on computers, phones, tablets, or any other device capable of producing a dashboard and sending messages over network 1602.

In some embodiments, building system 1600 includes building management system 1606. Building management system 1606 may contain several controllers capable of sending signals to actuators within a building to provide control and capable of receiving signals from various sensors within a building to provide monitoring. In addition, intelligence engines 1608 may include additional computers or processors connected to the network that can perform advanced analytics. For example, intelligence engines 1608 may provide optimization, supervisory control, or generative artificial intelligence models. In some embodiments, change-focused brokering system 1630 may be responsible for managing the communication between the devices connected to network 1602 within the environment for providing control and monitoring to a building system and storing the results of those communications or the state of the system in long-term storage 1610. Long term storage 1610, may consist of several memories or other computer readable media (e.g., CDROM, magnetic disks, solid-state drives, network storage, etc.).

Change-focused brokering system 1630 may be configured to take several actions upon receiving a message from any of the devices connected to network 1602. In some embodiments, upon receiving a message regarding any of the various parameters, states, and measurements (herein referred to as states or the state) of the building control and monitoring system, message controller 1660 uses read manager 1662 to read the current stored value for the state from short-term storage 1636. If any of the states or entities are not currently available in short-term storage 1636, read manager 1662 may be configured to read the current value of the states from long-term storage 1610. After obtaining the current values, message controller 1660 may be configured to use comparer 1668 to compare the current value to the values provided in the message to determine the differences between the values of the state (i.e., to determine the reported change). In some embodiments, write manager can send the change to long-term storage 1610; merge manager 1664 can merge the reported change into the set of states; and write manager 1666 can commit the updated set of states back into short-term storage 1636. Short-term storage 1636 may store the current value of the data for rapid response to client dashboards 1604, intelligence engines 1608, etc. and in some case short-term storage 1636 may also include storage of the time series data. Short-term storage 1636 may be configured to update standby-short term storage 1634 with the same change. In some embodiments, the current values may be compressed prior to being committed to short-term storage 1636 and current stored values must then also be decompressed after being read from storage 1636. In some embodiments, the changes may also be compressed prior to being committed to long-term storage 1610.

Short-term storage 1636 and standby-short term storage 1634 may consist of several memories or other computer readable media (e.g., RAM, magnetic disks, solid-state drives, network storage, etc.). Short-term storage 1636 may be designed to have faster access than long-term storage 1610. For example, short-term storage 1636 may include RAM or a partition of a solid-state drive that is local to the same computer that change-focused brokering system 1630 is configured upon. In some embodiments, the building system 1600 has some of the states stored locally in quickly accessible storage without the expense of having enough RAM or colocated hard disk space to store all of the states.

It is noted that by determining the change of the states of the system and saving those changes in long-term storage 1610, change-focused brokering system 1630 may natively store an audit log of all changes to the state of the environment for monitoring and controlling a building system. Additional service or storage may not be required to maintain the audit log of the data.

Figures 17, 18:
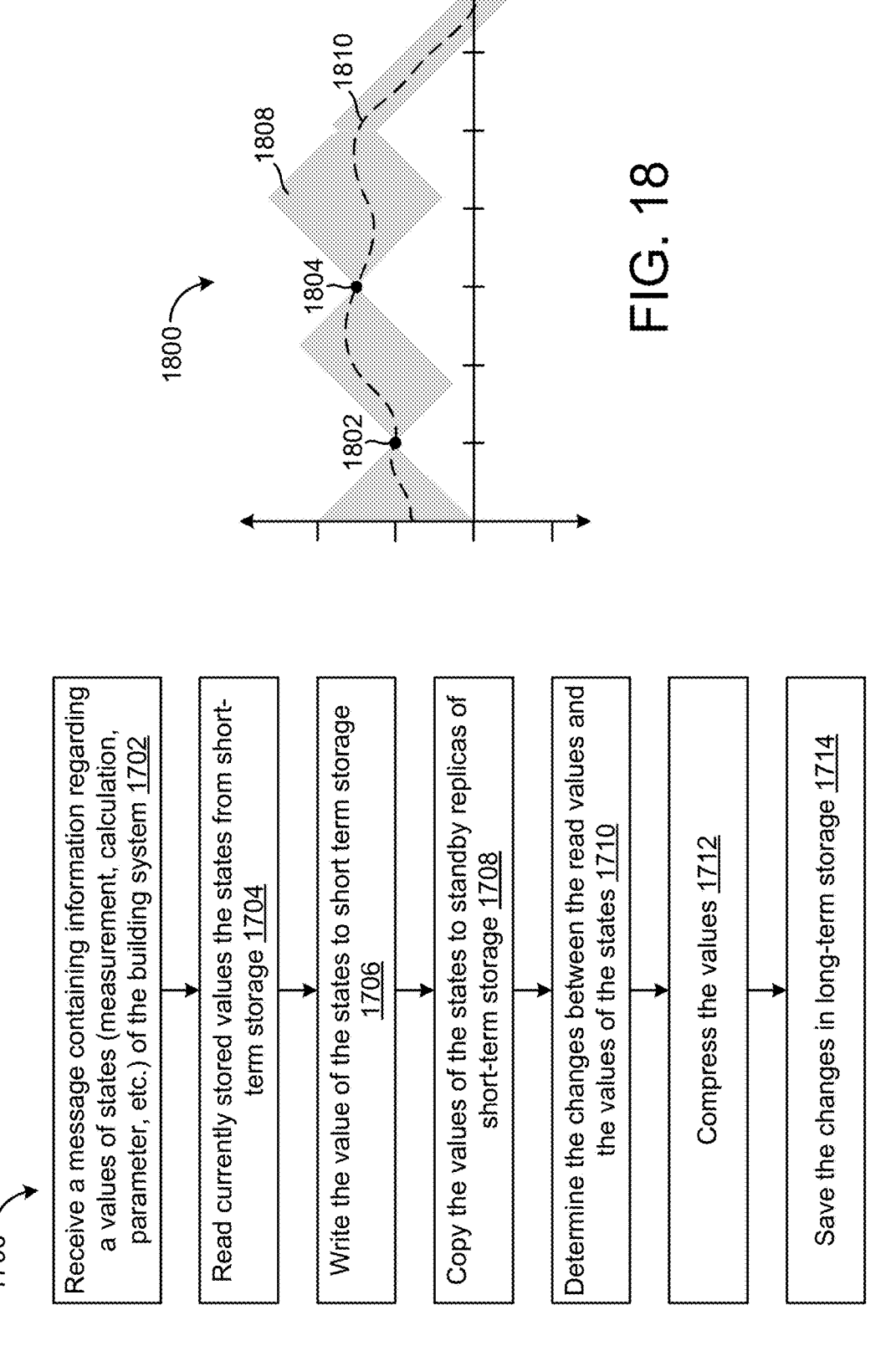
FIG. 17 is a flow diagram illustrating saving data by the change-focused brokering system of FIG. 16, according to some embodiments.
FIG. 18 is a plot of timeseries stored using change-of-values illustrating a region of certainty of the timeseries, according to some embodiments.

FIG. 17 shows flow of operations 1700, which may be performed by change focused brokering system 1630 or components thereof in some embodiments. Flow of operations 1700 may include receiving a message containing information regarding a measurement, value for a calculated state, a parameter for a control sequence or algorithm, etc. (sometimes referred to as the states of the building system being controlled or monitored) in operation 1702. In some embodiments, flow 1700 continues by reading the currently stored values of the states of the building system from short term storage in step 1704, writing the new values from the message to short-term storage in step 1706, and copying the new values to standby replicas in step 1708. For example, the current value of all states may be stored in RAM. When new values are received the operation, 1710 may be used to determine the difference between the new and old values and replace the values stored in RAM with the received values. By focusing on the changes of the states, a brokering system providing a means to implement the described method will natively be capable of providing an audit log of the states of the building system. For example, if building system behavior changes a technician may want to look back at all the changes to the building system (particularly, changes in parameters affecting system behavior). Another operator of the building system may have made a change or performed a manual override that is now affecting building system performance. To provide the changes to the technician, a dashboard would only need to query long-term storage, rather than have a separate storage system to recreate the changes that occurred or were requested.

In some embodiments, the data is stored in a compressed form. The current data (e.g., stored in RAM or another form of short-term storage) may be compressed as well as the previous history of changes (e.g., that may be in long-term storage). Data containing the values may be compressed in operation 1712. Any compression technique can be used, including those described later in the present disclosure. Compression may be performed on a table (e.g., in RAM) only storing the current state. For example, dictionary compression may be used. Timeseries compression techniques may be performed on the changes in long-term storage. Flow 1700 may also include saving the changes to the states in long-term storage in operation 1714. For example, changes to the state may be stored directly in a wire transfer type (e.g., JSON) with dictionary compression applied. In other embodiments, the changes may be stored in a relational database stored in a columnar format (all changes related to a specific state of the building system stored adjacently in storage) to provide for efficient querying of particular states by, for example, a client dashboard.

Efficient Compression of Timeseries Data

In some embodiments of the present disclosure, some of the states maintained in long-term storage 1610 may be expected to change in value frequently. For these states, one aspect of the present disclosure is storing the data in a special format representing how a particular variable changes over time (e.g., a timeseries). A timeseries may refer to a structure with timestamps and the respective value of the state, measurement or parameter at that given time. A timeseries may represent a value at a given time but may make no assertion about the value between any of the two timestamps. In some embodiments, knowledge of the particular state that is being stored as a timeseries allows one to sample the value of that state without loss of meaningful data. For example, knowledge of the maximum rate at which a value can change makes it possible to sample the data at a given rate while knowing a bound on the data. Further, smaller changes may be insignificant or even confounding the signals with sensor inaccuracies and noise. In these embodiments, values may be quantized and saved only if the reported change is more than a certain threshold.

With reference to FIG. 18, plot 1800 shows samples 1802, 1804, and 1806. Knowing the values of the state at the times of the samples an analytics system may be able to calculate admissible bounds of the values for the state at any point in time. For example, with the additional knowledge that a state stored as a timeseries is sampled every two units of time, only changes of greater than a half of a unit are saved, and physically the values will not change by more than one unit per unit of time, bounds may be calculated as shown by area 1808. Any function of time that falls within that area (function of time 1810, for example) could have been the actual trajectory of the state given the stored samples. In some embodiments, the certainty that the timeseries remains within the calculated area may be accurate enough for any calculations being performed on historical data. As such a building system (e.g., building system 1600) may store values for states as timeseries data that is periodically sampled, quantized, and stored when the value of the quantized state changes.

It is contemplated that change-of-value and quantization are different techniques, though using change-of-value does not preclude also storing data based on quantization. In a change-of-value (COV) system a value is reported to the subscriber (e.g., a message is sent) any time the data changes by more than a given amount. For a COV the limits at which a new value is reported is reported is centered around the previously reported value. In a quantized storage system the limit at which a value will be stored is based on a comparison of predefined thresholds. For example, the thresholds may be defined by $t_i$=min+(max−min)i/N for i=0 . . . . N−1. Messaging values of a state by COV and storing the data in quantized form may add additional uncertainty on the bounds shown in FIG. 18.

Referring again to FIG. 16, in some embodiments of change-focused brokering system 1630, upon receiving a message regarding current values of any of the various states of the building control and monitoring system that are stored as time series data, message controller 1660 may be configured to use read manager 1662 to read the current stored state from short-term storage 1636. If any of the states or entities are not currently available in short-term storage 1636, read manager 1662 may be configured to read the current states from long-term storage 1610. After obtaining the current states, message controller 1660 may be configured to use comparer 1668 to compare the current states to the states provided in the message to determine the differences between the states (i.e., to determine the reported change). In some embodiments, comparer 1668 may be configured to quantize (i.e., converting to an integer representation) the states provided in the message prior to making a determination if a change has occurred. In some embodiments, the message may already included a quantized value. If all communications on network 1602 use the same quantization scheme a given value when communicating on network 1602 the additional uncertainty described from additive COV and/or quantization noise may be eliminated and messages reduced to a minimum for a given accuracy level.

In some embodiments, quantizing the state may include receiving a minimum and a precision related to the state. For example, quantizing the state may be performed by the following equation:

$$Q_i = \text{round}((x_i - x_{min}) / p)$$

where $Q_i$ is the quantized sample output as an integer, $x_i$ is the input, $x_{min}$ is a reference value (e.g., a minimum) for the timeseries, and p is the precision. The precision being the smallest significant change that the building control and monitoring system should record.

After quantization, write manager may be configured to then send the changes to long-term storage 1610. Merge manager 1664 may be configured to merge the reported change into the set of states and write manager 1666 may be configured to commit the updated set of states back into short-term storage 1636. Write manager 1666 may be configured to then send the change to long-term storage 1610.

In some embodiments, both the current value of the state and the timeseries of the state are maintained in storage. The current value may be saved in a one form and the timeseries of the state may be saved in a different form. For example, the current value may be saved in the same form sent from building management system 1604 (i.e., unquantized and at its most recent value) and the timeseries data may be stored as an integer after the being quantized by the described procedure saving samples only at the specified times. For example, the storing timeseries data may be performed reading from the memory configured to store the current value at a specified period.

In some embodiments, time series data is compressed before being committed to storage. Advantageously, compressed time series data may allow more data to be stored in the same amount of short-term storage, may allow for more messages to be processed, and may allow for sets of historical data to be sent over the network in a shorter period of time, potentially providing for a more responsive system and user experience. Timeseries compressor 1652 may be configured to compress the timeseries data in a variety of ways. For example, timeseries compressor 1652 may be configured to compress the quantized timeseries using delta encoding, double delta encoding, integer interlacing, 7 bit encoding, bit packing, or any combination of those techniques. In some embodiments, the method for compressing the timeseries data may be chosen dependent on if the data is being committed to short-term or long-term storage, the accuracy requirements of the data, and/or the type of data.

The previously mentioned techniques for compressing timeseries data may be performed as follows. In some embodiments, delta encoding includes taking the difference between the sequential samples of the time series. For example, the output of delta encoding may be given by the following set of equations:

$$y_i = x_i - x_{i-1},$$
$$y_0 = x_0,$$

where x represents the input to the encoder and y represents the output of the encoder. The subscript i represents the ith sample of a timeseries and subscript 0 represents the first sample of the timeseries. Double delta encoding may be given by the following set of equations:

$$y_i = (x_i - x_{i-1}) - (x_{i-1} - x_{i-2}),$$
$$y_0 = x_0,$$
$$y_1 = x_1 - x_0.$$

Integer interlacing may be performed by mapping alternating positive and negative integers to positive integers (e.g., 0 to 0, 1 to 1, −1 to 2, 2 to 3, −2 to 4, . . . ). 7-bit encoding may be performed by encoding an integer 7 bits at a time with the eighth bit of a byte being reserved to communicate if another byte for the same integer is required. Bit packing may be performed having increasingly larger ranges of the form $[-2^n+1, 2^n]$; if the integer value is zero, adding a zero to the bit stream; if the integer value is not zero, determine the smallest range the value falls into and add r ones, followed by a zero, followed by the binary representation of the integer in n bits to the bit stream, where r is the range that the integer fell into (e.g. r is 1 for the first range and 2 for the second range). In some embodiments, the value of n for each of the ranges is chosen to maximize the compression ratios. The compression techniques are discussed in more detail with respect to flows of operation 2200-2260 of FIG. 22.

It is noted that the 7-bit encoding and bit packing compression techniques are very good at compressing data with small integers and the two delta encoding methods are very good at converting timeseries into a series of small integers. It may be advantageous to use one of the above encoding methods followed by one of the above compression methods. For example, some embodiments of the present disclosure may use delta encoding, followed by integer interlacing, followed by 7-bit encoding for short-term storage and double delta encoding followed by bit packing for the long-term storage. In some embodiments, a generic compressions scheme (e.g., Huffman coding or arithmetic coding) may be used after the integer specific encoding techniques discussed followed by the integer specific compression techniques discussed to further compress the data.

Sampling the data at a predefined interval in addition to quantizing the data, encoding the data using a delta encoding, and compressing the data using one of the compression techniques reveals a marked improvement over existing compression techniques or combinations of compression techniques not following this compression scheme. First, only storing data at a predefined sampling rate may make it possible to not store a timestamp associated with every value. Instead, an initial time may be stored, and the time of any subsequent sample may be calculated using the sampling rate and the initial time. To prevent drift due to imperfect representations of the sampling rate full timestamps may be stored periodically at regular intervals in some embodiments. Quantization is not computational expensive and if based on the configuration will cause no loss in significant information, in some embodiments quantization may be performed inherently be the analog to digital converters in the sensing system prior to communication to the brokering system further reducing the time required to perform the compression. Quantization, advantageously, opens the possibility to use lossless integer compression techniques as described. Delta encoding and double delta encoding create series of small integers to provide for efficient compression using bit packing and can be performed very efficiently using bit level operations. In addition, bit packing (7-bit encoding or the described bit packing technique) can also be performed with bit level operations leading to very short compression times. Surprisingly, the combination of sampling, quantization, delta encoding, and bit packing can lead to loss-less compression with very high compression ratios for which the time required to compress and decompress data is negligible. Compression ratios may be so high that much of the time series values may be stored in short-term storage (i.e., RAM or solid-state disk) leading to a significantly more responsive system.

In embodiments, read manager 1662 may be configured to execute timeseries compressor 1652 in order to decompress stored data for comparison. Write manager 1666 may be configured to execute time series compressor 1652 to compress data prior to writing to either short-term or long-term storage. Short-term storage 1636 and long-term storage 1610 may be configured to storage data in columnar format. In columnar format, all data for a single timeseries may be stored in the same portion of memory. When data is stored in columnar format it may be faster to read a long history of a small set of the stored states of the building system to perform calculations. In other embodiments, long-term storage 1610 may be stored in columnar format and short-term storage 1636 may be stored in a row format. To achieve highest possible compression ratios while minimizing the operations that need to be performed, generic compression tools may be used on a timeseries individually for long-term storage 1610 and used on all timeseries for a single time step in short term storage.

In some embodiments, change-focused brokering system 1630 may be configured to store a specified amount of recent timeseries data in short-term storage and older timeseries data in long-term storage. Storing the data in this manner may allow for quick reads from short-term storage for dashboards and control algorithms that require data in near real-time. In some embodiments, the specified amount of recent timeseries data may be dependent on the state of the building system. For example, one control algorithm may require the past 6 hours of static pressure measurements to perform fan control and a different control algorithm may require only the past 30 minutes of temperature data. In other embodiments, change-focused brokering system 1630 may be configured to determine and adapt the amount of data stored in short-term storage for each state. Advantageously, in these embodiments, short-term and long-term storage retrieval managed by a single system this may make it easier for engineers to design algorithms as there may be no need to ask for data from multiple systems.

Upon receiving a read request, message controller 1660 may be configured to invoke read manager 1662 to read the required data from short-term storage 1636. Timeseries compressor 1652 may be configured to decompress the data. In some embodiments, message controller 1660 can determine if all the data required by the read request was obtained and to invoke read manager 1662 to read the additional required data from long-term storage 1610. Timeseries compressor 1652 may be configured to decompress the additional data as well potentially using a different decompression technique than the read from short-term storage 1636. Merge manager 1664 may be configured to combine the data from short-term storage with the data from long-term storage. Message controller 1660 may then be configured to send a message with the data to the requesting system within the environment for controlling and monitoring buildings.

In some embodiments, certain historical data may not be storable in short-term storage within change-focused brokering system 1630, as older data may need to be dropped from short-term storage. Storage manager 1654 may be configured to remove old data from short-term storage 1636. In some embodiments, storage manager 1654 can send a delete request to short-term storage 1636 and standby short-term storage 1634. In some embodiments, storage manager 1654 can generate an additional short-term storage with less old data using the information from long-term storage 1610. Once the new short-term storage space has been populated, storage manager 1654 may decommission the original short-term storage 1636. Removing old storage in this manner may allow short-term storage 1636 to continue to serve data uninterrupted until the specific time that the changeover is performed. Thus, no requests to change-focused brokering system need to wait for the storage management. In some embodiments, the short-term storage with less old data may be populated within standby short-term storage, prior to the changeover. In other embodiments, merge manager 1664 is configured to delete an old sample each time a new sample is merged into the data and prior to being written back to short-term storage.

FIGS. 19-22 generally describe operations that may be used to efficiently store and retrieve data by a brokering system. Flows of operations described by FIGS. 19-22 may be performed by any suitable hardware. For example, the flows may be performed by change-focused brokering system 1630 or any components thereof. The flows of operations described by FIGS. 19-22 provide advantageous methods for storing data which can be used to provide faster service in control applications, for example, to perform a building control calculation (e.g., to maintain a setpoint, start equipment, or otherwise affect a condition of the building system).

Figures 19, 20:
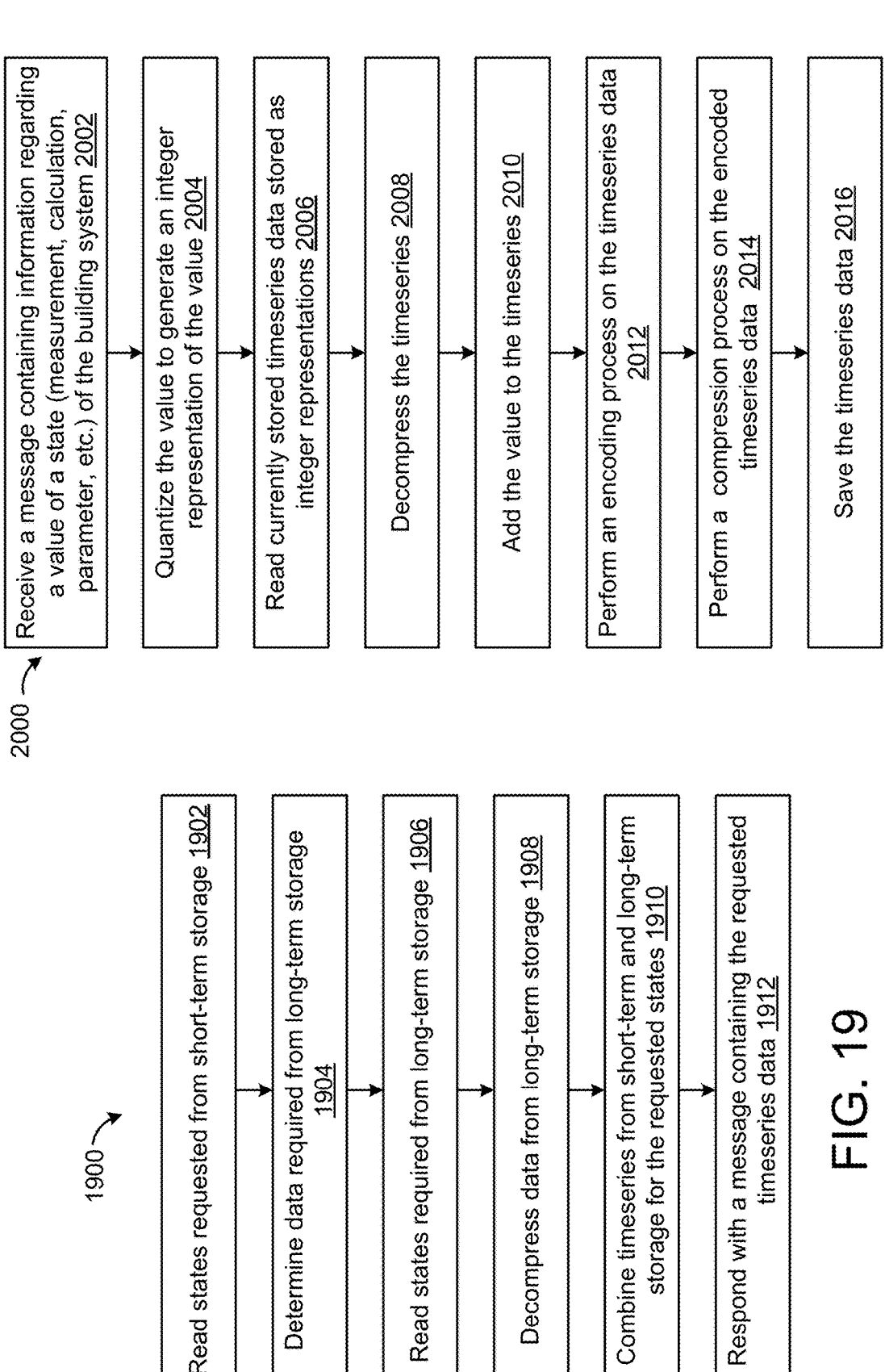
FIG. 19 is a flow diagram illustrating responding to a request for timeseries data, which can be performed by change-focused brokering system of FIG. 16, according to some embodiments.
FIG. 20 is a flow diagram illustrating quantization and compression of timeseries data, which can be performed by change-focused brokering system of FIG. 16, according to some embodiments.

FIG. 19 shows flow of operations 1900 for retrieving data from a brokering system that provides for both short and long-term storage of timeseries data within one interface (i.e., by means of one API call or message). In some embodiments, flow 1900 includes reading the timeseries for a requested state in operation 1902. As previously described, short-term storage is any means for storing information that can be rapidly accessed (e.g., RAM or solid-state disk collocated with the broker system) to allow for requests that do not require data significantly in the past to be satisfied with low latency from short-term storage alone. Data may be compressed using a variety of techniques, in which case a complementary decompression process may be performed as part of reading the data. Flow 1900 may include determining the data that must be read from long-term storage in operation 1904. Operation 1904 may, for example, be performed by tracking the information contained in short-term storage or by comparing the amount of data received from short-term storage to the data requested and determining if any data is missing. If no data is required from long-term storage, flow 1900 may conclude by responding with a message directly with the data from short-term storage in operation 1912. If data is required from long-term storage, flow 1900 may continue with reading data for the states requested from long-term storage in step 1906. Again, if compression is performed data may require decompression as shown in operation 1908. In some embodiments, process 1900 includes step 1910 for combining the timeseries from short-term and long-term storage for the requested states. Finally, flow 1900 may terminate after responding with a message containing the requested timeseries data (e.g., data that was stored in both the short-term and long-term storage) as in operation 1912. According to some embodiments, timeseries data may be compressed prior to being added to the message. Compression may make transfer over the message bus more efficient and the system more responsive in general.

FIG. 20 shows a flow diagram for flow of operations 2000. Flow 2000 is a method for saving timeseries data that makes advantageous use of a set of operations to significantly compress data without losing relevant information according to an exemplary embodiment. Using such a technique may allow a system to store more data in RAM or other forms of short-term storage and provide for a more responsive and algorithms that can perform operate in near real-time, thus providing more timely control or optimization in response to the current states of the building system. In some embodiments, flow 2000 includes receiving a message containing information regarding a value of a state of the building system in operation 2002. Flow 2000 may include quantizing the values (if they do not already arrive in a quantized form) in operation 2004. It is noted that quantization advantageously converts the data into an integer for which various integer compression techniques may be used. Furthermore, data from sensing systems is often natively measured in a quantized form using the native quantization at the sensing system. In some embodiments, data is communicated in a quantized form and the need for operation 2004 may be eliminated.

In some embodiments, flow of operations 2000 includes reading the currently stored timeseries data for the values in operation 2006 and decompressing the timeseries in operation 2008. This step may include reading from both short-term and long-term storage as necessary. Flow 2000 may include adding the new measurement to the timeseries in operation 2010. In some embodiments, the new measurements will be added to the timeseries even if no change has occurred. As discussed above by holding a value even if the change is zero can eliminate the requirement of storing a time stamp with every value of the timeseries, and values of zero change can be efficiently compressed into a single bit using bit packing. In other embodiments, measurements will only be stored in the timeseries if there has been a change to the quantized value.

In some embodiments, flow 2000 includes performing a delta encoding process on the timeseries data in operation 2012. The delta encoding process may include converting the timeseries into the difference of time adjacent values of the timeseries. The delta encoding process may additionally include performing double delta encoding by converting the timeseries into the difference of time adjacent values of the delta encoded timeseries. In some embodiments, delta encoding will be used for timeseries being stored in short-term storage whereas the additional operation to perform double delta encoding will be used for timeseries being stored in long-term storage. Advantageously, this offers a trade-off of compression ratio versus the computational time required to compress the data. In some embodiments, a bit packing compression scheme (7-bit encoding or range-based bit packing) is performed on the delta (or double delta) encoded timeseries in operation 2014 of flow 2000. For example, the computationally faster 7-bit encoding compression scheme may be used for short-term storage and range-based bit packing may be used to provide higher compression ratios in long-term storage. Flow 2000 may conclude by storing the timeseries data in either short-term or long-term storage in 2016.

In some embodiments, the compressed time series will be used to perform a building control calculation (e.g., to maintain a setpoint, start equipment, or otherwise affect a condition of the building system). Storing data compressed as described by FIG. 20 may allow more data to be stored in short term memory (e.g., RAM) and thus allow more advanced calculations requiring timeseries data to be performed in real-time (e.g., on a faster interval, as new data arrives, etc.).

According to some embodiments of the present disclosure, the broker system will store both timeseries data and the current value of the state of the building system in separate portions of short-term storage. Separate storage allows queries for a current state of the building system to be answered with the most recent received message even if it was not yet time to record a change in the timeseries (based on the sampling period), or if the change was less than the quantization precision of the timeseries. FIG. 21 shows flow of operations 2100 for maintaining separate storage for timeseries and the current values of states of the building system according to some embodiments. In some embodiments, flow 2100 beings by receiving a message containing information regarding the values of states (e.g., measurements, calculations, parameters, etc.) in operation 2102. Flow 2100 may include storing the current values of the states in a portion of the short-term storage for only the current values in operation 2104. In some embodiments, flow 2100 may continue with sampling the current values of the states from short-term storage at the time specified by the sampling period (e.g., when a sampling timer expires). In some embodiments, the current values of the states may be sampled by sending another message to the measurement instrumentation requesting a new sample to be taken. The remaining portion of flow 2100 may continue with operations 2108-2120, which may perform similarly as operations 2004-2016 of flow 2000 with the exception that any storage of timeseries data in short-term storage may be stored in the portion of short-term storage specifically maintained for timeseries data.

FIGS. 22A-D show operations for performing integer compression methods that are efficient at storing small numbers, such as those that may be obtained after performing delta compression or double delta compression. The operations described may be performed by any suitable hardware. For example, operations including compression and decompression may be performed by timeseries compressor 1652. FIGS. 22A-D will make clear the advantages of using delta encoding coupled with one of the integer bit packing compression schemes.

Figures 22A, 22B:
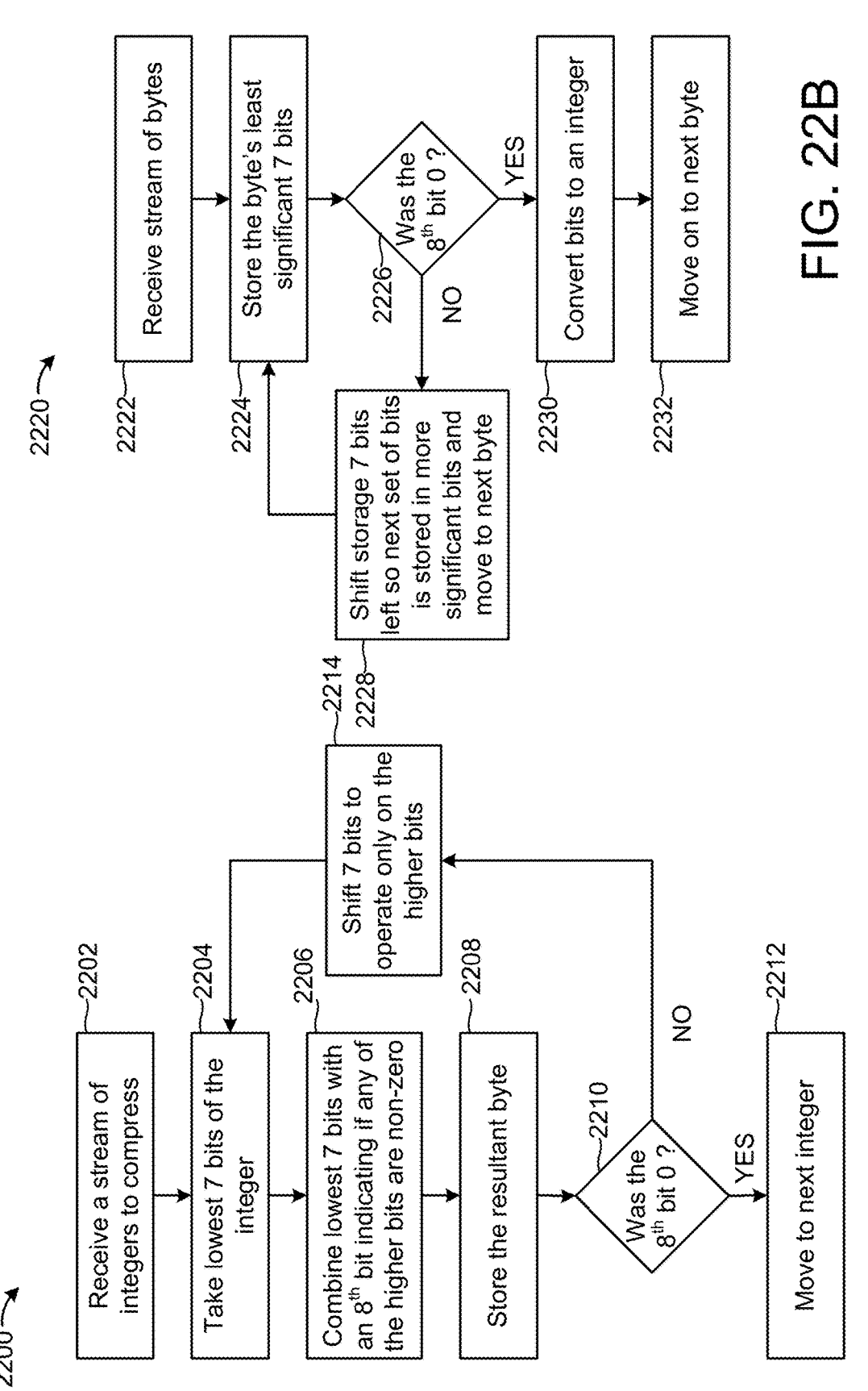
FIG. 22A is a flow diagram illustrating 7-bit encoding compression, which can be performed by change-focused brokering system of FIG. 16, according to some embodiments.
FIG. 22B is a flow diagram illustrating 7-bit encoding decompression, which can be performed by change-focused brokering system of FIG. 16, according to some embodiments.

FIG. 22A shows a flow of operations for compressing integers using 7-bit encoding in process 2200 according to some embodiments. During the description of the operations of flow 2200 the number 1434 will be used as an example. 1434 is stored as 0x0000059A in 32 bit integer in hexadecimal form (0x indicating the hexadecimal form). Flow 2200 beings with receiving the stream of integers in operations 2202 according to the exemplary embodiment. Flow 2200 may include taking the lowest 7 bits of the vale in operation 2204. In the given example, the seven least significant bits are 0b0011010 (0b indicating the binary form). Flow 2200 may continue by combining the lowest seven bits with an $8^{th}$ bit to indicate if there are any higher bits which are non-zero. For the example of 1434, there are additional nonzero bits so the most significant bit is given the value of one and the first stored byte is 0x9A. In some embodiments, this byte is stored during operation 2208 and in operation 2210 it is determined if the $8^{th}$ bit was 0 to direct the flow of operations either to operation 2214 or 2212. In the example integer 1434, the eighth bit of 0x9A is not zero and the bits are shifted right seven places to operate on 0b00001011 in operation 2214. Since there are no non-zero bits left of these seven bits in the example, a zero is added to the left of the seven bits according to operation 2206 resulting in the byte 0x0B. In the given example, if the $8^{th}$ bit is 0 in operation 2210, flow 2200 continues by moving to the next integer in step 2212. According to the example of the integer 1434, the value can be stored as 0x9A0B with a savings of two bytes or 50%.

FIG. 22B shows decompression of a bit stream using 7-bit encoding according to some embodiments of the flow of operations 2220. Flow 2220 will be described by way of example using the same integer given previously (1434 which was compressed to 0x9AOB). Flow of operations 2220 begins by receiving a stream of bytes in operation 2222 according some embodiments. Consider the example of receiving 0x9AOB. According to some embodiments of flow 2220, the bytes least significant 7 bits are read in operation 2224. In the case of receiving 0x9AOB, the least significant bits of 0x9A, 0b0011010, are stored. In some embodiments, the 8th bit of the byte is compared to 0 in operation 2226 and the flow is directed to either operation 2230 or operation 2228. In the case of 0x9A, the 8th bit is not zero and the process moves to step 2228. Operation 2228 may include moving the storage over to the next most significant seven bits and moving to the next byte of the data stream for the same integer. In the example of 0x9AB0, the current operating byte is 0x0B its lowest seven bits 0b0001011 are added to the previous seven bits to obtain 0b00010110011010 and since the most significant bit is 0 so the flow continues with step 2230. According to some embodiments, step 2230 may include a determination that the whole integer is now stored in the bits and the bits may be converted to an integer. In the example of 0x9AOB, 0b00010110011010 converts to 1434 and the integer has been successfully recovered. In some embodiments, flow of operations 2220 includes processing the next byte in step 2232.

Figure 22D:
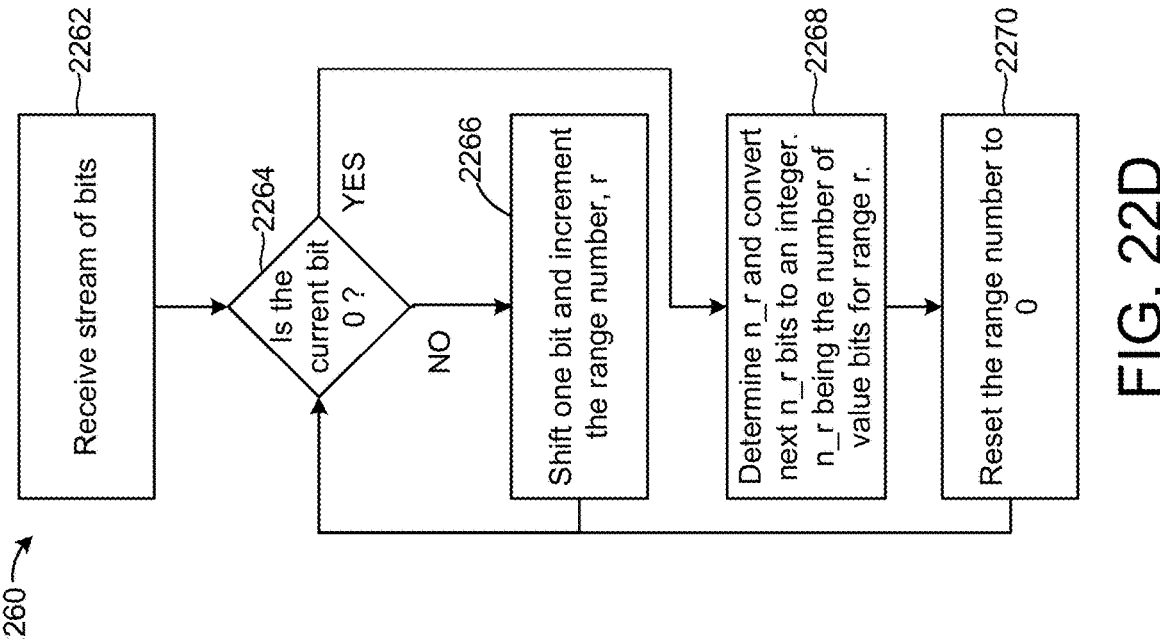
FIG. 22D is a flow diagram illustrating bit-packing decompression, which can be performed by change-focused brokering system of FIG. 16, according to some embodiments.
Figure 22C:
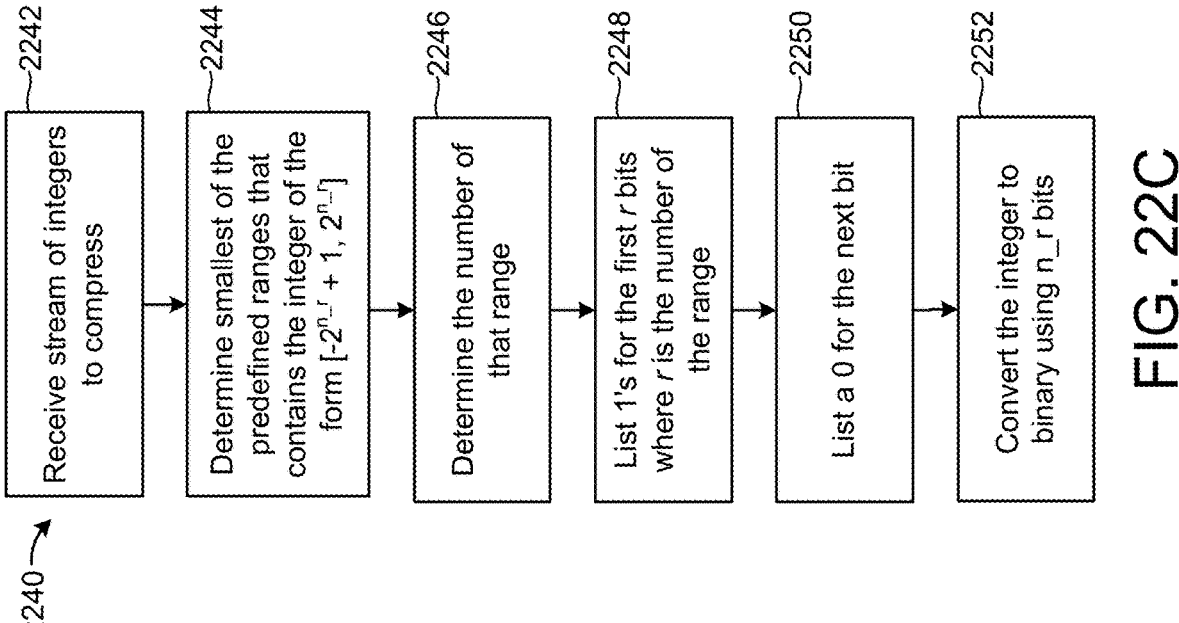
FIG. 22C is a flow diagram illustrating bit-packing compression, which can be performed by change-focused brokering system of FIG. 16, according to some embodiments.

FIG. 22C shows flow of operations 2240, a bit packing compression scheme, according to some embodiments. During the description of the operations of flow 2240 the example integer of 1434 will again be used as an example to follow along the operations. Additionally, bit packing uses a predefined set of ranges to perform the compression. For the example the following table below will be used; however, bit packing would be valid for any number of similar tables with ranges of the form $[-2^{n-r}+1, 2^{n-r}]$. In some embodiments, the table is optimized for statistics of the data that is processed (e.g., the changes in the sensor measurements that are commonly stored by change-focused brokering system 1630.

| Range number, r | Value bits n_r | Range | Tag Bits | Total Bits |
|---|---|---|---|---|
| 0 | 0 | 0 | 0 | 1 |
| 1 | 7 | [−63, 64] | 10 | 9 |
| 2 | 9 | [−255, 256] | 110 | 12 |
| 3 | 12 | [−2047, 2048] | 1110 | 16 |
| 4 | 32 | >2048 | 11110 | 36 |

According to some embodiments, flow of operations 2240 begins by receiving a stream of integers to compress in operation 2242. Flow 2240 may include operation 2244 to determine the smallest of the predefined ranges that contains the integer. The example of 1434 falls within the $4^{th}$ range with range number r=3. In some embodiments, flow 2240 continues with determining the range number, r for the range found in operation 2244, listing a number of bits of value 1 with multiplicity equal to the range number, r, in operation 2248 and adding an indicator 0 bit in operation 2250. Flow 2240 may include converting the integer to binary using n_r bits in step 2252. In some embodiments, bit packing may not use a 0 for the largest range value and instead may use implicit knowledge that there are no larger ranges to indicate that the last range should be used. In the example of 1434, three 1s are added (r=3), followed by a zero, followed by a 12 bit representation (n_r=12) of 1434 (0b010110011010) to obtain 0b1110010110011010 or 0xE59A in 16 bits for a savings of 50% compared to the 32 bit integer format.

FIG. 22D shows decompression of a bit stream using bit packing according to some embodiments of operations 2260. According to some embodiments, flow 2260 begins by receiving a stream of bits in operation 2262. In the case of the example, the beginning of the stream of bits is 0b1110010110011010. Flow 2260 may include operation 2264 to compare the current bit to 0 and if the current bit is zero proceed to operation 2268 otherwise proceed to operation 2266. According to some embodiments, operation 2266 of flow 2260 may include shifting one bit and incrementing the range number r. In the example of 0b1110010110011010 operation 2266 is performed 3 times before the current bit becomes 0 and the process continues to operation 2268. Flow 2260 may include operation 2268 to convert the next n_r bits into an integer. In the example of 0b1110010110011010, r=3 and therefore n_r=12; the next 12 bits are 0b010110011010 which convert back to 1434. In some embodiments, process 2260 continues continue by resetting the range number and moving on to the next bit in step 2270.

Figure 23:
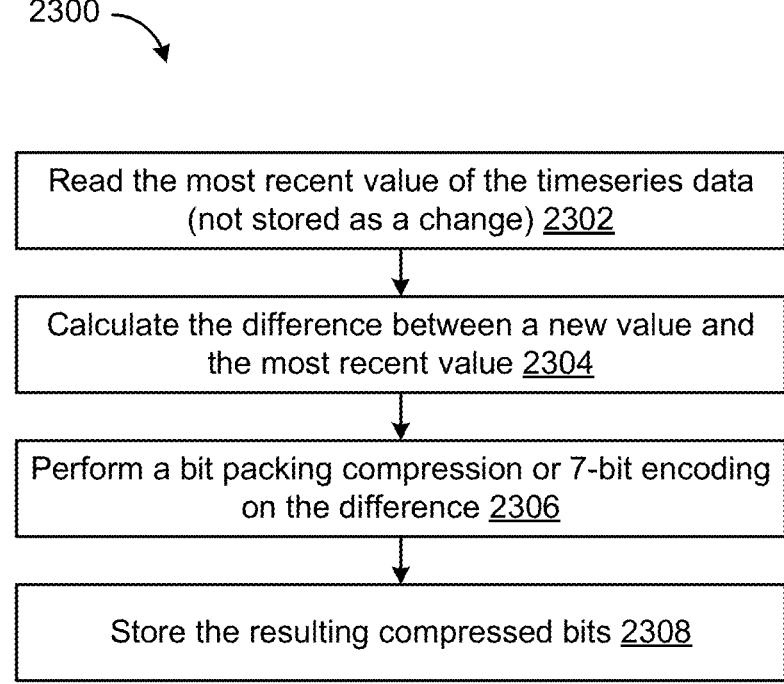
FIG. 23 is a flow diagram illustrating encoding and compressing data in a timeseries as it is received without decompressing, which can be performed by change-focused brokering system of FIG. 16, according to some embodiments.

With reference to FIG. 23, some embodiments of the present disclosure perform delta encoding starting with the most recent value. For example, encoding may be performed using:

$$y_{i-1} = x_i - x_{i-1},$$

$$y_N = x_N,$$

This encoding method may allow new values for the time-series data to be stored and compressed without decompressing the entire compressed timeseries. For example, by adding a new binary sequence (e.g., representing the new value or related difference), to the binary sequence representing the rest of the timeseries data stored (e.g., in compressed form).

Flow of operations 2300 provides timeseries compression that allows for each new value received to be stored in compressed form to by concatenating to and end of the timeseries array (e.g., the end representing the most recent time). Flow 2300 may include operation 2302 to read the most recent value of the timeseries data (e.g., $y_n$ in the above equation). Because the most recent value (e.g., $y_n$) is not encoded, no decompression needs to be performed. Flow 2300 may include calculating the difference between a new (e.g., received from a sensor, sampled from current storage in a message broker, etc.) value and the most recent stored value in operation 2304. For example, the new value becomes $y_n$ and the most recent stored value becomes encoded by subtracting it from the new value. Flow 2300 may include performing a compression scheme on the difference in operation 2306. For example, bit packing or 7-bit encoding may be performed as previously described. The flow of operations may end by storing the compressed bits in operation 2308. For example, the bits may be concatenated onto the end of the timeseries data (e.g., as stored as a binary sequence or stream).

Object Structure Compression

In some embodiments of a change-focused brokering system, data may be stored hierarchically in what is traditionally a serialized wire format (e.g., JSON, protobuf, XML, etc.). Storing data in a hierarchically in what is traditionally a serialized wire format may be advantageous because the message broker does not have to do as many conversions in order to serialize the objects before sending them in a message. Additionally, most serialization format are extensible in the sense that if a client (dashboard, control process, optimization algorithm, etc.) adds another key value pair to an object it can be readily added to storage without needing to update a database management system. In such embodiments, it may be advantageous to compress the stored serialization of the current states and/or timeseries so that more data can be stored in the same amount of short-term storage. For example, general purpose compression algorithms such as entropy encoding, run length encoding, or dictionary compression may be used.

Referring back to FIG. 16. Change-focused brokering system 1630 may be configured to take several actions upon receiving a message from any of the devices connected to network 1602. In some embodiments, upon receiving a message regarding the any of the various parameters, states, and measurements (herein referred to as states or the state) of the building control and monitoring system, message controller 1660 may be configured to use read manager 1662 to read the current stored state from short-term storage 1636. In some embodiments, the data in short-term storage and/or long-term storage may be compressed. Message controller 1660 may use message compressor 1670 to decompress the data. After obtaining the current states, message controller 1660 may be configured to use comparer 1668 to compare the current states to the states provided in the message to determine the differences between the states (i.e., to determine the reported change). Write manager may be configured to then send the change to long-term storage 1610. Merge manager 1664 may be configured to merge the reported change into the set of states and write manager 1666 may be configured to commit the updated set of states back into short-term storage 1636. In some embodiments, Short-term storage 1636 can update standby-short term storage 1634 with the same change. Message controller 1660 may use message compressor 1670 to compress the data prior to it being stored.

In some embodiments, data is stored hierarchically in a serialized wire format and dictionary compression may be used on any data that is stored in either short-term or long-term storage. Message compressor 1670 may be configured to perform some form of dictionary compression. To perform dictionary compression during a write to storage sequence, message compressor 1670 may receive the changes and/or states of the building system in the hierarchical, serialized format ready to be stored. Message compressor 1670 may be further configured to receive compression dictionaries 1638 from storage and perform a replacement for any sequence found in the information ready to be stored and found in the list of keys in the compression dictionary with a value (e.g., shortened encoded form of the sequence). For example, the encoded form may be a number or a hash-code representation of the sequence. During a read from storage, message compressor may be configured to perform a similar substitution after receiving information ready to be decompressed. To perform decompression, message compressor 1670 may perform a substitute of any sequence found in the information ready to be decompressed and the values (e.g., shortened encoded forms of a sequence) of the compression dictionary with the respective key in the compression dictionary.

In some embodiments, the compression dictionaries are shared with all clients of the message broker. In this way it is possible for the message to be compressed via dictionary compression as well as data to be stored in the hierarchical wire format. In some embodiments, compression dictionaries may be preset prior to deployment of the system. In some embodiments, the compression dictionaries may be shared to clients over the message bus at run time. In some embodiments, the compression dictionaries may be adapted based on a current statistical analysis of the messages being sent to the message broker. In some embodiments, different compression dictionaries may be used with different clients and potentially adapted separately. For a particular system, the embodiment of dictionary compression chosen may depend on a trade-off analysis between the additional computation and storage required to maintain the dictionaries and time and storage savings obtained using the various forms of compression.

Figure 24:
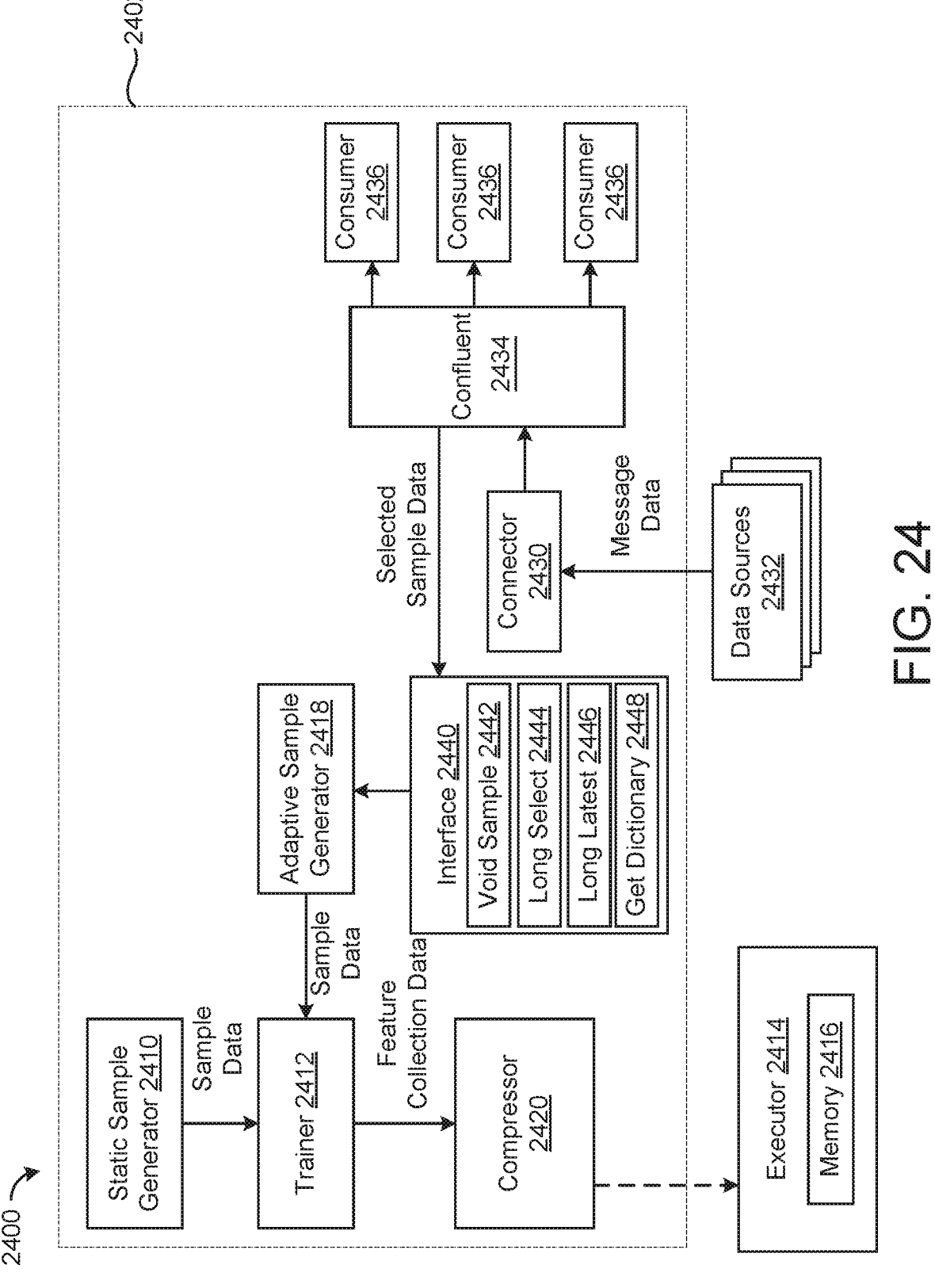
FIG. 24 is a block diagram of a system for performing dictionary compression and collecting data to adapt the dictionary, according to some embodiments.

Referring now to FIG. 24, systems and methods for compressing messages in a system are shown, according to an exemplary embodiment. In an exemplary embodiment, the features of FIG. 24 are configured to compress messages in an internet of things (IoT) system. The features of FIG. 24 may be configured to compress messages by extracting (e.g., collecting) common features of a message, for example into a feature collection, and use this feature collection to replace the common features of a message on both sides of a transport by sharing (and caching) the feature collection. In an exemplary embodiment, the features of FIG. 24 are configured to extract common features of a message, and replace the common features with associated data packets (e.g., compressed, shortened data strings, smaller data packets, etc.) in order to compress the message. Advantageously, the features of FIG. 24 can form message families that have a high statistical equivalency in their common feature collections (e.g., each having their own shared feature collections), which optimizes compression and minimizes collection size.

As shown in FIG. 24, the system 2400 is shown to interact in a cloud environment, shown as cloud 2402. In some embodiments, the system 2400 is configured to perform common feature collection in an offline adaptation (e.g., during a deployment time), as shown in at least FIG. 24. In other embodiments, the system 2400 is configured to perform common feature collection in an online adaptation (e.g., during a runtime).

According to an exemplary embodiment, the system 2400 includes a static sample generator 2410, a dictionary trainer, shown as trainer 2412, and an executor 2414 having a memory 2416. According to an exemplary embodiment, the static sample generator 2410 is configured to generate one or more samples, for example one or more messages (e.g., shown as sample data). In an exemplary embodiment, the static sample generator 2410 is configured to generate the one or more samples (e.g., messages) at random; however, in other embodiments the static sample generator 2410 is configured to generate the one or more samples via a permutation method. In some embodiments, the system 2400 includes an adaptive sample generator 2418. The adaptive sample generator 2418 may be configured to generate one or more samples (e.g., messages) using an adaptive generation method. Adaptive sample generator 2418 may, for example, receive selected sample data processed by the functions of interface 2440 (e.g., void sample 2442, long select 2444, long latest 2446, and get dictionary 2448.

As shown in FIG. 24, the trainer 2412 may be configured to receive the one or more samples, or sample data (e.g., from the static sample generator 2410, the adaptive sample generator 2418, etc.). According to an exemplary embodiment, the trainer 2412 is configured to receive the one or more samples, and extract (e.g., collect) one or more common features of the samples. The trainer 2412 may extract (e.g., collect) one or more common features of the one or more samples via a comparison of the samples, for example to collect common features based on a statistical equivalency of the features. In some embodiments, the trainer 2412 is configured to receive the one or more samples in an online environment. In other embodiments, the trainer 2412 is configured to receive the one or more samples in an offline environment.

In an exemplary embodiment, the extractor 2414 is configured to receive information relating to the one or more common features of the samples (e.g., shown as feature collection data). For example, the executor 2414 may be configured to receive feature collection data from the trainer 2412. In an exemplary embodiment, the executor 2414 is configured to receive the feature collection data in a first data format, and is configured to process (e.g., package) the feature collection data into a second data format. For example, the executor 2414 may be configured to receive feature collection data in a JSON format (e.g., unwrapped), and process (e.g., package) the feature collection data into one or more data packets. In an exemplary embodiment, the extractor 2414 is configured to code/decode the feature collection data, for example to form an association between one or more common features of the feature collection data and an associated data package. The memory 2416 may be configured to store the one or more data packets (e.g., relating to the common features of the samples), for example the one or more data packets may be embedded in the memory 2416. The memory 2416 may be configured to store the data packets in a data structure, for example a dictionary, which may be used for subsequent data analysis and processing, as discussed below.

In some embodiments, the system 2400 includes a compressor 2420. The compressor 2420 may be configured to receive information relating to the one or more common features of the samples (e.g., the feature collection data), and may be configured to compress the common feature data. The compressor 2420 may further be configured to communicate the compress feature collection data to one or more components of the system 2400. For example, the compressor 2420 may be configured to communicate the compressed feature collection data to the executor 2414, and the executor 2414 may be configured to process (e.g., package) the compressed feature collection data, as discussed above.

As shown in FIG. 24, the system 2400 also includes a connector 2430. In an exemplary embodiment, the connector 2420 includes one or more processors and/or memory configured to perform one or more operations described herein. For example, the connector 2430 may be configured to receive (e.g., from the extractor 2414) and/or store the one or more data packets associated with the one or more common features of one or more samples (e.g., feature collection data). According to an exemplary embodiment, the connector 2430 is also configured to receive data or information (e.g., message data, messages, samples, etc.) from one or more data sources, shown as data sources 2432. For example, the connector 2430 may be configured to receive message data from the data sources 2432. In some embodiments, the message data is an opaque binary blob (OBB), which includes packets of binary data. According to an exemplary embodiment, the connector 2430 is configured to receive the message data, extract (e.g., collect) one or more common features from the message data, and replace the common features of the message data with one or more associated data packages. In this regard, the connector 2430 may be configured to process (e.g., package) message data to replace common features of the message in order to compress the message and/or minimize the data size of the message.

Referring still to FIG. 24, the system 100 also includes a confluent 2434 and one or more consumers, shown as consumers 2436. In an exemplary embodiment, the confluent 2434 is configured to receive the processed (e.g., packaged) message data from the connector 2430, and is configured to communicate the processed message data to the consumer 2436. In an exemplary embodiment, the consumer 2436 is configured to receive the processed message data, and is configured process (e.g., unwrap, decode, etc.) the processed message data, for example when the processed message data is consumed. In some embodiments, the confluent 2434 is configured to select one or more samples from the message data at predetermined or predefined intervals (e.g., 1 in 1,000, 1 in 500, 1 in 250, etc.). The confluent 2434 may be configured to communicate the selected samples to an interface, shown as interface 40 (e.g., in at least FIG. 2). The interface 40 may communicate the selected sample to one or more components of the system 2400, for example the adaptive sample generator 2418 to generate one or more adapted samples based on the selected sample. As discussed above, the adapted sample may be communicated to the trainer 2412, for example to form one or more adapted associations between the one or more common features and the adapted sample data. In this regard, in an adaptive environment message samples may be selected (e.g., via the confluent 2434) at predetermined intervals, and adapted and/or analyzed in order to update the associations between the common features and the associated data to provide optimal correlations between the common features of each collection family.

As an illustrative example, the components of the system 2400 may be implemented to improve message size compression, as well as compression and decompression rates. For example, the static sample generator 2410, the trainer 2412, and the executor 2414 may be used to process data (e.g., analyze, package, etc.) in order to form one or more associations between common features of one or more samples (e.g., messages) and associated data packages. This information may be communicated to and/or received by the connector 2430. In an exemplary embodiment, the connector 2430 is configured to receive a series messages (e.g., via a series of opaque binary blobs) from the data sources 2432. The connector 2430 may extract (e.g., identify, collect) common features of the message, and replace the common features with one or more associated data packages. The connector 2430 may also package the processed messages into a second data structure, which may be communicated to the consumer 2436 (e.g., via the conduit 2434) where the message can be unwrapped. In an example embodiment, the system 2400 is configured to exhibit a five times improvement in message size compression, as well as a five times improvement of compression and decompression rates compared to traditional compression methods.

Figure 25:
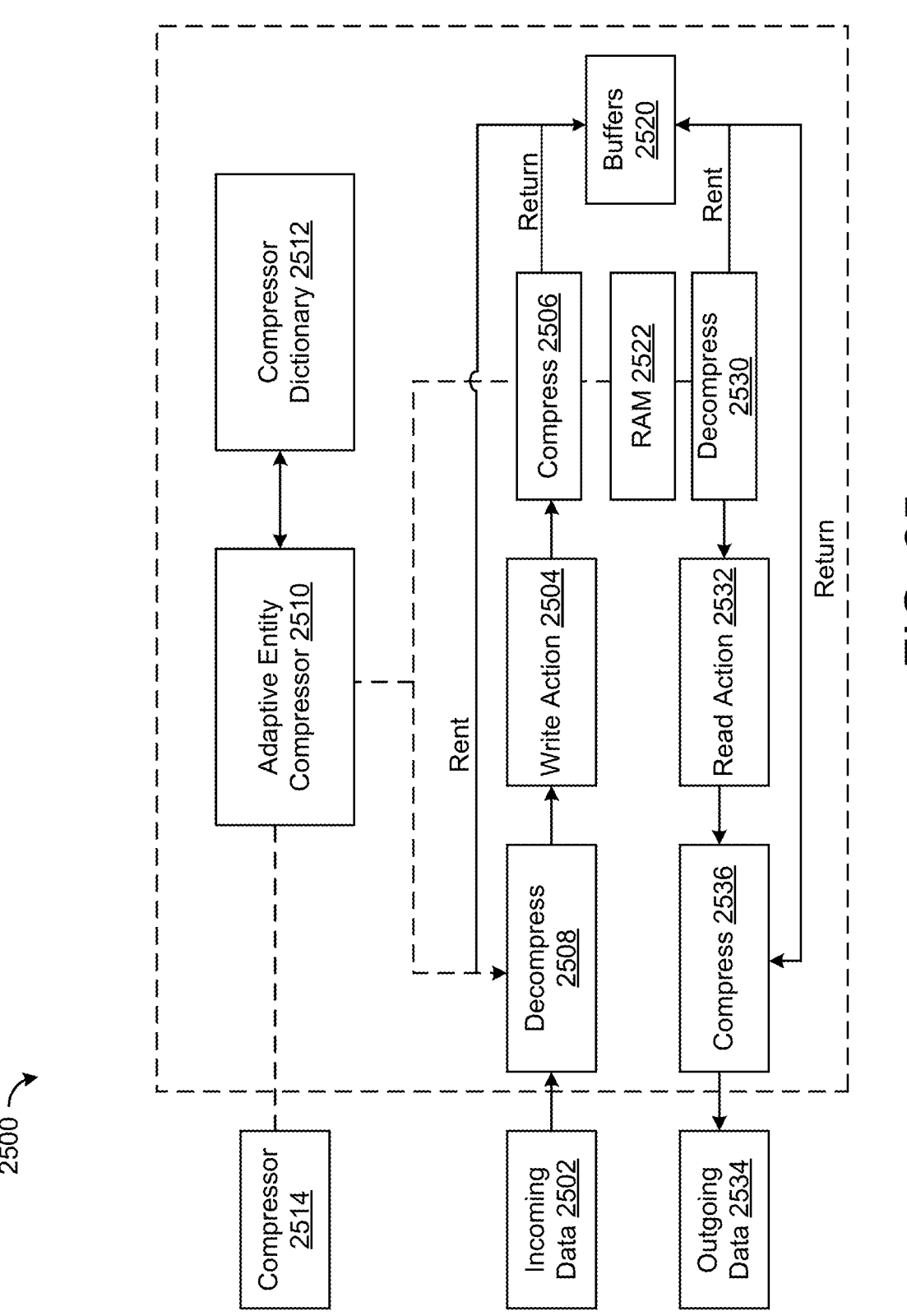
FIG. 25 is another block diagram of a system for performing dictionary compression and collecting data to adapt the dictionary, according to some embodiments.

Referring now to FIG. 25, a system and method for managing a data format in a system is shown, according to some embodiments. In some embodiments, the features of FIG. 25 are configured to allow a data format (e.g., a JSON, JavaScript format, etc.) to permeate within a system while limiting the computation resources consumed and/or the expenses associated with data storage and/or processing. For example, computational resources and/or time used when working with certain data formats (e.g., JSON format, etc.) tend to be high due to intense memory interactions. The features of FIG. 25 may provide an adaptive compression method (e.g., dictionary compression, etc.) that extracts features from a data format (e.g., JSON, etc. format) into a separately stored file that can be used to optimally compress the data format while in flight. In some embodiments, the data format objects (e.g., JSON, etc. format objects) are given types that identify which implementations are best to compress the data objects, for example using a predetermined format (e.g., a dictionary from a manufacturer, user, factory, etc.). Further, the features of FIG. 25 (e.g., a series of shared buffers, etc.) can be used to temporarily store the data objects (e.g., compressed data objects), for example to minimize the memory interactions with certain features of the system (e.g., a RAM, etc.). Advantageously, the features of FIG. 25 can improve memory (e.g., RAM memory) utilization while maintaining CPU usage through the use of shared buffers, as well as reduce network utilization for data formats between services within the system if the compression is enabled.

As shown in FIG. 25, the system 2500 is shown to receive data, shown as incoming data 2502. In some embodiments, the incoming data 2502 is in a predetermined data format, for example a JSON format. The system 2500 is shown to further be configured to perform a write action on the incoming data 2502 (e.g., the data format), shown as write action 2504, and is configured to compress the incoming data 2502, shown as compress 2506. In some embodiments, prior to performing a write action on the incoming data 2502 (e.g., at step 2504), the system 2500 is configured to decompress the incoming data 2502, shown as decompress 2508. In some embodiments, the system 2500 is configured to communicate the compressed data, for example to an adaptive entity compressor 2510, for additional data analysis and processing, as discussed below.

As shown in FIG. 25, the system 2500 further includes a compressor dictionary 2512. In an exemplary embodiment, the compressor dictionary 2512 is configured to store data format objects, for example based on data format object types that provide an optimal compression of the data objects. In some embodiments, the data format objects are stored based on a predetermined or predefined data format, for example based on a dictionary associated with a factory dictionary. In some embodiments, the adaptive entity compressor 2510 is configured to receive the compressed data, and is configured to communicate with the compressor dictionary 2512, for example to determine one or more data format objects (e.g., stored within the compressor dictionary 2512) that provide optimal compression of the compressed data. In this regard, the adaptive entity compressor 2510 (e.g., via the received compressed data, communication with the compressor dictionary 2512, etc.) may be configured to extract features from the compressed data (e.g., via the incoming data 2502, etc.), and store data objects associated with the compressed data in order to provide optimal compression of data in subsequent analysis and/or processing. In some embodiments, the adaptive entity compressor 2510 is also configured to communicate with an external compressor, shown as external compressor 2514, for example to determine one or more data format objects that provide optimal compression of the compressed data.

According to some embodiments, the system 2500 further includes one or more buffers, shown as buffers 2520, and a memory device, shown as RAM 2522. In an exemplary embodiment, the buffers 2520 are configured to receive, store, and/or provide data objects (e.g., compressed data objects) from/to one or more components of the system 2500. For example, the buffers 2520 may be configured to temporarily store one or more data objects and/or data formats, which may be utilized throughout the compression process. According to an exemplary embodiment, the buffers 2520 are configured to receive one or more data format objects that provide optimal compression of data (e.g., via the adaptive entity compressor 2510, the RAM 2522, etc.), and may store (e.g., temporarily) the objects. As shown in FIG. 25, upon receiving the incoming data 2502 the buffers 2520 may be configured to rent one or more of the data format objects to components of the system 2500, which may be used to write, compress, and/or store the incoming data 2502. In an exemplary embodiment, the compressed data (e.g., in the associated data format object) may be stored in the RAM 2522 for subsequent processing, and the one or more data format objects may be returned to the buffers 2520 (e.g., for subsequent data processing).

As shown in FIG. 25, the system 2500 is further configured to decompress the compressed data, shown as decompress 2530, perform a read action on the decompressed data, shown as read action 2532, and provide the data to another system or device, shown as outgoing data 2534. As discussed above, in an exemplary embodiment the outgoing data 2534 is in a predetermined data format, for example a JSON format. In some embodiments, after performing the read action 2532, the system 2500 is configured to compress the outgoing data 2534, shown as compress 2536. Similar to the decompression/compression process (e.g., as discussed in steps 2502-2508), the buffers 2520 may be configured to rent one or more of the data format objects to components of the system 2500, which may be used to decompress, read, and/or compress the outgoing data 2534. Further, following the read action 2532 and/or the compression of the outgoing data 2534 (e.g., the compress 2536), the one or more data format objects may be returned to the buffers 2520 (e.g., for subsequent data processing).

As an illustrative example, the components of the system 2500 may be implemented to improve memory utilization while maintaining CPU usage through the use of shared buffers, as well as reduce network utilization for data formats between services within a system. For example, the adaptive entity compressor 2510, the compressor dictionary 2512, and/or the buffers 2520 may be used to determine, provide, and/or use one or more of the data format objects to perform optimal compression of received data objects. In some embodiments, the system 2500 is configured to receive incoming data 2502 (e.g., in a JSON format). The buffers 2520 may be configured to rent one or more data format objects to components of the system 2500, which may be used to perform a write action and compress the incoming data 2502, which may be stored in the RAM 2522 in an optimal compression format. Further, the buffers 2520 may rent the one or more data formats to components of the system 2500, which may be used to decompress the data and perform a read action, in order to provide the outgoing data 2534 from the system 2500. In some embodiments, the components of the system 2500 (e.g., the buffers 2520, etc.) allow for improvement of RAM utilization (e.g., 80-90% compressed) while maintaining CPU usage through the use of the shared buffers, as well as reduce network utilization (e.g., 80-90% compressed) for data formats (e.g., JSON format) between services within the system.

FIG. 26A and FIG. 26B show flow of operations 2600 and 2620, according to some embodiments. Flow 2600 may be used to perform decompression during a read request. Flow 2620 may be used to perform compression during a write request. These processes may be performed, for example, by message controller 1660 of change-focused brokering system 1630.

According to some embodiments, flow 2600 begins by receiving a command to read data from storage in operation 2602. The read command may be initiated for any number of reasons. For example, the read command may be performed after data is received by a change-focused brokering system prior to the comparison to determine if there were any changes or the read command be performed after a request for data is received by a change-focused brokering system. According to some embodiments, flow 2600 continues with operation 2604 to request the substitution dictionary followed by reading the data from storage in operation 2606. Decompression may be performed in operation 2608 by finding all the values in the dictionary and replacing them with the (longer) keys.

Flow of operations 2620 is a method for compression during a write command according to some embodiments. Flow 2620 may begin by receiving a write command in operation 2622, requesting the substitution dictionary in operation 2624, replacing any dictionary keys found in the data to write with their values in operation 2626, and finally writing the compressed data in operation 2628. It is noted that compression and decompression as shown in process 2600 and 2620 can be performed prior to storing any of the data and/or can be performed before sending data in a message. Advantageously, compressing data on the message bus can lower congestion and thus lead to a more response system. In some embodiments, the messages are compressed using dictionary compression and the dictionary is shared with the consumers for decompression.

FIG. 26C shows flow of operations 2640 for creating and adapting the compression dictionaries to maintain high compression ratios even as the common messages on the system are changing according to some embodiments. According to some embodiments, flow 2640 begins by obtaining a sampling of messages in operation 2642. Flow 2640 may include clustering a set of messages into families based on common feature. Clustering can be performed by monitoring what data is included in write requests. For example, messages can be converted into a binary array where each element is indicative of a specific measurement, state, etc. that is included in the message. After messages are converted into a binary array, the Jaccard similarity between arrays can be calculated and agglomerative hierarchical clustering can be used to group the messages together based on their Jaccard similarity. Messages can be embedded into numerical vector forms as well. For example, text of a message may be embedded using a specialized form of a neural network. Once text is embedded into its numerical vector form, any classical clustering technique can be used on the vectors. For example, performing k-means clustering on the numerical vector representations of the analysis clusters. In some embodiments, other clustering algorithms may be used (density-based algorithms like OPTICS or DBSCAN, Gaussian mixture models, or agglomerative hierarchy clustering).

In some embodiments, flow 2640 continues by determining a dictionary for each family (i.e., each determined group or cluster) of messages that compression will be performed on in step 2646 according to the exemplary embodiment. Dictionaries may be determined by performing a statistical analysis of the messages being sent and converting high frequency components of words, whole words, or phrases into a binary representation that uses fewer bits. In the dictionary (e.g., a key-value mapping) each word component, whole word, phrase, etc. may become a key in the dictionary and the shorter substitute word or number may become the value. For example, the frequency of each word may be tracked, and each word or symbol given an integer value, the high frequency words and symbols may be given low integer values. This may allow for previously described integer compression techniques to be used on the resultant integer array. In some embodiments, every 4-letter combination may be given a substitute form based on the frequency of that 4-letter combination. In some embodiments, the vector embedding used in step 2644 is dependent on the form of dictionary compression. For example, if every 4-letter combination is to be a key in the dictionary, the embedding is chosen such that messages with similar frequencies are nearby in the embedded space (the frequency of the combinations could itself be the embedding). Advantageously, by first finding clusters of similar messages the dictionary can be customized for each cluster, increasing the overall compression ratio and/or reducing the amount of time required to perform compress/decompression.

According to some embodiments, flow 2640 continues by storing the dictionaries used for each family of messages in operation 2648. The initial set of dictionaries stored in 2648 may be used to perform dictionary compression on the message bus by giving message consumers and producers access to the dictionaries.

Message type and frequency may change on the message bus over time. Changes may be caused by new features, algorithms, extensions, etc. coming online within the greater system for controlling and monitoring a building. To maintain compression efficiencies with the changes, flow of operations 2640 may include additional steps to adapt the compression dictionaries. According to some embodiments, flow of operations 2640 includes receiving an additional sampling of messages in operation 2650. For example, one out of every thousand messages may be stored and provided during operation 2650, flow of operations 2640 may include operation 2652 to determine if new families of message should be created. Operation 2652 may be performed by repeating the clustering analysis of operation 2644 or operation 2652 may include a different clustering analysis that is initialized with the current set of the message clusters. For example, the centroids of the previous cluster may have been stored in operation 2644 and used to initialize a k-means clustering technique. After new families of messages are obtained (or it is determined that the families should remain the same), flow of operations 2640 may include step 2654 to determine a dictionary for each family of messages for which compression will be used. As in operation 2652, operation 2654 may also repeat operation 2646 or operation 2654 may use a different method for determining the dictionaries that will be used. In some embodiments, after completion of operation 2654, flow 2640 returns to operation 2648 to store the dictionaries and begin the process collecting new messages in order to adapt the dictionaries again.

Extensions to a Brokering System

In some embodiments, the change-brokering system is configured to allow for extensions to be deployed on an actively running system and subsequently used by any of the clients communicating over the message bus. These extensions may be accessed using the same hierarchical wire format (e.g., JSON) used to communicate other messages over the message bus. For example, the change-focused brokering system may respond by executing extension code based on the presence of a specific attribute or key-value pair within an entity.

Referring back to FIG. 16, according to some embodiments change-focused brokering system, is shown to contain extension manager 1656. Extension manager may be configured to contain additional instructions (e.g., feature 1 1657a and feature 2 1657b) that may run based on a trigger in a message received by the change focused message broker. In some embodiments, upon receiving a message, message controller 1660 can execute extension manager 1656 to determine if any additional code should be run in response to the json. For example, consider the json:

```
{
    "pl":{
        "_type":"plant",
        "equipment":["@cl"],
        "outsideAir":{
            "temperature":{
                "_type":"timeSeries",
                "spatialUnit":"0.1*degC",
```

-continued

```
                "temporalUnit":"1*s"
            }
        }
    }
    "cl":{
        "_type":"chiller",
        "plant":"@pl1"
        "capacity":[500, "kW"]
    }
}
``` indicating a plant with a chiller and an outside air temperature timeseries. Upon receiving an entity of type timeseries message controller 1660 may use extension manager 1656 to determine that a timeseries is a registered extension and the compression techniques described in previous sections should be run prior to storage. As a second example, message controller 1660 may use extension manager 1656 to determine that chiller is another type of extension and calculate a default performance model for a chiller of the specified capacity if no model is provided or already in storage.

Figure 27:
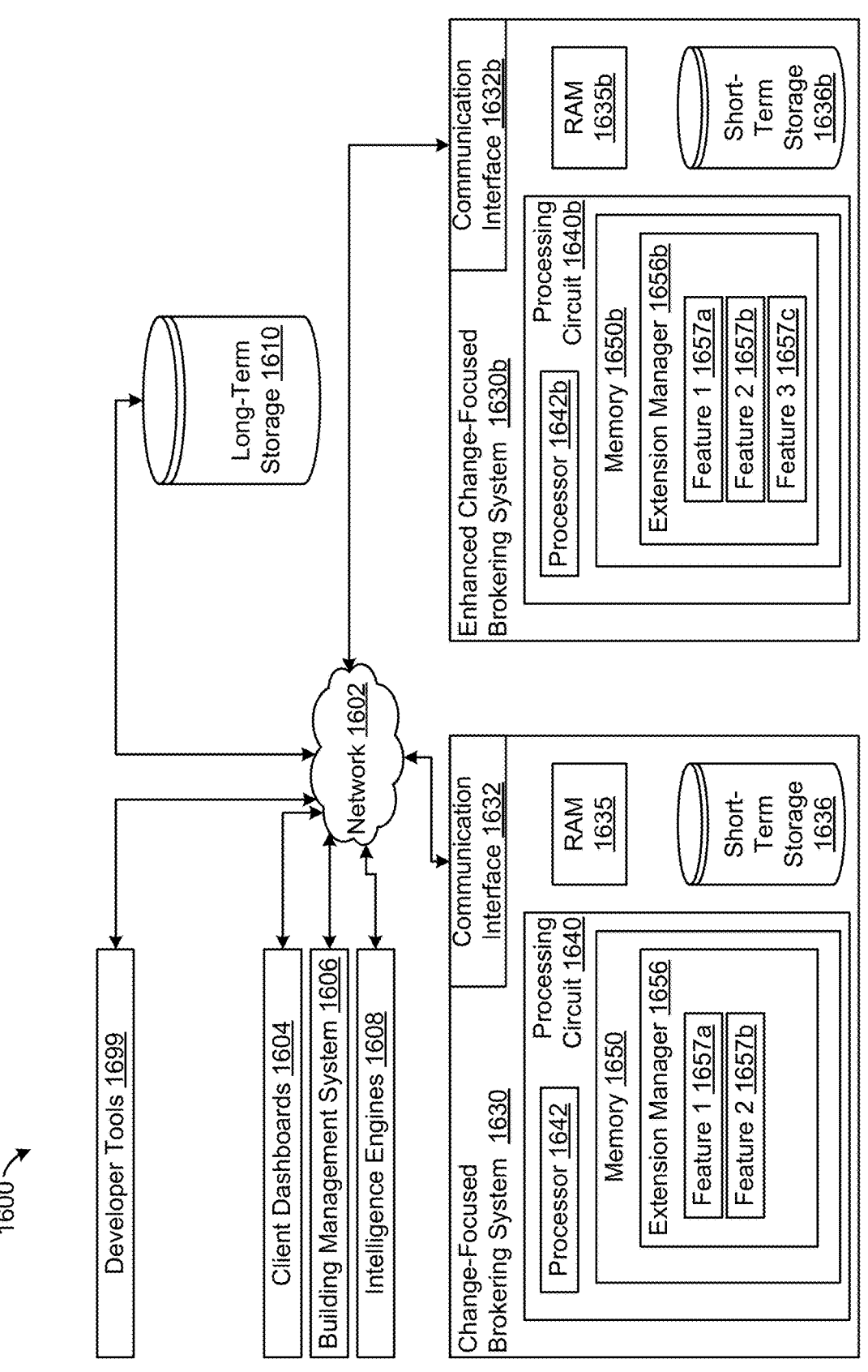
FIG. 27 is a block diagram of a system with an enhanced change-focused brokering system being commissioned, according to some embodiments.

FIG. 27 shows a system 1600 using change-focused brokering systems in the process of being upgraded to incorporate a new extension (e.g., feature 3 1657c) according to some embodiments. System 1600 is shown in FIG. 27 with a subset (e.g., as compared to FIG. 16) of the features of change-focused brokering systems 1630 and 1630b (described above) shown in order to focus on the components of the system 1600 that may be used during an upgrade of the change focused brokering system. According to some embodiments, system 1600 is shown to include developer tools 1699. Developer tools 1699 may be a computer, device, or combination of devices (e.g., multiple nodes on a computer cluster) capable of communicating over the network. Developer tools 1699 may be configured to create and deploy (e.g., install or commission on other computers of the network) isolated compute environments running a change focused brokering system. For example, a developer may create a new image for an isolated compute environment running an enhanced changed-focused brokering system 1630b with an extension manager 1656b that includes instructions to implement feature 3 1657c. After this image is created, developer tools 1699 may be configured to deploy said image to create a running version of enhanced change-focused brokering system 1630b. Developer tools 1699 can then cause enhanced change-focused brokering system 1630b to be operational. For example, developer tools 1699 may send a message to either of the change-focused brokering systems 1630 or 1630b, which would intern relay a message to all subscribers and publishers on the message bus (e.g., client dashboards 1604, etc.) that enhanced change-focused brokering system 1630b is active or developer tools 1699 may send the message to all subscribers and publishers itself. In some embodiments, enhanced change-focused brokering system 1630b upon being deployed may be configured to automatically send a message to all subscribers and publishers indicating that it is the active message broker on the bus. Once the new message broker is deployed it is possible to decommission the existing message brokers of the old revision.

FIG. 28 shows flow of operations 2800 for adding an extension to a change-focused brokering system according to some embodiments. In some embodiments, the flow of operations 2800 is executed by system 1600 as described with reference to FIG. 27. According to some embodiments, process 2800 begins by receiving an image for an isolated compute environment (container, virtual machine, etc.) implementing an enhanced change-focused brokering system that includes instructions for providing a new feature (i.e., the extension). For example, the developer could have completed compilation of code for the enhanced change-focused brokering system and has readied it for deployment. Flow 2800 may include deploying, from the image, an isolated compute environment running the extended message broker in operation 2804. Flow 2800 may include routing all traffic through the extended message broker in operation 2806. For example, a message may be sent to all publishers and subscribers on the message bus that the extended message broker is available, and all traffic should now go through it. In some embodiments, the extended message broker 1630b will automatically begin handling messages and old versions may be decommissioned, implicitly forcing all traffic through the extended message broker. According to some embodiments, flow 2800 includes decommissioning message brokers running previous versions (for example, message brokers without the feature or extension) in step 2808.

According to some embodiments of flow 2800, after operation 2808 is performed the new extension is ready to be used upon being triggered by the existence of an attribute or special key value pair inside the message (e.g., inside the JSON or other structured and/or hierarchical serialization format used to communicate over the message bus). Flow 2800 may include operation 2810, to receive a message containing a specific field in the message format; and executing that new feature in response to the message containing the specific field in operation 2812.

The extended message broker could, for example, implement the timeseries compression described by FIGS. 20-23 as an extension and execute the extension code based on a timeseries being referenced in a message to save data. In some embodiments, the operations of FIG. 19 can be executed as an extension based on a read from storage message including a timeseries attribute and the message broker may respond with data from both storage devices (e.g., tiers etc.). In some embodiments, additional functionality may be implemented as an extension. For example, reading data using BACnet protocols may be performed anytime in response to a read request including a BACnet point attribute; simulations may be performed in response to requests for timeseries data in the future or based on the existence of a simulation attribute; optimizations may be performed by requesting an unknown attribute; or fault detection may be performed based on the specification of a complex event processing formula in the message.

Note that storing data in JSON makes it easier to access the hierarchal structure for fast algorithm processing. Schema can be added, and any client that knows about the new schema (e.g., expanded data model) can query for the new information. In some embodiments, the broker tells all client machines about the schema change. In some embodiments, the broker includes a translation layer that allows interoperability between clients that use the same data, but use different names.

Advantageously, an extendible brokering system can allow new algorithms and intelligence systems to add data and amounts of required or beneficial code into the brokering system to make the development and/or deployment of the algorithms more efficient. In some embodiments, if there is a conflict with the schema related to the attributes of two different extensions, separate name-spacing may be used to resolve the conflict. For example, during development time of the message broker the developer may be notified of the conflict when the image of the message broker is made. In some embodiments, the source of the message is used to provide an automatic namespace, and may prevent conflicts with similarly named and organized extensions from different sources (e.g., algorithms, intelligence engines, etc.)

Building Automation Centric Applications of a Change-Focused Brokering System

Storing large amounts of data, in fast access storage, using change-focused brokering system through the sequential use of quantization, delta encoding, and bit packing compression can open several applications of such a system that were previously managed by disparate systems within a large architecture. Advantageously, change-focused brokering system 1630 can provide all of these use cases from within a single messaging and data system.

Figure 29:
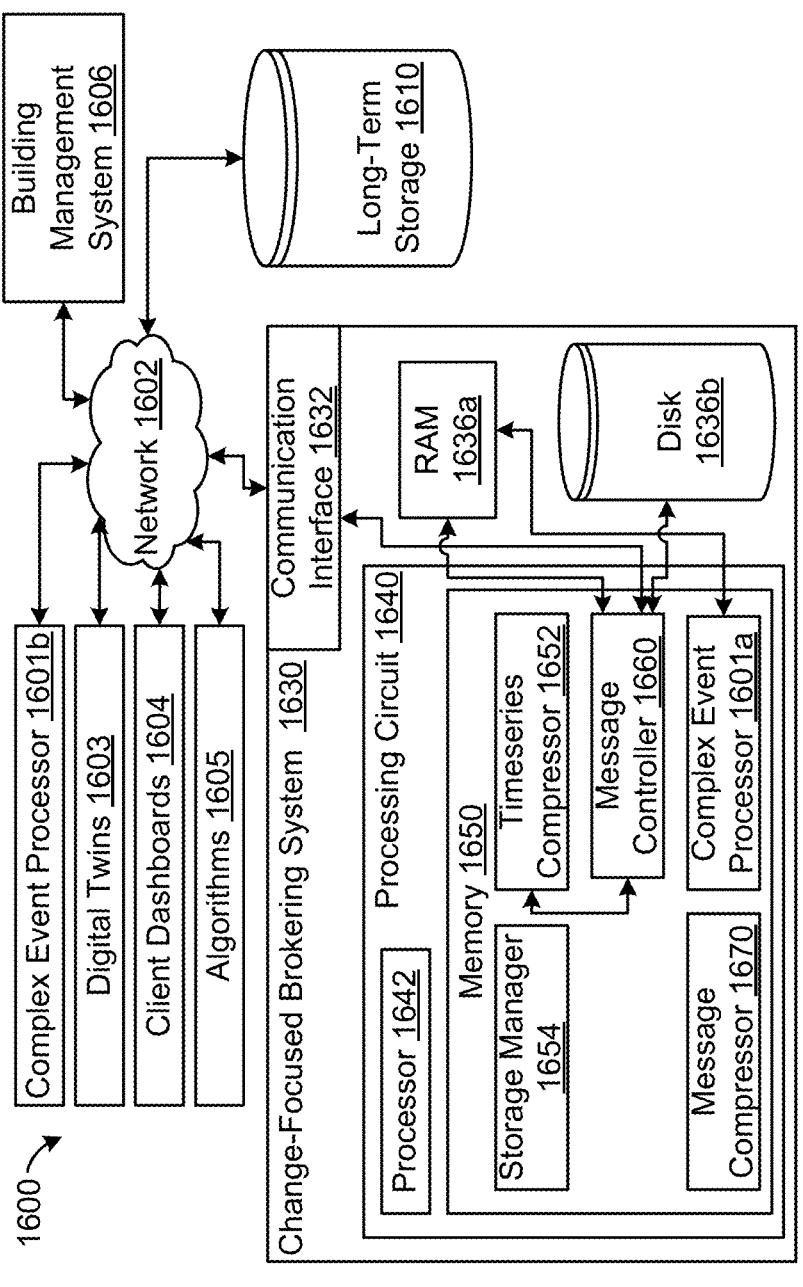
FIG. 29 is a block diagram of changed-focused brokering system providing multiple tiers of storage to meet the requirements of multiple building applications, according to some embodiments.

FIG. 29 shows an embodiment of system 1600 for controlling and monitoring a building system using a change-focused brokering system. Some portions of the system are not shown so that it is possible to focus on the components of system 1600 and change focused-brokering system 1630 that are necessary to provide various building automation centric applications. According to some embodiments, system 1600 includes complex event processor 1601b, digital twins 1603, client dashboards 1604, algorithms 1605, and building management system 1606 all connected to network 1602 and able to communicate to change-focused message broker 1630.

In some embodiments, building system 1600 includes complex event processor 1601b. Complex event processor 1601b may be any system that requires rapid access to live data. For example, complex event processor 1601b may be a critical fault detection system monitoring compressor health for signs of an imminent failure. Complex event processor 1601b can also perform automated actions in response to a trigger. For example, to shut down the compressor before in response to the possibility of a potential failure. Complex event processors are often classified as systems that process data before it is stored by the main database of a system. Change-focused brokering system 1630 can determine that a change has occurred and provide the data complex event processor 1601b before or as data is sent to long-term storage 1610. Allowing for the processing engine to perform the required near real-time actions without additional considerations.

According to some embodiments, system 1600 includes building management system 1606. Building management system 1606 may include additional monitoring and control processes. For example, building management system 1606 may include real time control processes (e.g., a PID controller), state machines that switch between different control logic based on building system conditions, and supervisory control. In general, building management systems also need to operate on low latency data. Building management systems may require sampling data as fast as 100 ms to perform pressure control (e.g., supply fan control, exhaust fan control, etc.) and have other control functionality (e.g., supervisory optimization) that only requires data every 15 minutes. In some embodiments, the control processes may request and/or obtain their data from a tier of storage (e.g., RAM or disk) based on the speed of the dynamics of the building system they control or based on the data sampling requirements (e.g., period, etc.).

According to some embodiments, system 1600 includes client dashboards 1604. Client dashboards 1604 may include displays for monitoring of building systems. For example, a building operator may view client dashboard 1604 for up-to-date information regarding the building system. Client dashboard 1604 for may include displays showing the alerts from complex event processor 1601*b* or results and measurements from building automation system 1606. At any time, an alert is displayed, an operator may use client dashboards 1604 in order to view information related to that alert. Low latency data is required for operators to obtain and react to information from complex event processor 1601*b*. For example, data that lags behind an alert from complex event processor 1601*b* could lead the operator to believe that the alert was a false alarm and prematurely dismiss it. Client dashboards 1604 may subscribe to the same messages for data as complex event processor 1601*b*, and thus be capable of updating the data as complex event processor 1601*b* processes it.

In some embodiments, building system 1600 includes digital twins 1603 and algorithms 1605. Digital twins 1603 may require up to date information similar to the client dashboard so that an operator can view the current status of the digital twin and potentially query for predictions of future behavior. Digital twin predictions can, for example, be used to validate alerts from complex event processor 1601*b*. Similar to client dashboards, the low latency data may be required by digital twins to ensure that displays are up to date and do not lag any complex event processor. Digital twins 1603 may also require historical timeseries data to predict maintenance needs or replay previous operations in a digital environment. Timeseries data used by simulations or data replays may be obtained from a slower tier of data (e.g., data that has been committed to disk storage, etc.).

Algorithms 1605 may also require both live conditions and historical timeseries data. Algorithms 1605 may, for example, perform optimization to provide setpoints to the control system. In some embodiments, the more recent the data is used to provide the more appropriate (e.g., efficient, optimal, etc.) the setpoints will be for the current conditions (which may have changed since the measurements were received). Additionally, algorithms 1605 may require large amounts of historical data to train their models. Some building automation systems do not save all the data that is measured. For example, to save storage space, specific data points must be added to a list of trends that save a recent history of data (e.g., the past day, the past week, or the last 72 COVs). When new algorithms are proposed for a site, time may be required to collect data specific to that site to train the model. Advantageously, in change-focused brokering system 1630 can continuously archive all data values with less storage because of the described compression schemes. All data may be available for a new algorithm if it was measured. Saving all data may eliminate months of data collection before the algorithms can provide value to the building operators or owners. Furthermore, in some embodiments of the present disclosure, it may be possible to generate virtual sensors for data that is not measured. In such cases, algorithms may use data provided on a standard interface even if it was not measure.

According to an embodiment shown in FIG. 29, change-focused brokering system is shown to have its short-term storage 1636 broken out into RAM 1636*a* and Disk 1636*b*. In some embodiments, storage may be broken out into "hot storage" meant to be accessed rapidly and often (e.g., including f RAM, embedded multimedia cards (eMMC), or solid-state drives), "warm storage" meant to be accessed relatively rapidly, but not as often as hot storage (e.g., including solid-state drives or magnetic disks), and "cold storage" meant to be accessed infrequently and as an archive (e.g., including of magnetic network drives of cloud storage).

According to some embodiments, change-focused brokering system 1630 can perform some complex event processing with complex event processor 1601*a* in addition to or instead of complex event processor 1601*b*. Performing complex event processing within change-focused brokering system 1630 may eliminate the need for a large number of messages potentially yielding less congestion on the message bus and a more response system. In some embodiments, complex event processor 1601*a* is implemented as a feature of extension manager 1656 of FIG. 16 or 27.

With reference to FIG. 29 the operations of change-focused brokering system 1630 uses to provide the above functionality from behind a single interface or with a single messaging format are described according to some embodiments. For example, a message containing current values of states (e.g., measurements, control states, calculated states, etc.) is received by communication interface 1632. According to some embodiments, message controller 1660 may be configured to store the current values from the message in RAM 1636*a*. In some embodiments, storing the current values in RAM 1636*a* may include reading the stored data, doing a comparison, and merging the new values with an existing timeseries stored in RAM 1636*a* or storing the changes so that only changes are sent to consumers as described with reference to FIG. 17, for example. In other embodiments, the current values received may overwrite the existing values for any states that are included in the message. According to some embodiments, message controller 1660 can use storage manager 1654 to first overwrite all the data stored in the current value section of RAM 1636*a*. At this point all consumers subscribed to receive messages regarding the current value of states prior to a check point may be sent messages indicative of the new values. Thus, new requests for the current values indicated in some way to be sourced from RAM 1636*a* (e.g., flagged as pre-checkpoint, from RAM, class 1, etc.) will receive the value from change-focused message broker. All real-time data requirements can be met. For example, complex event processor 1601*b* and 1601*a* may both use data "pre-check-point".

According to some embodiments, after overwriting the data in the current value section of RAM, message controller 1660 can do the same for a current value section on disk 1636*b* (e.g., warm storage). Additionally, message controller 1660 may be configured to read any timeseries values in RAM 1636*a* and disk 1636*b* that store values for states contained in the message. Reading timeseries data may include using timeseries compressor 1652 to decompress the data as necessary based on the stored data format. Once timeseries data for the values contained in the message are read by change-focused brokering system 1630 and decompressed, the values from the message may be quantized and added to the timeseries. In some embodiments, the timeseries are compressed prior to being stored.

Based on statistical analysis of the data used by the client applications connected to change-focused message broker 1630, storage manager 1654 may be configured to determine how much of the timeseries to keep stored in RAM 1636*a*. According to some embodiments, a timeseries is created to be stored in RAM 1636*a*. Timeseries compressor 1652 may be configured to compress both timeseries using a form of delta encoding and bit packing compression and storage manager 1654 may be configured to store the compressed timeseries in RAM 1636*a* and disk 1636*b*, respectively. In some embodiments, after timeseries data has been locally stored in change-focused brokering system 1630, the consumers subscribed to "low-latency data" can be informed of the new information. Additionally, read requests for the same data latency level may now receive the values contained in the message. For example, client dashboards 1604 and certain aspects of the building managements system may subscribe to the low-latency data after the checkpoint of storing data to local disk and change-focused brokering system 1630 can send the data over the message bus after the checkpoint of storing the data in disk 1636*b* (e.g., warm storage)

According to some embodiments, message controller 1660 may be configured to perform additional processing in order to prepare the states in the message for long-term storage. For example, message controller 1660 may use timeseries compressor 1652 to perform additional or different forms of compression on the data for long-term storage. Performing the compression may require storage manager 1654 to obtain information from long-term storage 1610 about the current timeseries information stored. In some embodiments, the message will contain no values of states in timeseries data and preparing the data for long-term storage may only require determining if any change has occurred so that it is available for replay in long-term storage 1610. Once the data is prepared, message controller 1660 may be configured to generate a message sending new information related to the values in the original message to long-term storage 1610. After or during storing data in long-term storage 1610, consumers that use timeseries data and do not require immediate access to the data may be notified of the changes. For example, if digital twin 1603 is being used to produce a replay, it will have access to data from the message stored in long-term storage 1610.

Change-focused message broker 1630, in some embodiments, provides three levels of service. For example, near real-time service may be provided when messages are sent from only RAM 1636*a* (e.g., hot storage) and can provide latencies in the range of a few milliseconds. Low-latency service may be provided when working with timeseries or having a requirement that data passes through a checkpoint and has been stored to a local disk. For example, low-latency service can have delays on the order of tens of milliseconds. General service may be provided when cold storage (e.g., network disk storage is used). For example, general service may provide latencies of approximately 1 second. Advantageously, providing multiple levels with change-focused brokering system 1630 allows the consumer with the choice of the most cost-effective and lowest latency access possible to a pipeline of incoming changes. Additionally, change-focused message broker 1630, as described herein, provides long-term and short-term storage of timeseries data as well as current values. Thus, providing for simplicity in client-side coding when obtaining the data, reducing the latency caused by having two data sources storing inputs for a single algorithm, and reducing the time-to-market for new algorithms by providing predictable service levels to developers.

FIG. 30 shows flow of operations 3000, for providing tiered levels of latency within a brokering system according to some embodiments. Flows of operations 3000 may be performed by any suitable hardware. For example, the flows may be performed by change-focused brokering system 1630 or any components thereof. Flow 3000 may begin by receiving a message containing a new value of a measurement, state, etc. of the building system in operation 3002. For example, the measurement or state could come from a building automation system, an optimization system, a fault detection method, etc. Flow 3000 may include operation 3004 to compare the received value to the value for the same measurement, state, etc. of the building system currently stored in RAM (or another version of "hot" storage). Operation 3004 may include decompression of the currently stored values if any form of compression is being used on the data stored in RAM. Flow 3000 may also include operation 3006 to send messages to any real-time subscribers of data. For example, real-time subscribers (e.g., tier one, pre-checkpoint, etc.) may include complex event processing systems and/or portions of the building automation system that require real-time data (pressure control loops for example). According to some embodiments, flow 3000 includes operation 3008 to store the received values in the RAM location that is dedicated to current values. Operation 3008 may include performing compression as needed to the data if compression (e.g., dictionary compression) is being used on the current values stored in RAM. message.

In some embodiments, flow of operations 3000 continues with saving any of the changes to current values to local disk in step 3010. Flow 3000 may include operation 3012 to send messages to any low-latency subscribers. Low-latency subscribers may include, for example, standard control algorithms, client dashboards or less critical operations of the building automation system. Compression may be used during this step as well dependent on whether local disk storage is compressed. After step 3010 is performed, the data received in the message may be communicated to any client devices requesting data flagged as low-latency (e.g., tier two, low-latency, post-checkpoint etc.).

In some embodiments, timeseries data is processed after the current values are stored to local disk. For example, the current values of data may be stored locally (in RAM or disk). Values of the timeseries data may be sampled from the current values periodically and independent of receiving the message. Operation 3014 may begin on expiration of a periodic sampling timer rather than after data has been messaged to low-latency subscribers. In some embodiments, flow 3000 continues with operation 3014 to read any timeseries data related to a change indicated by the message. The timeseries data could be read from any storage (RAM, local disk, long-term storage) and decompressed if stored in a compressed state. Flow 3000 may include operation 3016 to merge a new data into the timeseries. Operation 3016 may include quantizing the data and performing a delta encoding process. According to some embodiments, process 3000 continues by determining an amount of time series data to keep in local disk in step 3018 followed by storing the timeseries both in local disk and long-term storage in step 3020. The amount of data that is stored in local disk may depend on the messages that are being sent to the message broker. For example, the message broker may periodically perform a statistical analysis to determine how much historical data of different types is requested often and decide to keep an appropriate amount of data locally in order to be more responsive to historical data requests. After operation 3020 is performed, subscribers to the general level of service (tier three, general, historical, etc.) can be sent a message reflecting the change. Additionally, any requests for timeseries data may receive a response that contains the new value in the message that was received at the beginning of flow of operations 3000. Digital twins, intelligence systems, and algorithms may be subscribed to this level of service, for example.

Building System with Distributed Controls

Figure 31:
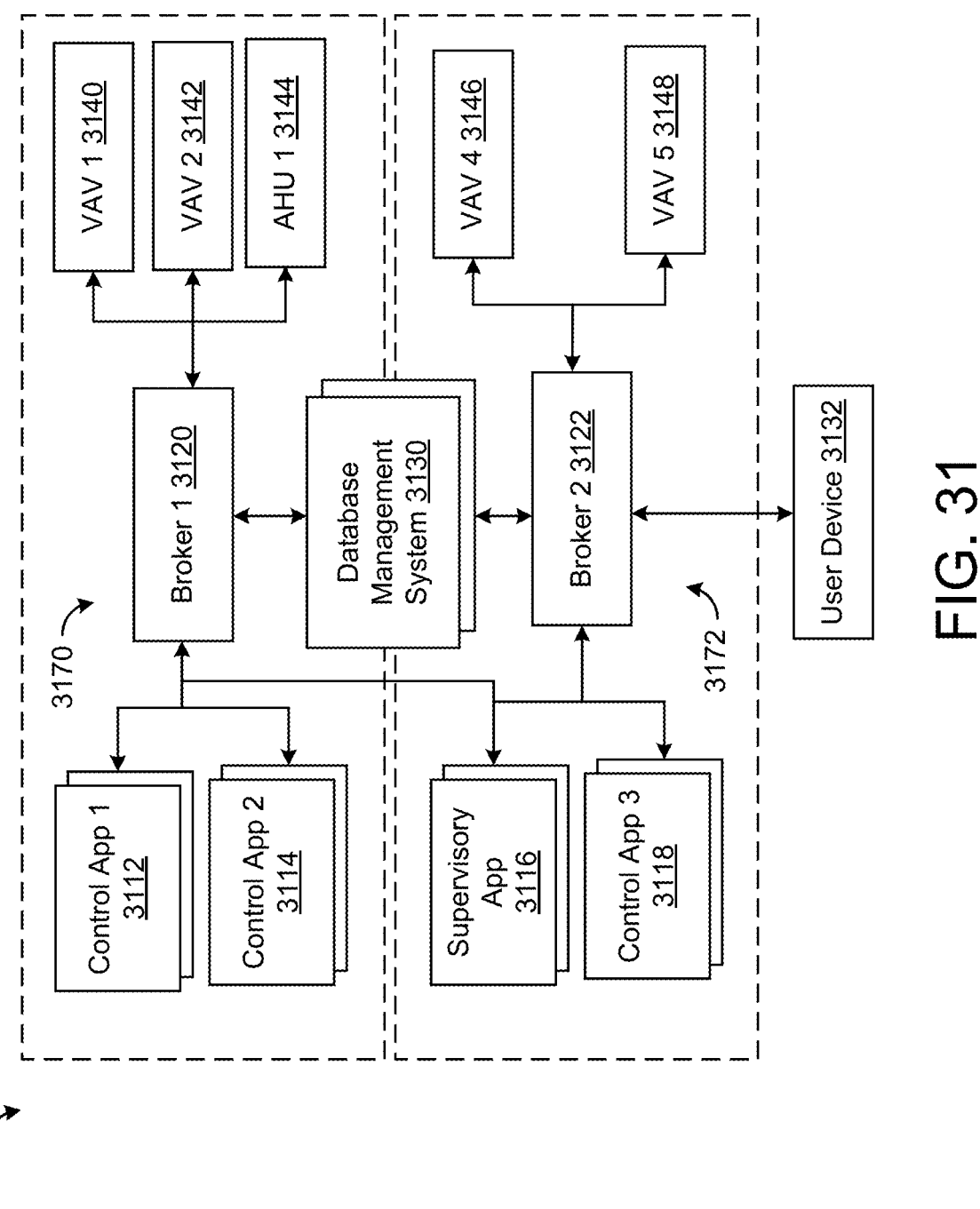
FIG. 31 is a block diagram of a distributed control system utilizing message brokers, according to some embodiments.

Referring generally to FIG. 31, a system for providing distributed controls is shown, according to an exemplary embodiment. According to some embodiments, the features of FIG. 31 are configured to provide an information technology (IT) managed internet protocol (IP) infrastructure that leverages certain protocols (e.g., user datagram protocol (UDP), HTTP, HTTP/3, etc.) to provide certain control loops. The features of FIG. 31 (e.g., the control loops enabling redundant control, etc.) may allow the system to run on an IT infrastructure, such as an existing server, while remaining reliable. Further, in an exemplary embodiment the features of FIG. 31 enable one or more applications to run on a "fit-for-function" hardware, such as a container running on an IT managed virtual machine (VM) or server. Advantageously, the features of FIG. 31 provide a stateless service that is simpler to manage and scale compared to stateful counterparts, which reduces the amount of resources consumed during technology deployment (e.g., electrical work associated with operational technology (OT) deployment, etc.) and/or increases efficiencies in the technologies industry (e.g., reduces the need for certain existing stockkeeping units (SKUs), etc.). Further, the features of FIG. 31 provide a system that allows for one or more applications to be handled as a unit, for example because the one or more applications can be run on a scaled hardware (e.g., Linux hardware, etc.).

As shown in FIG. 31, a system 3100 for providing distributed controls (e.g., with a broker) is shown, according to some embodiments. The system 3100 is shown to include one or more applications, one or more brokers (e.g., a change-focused brokering system as previously described), a database management system, and one or more input-output-modules (IoMs) or conversion devices. In an exemplary embodiment, the one or more applications are one or more controls or control systems configured to read/write data, the broker is a communications architecture configured to facilitate communication of data and/or information. Further, the database management system may be or include a data storage device configured to store data (e.g., a long-term online analytical processing (OLAP) database, etc.), and the IoMs may be part of one or more HVAC devices or pieces of building equipment (e.g., a variable air volume (VAV) system, etc.), for example for analog/digital conversion.

In some embodiments, the various applications of system 3100 may be operated within different isolated compute environments (e.g., virtual machines, containers, different hardware, etc.). For example, those applications in fault domain 3170 may operate within one isolated compute environment, those applications in fault domain 3172 may operate in a second isolated compute environment, and the database management system 3130 may operate in a third isolated compute environment. In some embodiments, an isolated compute environment may operate on a node in a cluster of computers (e.g., local cluster, cloud architecture, etc.) and another isolated compute environment may operate in edge hardware (e.g., an input-output module (IoM) used to receive measurements and/or output analog signals to the building system). For example, an input-output module may execute control applications closely related to the inputs and outputs that it manages.

In some embodiments, system 3100 includes a first control application (e.g., shown as control app 1 3112), a second control application (e.g., shown as control app 2 3114), a third control application (e.g., shown as supervisory app 3116), and a fourth control application (e.g., shown as control app 3 3118). The applications 3112-3118 may be stateless applications and may be configured to read/write data. For example, the applications 3112, 3114 are configured to read/write data directly to a first broker (e.g., shown as broker 1 3120), as if the applications 3112, 3114 are objects running within their own runtimes. Similarly, as another example, the applications 3116, 3118 are configured to read/write data to a second broker (e.g., shown as broker 2 3122), as if applications 3116, 3118 are objects running within their own runtimes. According to some embodiments, the brokers 3120-3122 have redundant standby variants and are scaled up/down via querying a database (e.g., a database management system), as discussed below. In some embodiments, the applications 3112-3118 are configured to read/write data indirectly and/or to different or additional components of the system 3100 (e.g., supervisory app 3116 is configured to read/write data to broker 1 3120, etc.). In some embodiments, brokers 3120-3122 are substantially similar to change-focused brokering system 1630 and can perform the flows of operations described with reference to the change-focused brokering system (e.g., the flows described in FIGS. 17, 19-23, 29, etc.). Messages communicated over the message bus and by message brokers (e.g., brokers 3120 or 3122) may be communicated in a compressed form (e.g., using dictionary compression). For example, message brokers may implement the functionality of systems 2400 and/or 2500 and perform flow of operations 2600, 2620, and/or 2640.

As shown in FIG. 31, the system 3100 also includes a database management system 3130, and one or more HVAC devices or pieces of building equipment capable of communicating to a broker (e.g., broker 1 3120) through an IoM. For example, the system 3100 is shown to include a first HVAC device (e.g., shown as VAV 1 3140), a second HVAC device (e.g., shown as VAV 2 3142), a third HVAC device (e.g., shown as AHU 1 3144), a fourth HVAC device (e.g., shown as VAV 4 3146), and a fifth HVAC device (e.g., shown as VAV 5 3148). In some embodiments, the database management system 3130 is a long-term database, for example an OLAP database. The database management system 3130 may be in communication with the brokers 3120-3122, for example to communicate data or information in response to one or more queries (e.g., via UDP, HTTP, HTTP/3, etc. protocols). In some embodiments, the database management system 3130 is in communication with a user or user device (e.g., shown as user device 3132), for example to communicate data or information in response to one or more queries. In an exemplary embodiment, the HVAC devices 3140-3148 are or include stateless IoMs, and are configured to send/receive information and/or implement or perform one or more control actions or decisions. For example, the HVAC devices 3140-3144 are configured to receive data from a first broker (e.g., the broker 1 3120), and the VAVs 3146-3148 are configured to receive data from a second broker (e.g., the broker 2 3122). In some embodiments, the HVAC equipment 3140-3148 are configured to receive data indirectly, and/or from different or additional components of the system 3100.

In some embodiments, the applications 3112-3118, the brokers 3120-3122, and/or the database management system 3130 is/are part of a hardware of the system 3100. For example, the applications 3112-3118, the brokers 3120-3122, and/or the database management system 3130 may be part of any suitable Linux hardware system and the brokers (e.g., brokers 3120 and 3122) may be implementations of change-focused brokering system 1630. In some embodiments, the HVAC devices 3140-3148 are a part of another suitable hardware and/or software system, for example a system different than Linux hardware system. Further, according to some embodiments the communication pathways within the system 3100 (e.g., between applications 3112-3118 and/or brokers 3120-3122, between brokers 3120-3122 and/or database management system 3130, etc.) are redundantly arranged and/or specified, for example to allow failover to occur immediately. For example, the applications 3112-3118 may be diversified or spread out over the hardware system (e.g., the Linux hardware system, etc.), the brokers 3120-3122 and/or the database management system 3130 may be diversified or spread out over the hardware system within a volume (e.g., within a volume of the Linux hardware system), and/or the HVAC devices 3140-3148 may be external and/or provide state. In this regard, the features of the system 3100 include certain organizational aspects and/or redundancies which allow for one or more applications to be handled as a unit and/or to be run on a scaled hardware (e.g., Linux hardware, etc.).

As indicated above, in some embodiments redundancy is managed via redundant communicational configurations (e.g., specified during deployment time) through static analysis of the system 3100. As shown in FIG. 31, the applications may be located in predetermined fault domains. For example, the applications 3112-3114 are shown to be located in a first fault domain, shown as fault domain X or fault domain 3170, and the applications 3116-3118 are shown to be located in a second fault domain, shown as fault domain Y or fault domain 3172. In an exemplary embodiment, the applications 3112-3114 and 3116-3118 are located within fault domains (e.g., fault domains 3170, 3172, respectively) to maximize the availability during fault domain outages. For example, the redundant pathways of the system 3100 allow the applications 3112-3118 to re-route commands immediately, while the brokers manage assimilating data on its end to abstract the need away from the application layer. As indicated above, advantageously the arrangement and/or features of FIG. 31 provide a stateless service that is simpler to manage and scale compared to stateful counterparts, which reduces the amount of resources consumed during technology deployment and/or increases efficiencies, for example allowing one or more applications to be handled as a unit (e.g., because the applications can be handled on a scaled hardware).

Figure 32A:
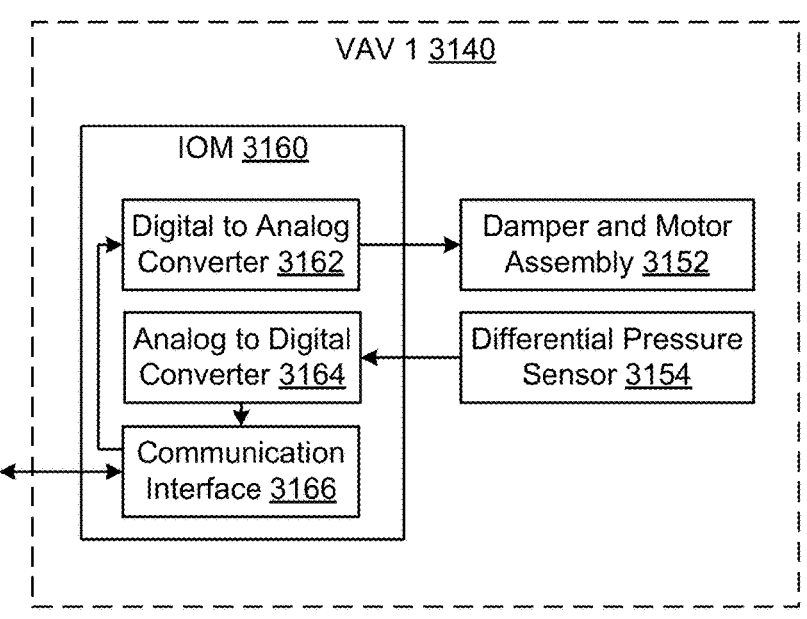
FIG. 32A is a block diagram of a VAV of the distributed control system of FIG. 31, according to some embodiments.
Figure 32B:
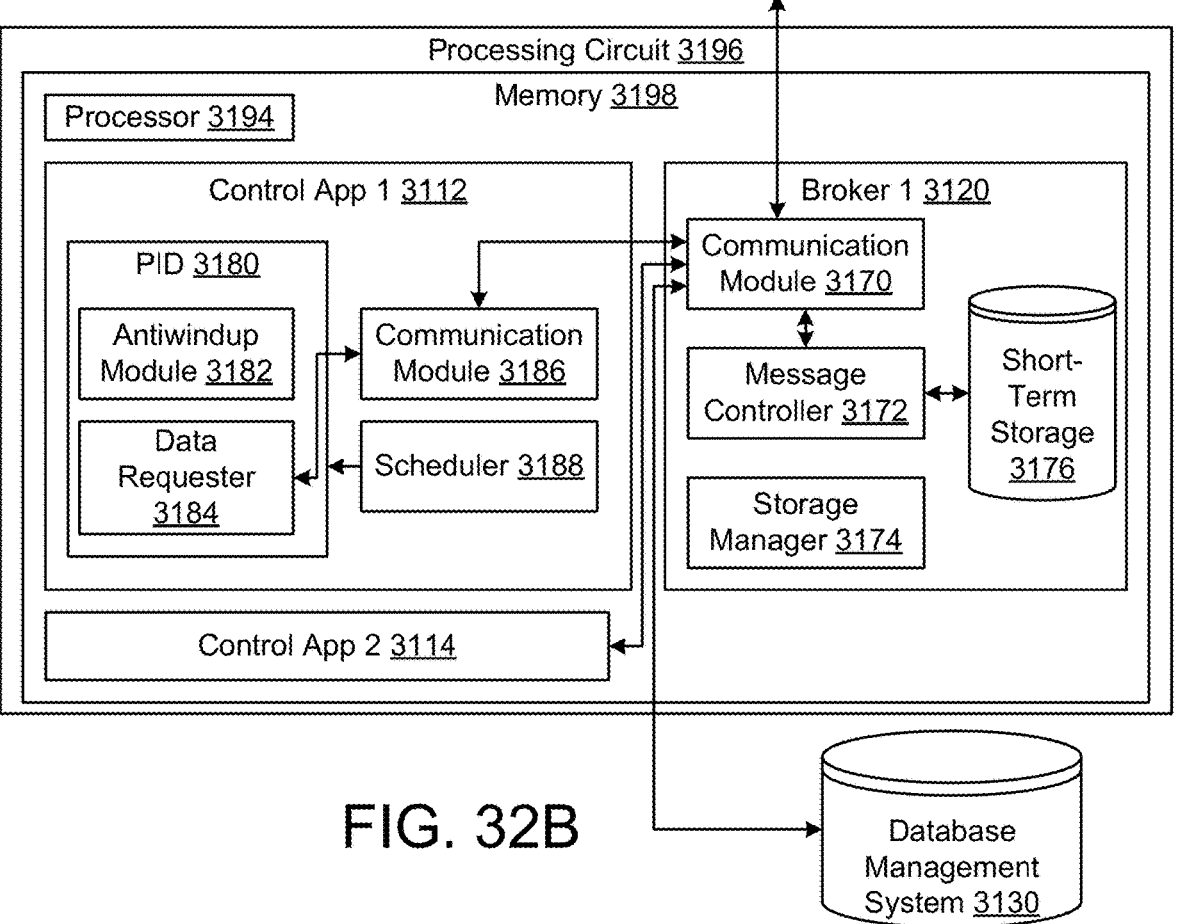
FIG. 32B is a block diagram of a control application and a message broker of the distributed control system of FIG. 31, according to some embodiments.

With reference to FIG. 31, to provide building control, HVAC devices 3140-3148, brokers 3120-3122, and control applications 3112-3118 may be configured to perform a series of interactions in response to a change in a single on any of the HVAC devices 3140-3148 or in response to the expiration of a timer. FIG. 32A and FIG. 32B show a detailed view of the some of the components within the distributed control architecture of system 3100. In some embodiments, VAV 1 3140 may contain IoM 3160, damper and motor assembly 3152, (e.g., actuators to affect a condition of the building) and differential pressure sensor 3154 (e.g., sensors to measure a condition of the building). As determined by the static analysis of the building system IoM 3160 contain a few analog to digital and digital to analog convertors and serve only VAV 1 3140 or IoM 3160 may contain a large number converters and be capable of serving several collocated HVAC devices. According to some embodiments, differential pressure sensor 3154 is continuously measuring the differential pressure across the damper in VAV 1 3140. Differential pressure sensor 3154 may be hard wired to IoM 3160 and communicate the differential pressure via a voltage presented on an input to IoM 3160. In some embodiments, differential pressure sensor 3154 may communicate the value digitally to IoM 3160. According to some embodiments, analog to digital converter 3164 is configured to convert the voltage to a digital representation of the differential pressure and give the value to communication interface 3166. Communication interface 3166 may be configured to generate a message that broker 1 3120 can interpret. It is noted that any number of IoMs may be communicating via a message bus to broker 1 3120 at the same time. In some embodiments, broker 1 3120 is configured to interpret all of the messages from any client device or application and store the state of the equipment in both short-term and long-term storage.

Now referring to FIG. 32B, according to some embodiments, broker 1 3120, control app 1 3112, and control app 2 3114, are contained within the same memory 3198 and processed by the same processing circuit 3196. In some embodiments, instructions for carrying out these functions may be stored across several different memory systems and executed by several different processors. For example, brokers and any control applications herein may be defined within their own container and run on any suitable computer.

In some embodiments, upon receiving a message related to a new measurement of the differential pressure, broker 1 3120 may be configured to use message controller 3172 in order to determine if data needs to be stored in short-term storage 3176 and/or long-term storage 3130. For example, broker 1 3120 may be a changed-focused brokering system and may be configured to perform any of the functions described in the previous section to determine if a significant change in the measurement has occurred and if the new state must be stored.

Still referring to FIG. 32B, short-term storage 3176 may for example, be short-term storage of a change-focused brokering system 1630 and long-term storage 3130 may be long-term storage 1610 of building system 1600. In some embodiments, both storage devices contain the current state of the measurement. Now referring to control app 1 3112. Control app 1 3112 is configured to operate as a proportional-integral-derivative (PID) controller, according to the exemplary embodiment. Scheduler 3188 may be configured to cause the PID algorithm to run on a periodic schedule (e.g., every 30 seconds or every 500 milliseconds). At time of execution, data requester 3184 may be configured to use communication module 3186 in order to obtain any information necessary for the PID 3180 to perform its algorithm. According to some embodiments, PID 3180 is stateless, therefore data requester 3184 may request the last few measurements of the control variable (e.g., differential pressure), the setpoint for the control variable, and the current state of the integrator of PID 3180. The setpoint for the control variable may have been received and placed in storage from a user interface or it may have been calculated by another control application configured to calculate the required flow and thus required differential pressure measurement in order to keep the a zone of a building at a specific temperature. To request the required data control app 1 3112 may be configured to place a request message on the message bus to be handled by broker 1 3120.

According to some embodiments, upon receiving the data control app 1 3112 may use PID algorithm 3180 to perform calculations required to move the differential pressure measurement towards its setpoint. For example, PID 3180 may perform a calculation to determine the output to send to the damper using the equation, $u=K_p(y-y_{sp})+K_I I+K_D\dot{y}$, where u is the new damper position, $y-y_{sp}$ is the error between the differential pressure measurement and the setpoint, I is the current state of the integrator for PID 3180 obtained from storage, y is a current estimate of the rate of change of the differential pressure measurement estimated from the last few measurements, and $K_p$, $K_I$, and $K_D$ are the proportional, integral, and derivative gains, respectively. PID 3180 may additionally perform a calculation to determine the state of the integrator for the next time PID 3180 is executed using the equation, $I_{k+1}=I_k+(y-y_{sp})$, where k represents the iteration number or an advanced integral calculation using Anti-windup module 3182. Upon performing these operations, control app 1 can use communication module 3186 to send a set message to be handled by broker 1 3120 containing the results of its calculations.

Upon receiving the message from control app 1 3112, broker 1 3120 may be configured to store the information (i.e., the new state of the integrator for PID 3180 and the new desired damper position, and an estimate of the derivative) in short-term storage 3176 and/or long-term storage 3130 and create another message to send the damper position to IoM 3160 of VAV 1 3140. Referring back to FIG. 32A, IoM 3160 may be configured to receive the message containing the new damper position at communication interface 3166, use digital to analog converter 3162 to generate a signal for damper and motor assembly 3152 that may affect the angle of the damper, causing more or less air to move through the VAV box and cause the differential pressure to move towards its setpoint. It is noted that the described example is not meant to be limiting, but rather to give an example of how the brokering architecture can provide for distributed controls with stateless control applications. In some embodiments, the control application may be any control application: VAV control performing calculations in terms of the flow rather than differential pressure, another PID performing duct static pressure control for an AHU supply fan, supervisory logic performing duct static pressure reset by monitoring a plurality of VAV damper positions, or a model predictive control system (MPC) calculating optimal setpoints for a central utility plant.

The system described herein makes real-time, stateless control applications possible because the broker is capable of storing all the necessary sates, measurements, and parameters in short-term memory (e.g., RAM or solid-state hard disk) for rapid delivery of the required information to the control applications. Furthermore, if a broker becomes overrun with messages the system may scale creating a second broker to increase message processing. When a new broker is created, its storage manager (similar to storage manager 3174) may create the state of short-term memory by calling back to long term storage, thereby not affecting any requests the current broker is processing. Advantageously, in the event of a failure of the hardware associated with control app 1 3112, the stateless nature of the control application allows it to be transferred seamlessly over to new hardware without having to regenerate the state as all necessary information is contained in short-term storage 3176 and/or long-term storage 3130 in the exemplary embodiment. Furthermore, in the event of a failure of the hardware associated with broker 1, database management system 3130 may be used to recreate the current state within short-term storage of the new broker causing a seamless transfer of information to the new hardware executing the recreated broker.

Figure 33:
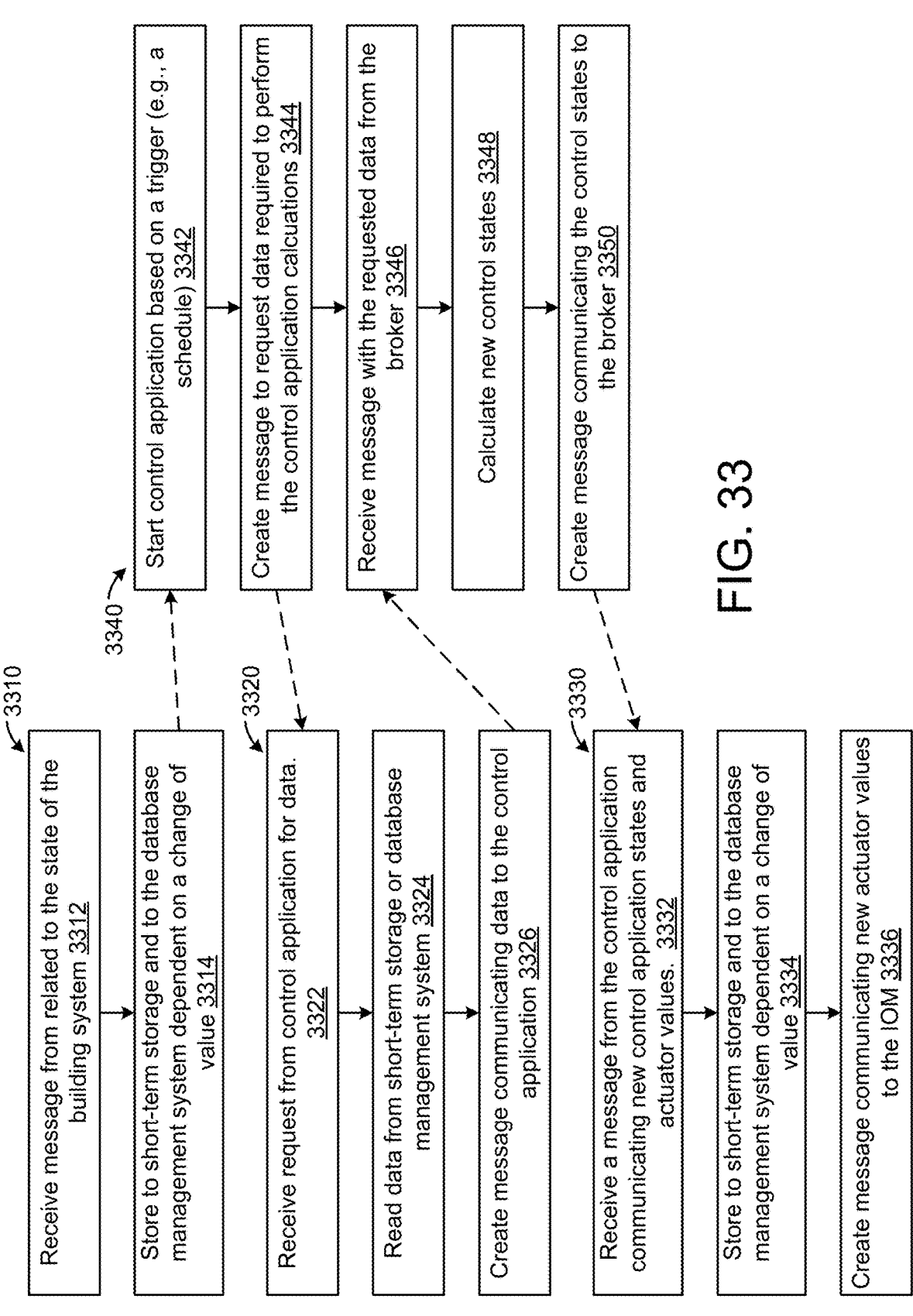
FIG. 33 are flow diagrams for providing distributed control using message brokers, which can be performed by the components of the distributed control system of FIG. 31, according to some embodiments.

FIG. 33 shows various flow diagrams demonstrating operations that may be continuously running within a system for providing distributed controls (e.g., system 3100). Flow of operations 3310, 3320, and 3330 may be performed by any suitable hardware; for example, hardware similar to that of the change-focused brokering system 1630. Flow 3340 may be performed by a control application (e.g., control app 1 3112 or control app 2 3114). In some embodiments, a broker may be continuously monitoring a message bus waiting to receive read or write messages and either act upon those messages or que them for when processing time is available. Broken lines in FIG. 33 are indicative of the flow transitioning to operations being performed in different devices or logical units (e.g., flow is transitioned from the broker to the application).

Flow 3310 may include receiving a message from an IoM, the message related to a measurement of a variable related to a building system being controlled in operation 3312. For example, the measurement may be from any sensor within the building (e.g., any zone's temperature, differential pressure of a VAV box, duct static pressure, fan speed, etc.), the message may be related to a digital input coming from a user interface (e.g., zone temperature setpoint, the start of a demand limiting period, etc.), or the measurement may be value calculated by an algorithm of a client application (e.g., intelligence engines 1608 or algorithms 1605).

Flow 3310 continues with storing the data in the message in operation 3314 according to some embodiments. Operation 3314 may include reading the current state of the measurement from short-term storage, decompressing the state if necessary, and comparing the received measurement to the current version in storage. Operation 3314 may include conditionally storing portions of the data in the message based on the amount of change the data represents relative to what is currently stored. For example, the new data may always be stored in short-term storage, but may only stored in the database management (i.e. long-term storage) system if the change is greater than a given threshold compared to the current value in long-term storage. In this way the system running flows of operations 3310-3340 is kept up to date with any measurements required for control and/or monitoring of the building system according to some embodiments.

Still referring to FIG. 33, Flow 3340 is shown to be initiated via a trigger in operation 3342 according to the exemplary embodiment. The trigger may be any mechanism for starting a control application. For example, the initiation may be caused by a schedule (either internal or external to the control application), a user may initiate the control application via a user interface, a message received by a brokering system (based on a change of value, etc.) may trigger the control application. In some embodiments, flow 3340 is shown to continue by creating a message, and sending it via a message bus, requesting the data required to perform the control application in operation 3344. In some embodiments, because the control application is stateless, the request for data may include a request for previous calculations done by the control application and stored elsewhere. The request for data may include measurements, including any current measurements sent by an IoM, or other parameters used by the control application. In some embodiments, flow 3340 waits to receive the requested data in operation 3346.

Flow of operations 3320 can be used for handling the request for data as described in step 3344 from a control application according to some embodiments. Flow 3320 begins by receiving the request in operation 3322 and may continue by reading the data from short-term storage or a database management system in operation 3324. Reading the data from storage may include determining if the short-term storage has all the required data and based on a determination of short-term storage not having all the required data requesting additional data from a database management system. If data must be requested from the database management system, data may be merged prior to sending the response. Advantageously, data from both the short-term storage and the database management system may be provided in response to a single message from the control application. Thus, lowering data latency and simplifying control application design. Flow of operations 3320 may continue by creating a message communicating the data back to the control application in operation 3326.

Flow of operations 3340 may receive the message with the requested data in operation 3346 according to some embodiments. Once the data is obtained, flow 3340 may continue by calculating control states or variables (e.g., anything that will be communicated to an actuator for control, to another control algorithm for further processing, for storage, or displayed to the user) in operation 3348. For example, operation 3348 may include a calculation to determine the output to a device being controlled by a PID control algorithm using the equation, $u=K_p \ (y-y_{sp})+K_I I+K_D \dot{y}$, where u is the new damper position, $y-y_{sp}$ is the error between the differential pressure measurement and the setpoint, I is the current state of the integrator obtained from the message received in operation 3346, $\dot{y}$ is a current estimate of the rate of change of the differential pressure measurement estimated from the last few measurements, and $K_p$, $K_I$, and $K_D$ are the proportional, integral, and derivative gains, respectively. In some embodiments, operation 3348 may additionally perform a calculation to determine the state of the integrator for the next time the same control application is executed using the equation, $I_{k+1}=I_k+(y-y_{sp})$, where k represents the iteration number. Operation 3348 may be simple (e.g., calculating a state and an output of a rate limiting operation to pass on to another control application) or complex (e.g., performing an optimization which will return setpoints for all temperatures and flows within a central utility plant). In some embodiments, a large number of control states may be calculated and sent via the message bus.

After calculating the control states and variables in operation 3348, flow 3340 continues with step 3350. According to some embodiments, operation 3350 includes creating a message communicating the result of the control application's calculations (i.e., communicating the calculated control states and variables). To complete the control loop and send data to the actuators, flow of operations 3330 may run after operation 3350 in response to any of the control states and variables being actuator variables. The indication that a variable may be related to an actuator could come from the control application or, in some embodiments, the IoM may subscribe to any changes in a particular variable. Flow 3330 starts with receiving a message communicating a change in a variable related to an actuator in operation 3332 in some embodiments. Process 3330 may continue with operation 3334 including storing the changes to short-term storage and/or a data base management system. In some embodiments, operation 3330 continues by creating a message to communicating the new values for actuator variables to the IoM (or other control devices) in operation 3336.

It is contemplated that in a system providing distributed controls to operate a building system, many instances of operational flows 3310-3340 will be operating concurrently across various processors and managed by several brokers sharing messages between the actuators (IoMs), various control applications, and the archive within the database management system. To perform advanced operations, several control applications may also need to be run one after another in a sequence. The trigger in operation 3342 may be the completion of a different control application. The control application may specifically send a message indicating that it has completed or the subsequent control application may be triggered based on a change in value of a input variable.

Modular Input-Output Module

In some embodiments of the distributed controls system described in the previous section only two types of devices may be required in addition to the site database management system to provided control and monitoring to a building system. The first device is a general compute processor capable of running control applications as well as the broker. For example, the general compute process may be an ARM processor that is capable of running Linux with docker or it may be cloud compute resources. The second device is the input-output module (IoM). The purpose of the IoM is to provide communication with the physical world. The IoM may provide binary inputs, binary outputs, analog inputs, PWM outputs, etc. along with the required additional circuit components to drive the outputs or to convert the inputs into a digital signal that can be sent to the broker. In some embodiments, the IoM functionality may be provided in the same device as the compute functionality. For example, all the traditional control functionality may be managed by a single family of devices and more advanced computationally intensive control algorithms may be managed in cloud-based compute resources.

It may be advantageous to create a family of modular IoMs with various interchangeable or add-on components. The modularized IoM may be configured to increase efficiencies in the IoM technologies industry, for example by reducing the number of SKUs or components to be supported by the IoM during deployment. In addition, modularized IoM functionality may be connected to the compute devices and allow processing capability and input-output capability to be expanded as needed.

Figure 34:
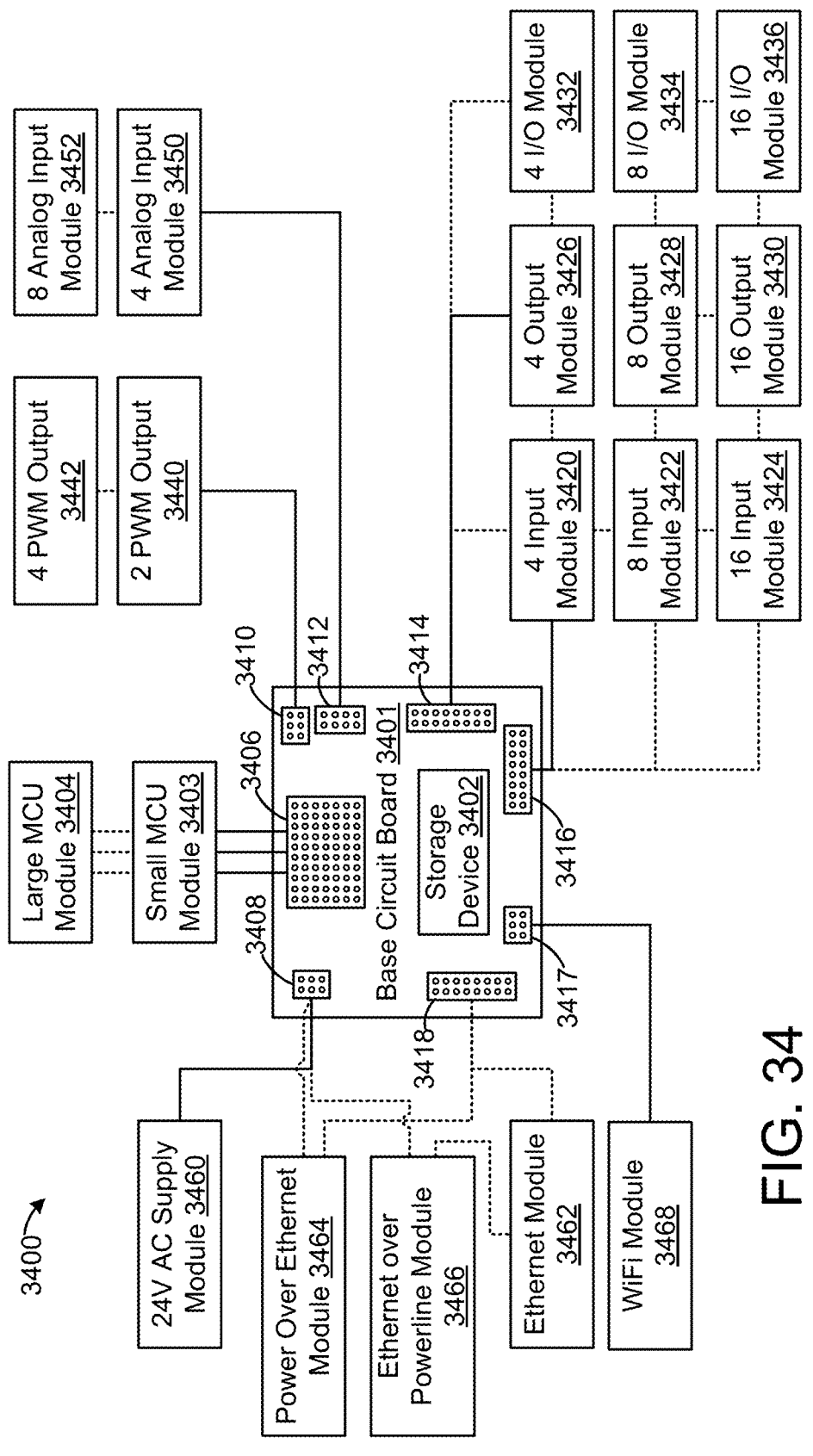
FIG. 34 is a modular input-output unit, which can be used to implement components of the distributed control system of FIG. 31, according to some embodiments.

FIG. 34 shows an illustration of various connections and modules that may be available within example modular IoM system 3400. In the exemplary embodiment, base circuit board 3401 is shown to have storage device 3402 to provide additional on-board storage to the microprocessor. For example, storage device 3402 may be a removable SD card to allow for providing different levels of storage to the based device based on user requirements or device model number or storage device 3402 may be an embedded multi-media card (eMMC). In embodiments of the present disclosure using eMMC, the storage capacity may be chosen at the time components are populated, but using the same circuit board design. Storage device 3402 is used to provide the configuration, program memory, and additional short-term storage for a broker in some embodiments.

According to some embodiments, base circuit board is shown to have a plurality of connection points 3406 for connecting a microprocessor module. For example, base circuit board 3401 is configured to use either the small or large microprocessor modules interchangeably. Advantageously, providing connections to different microprocessor modules allows base circuit board 3401 to connect to different microprocessors with different functionality using the same design. For example, small microprocessor module 3403 may contain a processor that offers 1 GHz processing speed, contain 2 GB of RAM, and provide for 16 general purpose input-output (GPIO) that can be connected to various input-output modules and large microprocessor module 3404 may contain a processor that offers 2.4 GHz processing speed, contain 4 GB of RAM, and provide 32 GPIO. The large microprocessor module may provide a higher processing capability and may be chosen for areas of the distributed controls architecture for a building where computationally intensive work is being performed (e.g., supervisory optimizations). In some embodiments, some base level of RAM may be populated on the base circuit board that is provided in addition to anything that is available on a microprocessor module. In some embodiments, a particular IoM may not be used to provide any compute capability for control applications and a microcontroller (or microprocessor of low functionality) may be used instead of a microprocessor.

It is contemplated that in some embodiments any of the functionalities and/or hardware herein presented as modules could be connected directly to base circuit board 3401 based on market decisions, thus providing a base level of functionality. For example, the components of 24V AC supply module 3460 (e.g., a rectifier and voltage regulators) may be populated on the board, along with the components of ethernet module 3462, and the components of power over ethernet module 3466, may manufactured as part of base circuit board 3401 to allow for various sources of power and network connectivity without additional add-on modules.

Still referring to FIG. 34, base circuit board is shown to have headers 3408-3418, according to some embodiments. Headers 3408-3418 may be configured to connect to various modules offered for connection to the modular IoM. For example, headers 3408-3418 may be rectangular housings with pins to accept ribbon cables to connect modules, headers 3408-3418 may be rectangular housings with receivers to accept pins from a module capable of plugging into the header, or headers may be connection points capable of being connected to pads on a module with solder during the manufacturing process. The header on may be connected to various busses or copper traces that connect to a microprocessor, the connection points for the microprocessor module, or various other components on base circuit board 3401.

The use of headers may allow for various modules to be interchangeably connected to change or increase the functionality of the modular IoM. FIG. 34 shows an example configuration (via the solid lines) in which the modular IoM is configured to provide 4 binary inputs, 4 binary outputs, 4 analog inputs, 2 PWM outputs, get power from a 24V AC line, establish communication over WiFi, and perform processing with a small microprocessor module. Other modules not chosen in this configuration are shown connected to respective headers with dotted lines.

According to some embodiments, header 3408 is connected to the power management circuitry of the base circuit board. For example, it may be connected to voltage regulators, rectifiers, or directly to the voltage supply lines for all other circuitry (e.g., integrated circuits) on the base circuit board to other headers to provide voltage as needed to other modules.

In some embodiments, header 3410 is connected to PWM outputs of the microprocessor, either directly or through the connection points for the microprocessor module. Header 3410 may also be connected to the power supplies required by the various interchangeable PWM modules. Modules 3440 and 3442 are pulse with modulating (PWM) output modules. Modules from this group can provide the modular IoM the ability to output analog signals in the form of time varying voltage signals. A module from this group may include a header for connecting to base circuit board 3401 (e.g., via a ribbon cable or set of pins), filters to convert PWM outputs to a continuous analog signal, transistors to drive any loads with a higher current requirement, and other additional circuitry necessary for conditioning the various signals and power supplies present on the module.

In some embodiments, header 3412 is connected to analog inputs of the microprocessor, either directly or through the connection points for the microprocessor module. Header 3412 may also be connected to the power supplies required by the various interchangeable analog input modules. Modules 3450 and 3452 are analog input modules. Modules from this group can provide the modular IoM the ability to read voltage signals or resistances (e.g., from a thermistor) and convert them to digital representations of their value for processing. A module from this group may include a header for connecting to base circuit board 3401 (e.g., via a ribbon cable or set of pins), signal buffers, resistive networks to set the measurement scale (i.e., full-scale voltage), a means for selecting the measurement scale and or to switch between a resistive input or a voltage input, and another additional circuitry necessary for conditioning the various signals and power supplies present on the module.

In According to the exemplary embodiment, headers 3414 and 3416 are connected to GPIO of the microprocessor, either directly or through the connection points for the microprocessor module, and to required voltage supplies. Headers 3414 and 3416 may also be connected to the power supplies required by the various interchangeable input-output modules. Modules 3420-3436 are input, output, or input-output modules with varying number of connections (e.g., 4, 8, 16). Modules from this group can provide the modular IoM with connectivity to binary inputs (e.g., contact switches) and binary outputs (e.g., to drive relays). A module from this group may include a header for connecting to base circuit board 3401 (e.g., via a ribbon cable or set of pins), pull up/down resistors for interfacing with the microprocessor, transistors or buffers to provide additional current capability to drive any outputs, a means for selecting input or output in the case of I/O modules 3432-3436, and other additional circuitry necessary for conditioning the various signals and power supplies present on the module. In some embodiments, more than one input, output, or input/output module may be connected to the same header, or they may be daisy chained by passing some of the connections through one module on to the next.

In some embodiments, header 3417 is connected to a serial interface (e.g. serial peripheral interface (SPI)) capable of communicating the information from the WiFi module to the micropocessor, either directly or through the connection points for the microprocessor module. Header 3417 may also be connected to the power supplies required by the various interchangeable communication input modules. Module 3468 is WiFi module. WiFi module 3468 can provide wireless network connectivity to the modular IoM. WiFi module 3468 may include a header for connecting to base circuit board 3401 (e.g., via a ribbon cable or set of pins), an antenna, a controller for performing the wireless communication and transferring the data over a communication bus (e.g., SPI) to the microprocessor, and other additional circuitry necessary for conditioning the various signals and power supplies present on the module.

According to the exemplary embodiment, header 3418 is connected to ethernet connections of the microprocessor, either directly or through the connection points for the microprocessor module, and to required voltage supplies. Header 3418 may also be connected to the power supplies required by the various interchangeable communication input modules. Header 3418 may be used to connect various wired communications modules to base circuit board 3401

Module 3462 is an ethernet module. Ethernet module 3462 can provide wired ethernet connectivity to the modular IoM. Ethernet module 3462 may include a header for connecting to base circuit board 3401 (e.g., via a ribbon cable or set of pins), a RJ45 jack for connecting to a network, and other additional circuitry necessary for conditioning the various signals and power supplies present on the module.

Module 3464 is a power ethernet module. Power over ethernet module 3464 can provide wired ethernet connectivity to the modular IoM and regulated voltage supplies (e.g., 5V and/or 3.3V). Power over ethernet module 3462 may include a header for connecting to base circuit board 3401 (e.g., via a ribbon cable or set of pins), a RJ45 jack for connecting to a network, or components of a switched-mode power supply, and other additional circuitry necessary for conditioning the various signals and power supplies present on the module.

Module 3466 is an ethernet over powerline module. Ethernet over powerline module 3466 can provide ethernet connectivity to the modular IoM, without a dedicated communications cable, and regulated voltage supplies (e.g., 5V and/or 3.3V). Ethernet over powerline module 3466 may include a header for connecting to base circuit board 3401 (e.g., via a ribbon cable or set of pins), twisted pair cabling to connect to ethernet module 3462, a microcontroller to configured to communicate over the powerline, diodes to perform rectification, filter capacitors to smooth the rectified signal, voltage regulators or components of a switched-mode power supply, and other additional circuitry necessary for conditioning the various signals and power supplies present on the module.

Module 3460 is a 24V AC supply module. 24V AC supply module can to a 24V AC power supply, rectify the AC power, filter the resulting DC signal, and provide regulated voltage supplies (e.g., 5V and/or 3.3V) to base circuit board 3401, the microprocessor, and any other modules connected to base circuit board 3401. 24V AC supply module 3460 may include a header for connecting to base circuit board 3401 (e.g., via a ribbon cable or set of pins), diodes to perform rectification, filter capacitors to smooth the rectified signal, voltage regulators or components of a switched-mode power supply, and other additional circuitry necessary for conditioning the various signals and power supplies present on the module.

In some embodiments, components of the system 3400 (e.g., the bus 3418, etc.) is/are configured to selectively establish communications with different communications modules, for example, to selectively enable the modular IoM to hook up with a supporting infrastructure. In an example embodiment, the ability to establish communications with the WiFi Module 3468, the power over ethernet module 3464, and/or ethernet over powerline module 3466 permit several devices (e.g., the base 3401, and any modules connected) to link back to an internet protocol network, thereby reducing resource consumption and/or pull (e.g., pull on power lines, pull on data lines, etc.). In some embodiments, one or more of the modular IoMs is/are configured to "self-join" a cluster of modular IoMs. For example, using one or more credentials (e.g., a security credential stored or installed on the storage device 3402) the one or more modular IoMs can cluster by verifying a signature created by the static analysis generated by the modular IoM runtime details.

In some embodiments, the storage device 3402 is configured to enable the modular IoM to verify that one or more connected IO devices is/are compatible with one or more characteristics of the IO device. For example, the storage device 3402 may store information relating to one or more IO devices and/or functions associated with each of the one or more IO devices. The modular IoM may be configured to receive or retrieve the stored information from the storage device 3402, relating to the one or more IO devices. When an IO device is connected to the IoM, the modular IoM (e.g., via the stored information associated with the functions of the IO devices, etc.) may be configured to determine and/or verify that a connected IO device (e.g. 4 input module 3420, etc.) is suitable for a selected task or function. In some embodiments, if it is determined that the connected IO device is not suitable for the selected task, the storage device 3402 may communicate an alert, alarm, or error to the modular IoM (e.g., via an internet protocol or an instruction to provide an indication on the modular IoM itself, for example illumination of a light emitting diode (LED), etc.). In some embodiments, the modular IoM may be configured to institute or provide the alert, alarm, or error (e.g., illumination of an LED, etc.).

As shown in FIG. 34, there are many different types of IO devices (e.g., IO 3420-3452). For example, in the HVAC industry there are many different types of IO device ports. However, in some embodiments the bus or one of the IO modules includes a latch mechanism that captures signals from the modular IoM. In an exemplary embodiment, the latch mechanism holds a predetermined output for an IO device, for example to meet the given power from the bus. In some embodiments, the inputs or IO devices (e.g., IO 3420-3452, etc.) are configured to leverage address techniques, for example to connect a specific slot only to a shared data line when a control signal is at a predetermined voltage level. In this regard, the modular features of the system 3400 (e.g., via the base circuit board 3401, the storage device 3402, a microprocessor module 3403 or 3404, and any of the other modules 3420-3468, etc.) may advantageously provide a module that enables connections with diverse IOs of various use cases, as well as minimize the overall resource consumption compared to traditional modules by permitting connections to be established with different communications modules (e.g., as suited for the situation).

Commissioning and Validation of a Distributed Building Automation System

In some embodiments, when creating a control application for a site or building a creator must consider one or more end outcomes to the design, for example to consider and/or account for hardware and/or network limitations. In view of this, the present disclosure describes methodology to provide a workflow that enables users to focus on one or more applications as a single entity (e.g., to combine one or more applications on a "fit-for-function" hardware, etc.). Advantageously, the features of the workflow reduce the hardware breakdown concerns associated with control applications, for example by allowing a creator to build the application as a single entity and (e.g., through the use of statistical analysis of the application) break the application down into a deployment package.

Additionally, once a building automation system is installed a commissioner may be responsible for validating that all the functionality operates as specified in a sequence of operations. In view of this, the present disclosure describes methods for automatically performing sequences of operations within a building automation system help the commissioner validate the system.

Generating a Deployment Package

Figure 35A:
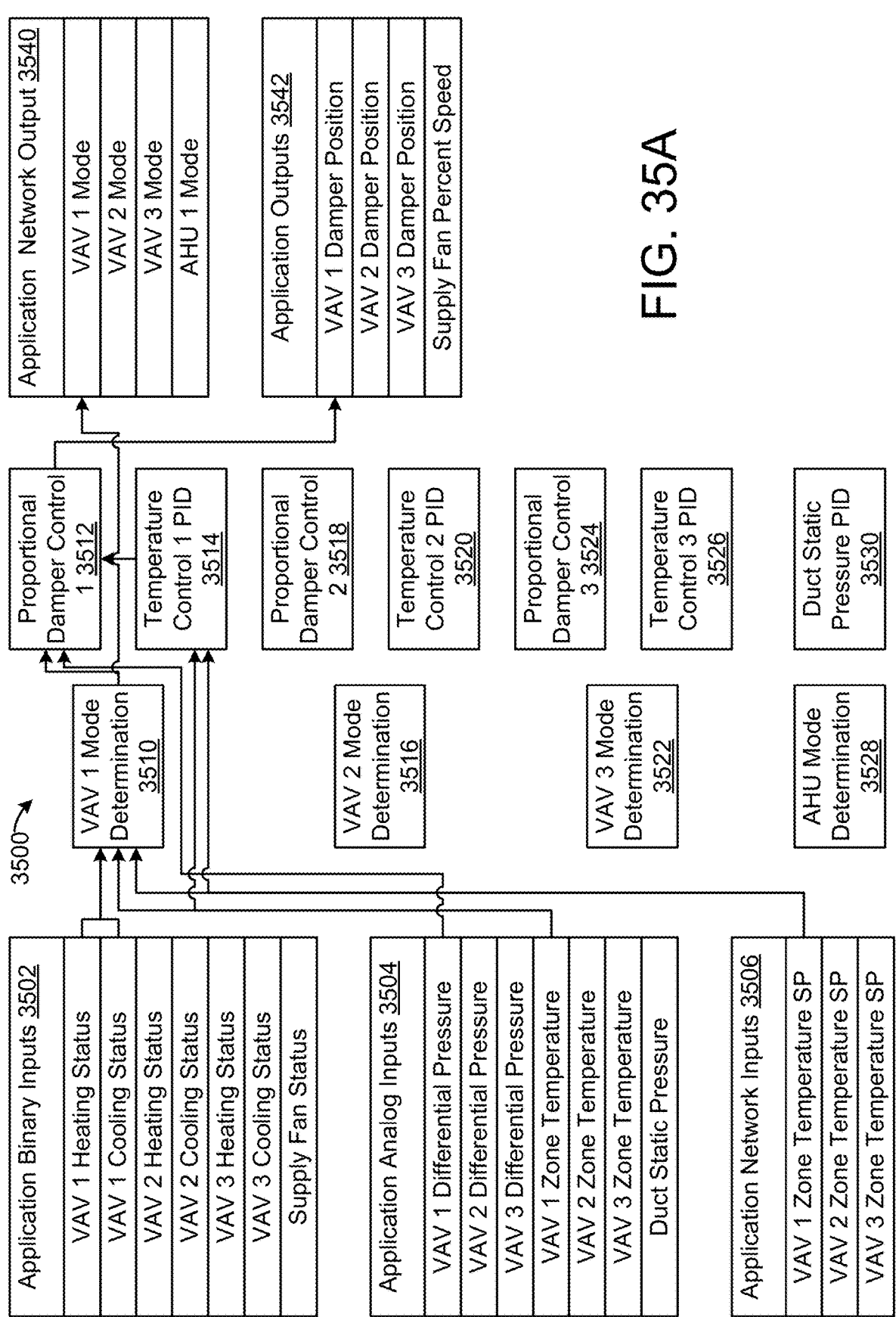
FIG. 35A is an interface for design a control application, according to some embodiments.

FIG. 35A shows interface 3500, an example of multiple control applications as they may appear on a user interface. A user may be able to see all the control applications in a single view. An over view of the whole system may allow the user to focus on the entire control application during design, without considering the boundaries of various hardware the applications will run on. According to some embodiments, all the inputs to the entire control application 3502-3506, all the individual control applications 3510-3530, and all the outputs to the entire control application 3540-3542 are shown. Due to the large number of individual control applications, inputs, and outputs that would include an entire control application, interface 3500 may be configured to only show certain connections between the various parts of the entire control application (e.g., inputs and outputs of the selected inputs, control applications, etc.). In FIG. 35A, the connections required to control a zone temperature using a VAV damper position are shown.

Interface 3500, shows an example of an application for controlling the temperature of three zones using VAV dampers and static pressure within the related duct work using the speed of the supply fan. According to some embodiments, VAV 1 Mode determination 3510 will use VAV 1 heating and cooling statuses (e.g., an indication of heating and/or cooling being available) from application binary inputs 3502, VAV 1 zone temperature from application analog inputs 3504, and VAV 1 zone temperature setpoint from application network inputs 3506 (e.g., a temperature setpoint received via a WiFi thermostat or phone) to calculate if heating or cooling is required (i.e. the mode). The mode may then be sent to temperature control 1 PID 3514 along with the zone temperature and zone temperature setpoint. Temperature control 1 PID 3514 may be configured to receive the mode, various parameters of temperature control 1 PID 3514 (e.g., proportional gain, etc.), the integral term from a previous calculations, the zone temperature and zone temperature setpoint and compute a flow setpoint for VAV 1 and send the flow setpoint back onto a message bus. Proportional damper control 1 3512 may be configured to receive the flow setpoint, convert it to a differential pressure setpoint based on parameters of the VAV box (e.g., face area, sensor calibration information, etc.). Proportional damper control 1 3512 may be configured to compare the differential pressure setpoint to the differential pressure measurement from application analog inputs 3504 and determine a new damper position for application outputs 3542. The set of control applications 3516-3520 for VAV2, 3522-3526 for VAV3, and 3528-3530 for the air handling unit (AHU) may similarly perform calculations based on inputs 3502-3506 and determine outputs 3540-3542.

Figure 35B:
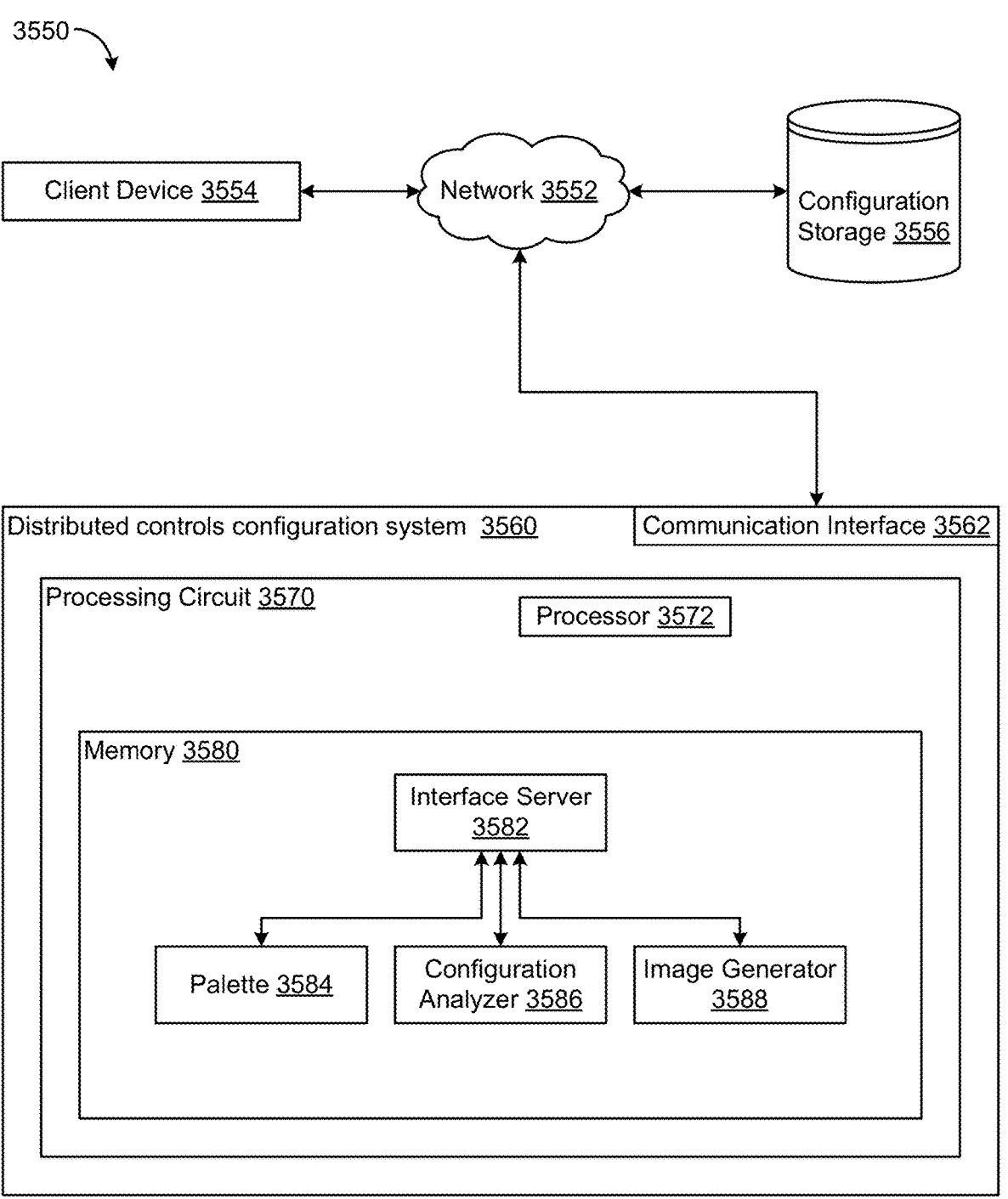
FIG. 35B is a system for providing the interface of FIG. 35A and generating a deployable set of images to execute the designed control application, according to some embodiments.

FIG. 35B shows system 3550 suitable for generating interface 3500 and allowing a user to configure a distributed controls system (e.g., distributed controls system 3100) According to some embodiments, the system 3550 may include various processors and or memory devices capable of communication over network 3552. The system may be within a desktop computer, laptop, several nodes of a cloud computing infrastructure, or any other suitable compute system.

System 3550 may include client device 3554. Client device 3554 may receive instructions (e.g., code, configurations, layouts, etc.) from distributed controls configuration system 3560. Instructions received may cause client device 3554 to produce interface 3500. Instructions received by client device 3554 may also provide operations by which a user can configure a distributed controls system (e.g., connect modules, generate images, or otherwise analyze the proposed controls.

System 3550 includes configuration storage 3556 in some embodiments. Configuration storage 3556 may store various user configurations (e.g., from multiple users) when the user is not actively configuring their system. For example, a user's session may begin by loading their configurations from configuration storage 3556 to distributed controls configuration system 3560 and may end by saving it back into configuration storage 3556. Configuration storage 3556 may use a data model (e.g., schema) to describe the current configuration of the entire control application (e.g., inputs, control applications, etc.).

System 3550 includes distributed controls configuration system 3560 in some embodiments. Distributed controls configuration system 3560 may include a communications interface 3562 (e.g., API, etc.) to communicate with configuration storage 3556 and client device 3554. Distributed controls configuration system may also include processing circuit 3570 with one or more processors (e.g., general purpose processors, GPU, ASIC, etc.) configured to perform operations stored in memory 3580.

According to some embodiments, memory 3580 includes interface server 3582. Interface server 3582 can cause distributed controls configuration system 3560 to communicate the instructions required to provide a user interface (e.g., interface 3500) to client device 3554. Interface server 3582 may use palette 3584 to generate the instructions to display and configure a control application within interface 3500. For example, once loaded interface 3500 may provide a interface palette for drag-and-drop functionality of control applications and inputs.

Configuration analyzer 3586 may be configured to analyze the inputs and/or components of a proposed control system. For example, client device, at the user's request, may call an API provided by distributed controls configuration system 3550 and provide the configuration or a reference to the configuration. As part of the commissioning process, based on the analysis (e.g., considering the inputs, the components, etc.) configuration analyzer 3586 may be configured to provide recommendations of a layout (i.e., groups of applications and required number of message brokers) that will run on the same hardware or in the same isolated compute environment. Configuration analyzer 3586 may, for example, first determine the number and type of IoMs required by evaluating configuration rules (e.g., that every VAV application will receive its own IoM) stored in the system or based on user defined groupings. Configuration analyzer 3586 may also determine the applications to run in each IOM (e.g., by way of determining applications that are directly connected to the IOM inputs and outputs). In some embodiments, the system may request a layout from the user and may be configured to provide recommendations or suggestions for changes to the layout, for example to provide a more fault tolerant layout. In some embodiments, configuration analyzer 3586 uses image generator 3588 to generate a deployment package that can be run within controls configuration system 3560 to perform a simulation of the entire control application and estimate the requirements (e.g., compute resources, memory).

According to some embodiments, memory 3580 includes image generator 3588 to generate a deployment package relating to the layout based on the analysis. For example, after configuration is complete the user can, via client device 3554, call an image generation API with the configuration to evoke the features of image generator 3588. The deployment package may include virtual machines or containers (i.e., isolated compute environments) or the specification thereof to run on the information technology (IT) infrastructure provided as part of the overarching design, where the virtual machines or containers may run in a static location and the IT may attempt to keep alive after any failures (e.g., given the build in redundancy of the design). The deployment package may also include images for the IoMs or devices that may be attached to expected equipment (e.g., in the form of instructions to be downloaded or pre-loaded on a card to be inserted into a specific IoM, device, etc.).

Further, in some embodiments, distributed controls configuration system 3560 is configured to recommend a deployment package relating to the layout by analyzing the control applications' (e.g., applications 3510-3530, etc.) point density, computation complexity, and/or the required number of parameters and states that must be saved and communicated between a broker and the control application. For example, the system may be configured to analyze the applications' point density and computational complexity via a suitable method (e.g., invoking the applications in a simulation). The system may be configured to build the deployment based on pre-configured limitations of the various components in the overarching design or architecture. For example, the system may build a deployment that ensures controls (e.g., of the applications, etc.) are close to the systems or devices they are controlling, that the brokers do not exceed input/output operations per second (IOPS) thresholds, and/or that an appropriate redundancy exists. In this regard, the system may be used in commissioning a site or building by allowing a user or designer to build an overarching design or architecture, and through statistical analysis the system may be configured to break down the design into a deployment package.

With reference to FIG. 36A, system 3550 can, for example, perform the operations described by flow of operations 3600. According to some embodiments, flow 3600 may include operation 3602 to receive information defining the inputs and the outputs of the entire control application. The inputs and outputs of the entire control application may include all sensors and actuators that the building automation system is expected to control, monitor, or use as an input to a control application. For example, the inputs and outputs may be of similar types to those described with reference to modular IoM 3400 (e.g., analog inputs, binary inputs, binary outputs, PWM outputs, etc) as needed to perform control. As part of operation 3602, flow 3600 may also determine the number and type of IoM required to perform read the sensors and/or control the actuators. Flow 3600 may also include receiving information defining the compute resources available to run the entire control application in operation 3604. Available compute resources may include nodes in a cluster of computers either in the cloud or on the building's local network. Available compute resources may also include the processor on any of the IoMs that will be installed (e.g., determined in operation 3602). In some embodiments of flow 3600, the inputs and outputs may be grouped according to some criteria (e.g. closeness of the equipment containing the inputs and outputs) and that information may be received in flow 3600 as well (e.g., to improve decisions related to the IoMs that will be installed). In some embodiments, the inputs and outputs may be grouped automatically by receiving a building information model (BIM) and performing a cluster analysis on the physical distance between the inputs and outputs, for example.

According to some embodiments, flow 3600 includes receiving information defining the individual applications and interconnections between them in operation 3606. For example, the creator of the entire control application may have defined the interconnections in interface 3500 as shown in FIG. 35A or the creator may have used a wizard selection process and the entire control application may be created for them by the wizard. Operations 3602-3606, for example, may all relate to receiving information from the interface 3500.

After receiving the information defining the inputs, compute resources, individual applications and interconnections between them, flow 3600 may continue with operation 3608 by using the input/output information received to estimate the processing power required to run the applications and to send the messages along each connection (e.g., the compute requirements of the control applications and the message brokers handling the communication and storage between them). In addition, the storage requirements (e.g., RAM) by the brokers in the system may be estimated.

With estimates of the processing power and storage requirements, flow 3600 may continue by grouping applications as shown in operation 3610. Applications may be grouped based on various objectives. In some embodiments, applications may be grouped based on latency across certain communication paths, avoiding limits on estimated processing power of IoM processors, to increase fault tolerance, or any combination of these objectives. For example, a data connection (as shown in FIG. 35A) may be part of a critical control loop, to decrease latency it may be desired to avoid sending such paths to different compute nodes.

According to some embodiments, flow 3600 uses the grouped applications to create a deployment package in operation 3612. As previously described, the deployment package may include instructions for creating isolated compute environments (e.g., virtual machines or containers) or the specification thereof. The deployment package may also include images for the IoMs (e.g., also running isolated compute environments on their own processors) or devices that may be attached to expected equipment (e.g., in the form of computer code to be downloaded or pre-loaded on a card to be inserted into a specific IoM, device, etc.). For example, a group of applications may represent one isolated compute environment specified by the deployment package.

Referring now to FIG. 36B, flow of operations 3620 for estimating the required processing power to run the applications is shown. Flow of operations 3620 may, for example, be performed by distributed controls configuration system 3560 to simulate the control applications and assess the computational resources used. In some embodiments, flow 3620 also includes determining the storage (e.g., RAM) required to locally store the measurements and/or results of calculations in each of the brokers. Flow 3620 may begin by building a deployment package for the entire control application (with a arbitrary grouping of applications, for example) and deploying that package in operation 3622. Flow of operations 3620 may include simulating changes to the inputs of the entire control application based on expected statistical properties of the inputs (e.g., signals, measurements) in operation 3624. For example, the changes may be simulated such that the time between a detected change follows the excepted mean and variance of the time between a detected change of the live system. Historical data of other buildings with similar types of measurements may be used if the control application is being created for a new building.

According to some embodiments, the computations done by each individual application, the states generated by each individual application and the messages sent along each connection may be monitored in operation 3626. The monitored information thus may be used to determine an accurate estimate of the required processing power to run the applications and to send the messages along each connection as well as the storage required to store the measurements or states as needed in operation 3608 of flow 3600. In some embodiments, the applications may also include instructions to send signals to validate the configuration and/or installation of the equipment of the building system that also contribute to the total compute and memory resources required by the control application.

Referring now to FIG. 36C, flow of operations 3640 is shown for grouping applications based on fault tolerance, storage latency, and the required processing power according to some embodiments. Flow 3640 may begin with receiving the inputs and outputs managed by each IoM in operation 3641. The input and output grouping information may be entered by the creator of the control application, or they may be determined by a different automatic method (e.g., by cluster analysis of the input sensors and output actuator's physical location). Flow 3640 may include selecting an output and determining the individual control applications that must run to calculate that output in operation 3642. For example, selection of the output may include starting with the most critical output or the output related to the fastest control loop. As will be shown, flow 3640 describes a greedy optimization where the applications selected first will be run in the IoM, and those selected later will be run on other distributed compute resources.

According to some embodiments, flow 3640 includes determining if the individual control applications required to calculate the output can be executed within the IoM (along with any previously identified applications) in operation 3644. Upon a determination that they can be run on the IoM, the applications can be added to the definition of the image for that will run on this IoM in operation 3646. Or, upon a determination that they cannot be run on the IoM, the applications can be added to the definition of the server image (i.e., an image of an isolated compute environment that may be run on a local cluster of hardware) for this IoM in operation 3648. In some embodiments, operation 3650 includes repeating operations 3642-3650 for each output of the IoM before creating an image for the IoM in operation 3652. In some embodiments, flow 3640 also includes creating an image with the IoM's control applications for failover to a local compute cluster (e.g., a redundant control application that can be run in a different isolated compute environment) in operation 3654 and creating an image for the local compute cluster based on the applications that could not be run in the IoM (e.g., flows through operation 3648) in operation 3656. According to some embodiments, operations 3642-3656 are repeated this for all IoMs required by the entire control application.

In some embodiments, the applications that could not be run in the IoM are saved until the end of flow of operations 3640. A number of the saved applications may fit or otherwise be able to run in IoM's for which compute and/or memory resources were not exhausted by the applications assigned to them earlier in flow 3640. Applications may be added to these IoMs' images before being added to the image of the general cluster (e.g., to save computational cost or resources at the server level).

A Common HVAC Interface Through Artificial Intelligence

Figure 37:
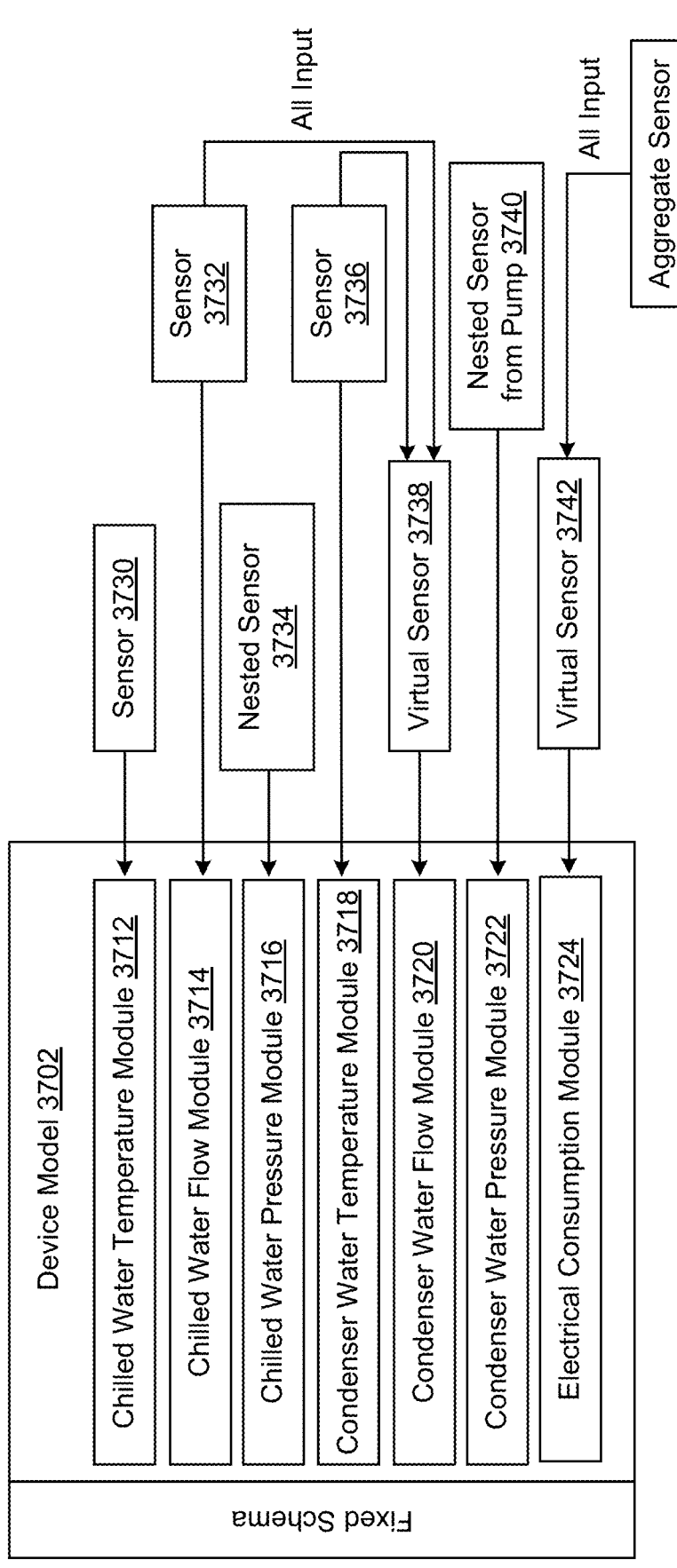
FIG. 37 is a block diagram illustrating a fixed device schema and various virtual sensors and/or relationships to populate the fixed schema, according to some embodiments.

Referring now to FIG. 37, a device model with a fixed schema in BAS is shown to connect to one or more virtual sensors, according to an exemplary embodiment. In an exemplary embodiment, building or device models may be used to illustrate a fixed representation of a building or device, for example based on available points or sample data. In some circumstances, certain sensors (e.g., flow sensors, etc.) are not present within a building or a device, which results in gaps or missing information in the sample data associated with the building or device. As shown in FIG. 37, the system 3700 includes virtual sensors that are configured to determine and/or "fill in" missing points or sample data (e.g., perform gap filling operations), for example to provide a fully qualified fixed representation of the building or device. Advantageously, the virtual sensors of the system 3700 determines and provides sample data that increases efficiencies (e.g., reduces site visits, etc.) and/or reduces costs (e.g., eliminates the need for additional sensors, etc.) associated with evaluating the characteristics of a BAS system upon installation and/or commissioning. For example, fixed schema device model 3702 may be used to communicate between applications and/or devices of distributed control system 3100 or building system 1600 and the virtual sensor calculations may be performed by a message broker (e.g., broker 3120, 3122, change-focused message broker 1630)

According to some embodiments, the virtual sensors (e.g., virtual sensor 3738, 3742, etc.) of fixed schema device model 2402 in the BAS are configured to receive operating data representative of the characteristics of a building or device within a fixed schema (e.g., a fixed environment, a representation of the real-work environment, etc.). For example, the virtual sensor 3738 is shown to receive data from the sensor 3732 and sensor 3736, and the virtual sensor 3742 is shown to receive data from the aggregate sensor 3744. In some embodiments, a virtual sensor is configured to receive data from any of the sensors 3730-3736, and/or other suitable sensor or source.

In some embodiments, nested sensors refer to sensors that are already defined in another device model and data is communicated (e.g., forwarded, linked) so that it is available in more than one location. For example, nested Sensor 3740, is from a pump and device model 3702 represents a fixed schema for a chiller. Nested sensor 3740 is a sensor that belongs to the pump, but for the sake of providing a fixed representation of the chiller, is also included in a second device model. In this example, nested sensor 3740 is a pressure sensor for a pump but is also used to represent the pressure drop across the condenser bundle of the chiller represented by device model 3702.

In some embodiments, the virtual sensors of FIG. 37 are configured to be trained, for example to determine and/or provide sample data representative of the characteristics of an associated component, device, and/or system. Virtual sensors may be trained within the message broker (e.g., broker 3120, 3122, change-focused message broker 1630, etc.) during runtime as data is collected or may be trained in an off-line system (e.g., as another instruction set stored in memory 3580 of distributed controls configuration system 3560. In some embodiments, the virtual sensors are trained using an artificial intelligence model, a learning model, a mathematical model, heuristics, and/or anther suitable training method designed to learn the correlations between the different sensors available and their timeseries of measurements. In some embodiments, the virtual sensors are trained using data received from one or more sensors of the BAS. In some embodiments, the virtual sensors are trained using one or more sets of training data, one or more databases of operating conditions, and/or datasets of expected operating parameters (e.g., optimal operating efficiency, output, energy usage or consumption, etc.).

According to some embodiments, the virtual sensors are also configured to determine and/or provide sample data along with a confidence percentage or uncertainty range associated with the determination. The confidence percentage may be an estimate of how much confidence (e.g., in the determined sample data, etc.) could be gained by adding a sensor at the component, device, and/or system. Advantageously, the virtual sensors of the BAS are configured to determine and/or provide missing sample data (e.g., perform gap filling operations) in order to provide a fully qualified and fixed representation of the building or device, thereby reducing resource consumption, (e.g., work hours spent during installation and/or commissioning), reducing the time required to develop and or code new algorithms (as each application does not have to be responsible for its own way of filling in missing data), and/or providing insight to users as to components or devices that could benefit from additional data gathering and/or analysis (e.g., via additional sensors).

With reference to FIG. 38A, flow of operations 3800 can be used to train virtual sensor, according to some embodiments. Flow of operations 3800 may, for example, be executed by broker 3120, 3122, change-focused message broker 1630, or distributed controls configuration system 3560. According some embodiments, flow of operations 3800 includes receiving a standard set of fields for a type of equipment in operation 3802. The standard set of fields may be measurements, states, parameters, etc. for this type of equipment. The standard set of fields may be stored as any data type. For example, the standard set of fields may include enumerations, integers, doubles, timeseries or any other appropriate class of data. In some embodiments, process 3800 includes receiving historical data related to the fields from a first set of equipment of the type of equipment in operation 3804. The historical data may come from any number of equipment of the type and of any variation of that equipment type. It may be difficult to find any single equipment that contains data from all fields of the standard set of fields. Each equipment that contributes to the historical data need not have all of the standard set of fields, rather it is only necessary that the union of all the equipment contributing to the historical data contain all of the standard set of fields. For example, experiments can be performed to determine relationships between particularly expensive data to measure that is important to the overall data model and virtual sensors can be used to eliminate or reduce the need to measure that data. The data obtained by operation 3804 may be used to train a set of models of estimating a set of models from a subset of the fields in operation 3806. The models may use artificial intelligence, a learning model, a mathematical model, heuristics, and/or anther suitable training method designed to learn the correlations between the different sensors available and their timeseries of measurements. For example, correlations may be determined between a set of measurements and another measurement that can be used for prediction and/or estimation of the another measurement.

According to some embodiments, flow of operations 3800 uses the trained models to estimate values for unknown fields on live equipment. This estimation process may be performed to provide a consistent interface for algorithms or control sequences may query to perform their functionality. In some embodiments, the fields are measured, and the virtual sensor is used to perform fault detection or replace a known faulty measurement. Data for the standard set of fields may obtained in operation 3808 and fields that have missing or faulty data are determined (e.g., indicated by the IoM, compared to the virtual sensor, etc.) in operation 3810.

Flow of operations 3800 may include using the previously trained set of models from operation 3806 to calculate values for the missing or faulty data in operation 3812. In some embodiments, flow 3800 includes adding the calculated values to the data of the standard set of fields for the equipment in operation 3814 and using the data to perform an automated action in operation 3816. For example, the automated action may be to initiate one or more control decisions, for example to initiate an automated action to alter the operating parameters or conditions of a device or system and/or provide an indication (e.g., message, alert, etc.) to a user identifying the error or potential errors.

Referring to FIG. 38B, in some embodiments, process 3800 includes additional flow of operations 3850 to determine a confidence interval for the data calculated by virtual sensors and flag data that is potentially erroneous. For example, flow 3850 may be executed as part of operation 3810. In some embodiments, flow of operations 3850 includes calculating values for all the fields in the standard set of fields in operation 3852. Flow 3850 may continue by calculating a confidence interval for all of the calculated values from operation 3852 in operation 3854. A confidence interval may represent a range for which there is a high probability that the measurement, state, etc. from properly operating equipment would fall within. A confidence interval may, for example, be calculated by estimating the standard deviation of the value conditional on the other fields (measurements, states, etc.) that are available and determining a range of width equal to some multiple of the estimated standard deviation centered at the estimated value for that field. In some embodiments a confidence interval, may take the form of a volume (e.g., ellipsoid or rectangular prism) within the multidimensional space represented by more than one of the fields of the standard set of fields.

According to some embodiments, flow 3850 may continue by determining if data from the standard set of fields is within the confidence interval (or volume) in operation 3856. If data is outside of the confidence interval (or volume) it may be flagged as potentially erroneous in operation 3858. Potentially erroneous data may be treated differently, in operation 3816 of flow 3800 when the control action or algorithm is executed in order to perform the automated action. For example, the virtual sensor may be used or control may transition to a different control scheme (e.g., on more robust to measurement errors).

Validation of Distributed Building Automation System Functionality

Figure 39:
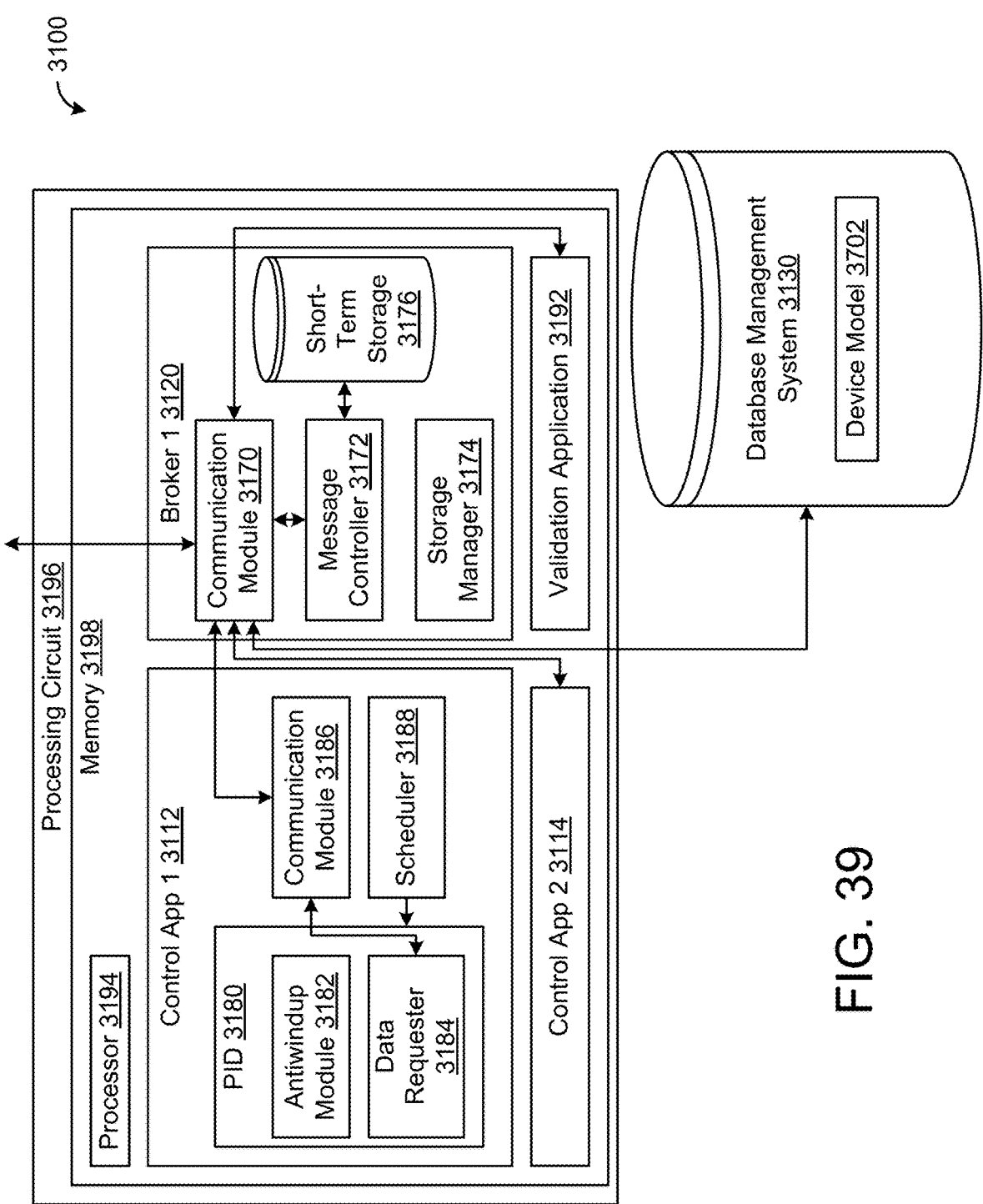
FIG. 39 is a block diagram of a distributed control system including a fixed device schema, according to some embodiments.

Referring now to FIG. 39, the processing circuit of system 3100 includes validation application 3192 in some embodiments. Database management system 3130 may also include device model 3702. Distributed building automation system 3100 may be used improve consistency of installation of one or more components of a BAS and minimize errors in the installation process in some embodiments. For example, unit tests and integration tests surrounding device installation are used to catch bugs or issues that occur during the installation process and may also be used to locate issues in order to eliminate and/or prevent potential problems from occurring. Advantageously, system 3100 may be configured to enable users (e.g., commissioning agents, technicians, etc.) to validate installation procedures more quickly, and aid in precisely detecting where potential issues may occur.

In some embodiments, the distributed control system 3100 includes one or more models, shown as device model 3702, and validation application 3192. Validation application 3192 may be configured to include expected characteristics of one or more devices of a BAS. For example, validation application may include expected characteristics of a chiller operating at an optimal efficiency, optimal energy output, optimal energy usage, etc. In some embodiments, validation application 3192 includes expected characteristics of a BAS system as a whole, a subsystem of the BAS, and/or another component of the BAS system. As discussed herein, validation application 3192 may be configured to receive data from one or more components of a BAS system and compare the data to expected characteristics to perform "unit testing" and/or "integration testing" on the BAS system (e.g., compared to expected system parameters, etc.) and identify errors or potential errors in the BAS system.

According to some embodiments, the device model 3702 operates in a fixed schema environment (e.g., as described with reference to FIG. 37). The device model 3702 may be configured to receive (e.g., retrieve, call, pull, etc.) data or information from one or more components of a device (e.g., a sensor, a chiller, etc.) in accordance with a fixed schema or hierarchy. For example, the device model 3702 may be configured to receive data or information from components of a device, a subsystem of a BAS, the BAS system, etc., for example in accordance with a hierarchy (e.g., device level, subsystem level, system level, etc.). In some embodiments, the device model 3702 is configured to receive (e.g., retrieve, call, pull, etc.) data or information from the one or more devices or systems, and compare the data or information to expected parameters, for example to identify errors (or potential errors) within the devices or systems. The device model 3702 may further be configured to initiate one or more control decisions, for example to initiate an automated action to alter the operating parameters of a device or system and/or provide an indication (e.g., message, alert, etc.) to a user identifying the error or potential errors.

As an illustrative example, upon installation of one or more control applications and notification that the one or more devices connected to the BAS system are ready, the distributed controls system 3100 may be configured to perform one or more "unit tests" and/or "integration tests" on components of the BAS system. For example, system 3100 may use validation application 3192 to send actions in a predefined sequence to broker 1 3120 which may be configured to relay the actions to the actuators connected to the IoMs of system 3100. System 3100 may collect data from various sensors as previously described. As the sequence of automated actions is being performed, validation application 3192 may be configured to requested data related to the equipment being tested and compare that data to expected behavior using a similarity criterion (e.g., average error for the duration of the test is less than 5%). During execution of the test, validation application 3192 may be configured to stop the test and/or initiate one or more control decisions, for example to initiate an automated action to alter the operating parameters of a device or system and/or provide an indication (e.g., message, alert, etc.) to a user identifying the error or potential errors.

In some embodiments, "integration tests" require more than one device to be present. For example, each time a new equipment is installed and system 3100 is notified that the new equipment is ready to be tested, validation application 3192 may be configured to run the "unit test" (i.e., a sequence of actions) related to the newly connected and ready equipment. After the "unit tests" pass for the equipment, validation application 3192 may be configured to search for "integration tests" in its set of tests that are related to the newly connected equipment and any other equipment that has already passed unit tests. As new equipment is added, validation application 3192 may be configured to search for "integration-tests" that require two equipment, three equipment, and so on until all relevant tests for the site are completed.

It is noted that the common HVAC interface (i.e., the fixed schema of device model 3702 as described with reference to FIG. 37) allows validation application 3192 to run effectively. If the interface were not fixed, it may be necessary to develop a set of unit and integration tests for each building's specific set of sensors that are available or write the tests in such a way as to account for all these possibilities.

FIG. 40 shows a flow of operations 4000 for validating the configuration and installation of a distributed control system according to some embodiments. Flow 4000 may include receiving an indication that an equipment of a type is ready to be tested in operation 4002. The indication may come in many different forms, for example the indication may be initiated by a user pressing a button on an interface or it may be initiated when an equipment is connected to the network or an IoM of the building automation system. Flow 4000 may include operation 4004 to determine an applicable set of sequences of automated actions based on the type of equipment that was indicated to be ready for a test. According to some embodiments, flow 4000 includes sending signals to actuators of the equipment to perform the set of sequences of automated actions in operation 4006. During the time the set of sequences of automated actions is occurring the building automation system should still be measuring the variables of the building. According to the exemplary embodiment, measurements, states and parameters from the equipment during the time the set of sequences of automated actions are running are received in operation 4008.

Flow of operations 4000 may include calculating the expected results in operation 4010 and comparing the measurements and states received with the expected results using a similarity criterion in operation 4012. For example, the expected results could include that a variable changes by more than 1° C. and the similarity criterion is the measurements also indicated a change of more than 1° C. As another example, the expected behavior could include an expected timeseries for a zone temperature after a change in setpoint and the similarity criterion could be a bound on the integrated absolute error (e.g., the integral with respect to time of the absolute value of the error) between the measurements and the expected timeseries. Flow 4000 may include generating a report for a commissioning agent, technician, or other user of the described method that indicates which of the set of sequences of automated actions did not satisfy the similarity criterion. Advantageously, a user can test equipment without manually overriding the control sequence.

In some embodiments, Flow 4000 may additionally include an operation in which after receiving and indication that the equipment is available to be tested, the first set of sequences of automated actions (set of tests) during the time period is run, and after all of the tests pass, the method determines of any of the other equipment of the building system that has passed has tests defined for the combination of the two types of equipment. Such tests may be executed and a report generated for those tests as well. This process may continue with similar steps for combinations of three, four, etc. types of equipment, and as more equipment is added or brought online, until all tests applicable to the given system have run.

In some embodiments, Flow 4000 may include operations that run during the time period the signals are sent to actuators of the equipment. For example, to monitor the results of the test as it is being performed. The operations may stop the process or stop that particular sequence of automated actions at that time if it is determined that the test will fail or has already failed. In some embodiments, it may be necessary to stop at least that particular sequence of automated actions to prevent damage to the equipment if the equipment is not behaving as expected.

Features of a Distributed Building Automation System

Broker-based distributed controls as described in the present disclosure make it possible to consider systems and methods with advantageous features. For example, it is difficult to maintain smooth, or undisturbed control of a system if there is a failure within the control system. Herein systems and methods for the bump-less fail over to a new set of hardware (e.g., maintaining smooth and undisturbed control) when there is a failure will be described. Additionally, problems can arise with the configuration of building automations systems even after it has been fully tested by a commissioning agent. Automated tests, as described in the present disclosure, may reduce the number for problems that make it through the commissioning phase. However, there is still the potential for bugs to exist. Systems and methods for servicing the building automation system's configuration and logic by connecting to a live replay of the data using the same configuration for an isolated compute environments are disclosed.

Bump-Less Failover

Referring now to FIG. 41A, a system for providing bump-less failover is shown, according to some embodiments. The components of FIG. 41A may be configured to provide bump-less failover in a distributed controls system, for example by providing a cooperative architecture between one or more distributed control platforms and the control algorithms themselves. Advantageously, the components of FIG. 41A are configured to allow control algorithms and associated devices to run controls in a distributed and/or redundant manner, thereby permitting functionality provided by one device, environment, or algorithm to be diverted to a secondary device, environment, or algorithm upon failure of the first device, environment, or algorithm without disturbing the variables and or states of the building system under control (e.g., without "bumping" the system) thereby reducing errors and/or increasing efficiencies.

Referring to FIG. 41A, components of distributed control system 3100 are shown. FIG. 41A shows components necessary for the discussion of bump-less failover and it should be understood that system 3100 may contain many additional components as shown in FIG. 31, FIG. 32A, B and FIG. 39. In some embodiments, the various components of system 3100 operate within various isolated compute environments (e.g., virtual machines, containers, separate hardware, etc.) to isolate faults to a certain set or fault domain within the distributed control system 3100.

In some embodiments, distributed control system 3100 includes control app 1 3112, control app 2 3114, broker 1 3120, short-term storage 3176, database management system 3130, IOM 3160, and a redundant version of control app 1 4180. The control applications 3112 and 3114 are configured to provide one or more control actions or decisions, for example to control a current operation of a device. The one or more control actions or decisions can be stored in short-term storage 3176 and/or communicated to the IoM 3122 (e.g., as subscribed outputs), for example, to be implemented by the device. Further, based on the one or more control actions or decisions, the short-term storage 3176 may provide, and/or the one or more control applications 3112 and 3114 may retrieve, one or more state inputs (e.g., subscribed inputs), for example to be used in implementing a subsequent control action or decision. For a PID control application a state input, the state may be the integral term.

In some embodiments, control applications are "state-less" (that is they do not save their own calculations) rather all the control application calculations that must be used in a subsequent calculation (e.g., the integral term of a PID) is saved by a short-term storage in a broker (e.g., short-term storage 3176) and database management system 3130. The advantageous compression and storage schemes discussed in this disclosure may allow the control applications to be state-less without undue increases in storage requirements elsewhere. Furthermore, because changes in the calculations of a control application are saved it may be possible to review what occurred when debugging a control application.

According to an exemplary embodiment, the control applications of distributed control system 3100 are configured to transition between one or more states, for example an active state and a standby state. In an active state, the control applications may be configured to receive state inputs (e.g., subscribed inputs) and/or provide one or more control decisions. As shown in FIG. 41A, in a first configuration, the control application 3110 may be in an active state and control application 4180 may be in a standby state. However, as will be discussed in greater detail below, in other configurations the control application 3110 may be in a standby state and the control application 4180 may be in an active state.

As shown in FIG. 41A, in some embodiments control application 3110 is in an active state, and is configured to receive subscribed inputs (e.g., from the short-term storage 3176) and/or provide one or more control actions or decisions (e.g., based on the subscribed inputs, to the IoM 3160, etc.). In some embodiments, when the subscribed destination of the subscribed inputs (i.e., control application 3110) no longer responds (e.g., updates, provides control decisions, etc.), for example in response to a fault or failure, broker 1 3120 may be configured to attempt to wake up a redundant control application (e.g., a standby controller, a backup controller, etc.). For example, the short-term storage 3176 may be configured to attempt to wake up the redundant control application 4180, which is shown to be in a standby state. In response, the second control application (e.g., the redundant control application 4180) may transition to an awake state, and may request current state information (e.g., subscribed inputs current state data, etc.) from short-term storage 3176. In an exemplary embodiment, the redundant control application 4180 receives the current state information, thereby becoming the "primary" or version of control application 1 in the system 3100 (e.g., in a second exemplary configuration). In this regard, the communication between the control applications 3110, 4180 to/from broker 1 3120 may instruct the broker 1 3120 as to which controller device is currently "in control," or the primary, active controller.

According to some embodiments, upon startup redundant control application 4180 is configured to analyze the current state information (e.g., subscribed inputs current state data, etc.) left by the previously active control application (e.g., the control application 1 3112). Further, the redundant control application 4180 may be configured to determine how to perform a transition, for example a bump-less or disturbance free transition, for its subsequent control action or decision. Advantageously, due to the state-less configuration of the control applications in system 3100, in most failovers redundant control application 4180 can operate in its normal mode as it will obtain the same states, inputs, etc. from short-term storage 3176 as the control application 3112 would have obtained. This may reduce the amount of coding that needs to be performed in order to design a control application. In some embodiments, if the failover takes an unexpected amount of time, it may be necessary for redundant control application to determine how to perform the transition, for example the bump-less or disturbance free transition, by performing additional calculations on the received states or control parameters.

In some embodiments, the system 3100 may experience a fault or failure condition at the IoM 3160, for example the IoM 3160 may be configured to stop or restart. Upon restart, the IoM 3160 may be configured to send a "NULL" value (e.g., sensor value, etc.). In some embodiments, the "NULL" value or sensor value is based on its last active time or reading. This may involve managing a heartbeat to non-volatile memory. According to some embodiments, this "NULL" valve or sensor value also indicates to associated control applications (e.g., control application 3110, etc. via the broker 3120) that prior control actions or decisions may not have been received and/or taken. In response, the control devices (e.g., active control application 3110, etc.) may be configured to determine how to implement a subsequent control action or decision, for example to provide a bump-less transition. As discussed above, in an exemplary embodiment the determination of subsequent control actions (e.g., which involves a bump-less transition) involves analyzing parameters associated with/based on the "NULL" value or sensor value (e.g., amount of time between last control decision and receiving the "NULL" value, parameters of the sensor value, parameters of the previous control action or decision, etc.).

In some embodiments, the system 3100 may experience a fault or failure condition at the broker 3120 or the short-term storage 3176. Upon receiving an indication and/or determining that the broker 3120 does not accept output changes (e.g., changes, control actions, control decisions, etc.), the controllers applications (e.g., control application 3110, control application 3114, etc.) may be configured to identify a broker within the system (e.g., a standby state persistence memory, a backup state persistence memory, etc.). For example, a redundant version of broker 1 3120 may already exist or a secondary broker may be created using stored values from within database management system 3130. In response, the control application (e.g., control application 3110, etc.) may be configured to determine how to communicate and/or implement a subsequent control action or decision via the secondary state persistence memory, for example to provide a bump-less transition. As discussed above, in some embodiments the determination of a subsequent communication and/or control actions involves analyzing the parameters associated with the determination the broker 3120 does not accept output changes. In some embodiments, the control applications (e.g., control application 3110, etc.) are configured to communicate the output information (e.g., output changes, control actions, control decisions, etc.) to the second state persistence memory, which may be configured to communicate the actions to the IoM 3160 in order to implement a bump-less transition or implementation of the control actions. Advantageously, the components of system 3100 (e.g., the control application 3110, 4180, 3114, brokers 3120, IoM 3160, etc.) are configured in a distributed and redundant manner, which allows for communication and/or decision making that avoids disturbances in the controlled variables (e.g., following a failure, fault, restart, etc.) and/or increase efficiencies across distributed control systems.

FIGS. 41B-41D include flow diagrams for methods to provide bump-less or disturbance free control of the variables or states in building system after failures of various devices. For example, the methods described by FIGS. 41B-41D could be implemented by a distributed control system 3100 following the failure of one of its components (e.g., control application, broker, or IoM).

FIG. 41B shows flow of operations 4100 for transitioning control (e.g., performing failover to another device) when a state-less control applications fails. According to some embodiments, flow 4100 includes determining that a control application has stopped performing its function in operation 4102. In some embodiments, knowledge of the stoppage may be known ahead of time or be predicted by the system (e.g., for a computer reset) and a message may be sent indicative of the stoppage. In some embodiments, a central system may be required to keep a heartbeat to ensure that the control application is providing data at the required (or expected) time interval. According to some embodiments, flow 4100 includes with activating the standby or redundant control application for the type of control action that has failed in operation 4104. Operation 4104 may include sending a wake command to the redundant control application, the wake command may include messaging the control application the next time it should run (execute). Advantageously, because the control applications are state-less, redundancy for multiple control applications of a single type can be achieved by having an isolated compute environment with only one or two of the same type of control applications. The current state and parameters being held by a separate means of storage means that a control application of one type can perform as any of the same control application across the entirety of the distributed building control system. According to some embodiments, process 4100 continues with includes the redundant or standby application receiving the data to perform its calculation (e.g., per its request at the previously communicated execution time) in operation 4106.

FIG. 41C shows flow of operations 4120, a method of failover when short-term storage has failed (e.g., RAM or disk within the compute environment of the message broker) according to some embodiments. According to some embodiments, process 4120 starts with determining that the short-term storage has failed in operation 4122. This determination may, for example, be made by the control application when a request for data is left unanswered for a predetermined period. Flow 4120 may include activating another broker with another short-term storage in operation 4124. For example, after the request is left unanswered the control application may proceed to sending the same message to another broker. In some embodiments, upon determining that the broker/storage has failed, the database management system may automatically generate another instance of the broker and storage. Flow 4120 may include sending all messages that used to communicate through the failed broker through the new broker (e.g., existing broker, or a newly generated broker) in step 4126.

FIG. 41D shows flow of operations 4140 for disturbance free control when an IoM fails or is offline (e.g., during a reset) according to some embodiments. Flow 4140 may include receiving an indication that the IoM has stopped responding at a time in operation 4142. For example, the IoM may have gone through a reset process that took two minutes; the IoM could send a message including a "NULL" value at a given time in a message to indicate when it went offline. In some embodiments, flow 4140 includes determining, from storage, the control action that the IoM had at that time. In the example given, the IoM, being offline, would have ignored the previous two minutes of control actions. To provide bump-less restart of control the control application may consider the control action that was last implemented by the IoM when performing the next control action (e.g., to avoid a large change in the control action). Flow 4140 may include calculating a next control action based on the control action the IoM was implementing at the time of failure (and is still implementing because it has been offline for other control actions that were sent). For example, the next control action may be chosen to satisfy a similarity criterion with the action the IoM was implementing at the time of failure. In some embodiments, the similarity criterion includes (or is represented by) a range around the previous action to prevent large changes when control begins.

Live Control Replay

Figure 42:
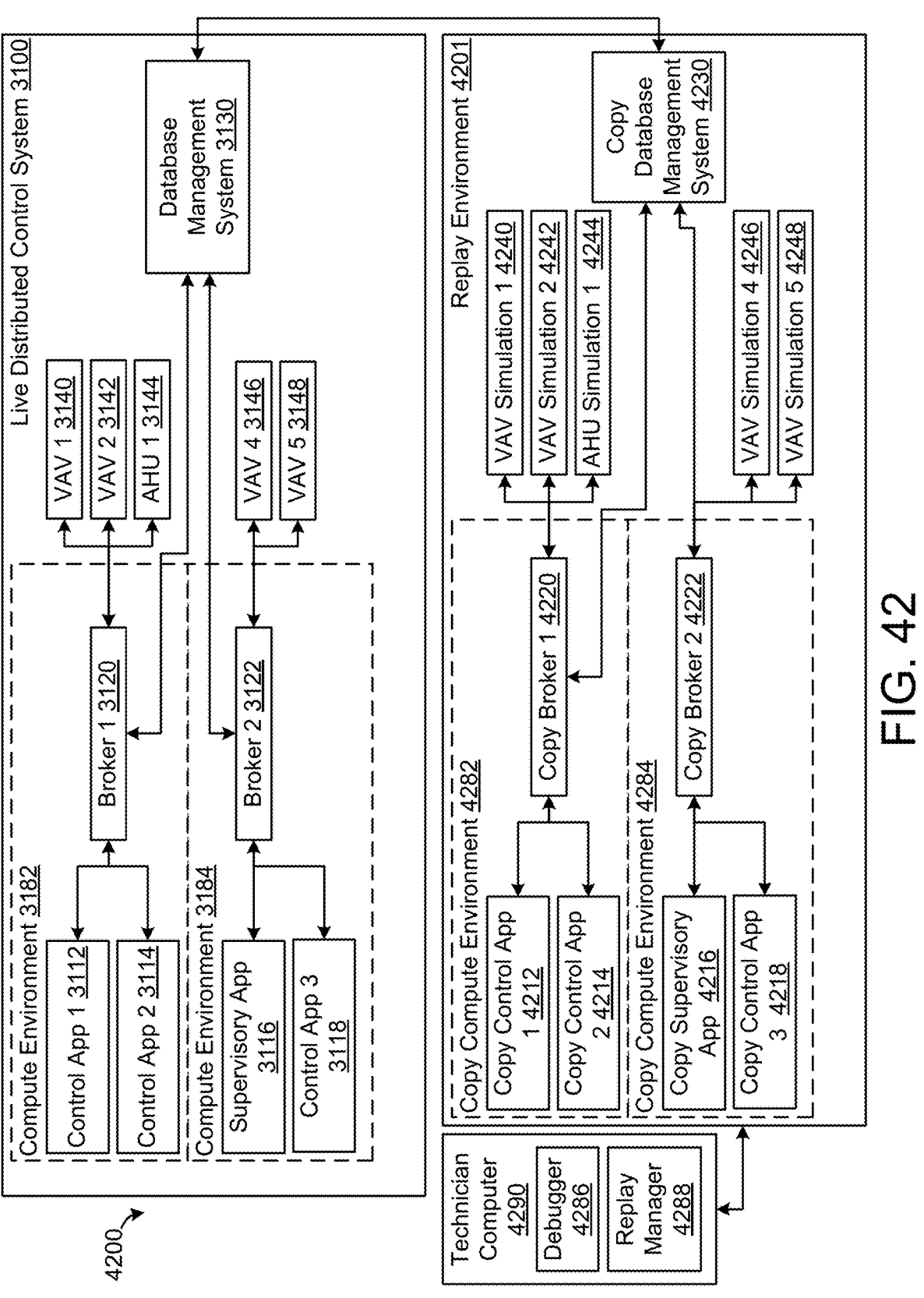
FIG. 42 is a block diagram of a distributed control system providing replay of on-site operations, according to some embodiments.

Referring to FIG. 42, distributed controls system with replay environment 4200 for storing and providing data for diagnostic and maintenance procedures is shown, according to some embodiments. System 4200 be configured to store input, state, and/or output data from one or more control devices (e.g., in real time, etc.) to perform control of building equipment (e.g., using system 3100). In some embodiments, system 4200 is also configured to provide relevant input, state, and/or output data, for example as a "replay" of one or more fault conditions or failures (e.g., replay environment 4201). Advantageously, the features of system 4200 provide a system that stores relevant input, state, and/or output data from one or more control devices within an environment (e.g., a building management system, etc.), and provides the relevant data to a user or operator (e.g., in response to a fault condition or failure, etc.) to be used in diagnostic and/or maintenance processes, which can reduce resource consumption (e.g., technician time, trips to a maintenance site, etc.) and/or increase efficiencies in the diagnostic and/or maintenance processes.

As shown in FIG. 42, a system for performing building control and providing data for control system diagnostic procedures is given by system 4200. In some embodiments, system 4200 is a combination of distributed control system 3100 and replay environment 4201. System 4200 may include one or more brokers, one or more applications (e.g., one or more input-output modules, control applications, etc.), and a database management system. For example, the system 4200 is shown to include an active broker 3120, an active control application 3112, and a database management system 3130, as shown in FIG. 42. Further, the system 4200 is shown to include a replay environment 4201 containing compute environments that are configured to perform the same function as the live compute environments (named with the term "copy"). For example, replay environment may be generated by the same container image as distributed control system 3100.

In some embodiments, the system 4200 includes an integrated development environment (IDE) on a technician computer 4290 (e.g., a laptop, tablet, a cloud cluster with access provided to the technician, etc.) including debugger 4286. According to some embodiments, the system 4200 is configured to operate under one or more conditions and/or within one or more operating environments. For example, the system 4200 may operate within a building management system, which may include one or more systems, subsystems, and/or pieces of building equipment.

According to a non-limiting example, FIG. 42 illustrates the system 3100 operating under standard (e.g., normal, active, etc.) operating conditions. Under standard operating conditions, the active broker is shown to provide input data (e.g., input changes, etc.) to an active control application 3112. The input data may relate to one or more operating conditions or characteristics, for example relating to the building management system, a subsystem, a piece of building equipment, etc. The active control application 3112 may be configured to receive the input data and provide one or more control decisions in response to the input data, for example to implement a subsequent control action and/or process. For example, the active control application 3112 is shown to provide state data (e.g., state changes, etc.) and/or output data (e.g., output changes, etc.) to the active broker 3120, which can be used to implement a control decision or action (e.g., at a system, a subsystem, a device of building equipment, etc.). The communication of information (e.g., input data, output data, state data, control decisions, etc.) between the active broker 3120 and the active control application 3112 may occur in real time, for example during operation of components of the system 4200. As shown in FIG. 42, the active broker 3120 is also configured to communicate the data (e.g., persist data including the input data, output data, state data, etc.) to the database management system 3130, for example for storage. The database management system 3130 may be configured to store data received from the active broker 3120 (e.g., persist data including the input data, output data, state data, etc.), for example to store and/or track information relating to the components of the distributed control system 3100 within system 4200 operating under standard operating conditions.

In operation one or more components of distributed control system 3100 (e.g., a component of the building management system, a subsystem, and/or a device of building equipment, etc.) may experience a fault or failure condition or event. When a component of the system 3100 experiences a fault or failure condition, the replay environment 4201 may receive (e.g., pull, request, retrieve, etc.) data from the database management system 4230. According to some embodiments, the data includes data relating to the fault condition or event, which may include associated input data, output data, and/or state data at and/or around the time the fault condition or event occurred. In some embodiments, the replay environment is configured to receive a time (or identify a time), from replay manager 4288, associated with the fault, and receive (e.g., request, pull, retrieve, etc.) data from the database management system 3130 within or around a predetermined time from the time associated with the fault to generate copy database management system 4230. According to the exemplary embodiment, control applications and the brokers may be configured with options to change behavior within the replay system while still using the same images of the compute environments as those used by the live system. For example, timers may be disabled so that the applications do not automatically run when deployed in the replay environment, but rather run when the simulated time causes crosses a threshold or in another way depends on input from the technician computer 4290

As shown in FIG. 42 after receiving data (e.g., persist data) from the database management system 3130 the replay environment 4201 is also configured to provide data to simulate the inputs and provide data to the copy brokers and the copy control applications. For example, the replay environment 4201 may be configured to provide input data (e.g., input changes, etc.) and/or state data (e.g., state changes, etc.) to the copy control application 4212 through copy broker 1 4220. The copy control application 4212 may be configured to receive the data from the copy broker 1 4220, and based on the received data, provide output data back to the copy broker 4220. In some embodiments, the output data includes one or more control decisions or actions (e.g., a subsequent control action and/or process), for example indicative of one or more control decisions to be implemented in response to the received data (e.g., input data, state data, etc.). According to some embodiments, the communication of information (e.g., input data, state data, output data, etc.) between the copy broker 4220 and the copy control application 4212 provide an indication (e.g., a replay) of the operating conditions of one or more components of the system 3100 at and/or around the time of the fault condition or event. In this regard, the copy broker 4220 and/or the copy control application 4212 may be configured to acquire data (e.g., via the replay database management system 4230), which may be used to provide a "replay" of the operating conditions (e.g., control decisions, operating parameters, etc.) of the system 3100 during the time of the fault condition. Advantageously, this information may be provided to a user or operator (e.g., via a data file, etc.) for diagnostic and/or maintenance purposes, which can reduce resource consumption (e.g., technician time, trips to a maintenance site, etc.) and/or increase efficiencies in the diagnostic and/or maintenance processes. According to some embodiments, the measurements of IoMs are simulated (e.g., by simulations 4240-4248) to provide data to the brokers at the times the actual IoMs did according to copy database management system 4230.

FIG. 43 shows flow of operations 4350 for replaying a live distributed control system according to an some embodiments. Flow of operations can, for example, be performed by system 4200 (e.g, using technician computer 4290 to generate and/or operate replay environment 4201). In some embodiments, process 4350 includes receiving a copy of the data in an operational database within a period or around a time of interest in operation 4352. For example, the data around the time of an expected fault may be received. Flow 4350 may include creating, from images used to create the operational sets of isolated compute environments, a copy of the control applications with copies of the isolated compute environments in operation 4354. For example, the applications and brokers making up a distributed control system may be deployed to a second set of hardware (e.g., computers, nodes on a cloud server, etc.).

In some embodiments, flow 4350 continues with operation 4356 in which a time in the past is received that represents the time that the replay environment will begin its replay. Flow 4350 may include using the copy of the database management system (DBMS) to recreate the state of short-term storage (e.g., RAM, disk, etc.) at the received time in the copy of the isolated compute environment in operation 4358. For example, the DBMS may be used to recreate a broker as its live counterpart would have been at the received time. Flow 4350 may include simulating the copy of the entire control application using the copy of the operational DBMS to send data when the time of the simulate matches the time the data was recorded in the DBMS in operation 4360. For example, during simulation time can be propagated on demand (as if stepping through a debugger) or in a "video mode" playing at some multiple (faster or slower) of original speed. In some embodiments, the IoMs may be simulated (they interact with the physical world) by at each increment in time checking to see if any changes of the building system measurements were recorded. If a measurement was recorded in the DBMS, it can be sent to the brokers in the replay environment as the IoM would send data to the brokers.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps can be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

In various implementations, the steps and operations described herein may be performed on one processor or in a combination of two or more processors. For example, in some implementations, the various operations could be performed in a central server or set of central servers configured to receive data from one or more devices (e.g., edge computing devices/controllers) and perform the operations. In some implementations, the operations may be performed by one or more local controllers or computing devices (e.g., edge devices), such as controllers dedicated to and/or located within a particular building or portion of a building. In some implementations, the operations may be performed by a combination of one or more central or offsite computing devices/servers and one or more local controllers/computing devices. All such implementations are contemplated within the scope of the present disclosure. Further, unless otherwise indicated, when the present disclosure refers to one or more computer-readable storage media and/or one or more controllers, such computer-readable storage media and/or one or more controllers may be implemented as one or more central servers, one or more local controllers or computing devices (e.g., edge devices), any combination thereof, or any other combination of storage media and/or controllers regardless of the location of such devices.

What is claimed is:

1. One or more memory devices having instructions stored thereon that, when executed by one or more processors, cause the one or more processors to perform operations comprising:

operating a first isolated compute environment comprising a message broker and a first tier of storage, wherein the first tier of storage is configured to respond faster than a second tier of storage in a second isolated compute environment; and operating the second isolated compute environment comprising the second tier of storage, wherein the message broker is configured to:

receive measurements relating to a building system;

store a current measurement of the measurements in the first tier of storage; and send, after storing the current measurement into the first tier of storage, a message to the second isolated compute environment to store a difference between the current measurement and a previous measurement of the measurements in the second tier of storage.

2. The one or more memory devices of claim 1, wherein the first tier of storage comprises at least one of:

RAM;

a solid-state drive; or an embedded multi-media card.

3. The one or more memory devices of claim 1, wherein the second tier of storage comprises at least one of:

a solid-state drive;

a magnetic disk drive; or an embedded multi-media card.

4. The one or more memory devices of claim 1, wherein the message broker is further configured to:

store a first portion of a timeseries representing a variable in the measurements in the first tier of storage; and cause a second portion of the timeseries representing the variable to be stored in the second tier of storage.

5. The one or more memory devices of claim 4, wherein the message broker is further configured to:

encode the timeseries by subtracting time adjacent values of the timeseries to form an encoded timeseries; and bit-pack the encoded timeseries to form a compressed timeseries.

6. The one or more memory devices of claim 4, the operations further comprising operating a third isolated compute environment comprising an algorithm calculator configured to request the timeseries from the message broker, wherein the message broker is configured to:

request the second portion of the timeseries;

generate a combined timeseries comprising the first portion of the timeseries and the second portion of the timeseries; and send the combined timeseries to the algorithm calculator.

7. The one or more memory devices of claim 4, the operations further comprising operating a third isolated compute environment comprising a digital twin of at least a portion of the building system, the digital twin configured to:

receive the current measurement from the first tier of storage before the difference is stored in the second tier of storage;

display a state of the portion of the building system;

request the timeseries from the message broker; and simulate the portion of the building system using the timeseries.

8. The one or more memory devices of claim 1, the operations further comprising operating a third isolated compute environment comprising a complex event processor configured to:

receive the current measurement from the first tier of storage before the difference is stored in the second tier of storage; and perform a fault detection operation with the current measurement.

9. The one or more memory devices of claim 1, the operations further comprising operating a third isolated compute environment comprising a control application configured to:

select the first tier of storage or the second tier of storage based on a speed of a system controlled by the control application; and request the current measurement from the selected tier of storage.

10. A method for providing real-time data and historical data from a building system, the method comprising:

storing a current measurement relating to the building system in a first tier of storage operating in a first isolated compute environment; and storing a difference between the current measurement and a previous measurement in a second tier of storage operating in a second isolated compute environment after processing requests for the current measurement in the first tier of storage, wherein the first tier of storage is configured to respond faster than the second tier of storage.

11. The method of claim 10, wherein the first tier of storage comprises at least one of:

RAM;

a solid-state drive; or an embedded multi-media card.

12. The method of claim 10, wherein the second tier of storage comprises at least one of:

a solid-state drive;

a magnetic disk drive; or an embedded multi-media card.

13. The method of claim 10, wherein the current measurement is stored in a timeseries, wherein a first portion of the timeseries is stored in the first tier of storage and a second portion of the timeseries is stored in the second tier of storage.

14. The method of claim 13, wherein the timeseries is stored in a compressed form, the method further comprising:

encoding the timeseries by subtracting time adjacent values of the timeseries to form an encoded timeseries; and bit-packing the encoded timeseries to form a compressed timeseries, wherein a most recent stored value in the timeseries is not encoded.

15. The method of claim 13, further comprising performing calculations of an algorithm using the first portion of the timeseries and the second portion of the timeseries.

16. The method of claim 13, the method further comprising displaying in real-time a state of a part of the building system using the current measurement from the first tier of storage and performing a simulation of the building system using the timeseries.

17. The method of claim 10, further comprising performing a fault detection operation using a response to a request for the current measurement from the first tier of storage.

18. The method of claim 10, further comprising selecting the first tier of storage or the second tier of storage based on a speed of a system controlled by a control application and performing a calculation of the control application using the current measurement from the selected tier of storage.

19. One or more non-transitory computer-readable storage media having instructions stored thereon that, when executed by one or more processors, cause the one or more processors to perform operations comprising:

receiving a current measurement of a building system;

storing the current measurement in a first tier of storage;

providing the current measurement in the first tier of storage to a digital twin before storing the current measurement in a timeseries in a second tier of storage;

providing the timeseries from the second tier of storage to the digital twin after storing the current measurement in the timeseries in the second tier, wherein the digital twin is configured to display the current measurement and perform a simulation or replay using the timeseries.

20. The one or more non-transitory computer-readable storage media of claim 19, wherein the current measurement is stored in a timeseries, the operations further comprising:

encoding the timeseries by subtracting the current measurement from a most recent stored value in the timeseries to obtain a difference, replacing the most recent stored value in the timeseries with the difference, and appending the current measurement to the timeseries; and bit-packing the encoded timeseries to form a compressed timeseries.

\* \* \* \* \*